United States Patent
Ikoma

(10) Patent No.: US 10,115,699 B2
(45) Date of Patent: Oct. 30, 2018

(54) METHOD FOR MANUFACTURING WIRE BONDING STRUCTURE, WIRE BONDING STRUCTURE, AND ELECTRONIC DEVICE

(71) Applicant: ROHM CO., LTD., Kyoto-shi, Kyoto (JP)

(72) Inventor: Kazuya Ikoma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/308,544

(22) PCT Filed: May 8, 2015

(86) PCT No.: PCT/JP2015/063293
§ 371 (c)(1),
(2) Date: Nov. 2, 2016

(87) PCT Pub. No.: WO2015/170738
PCT Pub. Date: Nov. 12, 2015

(65) Prior Publication Data
US 2017/0062381 A1    Mar. 2, 2017

(30) Foreign Application Priority Data

May 8, 2014    (JP) .................................. 2014-096643

(51) Int. Cl.
*H01L 23/00*    (2006.01)
*H01L 23/48*    (2006.01)
(Continued)

(52) U.S. Cl.
CPC ............... *H01L 24/85* (2013.01); *B23K 20/10* (2013.01); *B23K 20/1205* (2013.01);
(Continued)

(58) Field of Classification Search
CPC ......... H01L 24/85; H01L 24/81; H01L 24/78; H01L 24/48; H01L 24/45; H01L 21/13;
(Continued)

(56) References Cited

U.S. PATENT DOCUMENTS

2007/0035035 A1* 2/2007 Minamio ............ H01L 21/2007
257/784
2009/0127317 A1* 5/2009 Siepe .................... B23K 20/004
228/110.1
(Continued)

FOREIGN PATENT DOCUMENTS

JP    10-199913 A    7/1998
JP    2000-357705 A    12/2000
(Continued)

OTHER PUBLICATIONS

International Search Report, PCT/JP2015-063293, dated Jun. 30, 2015 (1 page).

*Primary Examiner* — Dao H Nguyen
(74) *Attorney, Agent, or Firm* — Hamre, Schumann, Mueller & Larson, P.C.

(57) ABSTRACT

A manufacturing method for a wire bonding structure of the present invention includes a step of preparing a wire made of Cu and a step of joining the wire to a first joining target formed on an electronic device. Before the joining step, the wire has an outer circumferential surface and a withdrawn surface. The withdrawn surface is withdrawn toward a central axis of the wire from the outer circumferential surface. In the joining step, ultrasonic vibration is applied to the wire in a state in which the withdrawn surface is pressed against the first joining target.

31 Claims, 89 Drawing Sheets

(51) Int. Cl.
*H01L 21/60* (2006.01)
*B23K 20/10* (2006.01)
*B23K 20/12* (2006.01)
*H01L 21/48* (2006.01)
*H01L 21/56* (2006.01)
*H01L 23/31* (2006.01)
*H01L 23/495* (2006.01)

(52) U.S. Cl.
CPC ........ *B23K 20/129* (2013.01); *H01L 21/4825* (2013.01); *H01L 21/4882* (2013.01); *H01L 21/565* (2013.01); *H01L 23/3114* (2013.01); *H01L 23/4952* (2013.01); *H01L 23/49513* (2013.01); *H01L 23/49562* (2013.01); *H01L 23/49568* (2013.01); *H01L 23/49582* (2013.01); *H01L 24/13* (2013.01); *H01L 24/45* (2013.01); *H01L 24/48* (2013.01); *H01L 24/78* (2013.01); *H01L 24/81* (2013.01); *H01L 2224/0603* (2013.01); *H01L 2224/32245* (2013.01); *H01L 2224/45015* (2013.01); *H01L 2224/45124* (2013.01); *H01L 2224/45147* (2013.01); *H01L 2224/48091* (2013.01); *H01L 2224/48227* (2013.01); *H01L 2224/48247* (2013.01); *H01L 2224/48472* (2013.01); *H01L 2224/4903* (2013.01); *H01L 2224/49171* (2013.01); *H01L 2224/73265* (2013.01); *H01L 2224/7855* (2013.01); *H01L 2224/78313* (2013.01); *H01L 2224/78314* (2013.01); *H01L 2224/78343* (2013.01); *H01L 2224/78705* (2013.01); *H01L 2224/78756* (2013.01); *H01L 2224/85047* (2013.01); *H01L 2224/85136* (2013.01); *H01L 2224/85181* (2013.01); *H01L 2224/85205* (2013.01); *H01L 2924/00014* (2013.01); *H01L 2924/13055* (2013.01); *H01L 2924/13091* (2013.01); *H01L 2924/15724* (2013.01); *H01L 2924/181* (2013.01)

(58) Field of Classification Search
CPC ........... H01L 23/49513; H01L 23/4952; H01L 23/49568; H01L 23/49562; H01L 23/49582; H01L 23/3114; H01L 21/4825; H01L 21/4882; H01L 21/565; B23K 20/129; B23K 20/1205; B23K 20/10
USPC ............... 257/675, 780, 784, E23.1, E23.01, 257/E23.02, E23.021, E23.025, E21.509, 257/E21.503, E21.508, E21.517; 228/13, 228/44.7, 110.1; 438/127, 612
See application file for complete search history.

(56) References Cited

U.S. PATENT DOCUMENTS

2011/0241224 A1* 10/2011 Tsubaki ............... B23K 20/005
257/784
2015/0145148 A1* 5/2015 Tran ........................ H01L 24/13
257/780
2015/0336206 A1* 11/2015 Broekelmann ......... H01L 24/48
228/110.1

FOREIGN PATENT DOCUMENTS

JP 2011-216518 A 10/2011
JP 2013-004779 A 1/2013

* cited by examiner

METHOD FOR MANUFACTURING WIRE BONDING STRUCTURE, WIRE BONDING STRUCTURE, AND ELECTRONIC DEVICE

TECHNICAL FIELD

The present invention relates to a manufacturing method for a wire bonding structure, and to a wire bonding structure and an electronic device.

BACKGROUND ART

FIGS. 93 and 94 show an example of a conventional bonding tool and a wire bonding method that uses this bonding tool. As shown in FIG. 93, a bonding tool X is provided with a wedge 91, a wire guide 92 and a cutter 93. The wedge 91, the wire guide 92 and the cutter 93 are supported by a horn which is not illustrated. The horn produces ultrasonic vibration in a state in which the wedge 91 is pressed against a connection target. The wire guide 92 is for guiding a wire 96 to the tip of the wedge 91. The wedge 91 joins the wire 96 and the connection target, by applying ultrasonic vibration and pressure in a state in which the wire 96 is sandwiched between the tip thereof and the connection target. The cutter 93 cuts the wire 96 that has been connected.

In this wire bonding method, first bonding on an electrode pad 98*a* of a semiconductor device 98 mounted on a lead 97A is performed first. The wire 96 is pressed against the electrode pad 98*a*, which is the connection target, by the wedge 91. When ultrasonic vibration is applied in this state, the wire 96 is joined to the electrode pad 98*a*. This joined portion serves as a first bonding part 96A shown in FIG. 94.

Next, the bonding tool X is moved to directly above a lead 97B, and second bonding is performed. In this process, ultrasonic vibration is applied while the wire 96 is being pressed against a pad part 97Ba, which is another connection target, by the wedge 91. The wire 96 is thereby joined to the pad part 97Ba. This joined portion serves as a second bonding part 96B shown in FIG. 94. The first bonding part 96A and the second bonding part 96B are connected via a bridging part 96C. Electrical continuity can thereby be established between the electrode pad 98*a* of the semiconductor device 98 and lead 97B.

CITATION LIST

Patent Literature

PTL 1: JP 2011-216518A

SUMMARY OF INVENTION

Technical Problem

Conventionally, wire made of Al is often used as the wire 96. In recent years, development of an electronic device called a power device has been advanced. High current flows through the wire of the electronic device known as a power device. In view of this, using wire made of Cu as the wire 96 is being considered. The wire 96 made of Cu has low electrical resistance and thermal resistance, and is able to efficiently release heat produced in the semiconductor device 98 to outside of the electronic device. However, the wire 96 made of Cu is harder than the wire 96 made of Al, and is not readily deformed. Thus, when the wire 96 is pressed against the electrode pad 98*a*, which is the connection target, by the wedge 91, excessive force could be loaded on the electrode pad 98*a* due to the wire 96 not deforming. This would damage the semiconductor device 98.

The present invention has been proposed under the above circumstances, and a main object of the invention is to provide a manufacturing method for a wire bonding structure that is able to appropriately join a wire to a joining target, while preventing damage to an electronic device, even in the case where a wire made of Cu is used.

Solution to Problem

A manufacturing method for a wire bonding structure provided according to a first aspect of the present invention includes a step of preparing a wire made of Cu and a step of joining the wire to a first joining target formed on an electronic device. Before the joining step, the wire has an outer circumferential surface and a withdrawn surface, the withdrawn surface being withdrawn toward a central axis of the wire from the outer circumferential surface, and in the joining step, ultrasonic vibration is applied to the wire, in a state in which the withdrawn surface is pressed against the first joining target.

Preferably, at a point in time at which the joining step is started, the withdrawn surface is flat.

Preferably, the manufacturing method for a wire bonding structure further includes a step of forming the withdrawn surface, by pressing the wire against a pressing target, before the joining step.

Preferably, the pressing target is made of a ceramic material or a metal.

Preferably, the manufacturing method for a wire bonding structure further includes a step of preparing a wedge for pressing the wire, and in the step of forming the withdrawn surface, the wire is pressed against the pressing target by the wedge, and in the step of joining the wire to the first joining target, the wire is pressed against the first joining target by the wedge.

Preferably, a guide groove that guides the wire is formed in the wedge, the manufacturing method further includes a step of moving the wedge from a position in which the guide groove directly opposes the pressing target to a position in which the guide groove directly opposes the first joining target, while maintaining a state in which the wire is slotted into the guide groove, between the step of forming the withdrawn surface and the step of joining the wire to the first joining target, in the step of forming the withdrawn surface, the wire is pressed against the pressing target by an inner surface of the guide groove, and in the step of joining the wire to the first joining target, the wire is pressed against the first joining target by the inner surface of the guide groove.

Preferably, the wire has a circular shape with a diameter of 150 to 1000 μm.

Preferably, the wire has a circular shape with a diameter of 300 to 1000 μm.

Preferably, the wire is made entirely of Cu.

Preferably the manufacturing method for a wire bonding structure further includes a step of joining the wire to a second joining target, by applying ultrasonic vibration in a state in which the wire is pressed against the second joining target.

Preferably, the electronic device is a semiconductor device.

Preferably, the semiconductor device is a MOSFET or an IGBT.

A wire bonding structure provided according to a second aspect of the present invention includes a first joining target having a first surface, a second joining target, and a wire joined to both the first joining target and the second joining target, the wire being made of Cu and having a circular shape with a diameter of 150 to 1000 μm.

Preferably, the wire has a circular shape with a diameter of 300 to 1000 μm.

Preferably, the wire is made entirely of Cu.

Preferably, the wire includes a bonding part joined to the first joining target, the bonding part has an outer circumferential surface and a joining surface joined to the first joining target, and the joining surface is withdrawn toward a central axis of the wire from the outer circumferential surface.

Preferably, a size of the joining surface, in a cross-sectional shape of a cross-section orthogonal to a first direction, is 60 to 80% of the diameter of the wire, and the first direction is a direction in which the central axis of the wire extends and is orthogonal to a direction in which the first surface faces.

Preferably, the size of the joining surface, in a cross-sectional shape orthogonal to the first direction, is 90 to 800 μm.

Preferably, the size of the joining surface in the first direction is 3 to 10 times the diameter of the wire.

Preferably, the size of the joining surface in the first direction is 1200 to 4000 μm.

Preferably, the joining surface has an elliptical shape whose major axis coincides with the direction in which the central axis of the wire extends.

Preferably, an elliptical mark having an elliptical shape is formed in the joining surface, and the elliptical mark is located on an inner side of the edge of the joining surface.

Preferably, the bonding part has a first pressed surface and a second pressed surface, the first pressed surface and the second pressed surface are withdrawn toward the central axis of the wire from the outer circumferential surface, and the first pressed surface and the second pressed surface are located on opposite sides to each other with a virtual plane that passes through the central axis and is orthogonal to the first surface sandwiched therebetween, when viewed in a direction orthogonal to the first surface.

Preferably, the first pressed surface and the second pressed surface slopes with respect to the virtual plane.

Preferably, a first curved mark formed at a position shifted from an edge of the first pressed surface and a second curved mark formed at a position shifted from an edge of the second pressed surface are formed in the bonding part.

Preferably, the bonding part serves as a first bonding part, the wire includes a second bonding part and a bridging part, the bridging part connects the first bonding part and the second bonding part, and the second bonding part is joined to the second joining target.

An electronic device provided according to a third aspect of the present invention includes the wire bonding structure provided according to the second aspect of the present invention and an electronic device on which the first joining target is formed, the first joining target being an electrode pad.

Preferably, the electronic device is a semiconductor device.

Preferably, the semiconductor device is a MOSFET or an IGBT.

Preferably, the first joining target is made of Al.

Preferably, the first joining target has a thickness of 1 to 10 μm.

Preferably, the maximum current value that flows through the wire is 150 to 200 A.

Preferably, the first joining target includes a metal layer and an electrode pad, the wire is joined to the metal layer, the metal layer is interposed between the wire and the electrode pad, and the metal layer has a greater thickness than the electrode pad.

The other features and advantages of the present invention will become apparent from the detailed description given below with reference to the accompanying drawings.

DESCRIPTION OF EMBODIMENTS

First Embodiment

A first embodiment of the present invention will be described using FIGS. 1 to 30.

Figure 1:
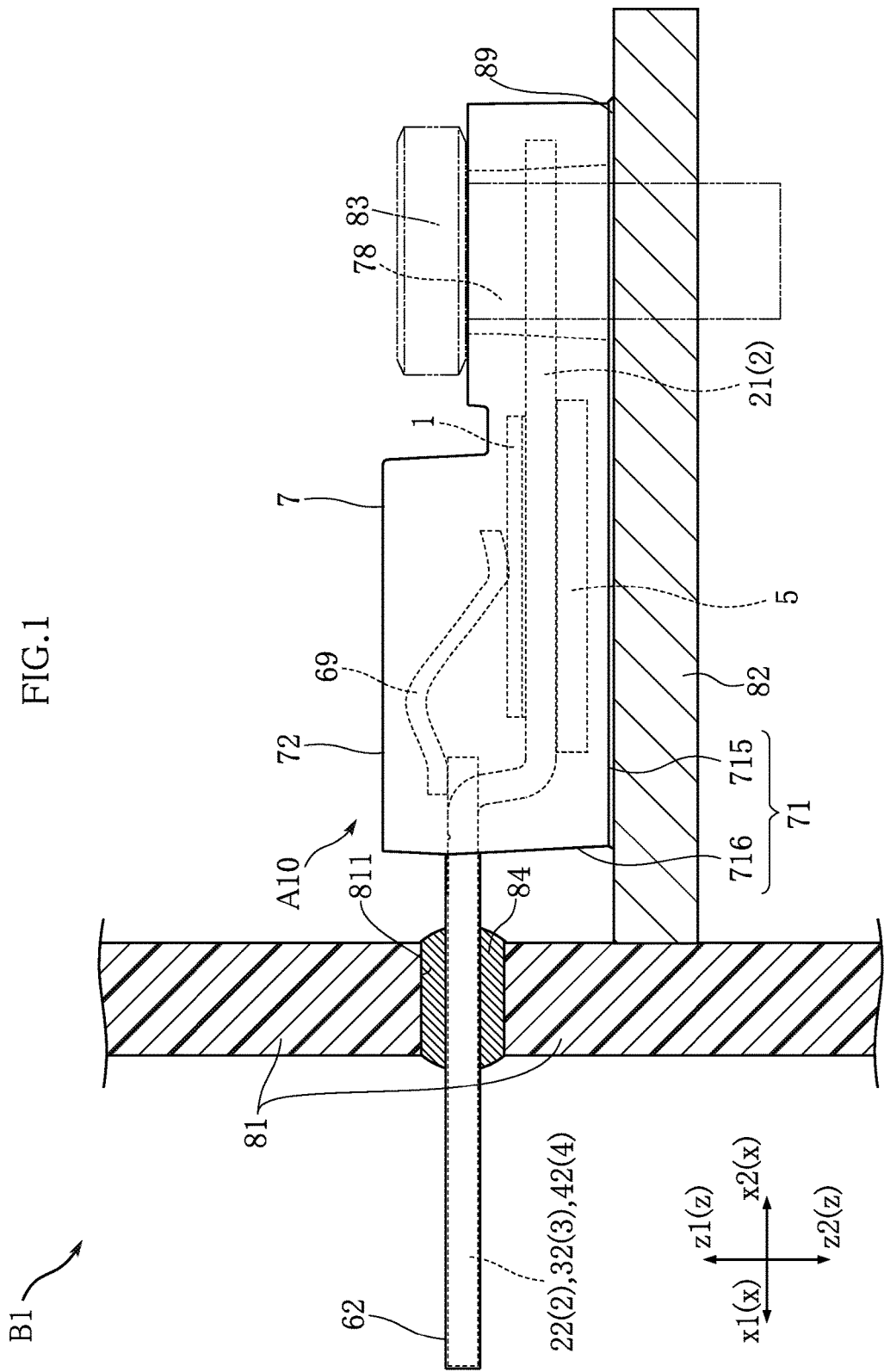
FIG. 1 is a cross-sectional view of a main section showing a mounting structure of an electronic device according to a first embodiment of the present invention.

FIG. 1 is a cross-sectional view of a main section showing amounting structure of an electronic device according to the present embodiment.

An electronic device mounting structure B1 shown in FIG. 1 is provided with an electronic device A10, a mounting board 81, and a heat sink 82.

The mounting board 81 is a substrate on which a plurality of electronic components are mounted. The mounting board 81 is made of an insulating material. A wiring pattern which is not illustrated is formed on the mounting board 81. A plurality of holes 811 are formed in the mounting board 81. The heat sink 82 stands erect on the mounting board 81. The heat sink 82 is made of a material having comparatively high thermal conductivity, such as aluminum or a similar metal, for example.

Figure 2:
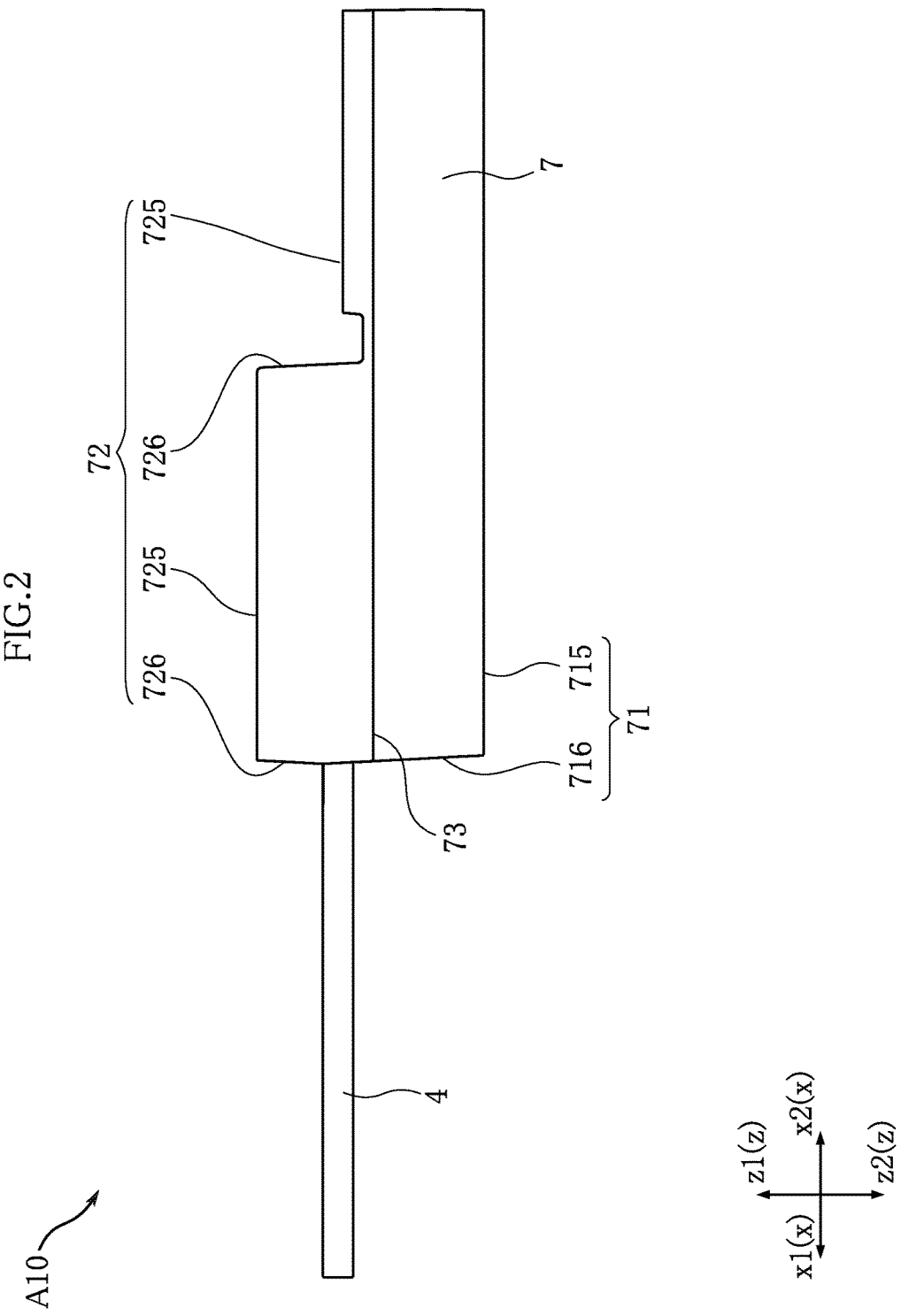
FIG. 2 is a front view of the electronic device according to the first embodiment of the present invention.
Figure 3:
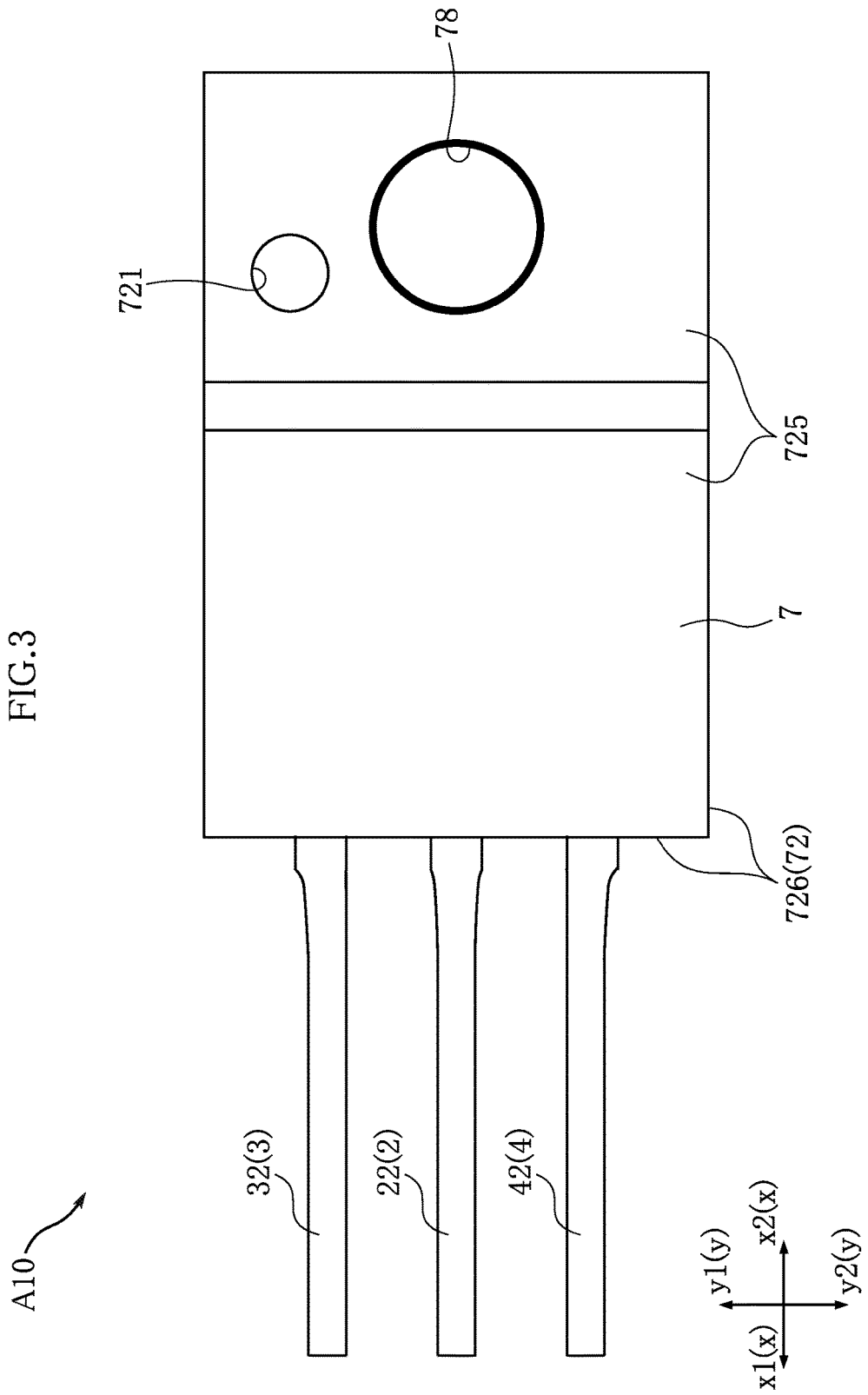
FIG. 3 is a plan view of the electronic device according to the first embodiment of the present invention.
Figure 4:
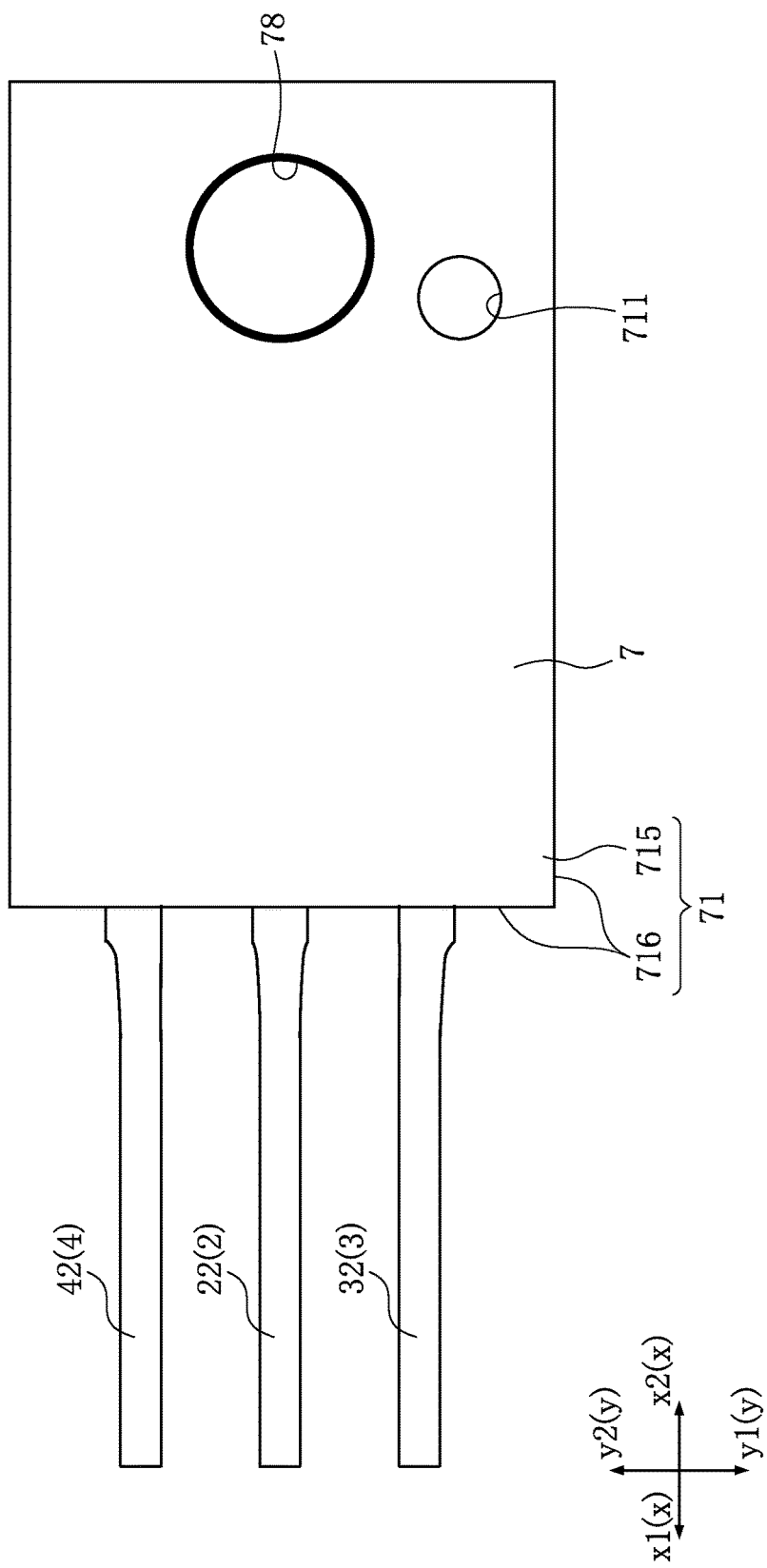
FIG. 4 is a bottom view of the electronic device according to the first embodiment of the present invention.
Figure 5:
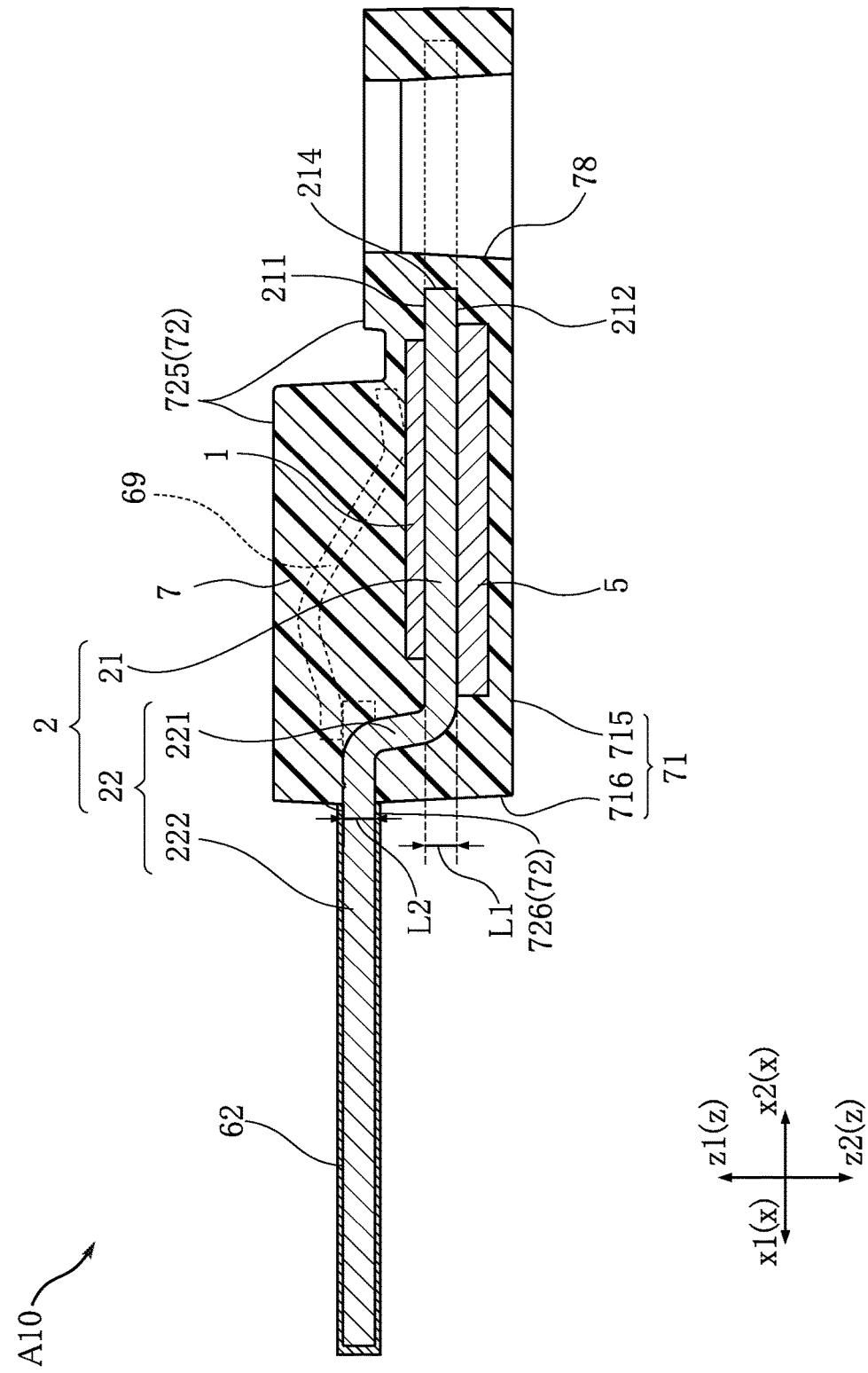
FIG. 5 is a cross-sectional view of the electronic device according to the first embodiment of the present invention.
Figure 6:
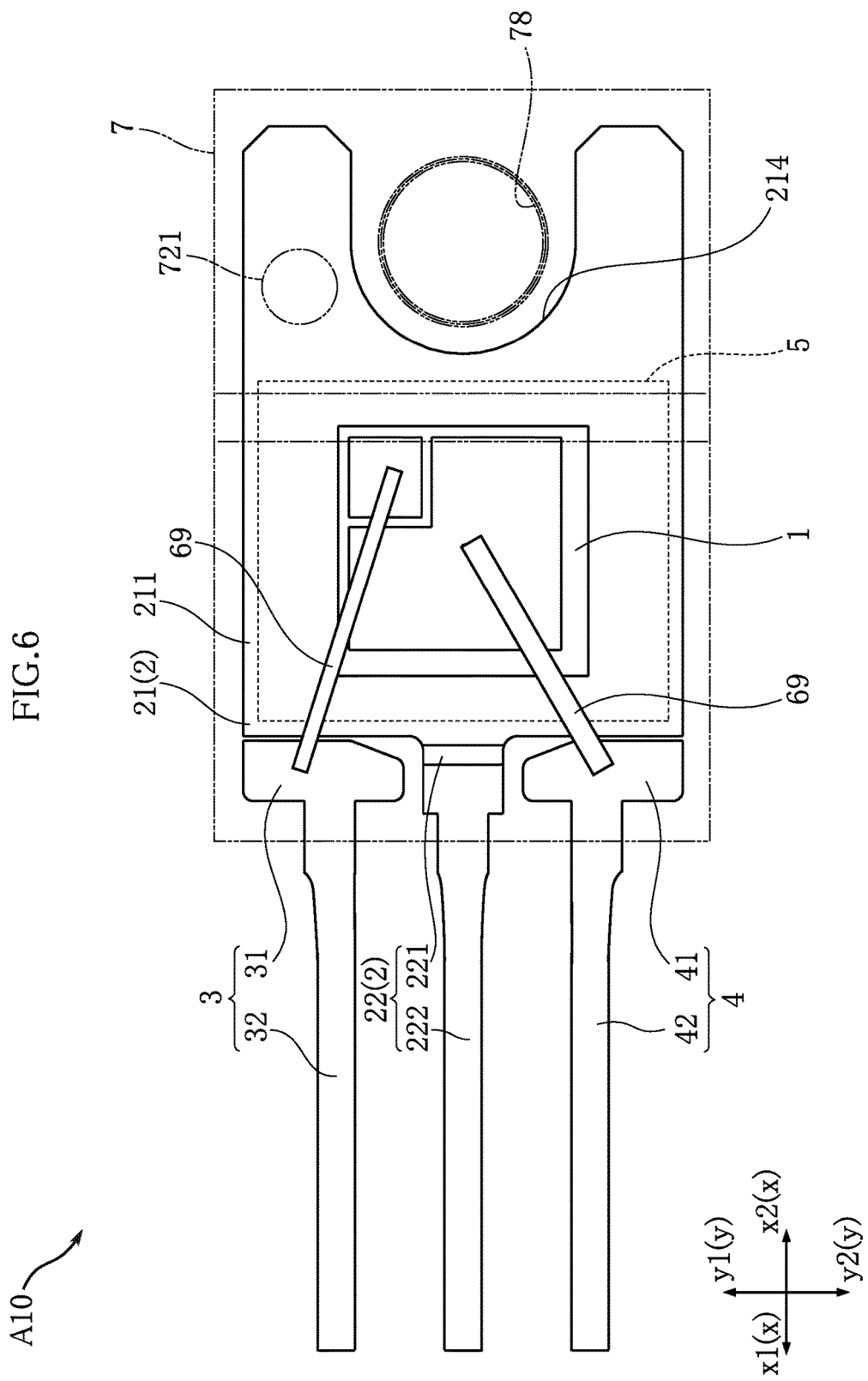
FIG. 6 is a plan view (partially see through) of the electronic device according to the first embodiment of the present invention.
Figure 7:
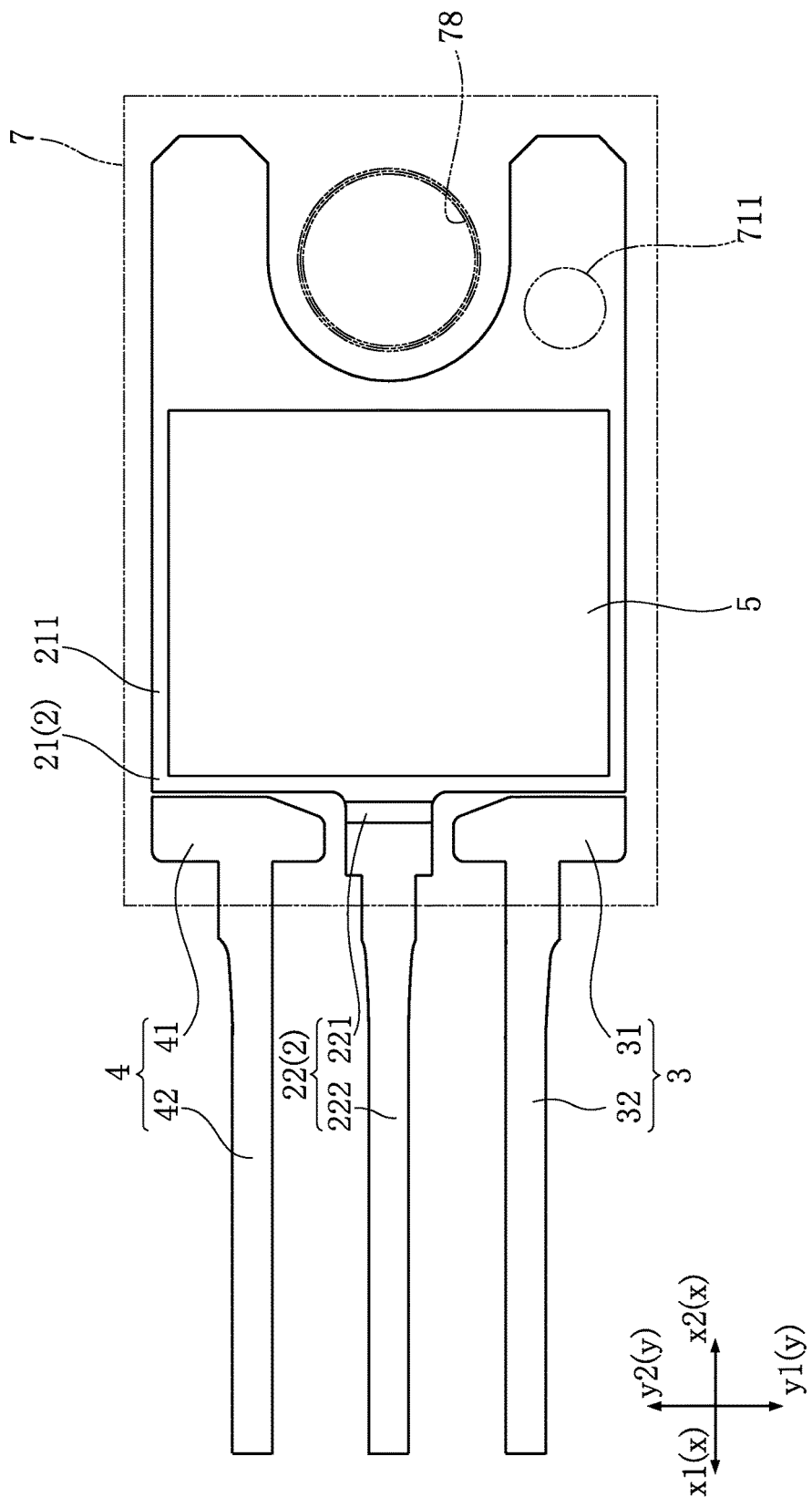
FIG. 7 is a bottom view (partially see through) of the electronic device according to the first embodiment of the present invention.
Figure 8:
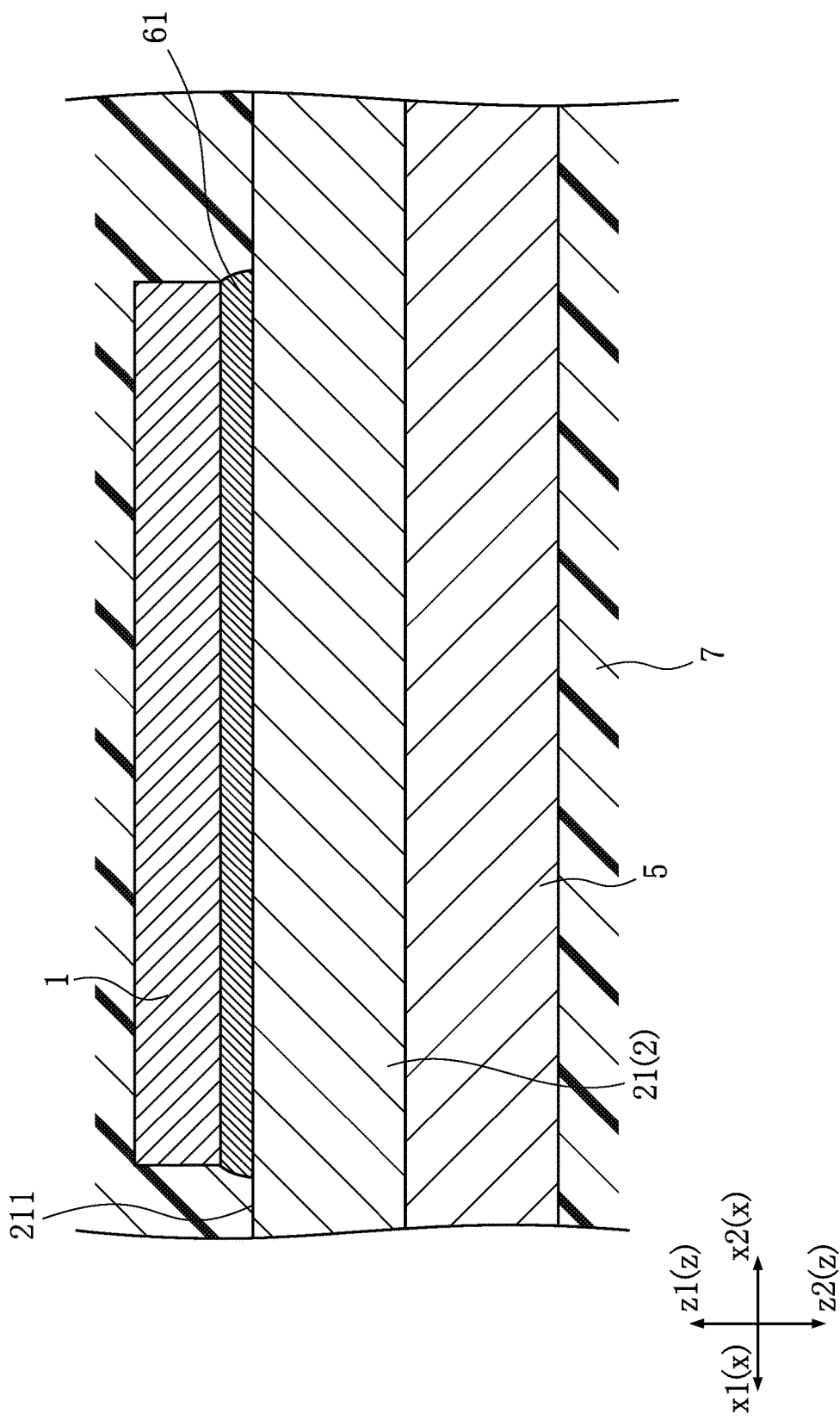
FIG. 8 is a partial enlarged cross-sectional view of the electronic device shown in FIG. 5.

FIG. 2 is a front view of the electronic device according to the present embodiment. FIG. 3 is a plan view of the electronic device according to the present embodiment. FIG. 4 is a bottom view of the electronic device according to the present embodiment. FIG. 5 is a cross-sectional view of the electronic device according to the present embodiment. FIG. 6 is a plan view (partially see through) of the electronic device according to the present embodiment. FIG. 7 is a bottom view (partially see through) of the electronic device according to the present embodiment. FIG. 8 is a partial enlarged cross-sectional view of the electronic device shown in FIG. 5.

The electronic device A10 shown in these diagrams is provided with an electronic element 1, electrodes 2 to 4, a heat dissipation member 5, an adhesive layer 61 (see FIG. 8; omitted in other diagrams), a plating layer 62 (see FIGS. 1 and 5; omitted in other diagrams), two pieces of wire 69, and a resin package 7. In FIGS. 6 and 7, the resin package 7 is shown with a two-dot chain line. As shown in FIG. 1, the electronic device A10 is mounted on the mounting board 81. The electronic device A10 is used as an electronic component that performs functions such as switching, rectification and amplification in an electrical circuit, depending on the type of electronic element 1.

The electronic element 1 shown in FIGS. 1, 5 and 6 has a rectangular shape in plan view. The electronic element 1 is a device composed of a semiconductor such as a diode or a transistor, for example. In the present embodiment, the electronic element 1 is a transistor. Alternatively, a MOS- FET (Metal Oxide Semiconductor Field Effect Transistor) and an IGBT (Insulated Gate Bipolar Transistor), for example, are given as the electronic element 1. The maximum current value that flows through the wire 69 when using the electronic device A10 is 150 to 200 A, for example.

As clearly shown in FIGS. 5 to 7, the electrode 2 includes a die bonding pad 21 and a lead 22. The die bonding pad 21 and the lead 22 are made of a conductive material such as copper, for example. The die bonding pad 21 and the lead 22 are integrally shaped. In the present embodiment, the die bonding pad 21 and the lead 22 are formed by integral shaping, such as bending a conductor member having a uniform thickness, for example.

The die bonding pad 21 is for mounting the electronic element 1. The die bonding pad 21 has a tabular shape that spreads in an xy plane. The die bonding pad 21 has a placement surface 211 and a back surface 212. The placement surface 211 faces in a direction z1. The back surface 212 faces in a direction z2. The electronic element 1 is placed on the placement surface 211. Heat produced in the electronic element 1 is transferred to the die bonding pad 21. A hole 214 passing through from the placement surface 211 to the back surface 212 is formed in the die bonding pad 21. As shown in FIG. 6, the hole 214 has a recessed shape that is recessed in an x1 direction from the end of the die bonding pad 21 on a direction x2 side in xy plan view.

The lead 22 has a shape extending linearly from the die bonding pad 21. The lead 22 is for insertion mounting. As shown in FIG. 1, the lead 22 is inserted in the hole 811. The electronic device A10 is thereby mounted on the mounting board 81. In order to fix the lead 22 to the mounting board 81, the hole 811 is filled with solder 84. As shown in FIGS. 5 to 7, the lead 22 has a coupling part 221 and a terminal part 222. The coupling part 221 is connected to the die bonding pad 21. The coupling part 221 extends from the die bonding pad 21 in a direction intersecting the placement surface 211. The terminal part 222 is connected to the coupling part 221. The terminal part 222 extends from the coupling part 221 in the direction x1. The terminal part 222 has a region projecting from the resin package 7 which will be discussed later. As described above, the lead 22 is formed, together with the die bonding pad 21, by integrally shaping a conductor member having a uniform thickness. Thus, as shown in FIG. 5, a thickness L2 (size in the direction z) of the portion of the terminal part 222 that projects from the resin package 7 is the same as a thickness L1 (size in the direction z) of the die bonding pad 21.

As shown in FIG. 6, the electrode 3 includes a wire bonding pad 31 and a lead 32. The electrode 3 is located, in xy plan view, on the direction x1 side of the die bonding pad 21 and the direction y1 side of the lead 22. The wire bonding pad 31 and the lead 32 are integrally shaped. The wire bonding pad 31 and the lead 32 are made of a conductive material such as copper, for example. The wire bonding pad 31 has a substantially rectangular tabular shape that is smaller than the die bonding pad 21. The lead 32 is connected to the wire bonding pad 31. The lead 32 has a shape extending linearly from the wire bonding pad 31 in the direction x1. The lead 32 is disposed in parallel with the lead 22. The lead 32 has a region projecting from the resin package 7 which will be discussed later. The lead 32 is for insertion mounting. As shown in FIG. 1, the lead 32 is inserted in the hole 811. The electronic device A10 is thereby mounted on the mounting board 81. In order to fix the lead 32 to the mounting board 81, the hole 811 is filled with the solder 84.

As shown in FIG. 6, the electrode 4 includes a wire bonding pad 41 and a lead 42. The electrode 4 is located, in xy plan view, on the direction x1 side of the die bonding pad 21 and the direction y2 side of the lead 22. The wire bonding pad 41 and the lead 42 are integrally shaped. The wire bonding pad 41 and the lead 42 are made of a conductive material such as copper, for example. The wire bonding pad 41 has a substantially rectangular tabular shape that is smaller than the die bonding pad 21. The lead 42 is connected to the wire bonding pad 41. The lead 42 has a shape extending linearly from the wire bonding pad 41 in the direction x1. The lead 42 is disposed in parallel with the lead 22. The lead 22 is located between the lead 42 and the lead 32. The lead 42 has a region projecting from the resin package 7 which will be discussed later. The lead 42 is for insertion mounting. The lead 42 is inserted in the hole 811 as shown in FIG. 1. The electronic device A10 is thereby mounted on the mounting board 81. In order to fix the lead 42 to the mounting board 81, the hole 811 is filled with the solder 84.

As shown in FIG. 8, the adhesive layer 61 is interposed between the electronic element 1 and the die bonding pad 21. The adhesive layer 61 is for adhering the electronic element 1 to the die bonding pad 21. In the present embodiment, electrical continuity is established between the electronic element 1 and the die bonding pad 21 via the adhesive layer 61. The adhesive layer 61 is silver paste or solder paste, for example.

As shown in FIGS. 5 to 7, the heat dissipation member 5 is placed on the opposite side to the side on which the electronic element 1 is placed, with the die bonding pad 21 sandwiched therebetween. That is, the die bonding pad 21 is located between the heat dissipation member 5 and the electronic element 1. The heat dissipation member 5 is located further on the direction x1 side than the hole 214. In the present embodiment, the heat dissipation member 5 has a substantially rectangular plate-like shape. Since special processing such as making a hole is not necessary in forming the heat dissipation member 5, in the case where the heat dissipation member 5 has a substantially rectangular plate-like shape, manufacturing of the heat dissipation member 5 is facilitated. The heat dissipation member 5 may be joined to the die bonding pad 21 via an adhesive, and, in the present embodiment, is joined to the die bonding pad 21 by ultrasonic joining. Thus, the heat dissipation member 5 and the die bonding pad 21 are in direct contact, without interposing an adhesive or the like between the heat dissipation member 5 and the die bonding pad 21.

The heat dissipation member 5 is provided in order to quickly release the heat produced in the electronic element 1 to outside of the electronic device A10. In order to quickly release the heat produced in the electronic element 1 to outside of the electronic device A10, the higher thermal conductivity of the material constituting the heat dissipation member 5 the better. Preferably, the heat dissipation member 5 is made of a material having a higher thermal conductivity than the thermal conductivity of the material constituting the resin package 7. More preferably, the heat dissipation member 5 is made of a material having a higher thermal conductivity than the thermal conductivity of the material constituting the die bonding pad 21. The heat dissipation member 5 is made of a conductor such as aluminum, copper or iron, for example. Note that the heat dissipation member 5 may be formed by silver plating aluminum.

The resin package 7 shown in FIGS. 1 to 8 covers the electronic element 1, the electrodes 2 to 4 and the heat dissipation member 5. The resin package 7 is made of a black epoxy resin, for example. As shown in FIGS. 1 to 4, the resin package 7 has a first surface 71 and a second surface 72. The first surface 71 has a flat surface 715 and a tapered surface 716. As shown in FIG. 1, the flat surface 715 directly opposes the heat sink 82. Grease 89 may be interposed between the flat surface 715 and the heat sink 82. Alternatively, although not illustrated, the flat surface 715 may contact the heat sink 82. These configurations are preferable from the viewpoint of improving the heat dissipation of the electronic device A10. The tapered surface 716 is connected to the flat surface 715. The tapered surface 716 has a shape that extends outwardly in an xy plane moving in the direction z1. As shown in FIG. 4, a pin mark 711 that is recessed from the flat surface 715 is formed in the resin package 7.

As shown in FIGS. 2 and 3, the second surface 72 has a plurality of flat surfaces 725 and a plurality of tapered surfaces 726. Each tapered surface 726 is connected to a different one of the plurality of flat surfaces 725. Each tapered surface 726 has a shape that extends outwardly in an xy plane moving in the direction z2. Each tapered surface 726 is connected to the tapered surface 716 at a boundary 73. As shown in FIG. 3, a pin mark 721 that is recessed from the flat surface 725 is formed in the resin package 7. Also, a screw hole 78 is formed in the resin package 7. As shown in FIG. 1, a screw 83 for fixing the electronic device A10 to the heat sink 82 is inserted in the screw hole 78.

Each piece of wire 69 shown in FIGS. 5 and 6 is made of a metal such as aluminum, for example. One of the two pieces of wires 69 is joined to the electronic element 1 and the wire bonding pad 31. Electrical continuity is thereby established between the electronic element 1 and the wire bonding pad 31. The other of the two pieces of wires 69 is joined to the electronic element 1 and the wire bonding pad 41. Electrical continuity is thereby established between the electronic element 1 and the wire bonding pad 41. In the case where the electronic element 1 is a diode rather than a transistor, the wire 69 does not need to be bonded to both the wire bonding pads 31 and 41. In this case, the wire 69 need only be bonded to one of the wire bonding pads 31 and 41.

The plating layer 62 shown in FIGS. 1 and 5 covers the region of the leads 22, 32 and 42 that projects from the resin package 7. The plating layer 62 is made of an alloy of tin, silver and copper, for example.

Next, a manufacturing method for the electronic device A10 will be described using FIGS. 9 to 30.

Figure 9:
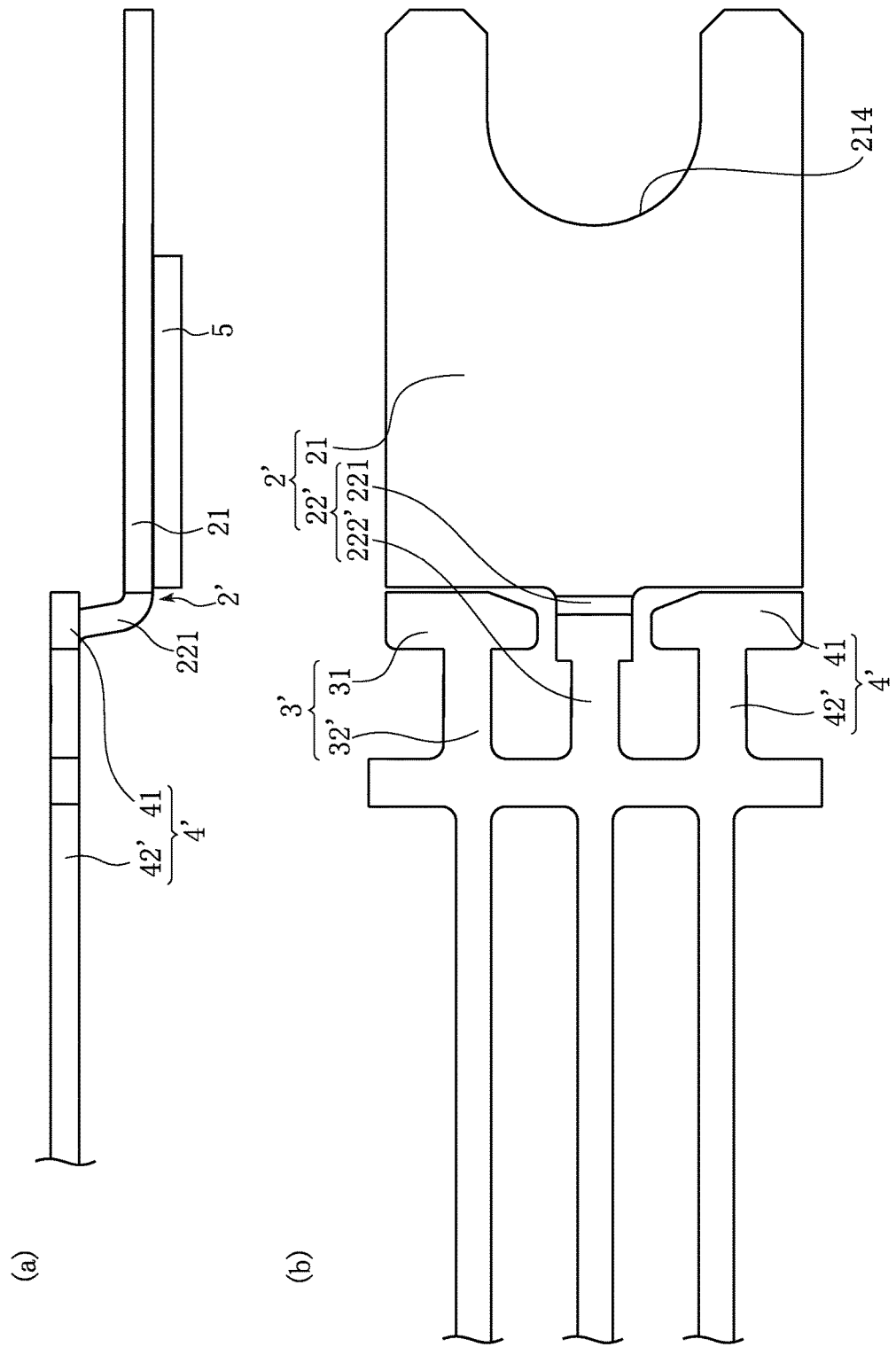
FIG. 9($a$) is a front view in one process of manufacturing processes of the electronic device according to the first embodiment of the present invention, and FIG. 9($b$) is a plan view of the configuration shown in FIG. 9($a$).

First, as shown in FIG. 9, electrodes 2', 3' and 4' are formed. Next, as shown in FIG. 9(a), the heat dissipation member 5 is joined to the die bonding pad 21 of the electrode 2'. In the present embodiment, joining of the die bonding pad 21 and the heat dissipation member 5 is performed by ultrasonic joining. Next, as will be shown later in FIG. 29(a) and FIG. 29(b), the electronic element 1 is placed on the die bonding pad 21 via the adhesive layer 61 (see FIG. 8, omitted in FIG. 29). The position in which the electronic element 1 is placed is on the opposite side to the heat dissipation member 5 with the die bonding pad 21 sandwiched therebetween.

Next, the wire 69 is joined to the electronic element 1 and the wire bonding pad 31. Similarly, the wire 69 is joined to the electronic element 1 and the wire bonding pad 41. Joining of the wire 69 is performed as follows, using the following bonding tool 900A.

Figure 10:
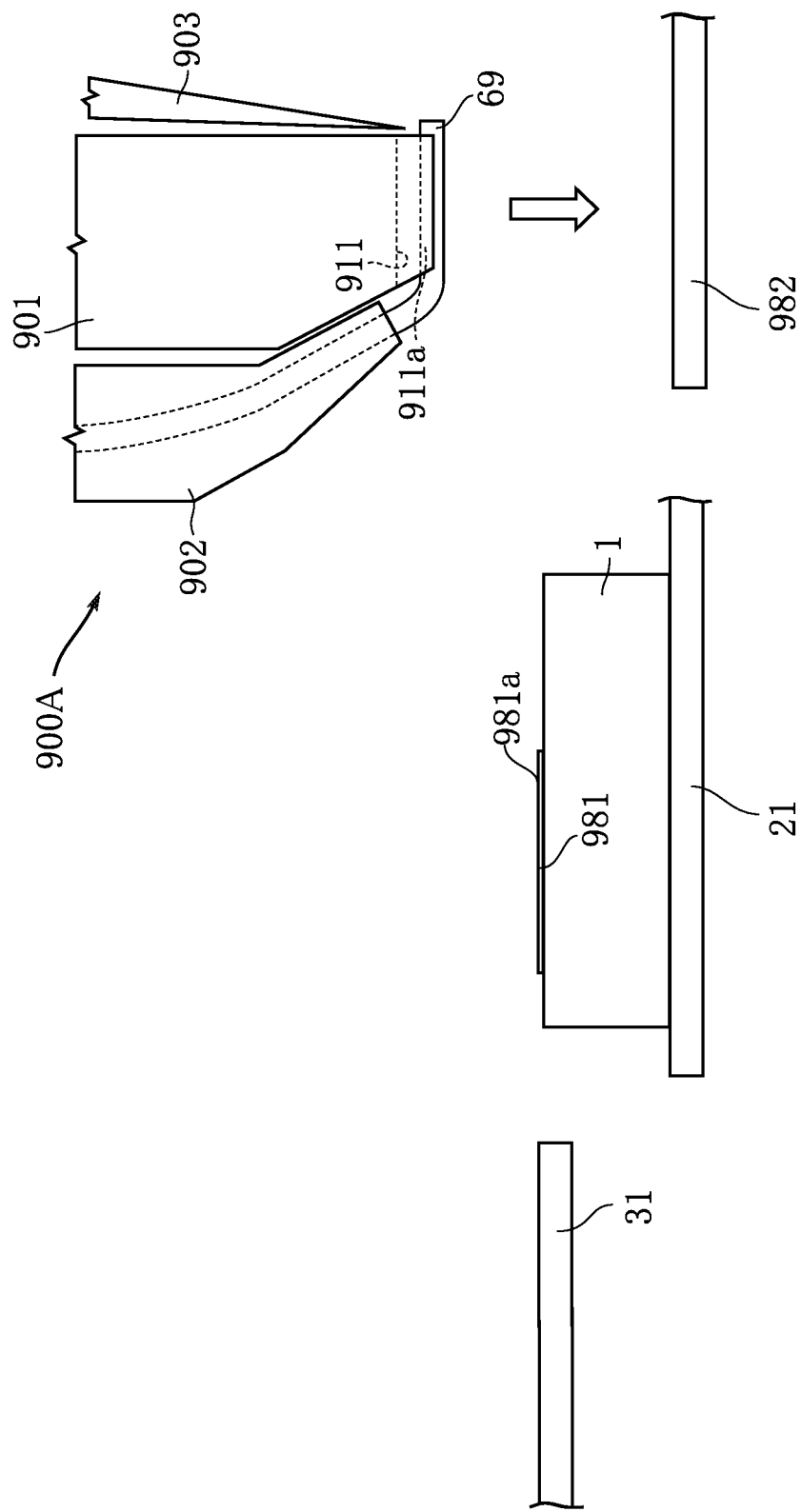
FIG. 10 is a front view showing one process of the wire bonding method according to the first embodiment of the present invention.
Figure 11:
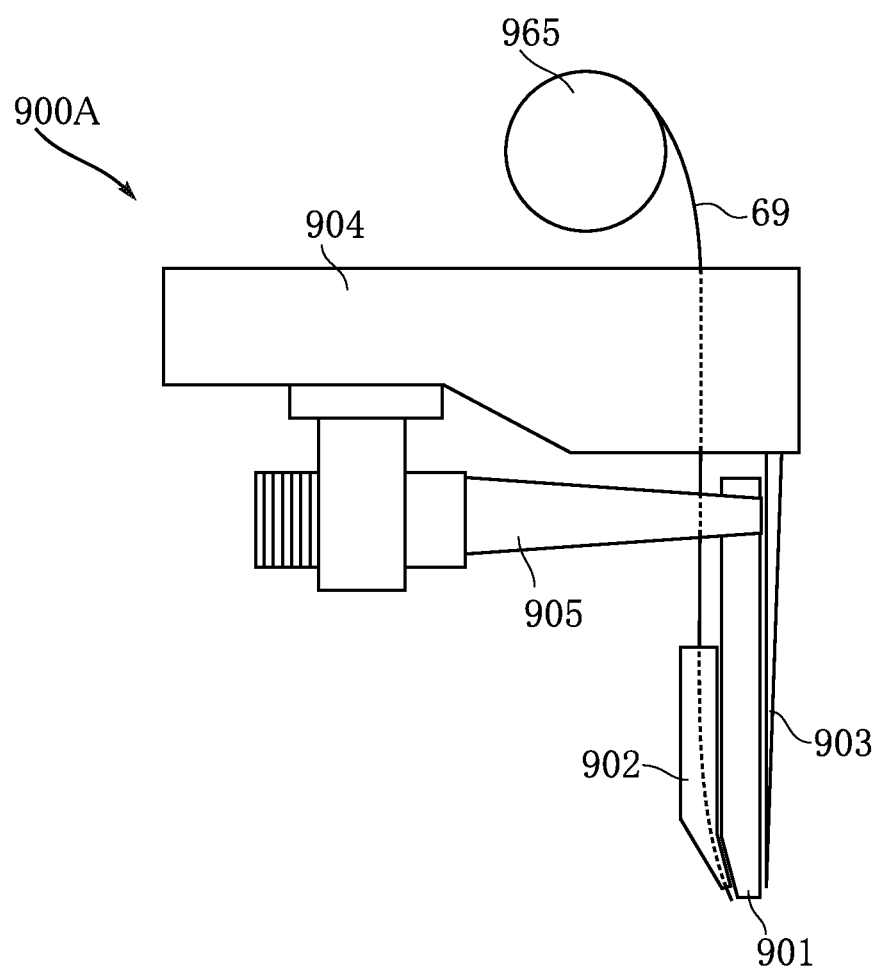
FIG. 11 is an overall schematic view showing a bonding tool that is used in the wire bonding method according to the first embodiment of the present invention.

FIG. 10 is a front view showing one process of the wire bonding method according to the first embodiment of the present invention. FIG. 11 is an overall schematic view showing the bonding tool used in the wire bonding method according to the first embodiment of the present invention.

The bonding tool 900A shown in these diagrams is provided with a wedge 901, a wire guide 902, a cutter 903, a main body 904, and a horn 905. The bonding tool 900A is used in order to bond the wire 69 to a joining target.

The horn 905 holds the wedge 901, and is for applying ultrasonic vibration while pushing the wedge 901 against the joining target. The horn 905 is supported by the main body 904. In the present embodiment, the horn 905 is fixed to the main body 904 via an elastic support member (illustration omitted). The horn 905 is thereby elastically supported by the main body 904.

The wire guide 902 is fixed to the wedge 901, and is for guiding the wire 69 to the wedge 901 from a wire reel 965, for example.

Figure 12:
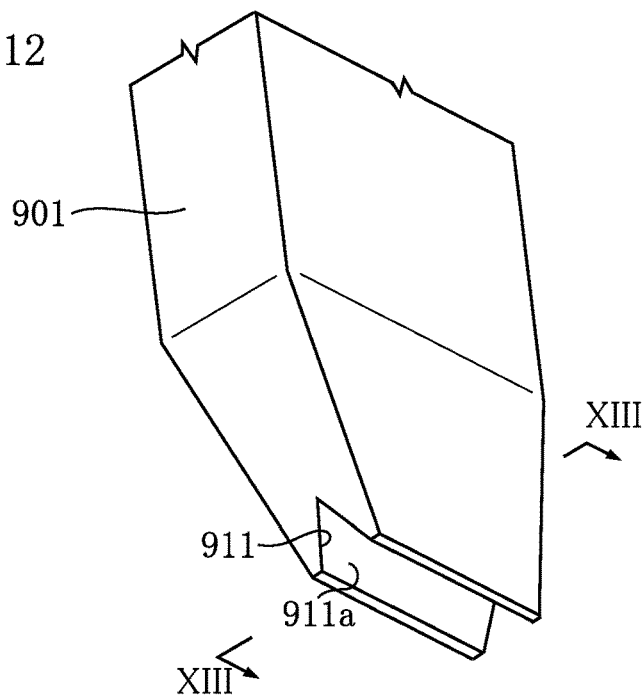
FIG. 12 is a perspective diagram showing part of a wedge in the bonding tool shown in FIG. 10.
Figure 13:
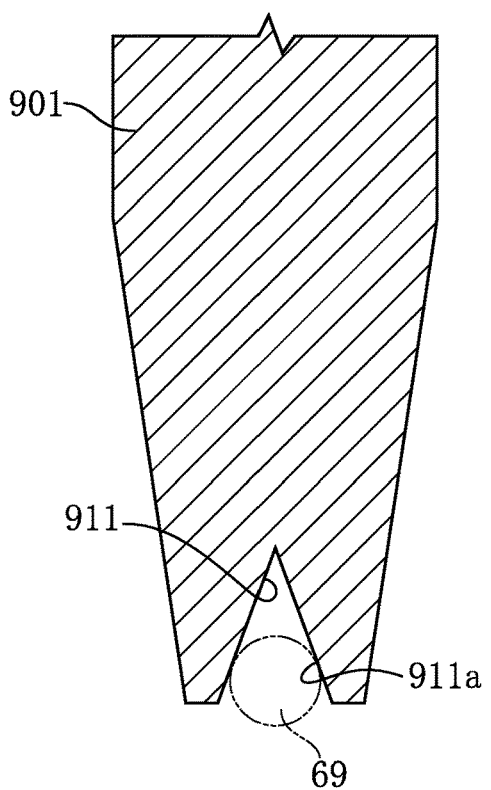
FIG. 13 is a cross-sectional view along a line XIII-XIII in FIG. 12.

FIG. 12 is a perspective diagram showing part of the wedge in the bonding tool shown in FIG. 10. FIG. 13 is a cross-sectional view along a line XIII-XIII in FIG. 12.

The wedge 901 is the portion that presses the wire 69 and joins the wire 69 to the joining target by ultrasonic vibration. The wedge 901 is made of tungsten carbide, for example. As shown in FIGS. 12 and 13, a guide groove 911 is formed in the wedge 901. The guide groove 911 is provided in a lower end of the wedge 901. In the present embodiment, the guide groove 911 has a V-shape in cross-section.

The cutter 903 is for cutting the wire 69, and is disposed adjacent to the wedge 901. In the present embodiment, the cutter 903 is rigidly attached to the main body 904.

The wire 69 that is used in the present embodiment has a circular shape in cross-section. The wire 69 has a circular shape with a diameter of 150 to 1000 µm. More preferably, the wire 69 has a circular shape with a diameter of 200 to 1000 µm. More preferably, the wire 69 has a circular shape with a diameter of 300 to 1000 µm. The wire 69 is made of Cu. Preferably, the wire 69 is made entirely of Cu.

Next, a wire bonding method using the bonding tool 900A will be described using FIG. 10 and FIGS. 14 to 23. Note that, in the following processes, the wire 69 is deformed or changes from a state of being wound around the wire reel 965 by being cut or the like. However, in the following description, the wire will be shown as the wire 69 in all situations.

As shown in FIG. 10, the tip of the wedge 901 of the bonding tool 900A that has been changed in advance into a state in which the wire bonding method can be started is positioned directly above a pressing target 982. The tip of the wedge 901 is then moved toward the pressing target 982. At this time, the tip portion of the wire 69 slots into the guide groove 911. The pressing target 982 is made of a ceramic material or a metal, for example. In the present embodiment, the surface of the pressing target 982 is flat. Also, the pressing target 982 may be part of the electrode 2 or the electrode 3, for example.

Figure 14:
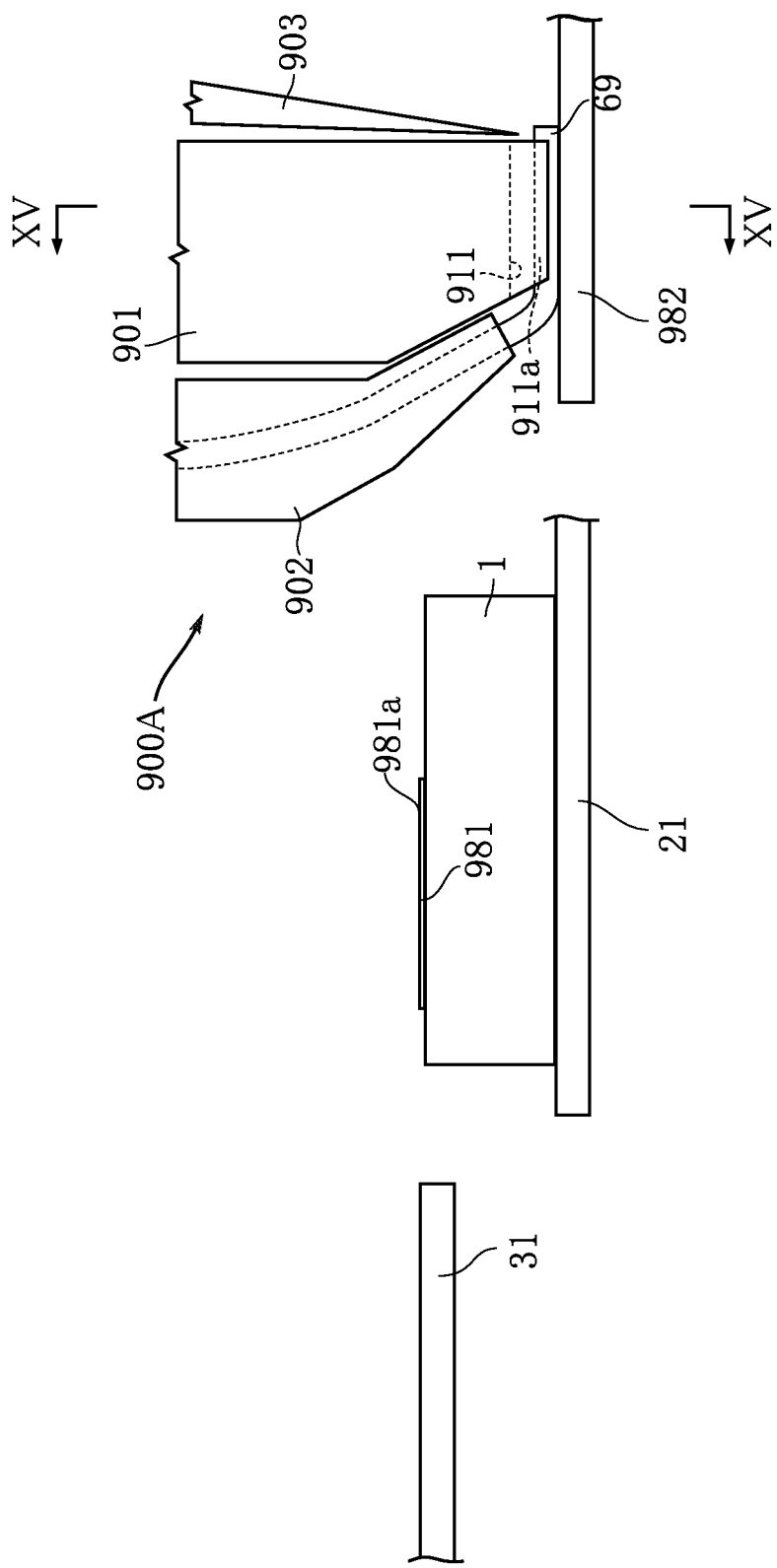
FIG. 14 is a diagram showing a process following FIG. 10.

Subsequently, as shown in FIG. 14, the wire 69 is pressed against the surface of the pressing target 982 by the wedge 901. Specifically, the wire 69 is pressed against the surface of the pressing target 982 by an inner surface 911a of the guide groove 911.

Figure 15:
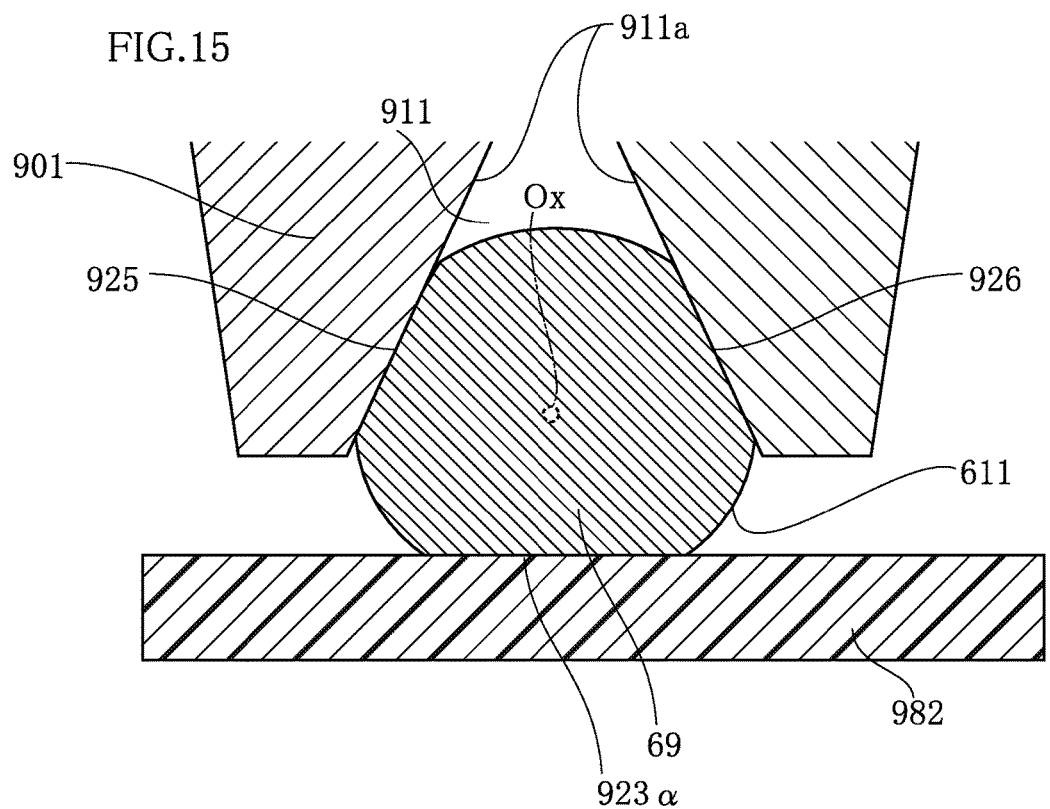
FIG. 15 is a cross-sectional view along a line XV-XV in FIG. 14.
Figure 16:
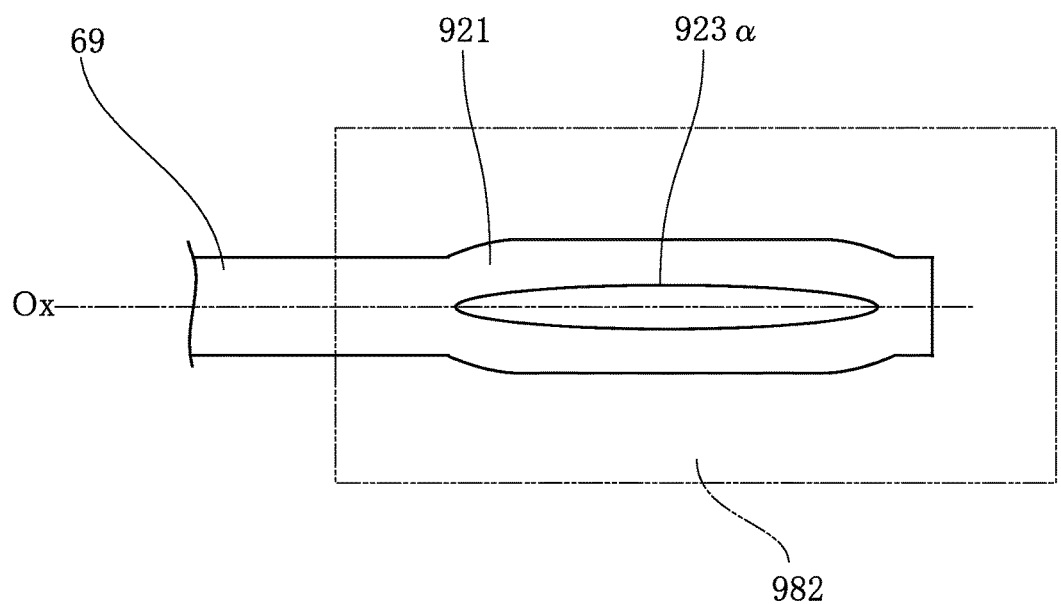
FIG. 16 is a diagram looking from below at the wire when the process shown in FIG. 14 is performed.
Figure 17:
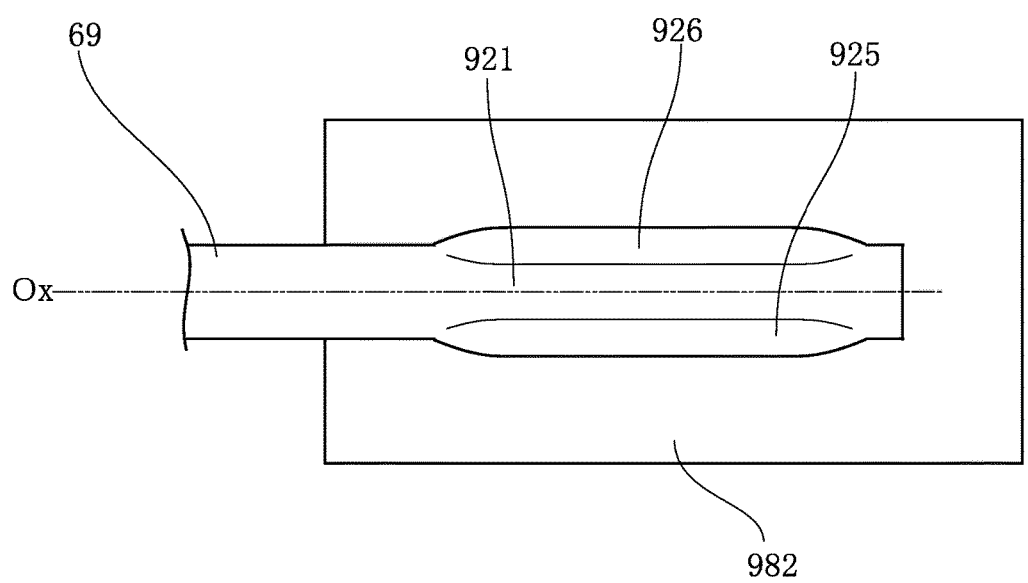
FIG. 17 is a diagram looking from above at the wire when the process shown in FIG. 14 is performed.

FIG. 15 is a cross-sectional view along a line XV-XV in FIG. 14. FIG. 16 is a diagram looking from below at the wire when the process shown in FIG. 14 is performed. FIG. 17 is a diagram looking from above at the wire when the process shown in FIG. 14 is performed. In FIGS. 16 and 17 illustration of the wedge 901 is omitted, and in FIG. 16 the pressing target 982 is shown using a virtual line.

As shown in FIGS. 15 and 16, a withdrawn surface 923a is formed by the pressing of the wire 69 against the pressing target 982. The withdrawn surface 923a is the portion that abutted the pressing target 982 during the pressing. The withdrawn surface 923a is a surface withdrawn to a central axis Ox side of the wire 69 from an outer circumferential surface 921 that is arc-shaped in cross-section. In the present embodiment, the withdrawn surface 923a is flat, since the surface of the pressing target 982 is flat. Also, as shown in FIGS. 15 and 17, a first pressed surface 925 and a second pressed surface 926 are formed, at the time of the pressing of the wire 69 against the pressing target 982. The first pressed surface 925 and the second pressed surface 926 are the portions that are pressed by the inner surface 911a of the guide groove 911. The first pressed surface 925 and the second pressed surface 926 are surfaces withdrawn to the central axis Ox side of the wire 69 from the outer circumferential surface 921 having the arc-shaped cross-section.

Subsequently, although illustration is omitted, the wedge 901 moves from the position at which the guide groove 911 directly opposes the pressing target 982 to a position at which the guide groove 911 directly opposes an electrode pad 981, while maintaining the state in which the wire 69 is disposed in the guide groove 911. The tip of the wedge 901 is then moved toward the electrode pad 981. At this time, the tip portion of the wire 69 remains slotted in the guide groove 911.

Figure 18:
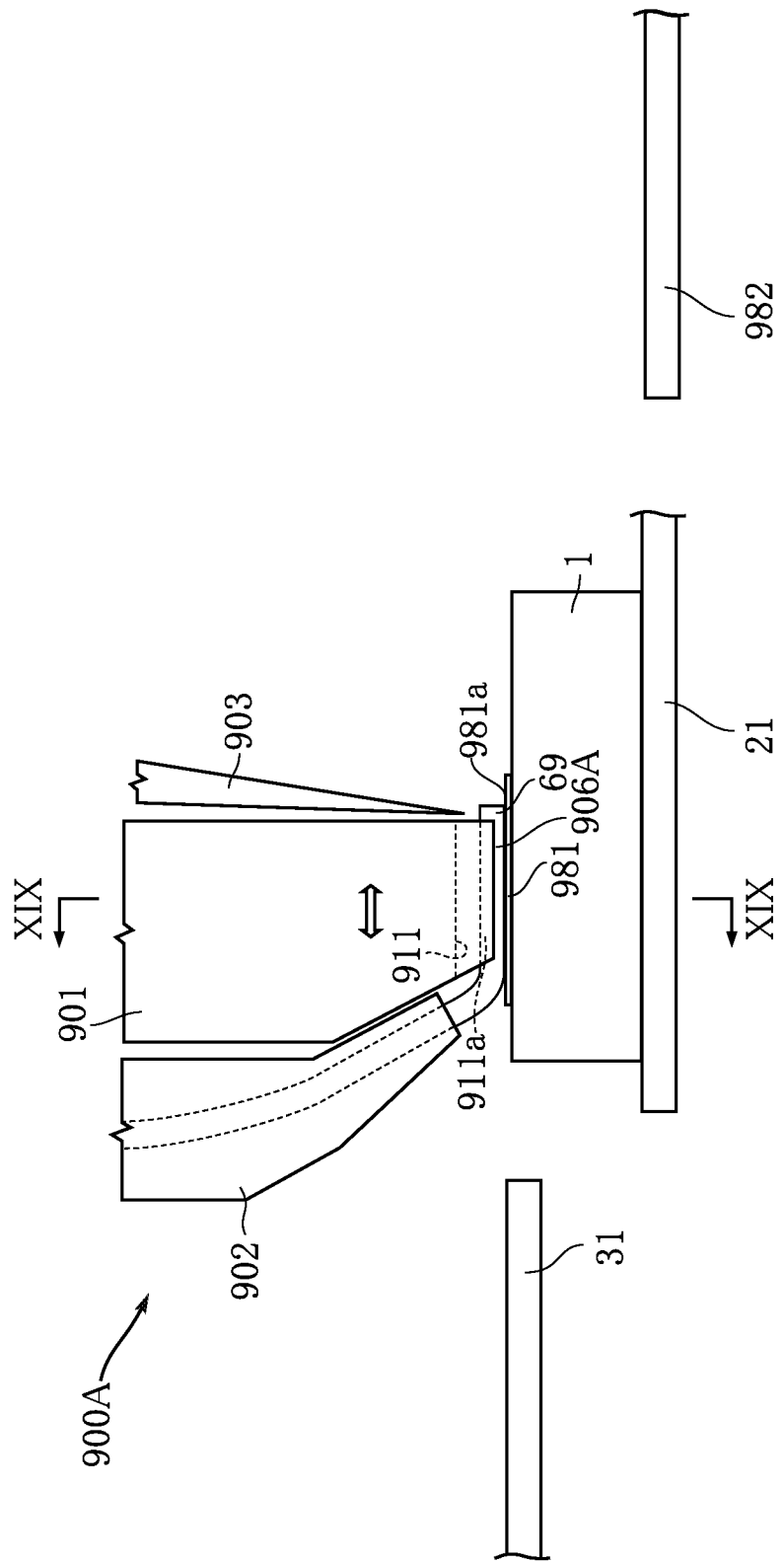
FIG. 18 is a diagram showing a process following FIG. 14.
Figure 19:
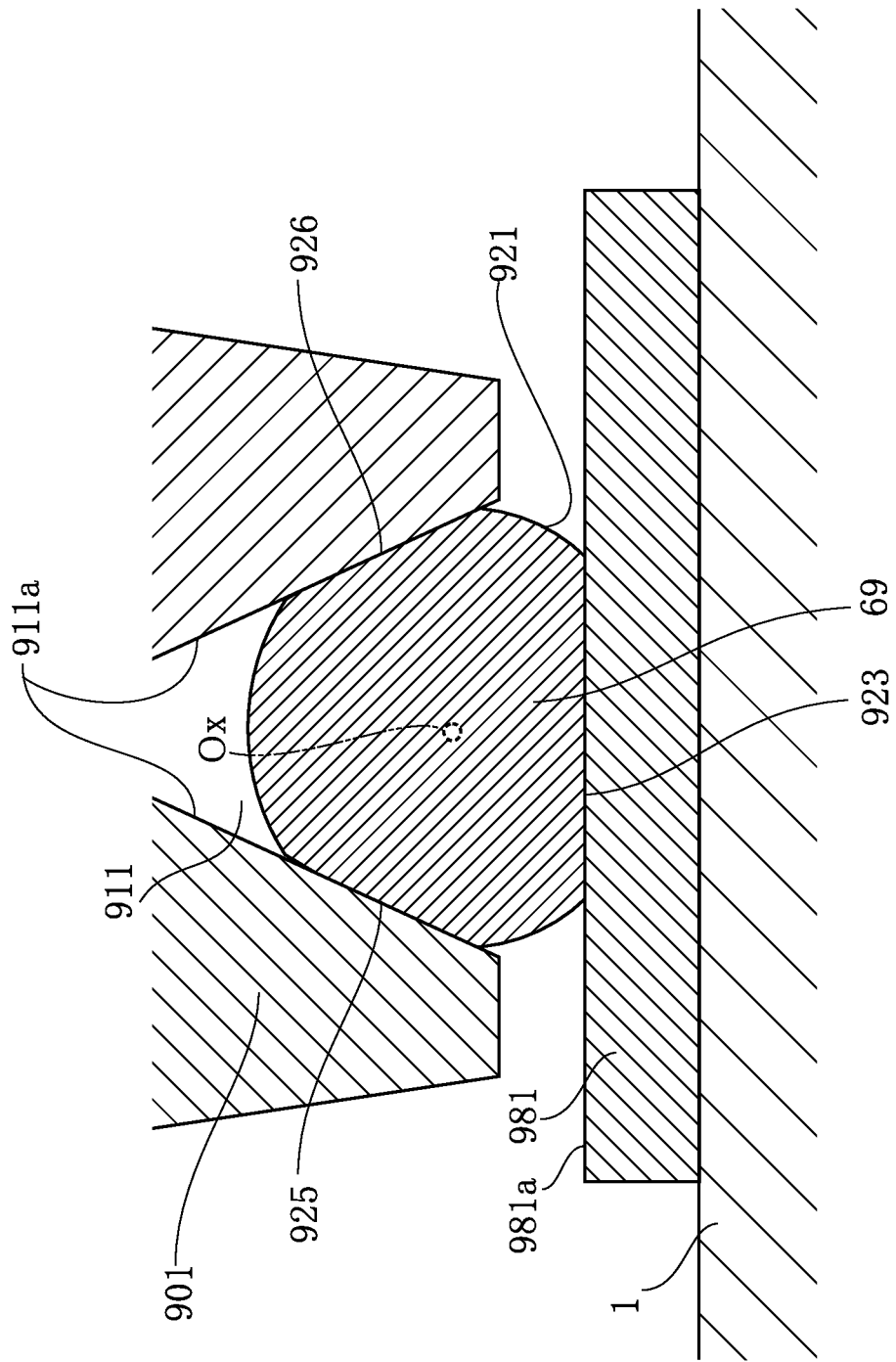
FIG. 19 is a cross-sectional view along a line XIX-XIX in FIG. 18.

Subsequently, as shown in FIGS. 18 and 19, a first bonding process is performed. In the first bonding process, the wire 69 is joined to the electrode pad 981 formed on the electronic element 1. Here, the electrode pad 981 corresponds to an example of a first joining target as referred to in the present invention. Specifically, ultrasonic vibration is applied to the wire 69, in a state in which the withdrawn surface 923a is pressed against the electrode pad 981. More specifically, the wire 69 is pressed against the electrode pad 981 by the wedge 901, when joining the wire 69 to the electrode pad 981. Even more specifically, the wire 69 is pressed against the electrode pad 981 by the inner surface 911a of the guide groove 911. The wire 69 is thereby further crushed. Also, the wire 69 is ultrasonically welded to the electrode pad 981. This welded portion serves as a first bonding part 906A, and the surface of the wire 69 that joins to the electrode pad 981 serves as a joining surface 923.

Figure 20:
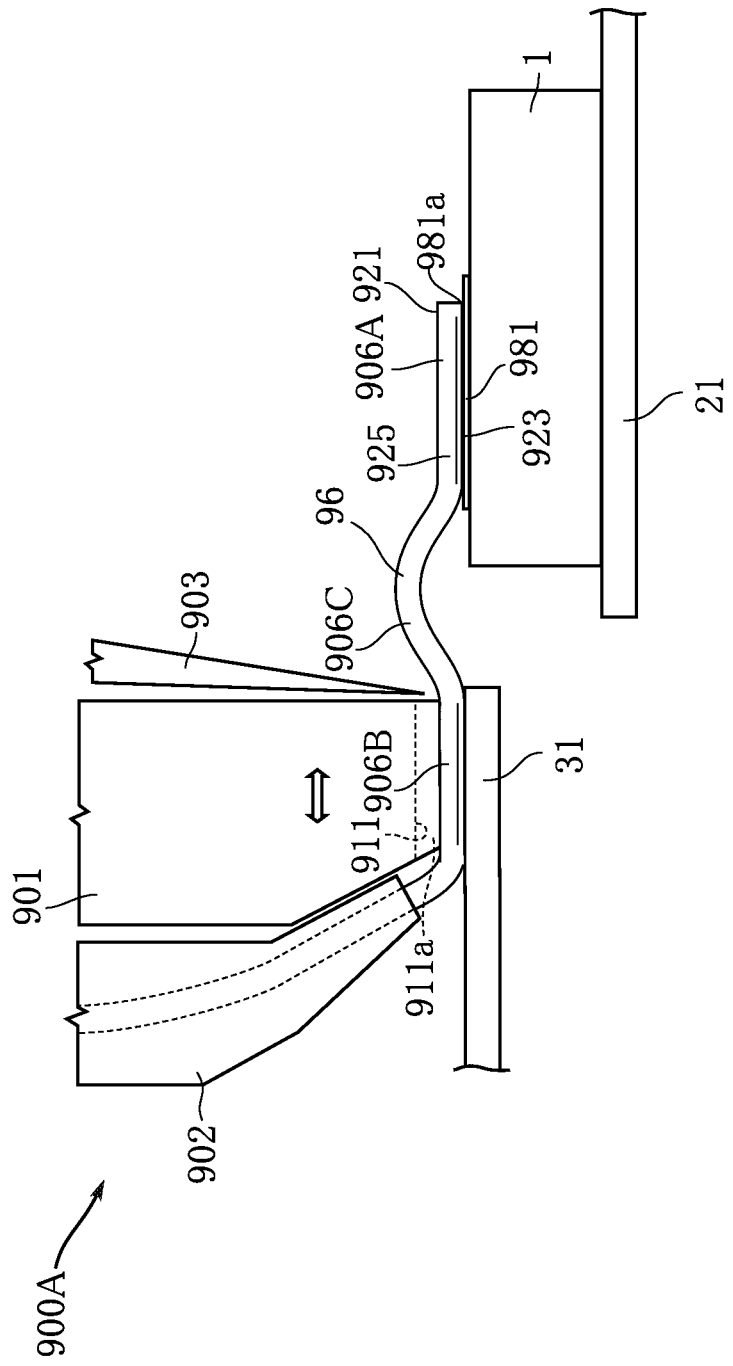
FIG. 20 is a diagram showing a process following FIG. 18.

Subsequently, as shown in FIG. 20, a second bonding process is performed. In the second bonding process, the wire 69 is joined to the wire bonding pad 31. Here, the wire bonding pad 31 corresponds to an example of the second joining target as referred to in the present invention. Specifically, ultrasonic vibration is applied in a state in which the wire 69 is pressed against the wire bonding pad 31. The wire 69 is thereby ultrasonically welded to the wire bonding pad 31. This welded portion serves as a second bonding part 906B.

Figure 21:
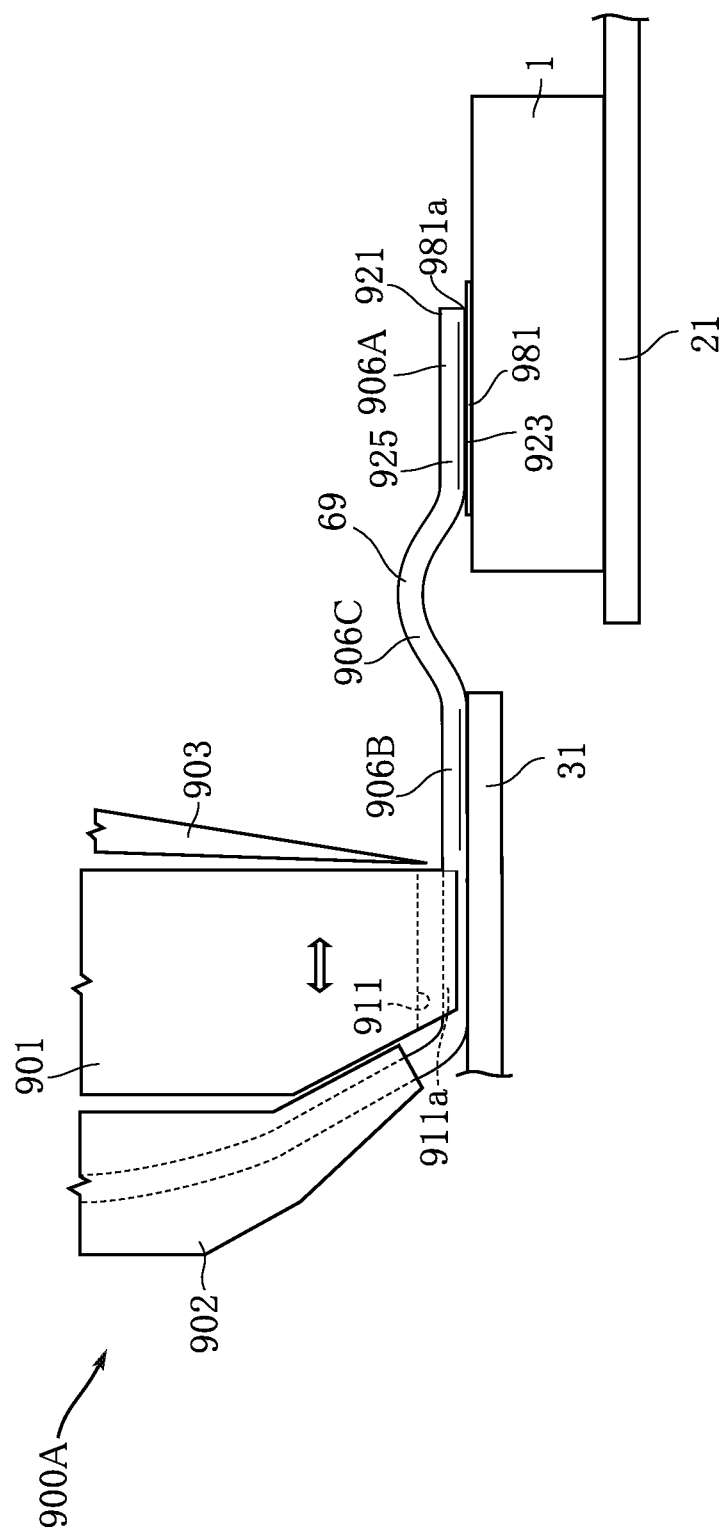
FIG. 21 is a diagram showing a process following FIG. 20.

Subsequently, as shown in FIG. 21, the bonding tool 900A is moved to the left in the diagram. As a result of this movement, the cutter 903 is positioned between the left end of the second bonding part 906B in the diagram and the left end of the wire bonding pad 31 in the diagram.

Figure 22:
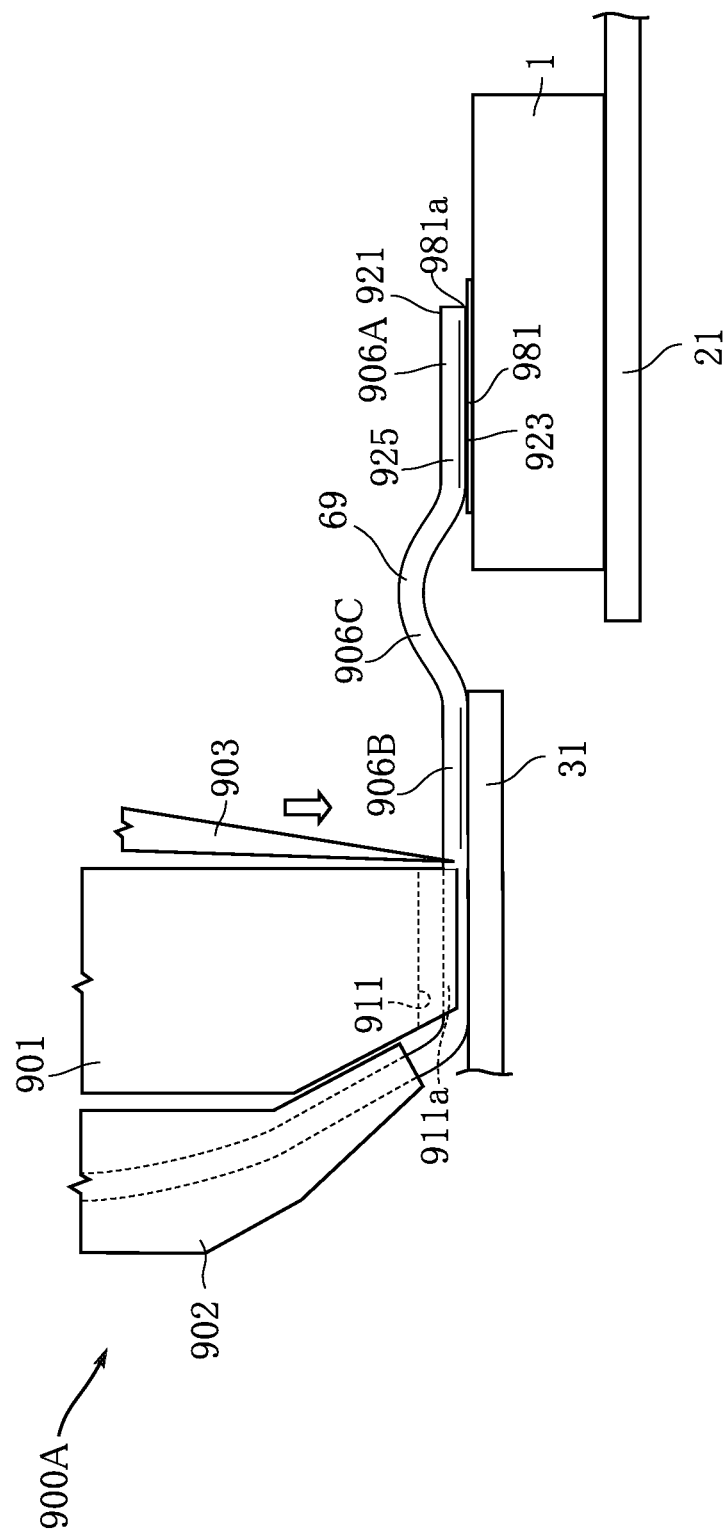
FIG. 22 is a diagram showing a process following FIG. 21.

Subsequently, as shown in FIG. 22, when the main body 904 is pressed down, the cutter 903 rigidly attached to the main body 904 descends together with the main body 904. In the present embodiment, a cut is made in the wire 69 as a result of the descent of this cutter 903. That is, the amount that the main body 904 descends is set such that the cutter 903 does not completely section the wire 69.

Figure 23:
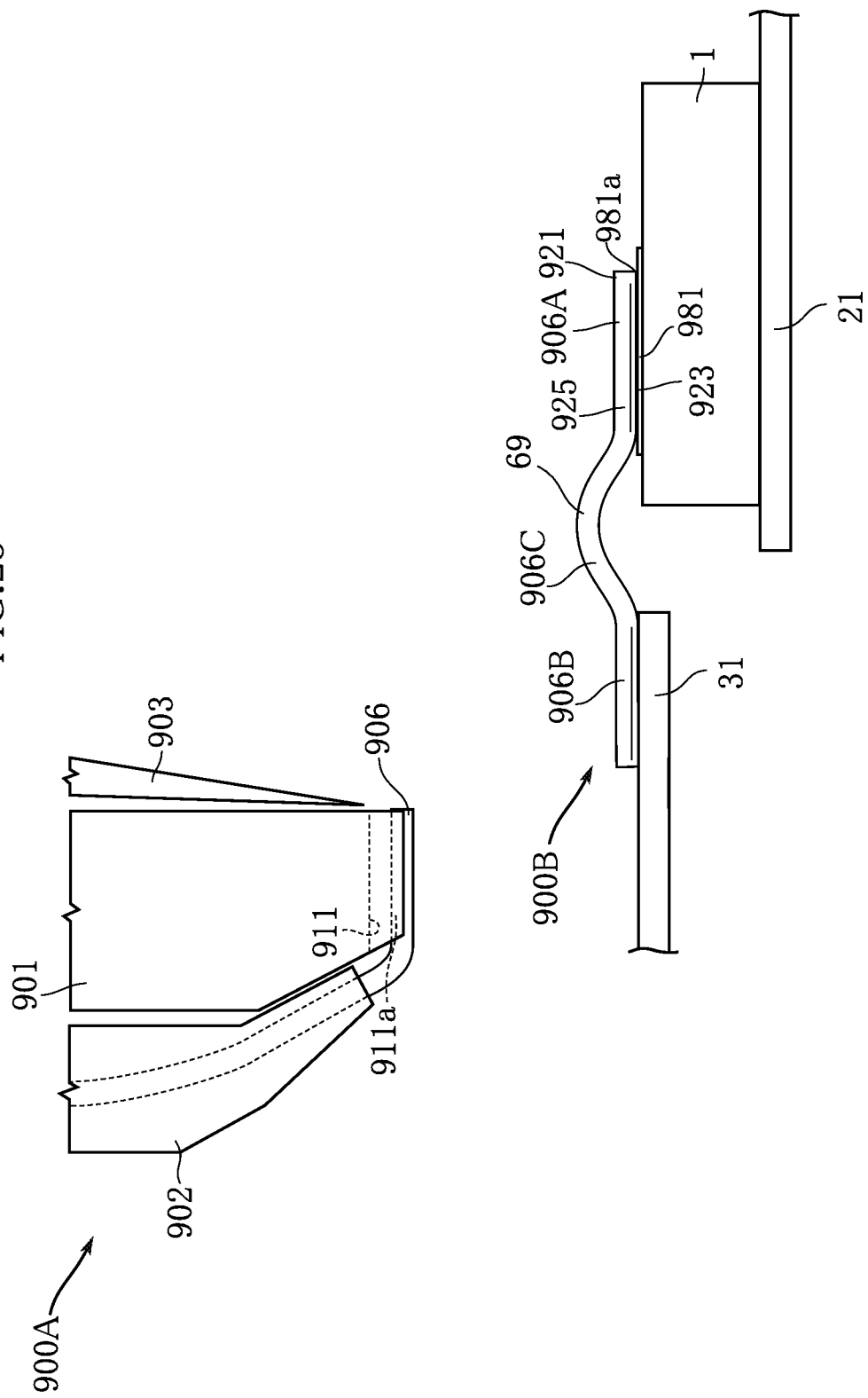
FIG. 23 is a diagram showing a process following FIG. 22.

Thereafter, as shown in FIG. 23, the wire 69 is moved away from the wire bonding pad 31 together with the wedge 901. The wire 69 in which the cut was made is thereby sectioned.

As a result of undergoing the above processes, a wire bonding structure 900B shown in FIG. 23 is manufactured.

The wire bonding structure 900B shown in this diagram is provided with the wire 69, the electrode pad 981 and the wire bonding pad 31.

Figure 24:
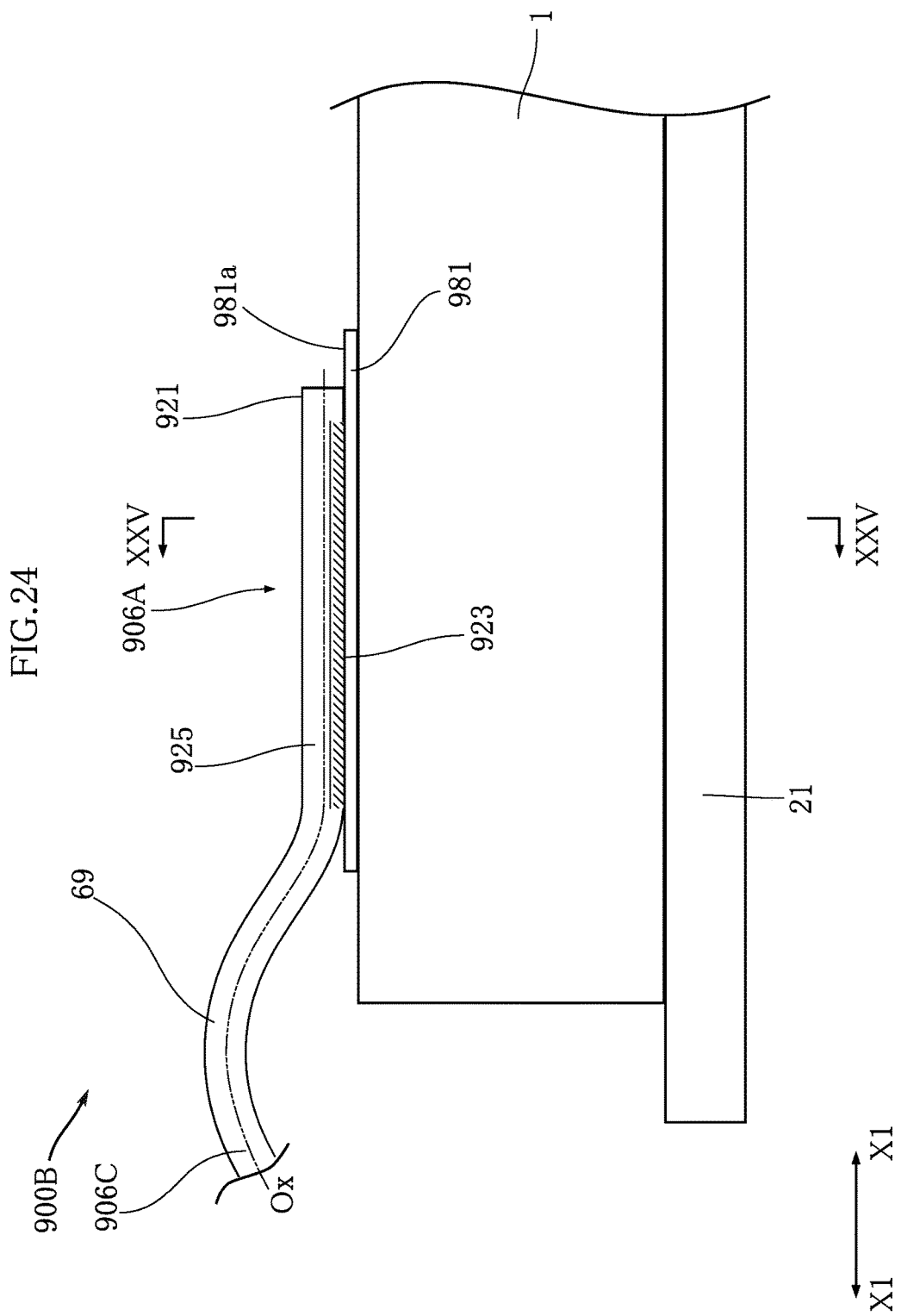
FIG. 24 is a partial enlarged view of the wire bonding structure shown in FIG. 23.
Figure 25:
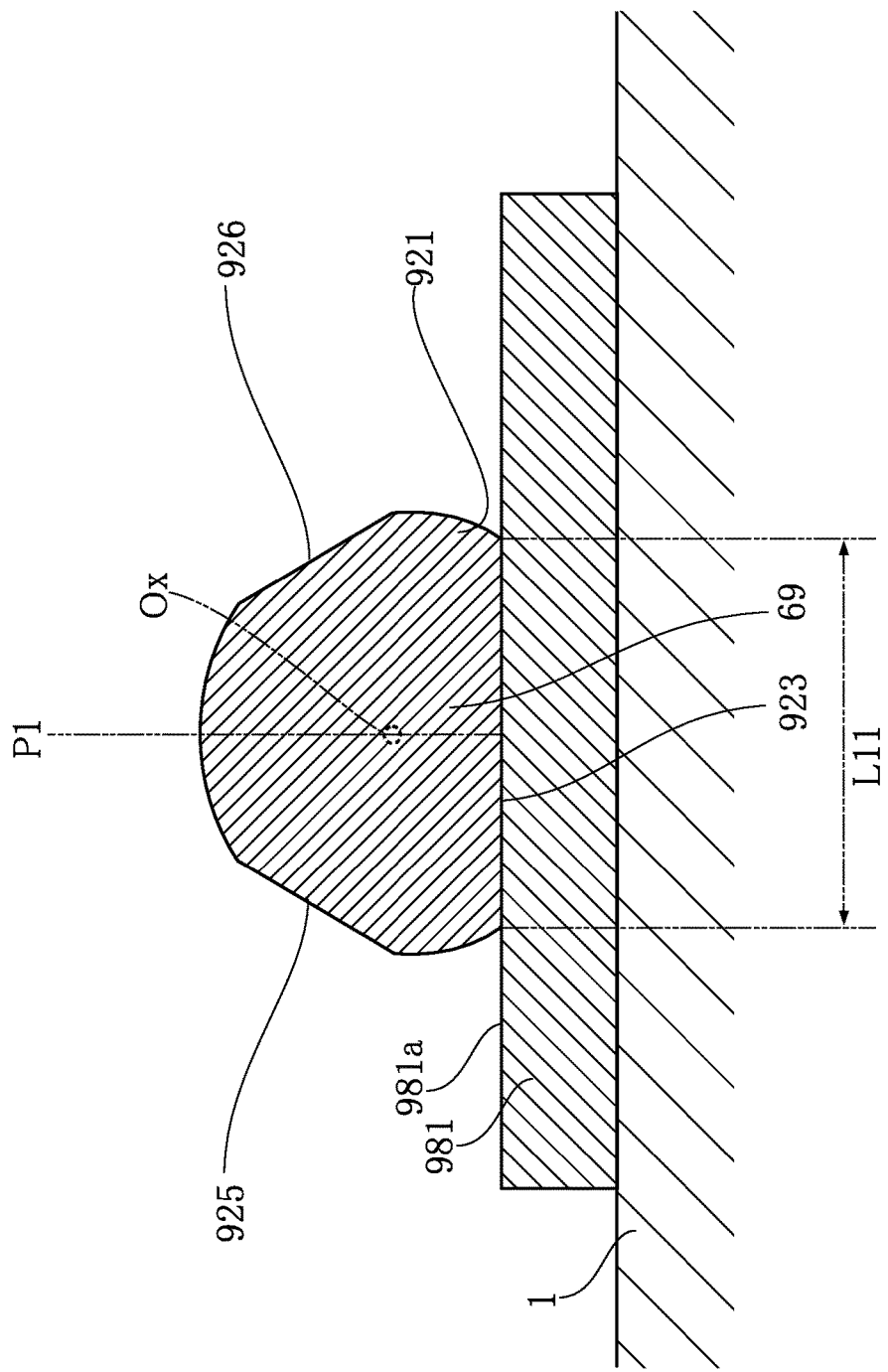
FIG. 25 is a cross-sectional view along a line XXV-XXV in FIG. 24.
Figure 26:
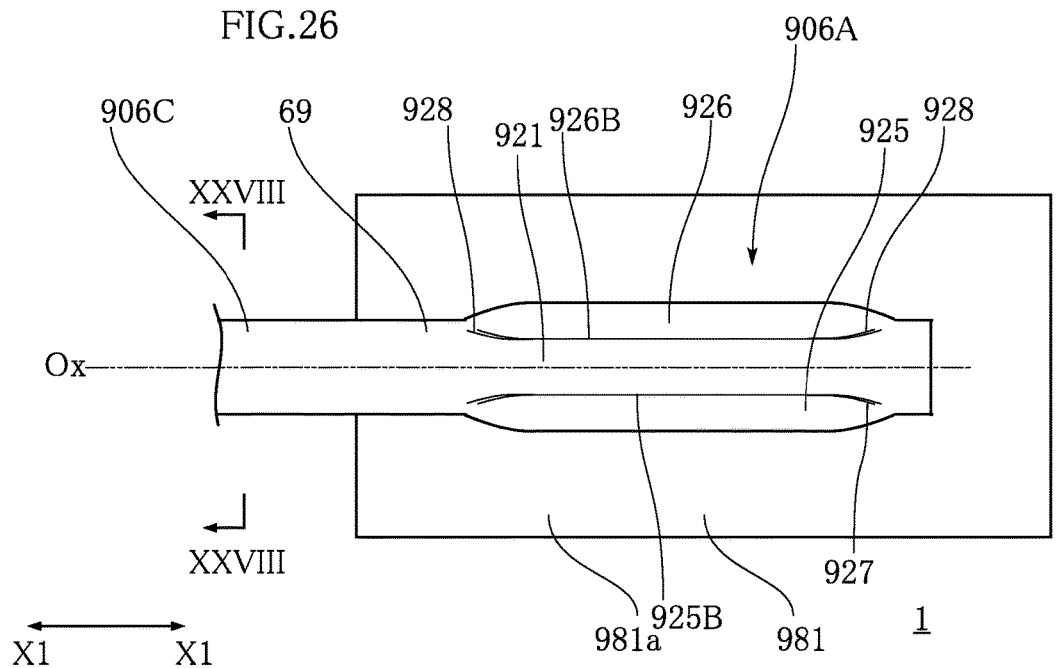
FIG. 26 is a plan view of the wire bonding structure shown in FIG. 24.
Figure 27:
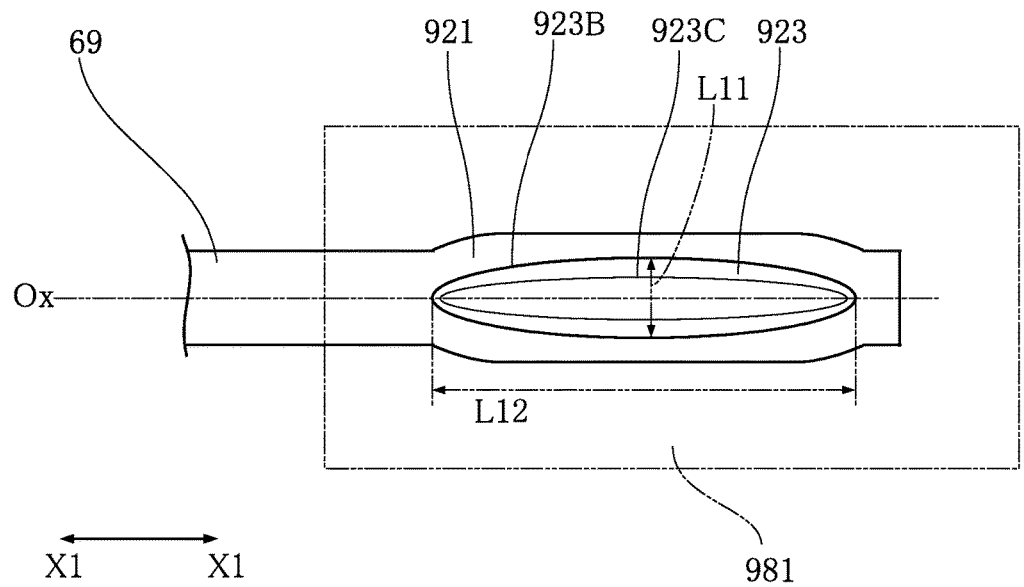
FIG. 27 is a bottom view of the wire in the wire bonding structure shown in FIG. 24 (parts other than the wire are omitted).
Figure 28:
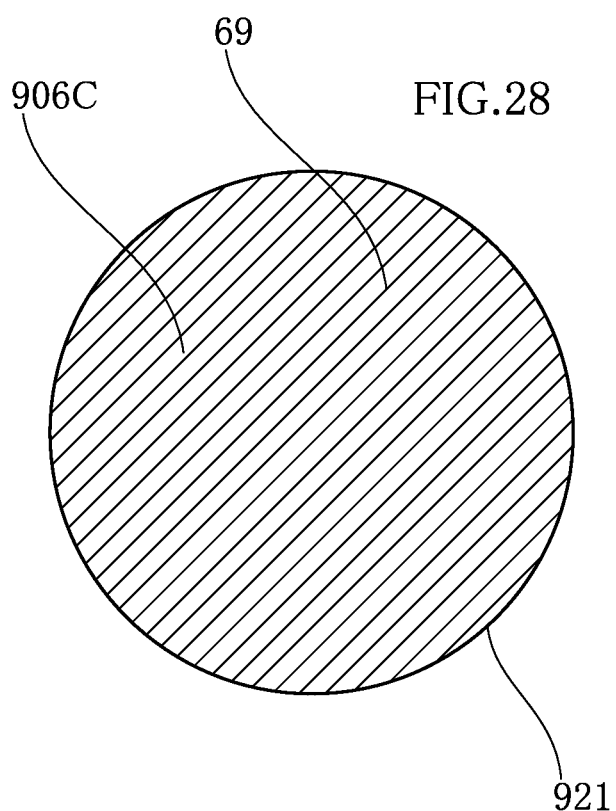
FIG. 28 is a cross-sectional view along a line XXVIII-XXVIII in FIG. 26.
Figure 29:
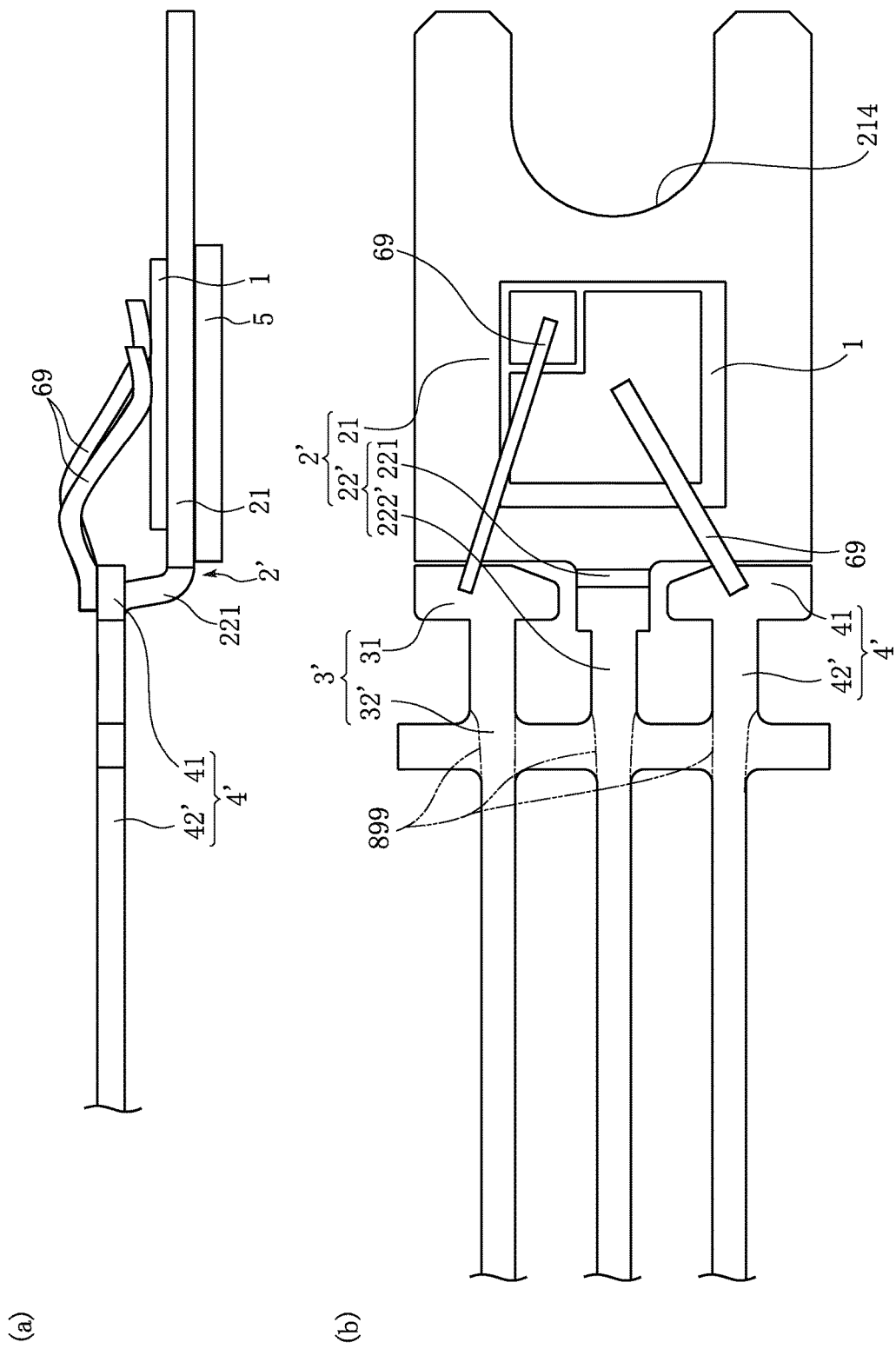
FIG. 29(a) is a front view in one process of manufacturing processes of the electronic device according to the first embodiment of the present invention.
FIG. 29(b) is a plan view of the configuration shown in FIG. 29(a).

FIG. 24 is a partial enlarged view of the wire bonding structure shown in FIG. 23. FIG. 25 is a cross-sectional view along a line XXV-XXV in FIG. 24. FIG. 26 is a plan view of the wire bonding structure shown in FIG. 24. FIG. 27 is a bottom view of the wire in the wire bonding structure shown in FIG. 24 (parts other than the wire are omitted). FIG. 28 is a cross-sectional view along a line XXVIII-XXVIII in FIG. 26.

The electrode pad 981 and the wire bonding pad 31 are made of a conductive material. Al, for example, is given as such a material. The electrode pad 981 and the wire bonding pad 31 may each be a structure in which a plurality of metal layers made of mutually different metals are laminated. The electrode pad 981 and the wire bonding pad 31 are, for example, an electrode pad or a lead frame. In the present embodiment, the electrode pad 981 is an electrode pad and the wire bonding pad 31 is a lead frame. The electrode pad 981, which is an electrode pad, has a thickness of 1 to 10 μm, for example. The electrode pad 981 has a first surface 981a.

As shown in FIG. 23, the wire 69 is joined to both the electrode pad 981 and the wire bonding pad 31. The wire 69 includes the first bonding part 906A, the second bonding part 906B and a bridging part 906C.

The first bonding part 906A is joined to the electrode pad 981. Specifically, the first bonding part 906A is joined to the first surface 981a of the electrode pad 981. The first bonding part 906A includes the outer circumferential surface 921, the joining surface 923, the first pressed surface 925 and the second pressed surface 926.

The joining surface 923 shown in FIGS. 24, 25 and 27 is a surface joined to the electrode pad 981, and is a surface withdrawn to the central axis Ox side of the wire 69 from the outer circumferential surface 921. As shown in FIG. 27, in the present embodiment, the joining surface 923 has an elliptical shape whose major axis coincides with the direction in which the central axis Ox of the wire 69 extends. An elliptical mark 923C having an elliptical shape may be formed in the joining surface 923. The elliptical mark 923C is located on the inner side of an edge 923B of the joining surface 923. The elliptical mark 923C is formed when the edge of the withdrawn surface 923a shown in FIGS. 15 and 16 became harder than other regions due to work hardening of the metal. Unlike the present embodiment, the elliptical mark 923C need not be formed in the joining surface 923.

As shown in FIG. 27, the direction in which the central axis Ox of the wire 69 extends and that is orthogonal to the direction in which the first surface 981a faces is defined as a first direction X1. A size L11 (see FIGS. 25 and 27) of the joining surface 923 in the cross-sectional shape of a cross-section orthogonal to the first direction X1 is 60 to 80% of the diameter of the wire 69, for example. The diameter of the wire 69 refers to the diameter of the circular bridging part 906C which will be discussed later. The size L11 (see FIGS. 25 and 27) of the joining surface 923 in a cross-sectional shape orthogonal to the first direction X1 is 90 to 800 μm, for example. A size L12 (see FIG. 27) of the joining surface 923 in the first direction X1 is 3 to 10 times the diameter of the wire 69, for example. The size L12 (see FIG. 27) of the joining surface 923 in the first direction X1 is 1200 to 4000 μm, for example.

The first pressed surface 925 and the second pressed surface 926 shown in FIGS. 24 to 26 are surfaces withdrawn to the central axis Ox side of the wire 69 from the outer circumferential surface 921. As shown in FIG. 25, the first pressed surface 925 and the second pressed surface 926 are located on opposite sides to each other with a virtual plane P1 that passes through the central axis Ox and is orthogonal to the first surface 981*a* sandwiched therebetween, when viewed in the direction orthogonal to the first surface 981*a*. The first pressed surface 925 and the second pressed surface 926 slope with respect to the virtual plane P1.

The positions of the inner surface 911*a* of the guide groove 911 with respect to the first pressed surface 925 and the second pressed surface 926 may possibly shift slightly from the process of pressing the wire 69 against the pressing target 982 (see FIGS. 14 and 15) to the process of joining the wire 69 to the electrode pad 981 (see FIGS. 18 and 19). In this case, as shown in FIG. 26, a first curved mark 927 and a second curved mark 928 may possibly be formed in the wire 69, due to the inner surface 911*a* of the guide groove 911 pressing the wire 69, when joining the wire 69 to the electrode pad 981. As shown in this diagram, the first curved mark 927 is formed at a position shifted from an edge 925B of the first pressed surface 925. Similarly, the second curved mark 928 is formed at a position shifted from an edge 926B of the second pressed surface 926. Unlike the present embodiment, neither the first curved mark 927 nor the second curved mark 928 need to be formed in the wire 69.

The second bonding part 906B shown in FIG. 23 is the region of the wire 69 that is joined to the wire bonding pad 31. The bridging part 906C shown in FIGS. 23 and 24 connects the first bonding part 906A and the second bonding part 906B. As shown in FIG. 28, the bridging part 906C has a circular shape in cross-section.

As shown in FIG. 23, the electrode pad 981 of the wire bonding structure 900B is stacked on the electronic element 1.

As described above, the wire 69 is joined to the wire bonding pad 31 and the electronic element 1. Although not described in detail, the wire 69 is similarly joined to the wire bonding pad 41 and the electronic element 1. This enables the configuration shown in FIG. 29 to be obtained.

Figure 30:
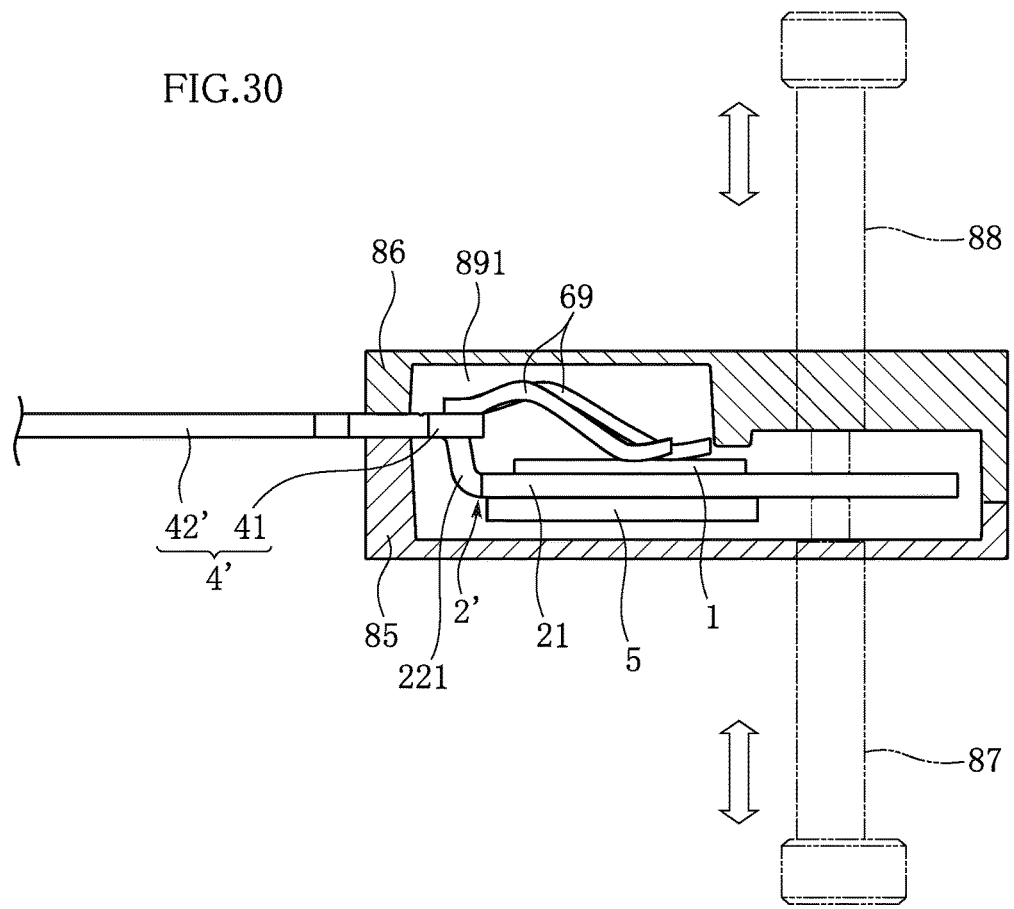
FIG. 30 is a front view (part cross-sectional view) in one process of manufacturing processes of the electronic device according to the first embodiment of the present invention.
Figure 31:
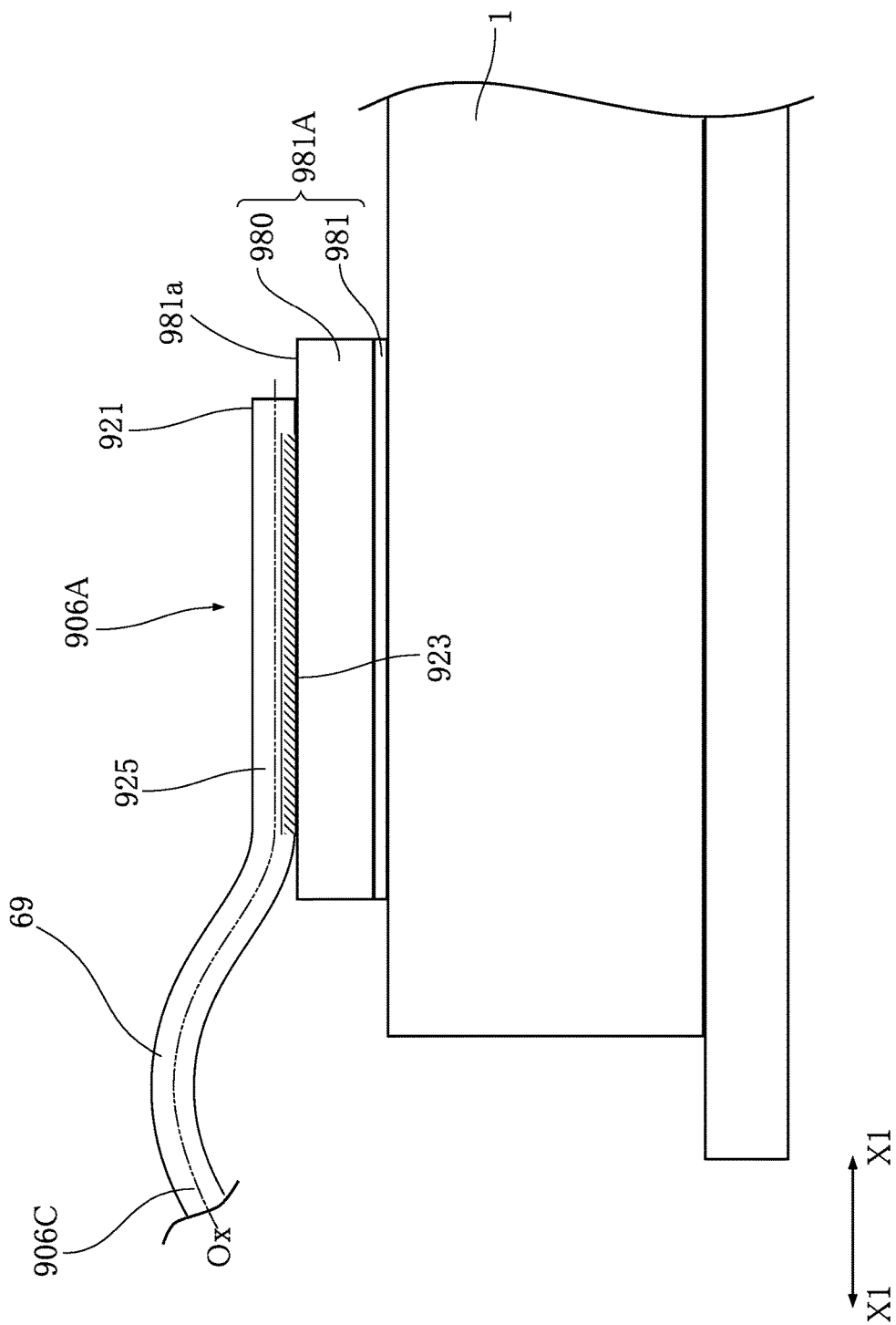
FIG. 31 is a partial enlarged view of a variation of the wire bonding structure according to the first embodiment of the present invention.

Next, as shown in FIG. 30, leads 22', 32' and 42' are sandwiched by a die 85 and a die 86 (FIG. 30 shows only the lead 42'). The dies 85 and 86 are fixed to the leads 22', 32' and 42', in the state in which the dies 85 and 86 are sandwiching the leads 22', 32' and 42'. The die bonding pad 21 is fixed to the dies 85 and 86 using pins 87 and 88. A space 891 enclosed by the dies 85 and 86 is formed, when the leads 22', 32' and 42' are sandwiched by the dies 85 and 86. The space 891 houses the die bonding pad 21, the electronic element 1 and the like.

Next, resin is poured into the space 891. Next, the pin 87 is moved slightly away from the die bonding pad 21. Resin then also enters between the die bonding pad 21 and the pin 87. Similarly, the pin 88 is moved slightly away from the die bonding pad 21. Resin then enters between the die bonding pad 21 and the pin 88. Thereafter, the dies 85 and 86 are removed from the resin package 7 after the resin has completely hardened. This results in the above-mentioned resin package 7 shown in FIGS. 2 to 4 being formed. The surface of the resin package 7 formed by the die 85 serves as the above-mentioned first surface 71. On the other hand, the surface of the resin package 7 formed by the die 86 serves as the above-mentioned second surface 72. The region of the resin package 7 in which the pin 87 was inserted serves as the above-mentioned pin mark 711. Similarly, the region of the resin package 7 in which the pin 88 was inserted serves as the above-mentioned pin mark 721. Thereafter, the electronic device A10 is manufactured by processing such as sectioning the leads 22', 32' and 42' along a line 899 (see FIG. 29).

The electronic device A10 includes the above-mentioned wire bonding structure 900B. The point that the wire bonding structure 900B is included in a similar mode is also common to other electronic devices that will be described below.

Next, advantages of the present embodiment will be described.

In the present embodiment, the wire 69 has the withdrawn surface 923*a*, before the process of joining the wire 69 to the electrode pad 981. The withdrawn surface 923*a* is a surface withdrawn to the central axis Ox side of the wire 69 from the outer circumferential surface 921. In the process of joining the wire 69 to the electrode pad 981, ultrasonic vibration is applied to the wire 69, in a state in which the withdrawn surface 923*a* is pressed against the electrode pad 981. According to such a configuration, the area of the wire 69 that contacts the electrode pad 981, when the wire 69 is pressed against the electrode pad 981 by the wedge 901, at the time of joining the wire 69 to the electrode pad 981, can be further enlarged. The application of localized force on the electrode pad 981 from the wire 69, when the wire 69 is pressed against the electrode pad 981 by the wedge 901, can thereby be suppressed. As a result, the electronic element 1 on which the electrode pad 981 is formed can be prevented from being damaged. As described above, according to the present embodiment, the wire 69 can be appropriately joined to the electrode pad 981, while preventing damage to the electronic element 1, even in the case where a wire 69 made of Cu is used.

In the present embodiment, the withdrawn surface 923*a* is flat, at the point in time at which the process of joining the wire 69 to the electrode pad 981 is started. According to such a configuration, the area of the wire 69 that contacts the electrode pad 981, when the wire 69 is pressed against the electrode pad 981 by the wedge 901, at the time of joining the wire 69 to the electrode pad 981, can be further enlarged. Accordingly, for similar reasons to the reasons mentioned above, the wire 69 can be more appropriately joined to the electrode pad 981, while further preventing damage to the electronic element 1, even in the case where a wire 69 made of Cu is used.

In the present embodiment, the withdrawn surface 923α is formed by pressing the wire 69 against the pressing target 982, before joining the wire 69 to the electrode pad 981. Such a configuration is favorable in forming the withdrawn surface 923α in the wire 69. Note that, unlike the present embodiment, a wire 69 in which the withdrawn surface 923α has already been formed at the point in time at which the wire 69 is wound around the wire reel 965 may be used. In this case, the process of forming the withdrawn surface 923*a* by pressing the wire 69 against the pressing target 982 does not need to be performed.

As the diameter of the wire 69 increases, the wire 69 needs to be pressed with greater force against the electrode pad 981 in joining the wire 69 to the electrode pad 981. In the present embodiment, a wire 69 having a diameter of about 150 to 1000 μm is used, with this enabling the wire 69 to be appropriately joined to the electrode pad 981 while preventing damage to the electronic element 1.

The electronic device A10 is provided with the heat dissipation member 5. Thus, the heat transferred from the electronic element 1 to the die bonding pad 21 can be conducted to the heat sink 82 via the heat dissipation member 5. Therefore, the heat transferred from the electronic element 1 to the die bonding pad 21 is readily transferred to the heat sink 82. Accordingly, the electronic device A10 is suitable for suppressing the electronic element 1 from reaching an excessively high temperature. That is, the electronic device A10 has excellent heat dissipation characteristics.

In the electronic device A10, the electrode 2 is formed by shaping a conductor member of uniform thickness. Thus, a conductor member in which the die bonding pad 21 differs in thickness from the lead 22 does not need to be used in order to form the electrode 2. The conductor member of uniform thickness can be manufactured at low cost. Accordingly, the electronic device A10 is suitable for achieving a reduction in manufacturing costs.

In the electronic device A10, the die bonding pad 21 and the heat dissipation member 5 are joined by ultrasonic joining. At the time of joining the die bonding pad 21 to the heat dissipation member 5 by ultrasonic joining, the temperature of the die bonding pad 21 does not need to be raised. Thus, at the time of joining the heat dissipation member 5, the die bonding pad 21 does not readily oxidize. That is, even after the heat dissipation member 5 is joined, the state in which the conductive material is exposed without the placement surface 211 of the die bonding pad 21 being covered with an oxide film can be maintained. Accordingly, the electronic device A10 is suitable for more reliably establishing electrical continuity between the die bonding pad 21 and the electronic element 1.

Hereinafter, variations of the present embodiment will be shown. In the following variations, the same reference signs as the above embodiment are given to constituent elements that are the same as or similar to the above embodiment.

<Variation of Wire Bonding Structure 900B>

In this variation, the wire 69 does not have the withdrawn surface 923a, before the process of joining the wire 69 to the first joining target 981A. Also, the first joining target 981A differs from the first embodiment in including a metal layer 980 and an electrode pad 981. Description of the electrode pad 981 will be omitted in the present embodiment, because description of the electrode pad 981 mentioned in the first embodiment can be directly applied thereto. The metal layer 980 is interposed between the electrode pad 981 and the first bonding part 906A. The metal layer 980 has a greater thickness than the electrode pad 981. The metal layer 980 has a thickness of 50 to 150 μm, for example.

According to the present embodiment, the metal layer 980 acts as a buffer layer, at the time of joining the wire 69 to the first joining target 981A. Thus, localized force can be prevented from being applied to the electrode pad 981. As a result, the electronic element 1 on which the first joining target 981A is formed can be prevented from being damaged. As described above, according to the present embodiment, the wire 69 can be appropriately joined to the first joining target 981A, while preventing damage to the electronic element 1, even in the case where a wire 69 made of Cu is used.

<First Variation>

Figure 33:
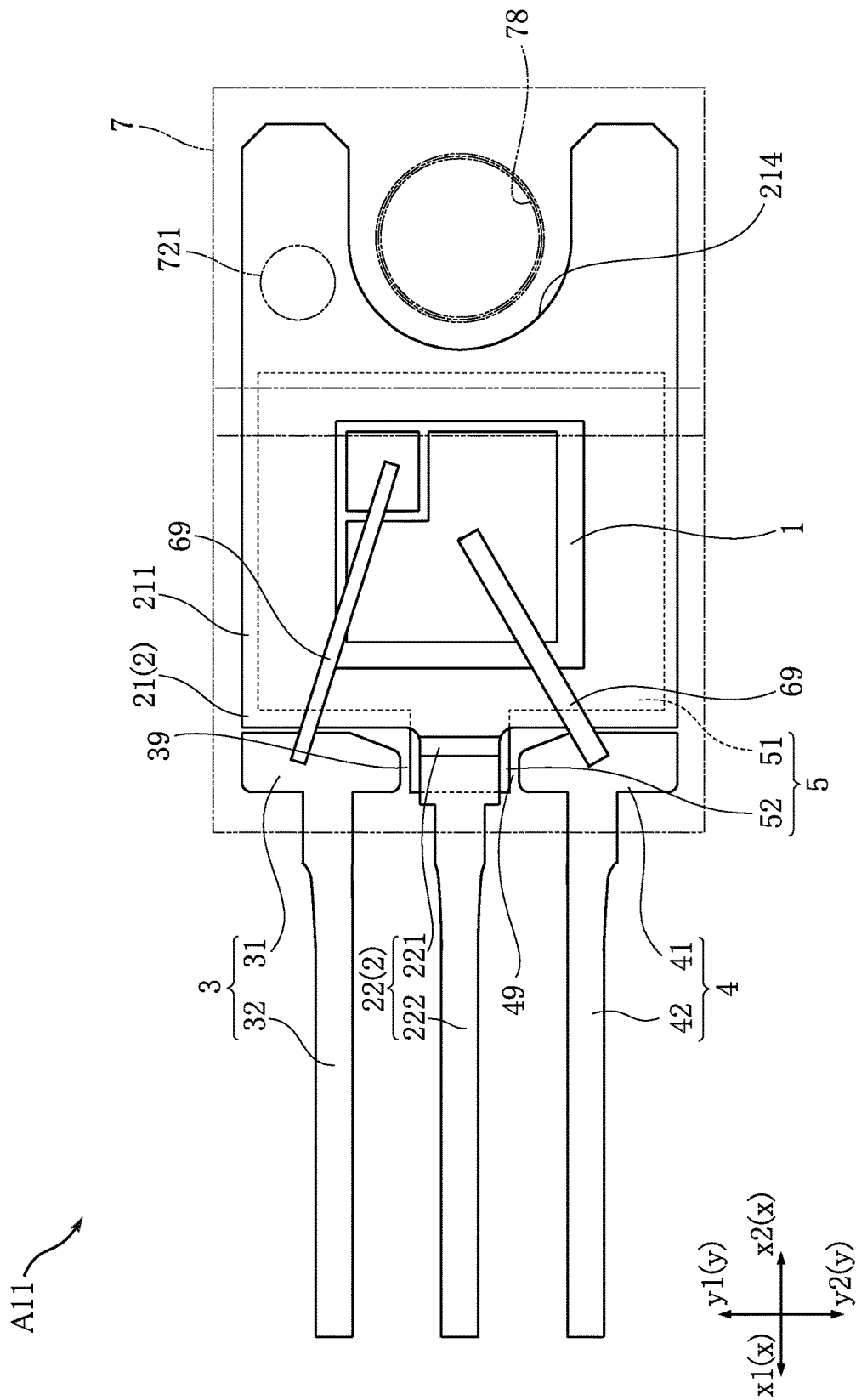
FIG. 33 is a plan view (partially see through) of the electronic device according to the first variation of the first embodiment of the present invention.
Figure 34:
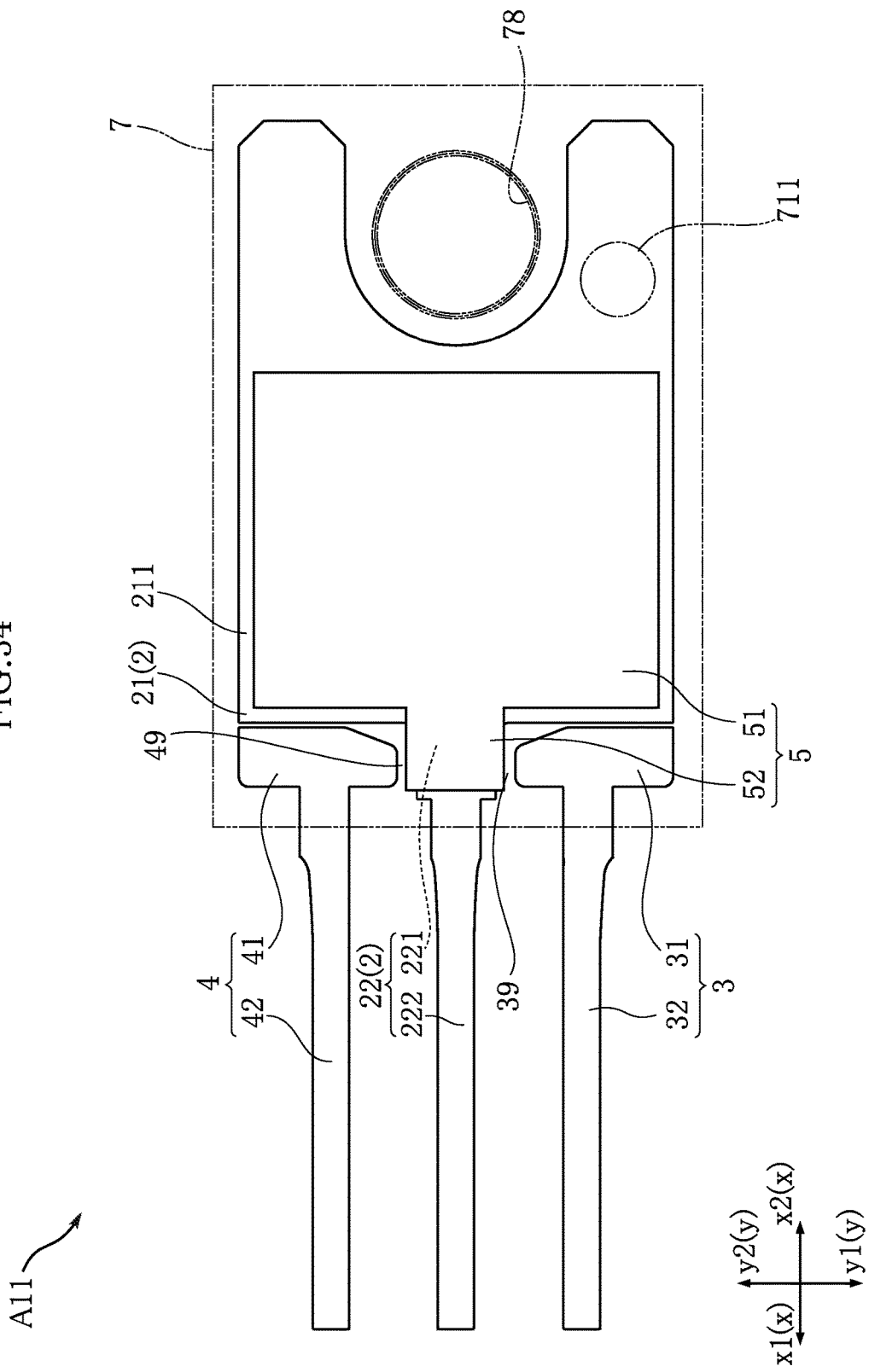
FIG. 34 is a bottom view (partially see through) of the electronic device according to the first variation of the first embodiment of the present invention.

Next, a first variation of the electronic device according to the present embodiment will be described using FIGS. 32 to 34.

Figure 32:
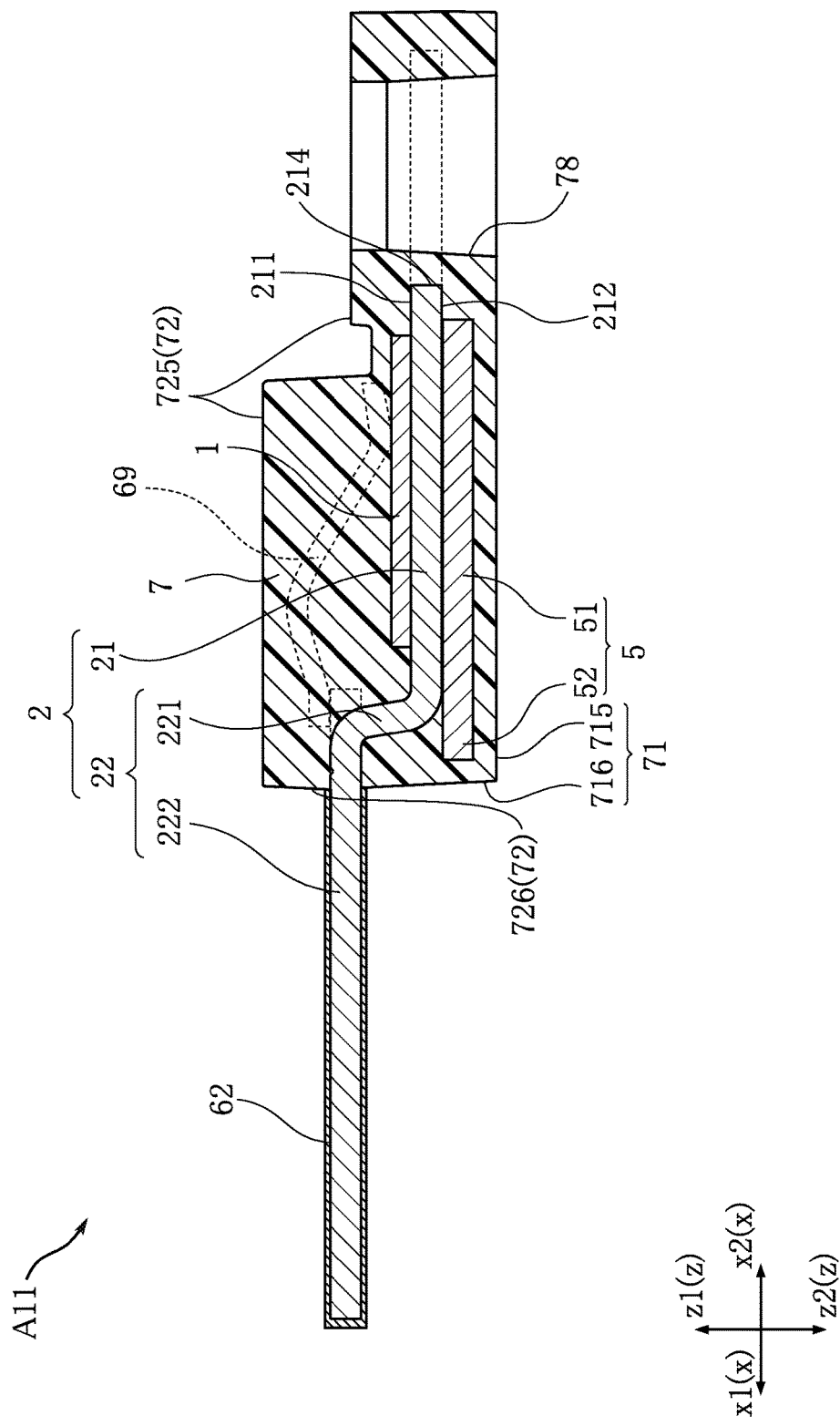
FIG. 32 is a cross-sectional view of an electronic device according to a first variation of the first embodiment of the present invention.

FIG. 32 is a cross-sectional view of an electronic device according to this variation. FIG. 33 is a plan view (partially see through) of the electronic device according to this variation. FIG. 34 is a bottom view (partially see through) of the electronic device according to this variation.

An electronic device A11 shown in these diagrams is, similarly to the electronic device A10, provided with the electronic element 1, the electrodes 2 to 4, the heat dissipation member 5, the adhesive layer 61 (see FIG. 8; illustration omitted in this variation), the plating layer 62, the two pieces of wire 69 and the resin package 7. The electronic device A11 differs from the electronic device A10 in the shape of the heat dissipation member 5. Since the respective configurations of the electronic element 1, the electrodes 2 to 4, the adhesive layer 61, the plating layer 62, the wire 69 and the resin package 7 in the electronic device A11 are similar to the configurations of the electronic device A10, description thereof will be omitted.

In this variation, the heat dissipation member 5 includes a tabular part 51 and a projecting part 52. The tabular part 51 has a substantially rectangular plate-like shape. The tabular part 51 overlaps with the die bonding pad 21 in xy plan view. The projecting part 52 projects in the direction x1 from the tabular part 51. The projecting part 52 overlaps with the lead 22 in xy plan view. As shown in FIGS. 33 and 34, a gap 39 is formed between the projecting part 52 and the wire bonding pad 31. Similarly, a gap 49 is formed between the projecting part 52 and the wire bonding pad 41. The tip of the projecting part 52 on the direction x1 side is located further on the direction x1 side than the die bonding pad 21.

Next, advantages of this variation will be described.

In the electronic device A11, the heat dissipation member 5 includes the projecting part 52 projecting from the tabular part 51. The configuration in which the heat dissipation member 5 includes the projecting part 52 is suitable for enlarging the area of the heat dissipation member 5 in xy plan view. Thus, according to the electronic device A11, heat is readily transferred from the die bonding pad 21 to the heat sink 82 via the heat dissipation member 5.

In the electronic device A11, the gap 39 is formed between the projecting part 52 and the wire bonding pad 31 in xy plan view. According to such a configuration, the region where the projecting part 52 overlaps with the wire bonding pad 31 in xy plan view can be reduced in size. At the time of joining the wire 69 to the wire bonding pad 31, a heater which is not illustrated is placed on the direction z2 side of the wire bonding pad 31. Placement of the heater is facilitated when the region where the projecting part 52 and the wire bonding pad 31 overlap in xy plan view is small. Accordingly, the electronic device A11 enables the wire 69 to be readily joined to the wire bonding pad 31. For a similar reason, the electronic device A11 enables the wire 69 to be readily joined to the wire bonding pad 41.

<Second Variation>

Figure 36:
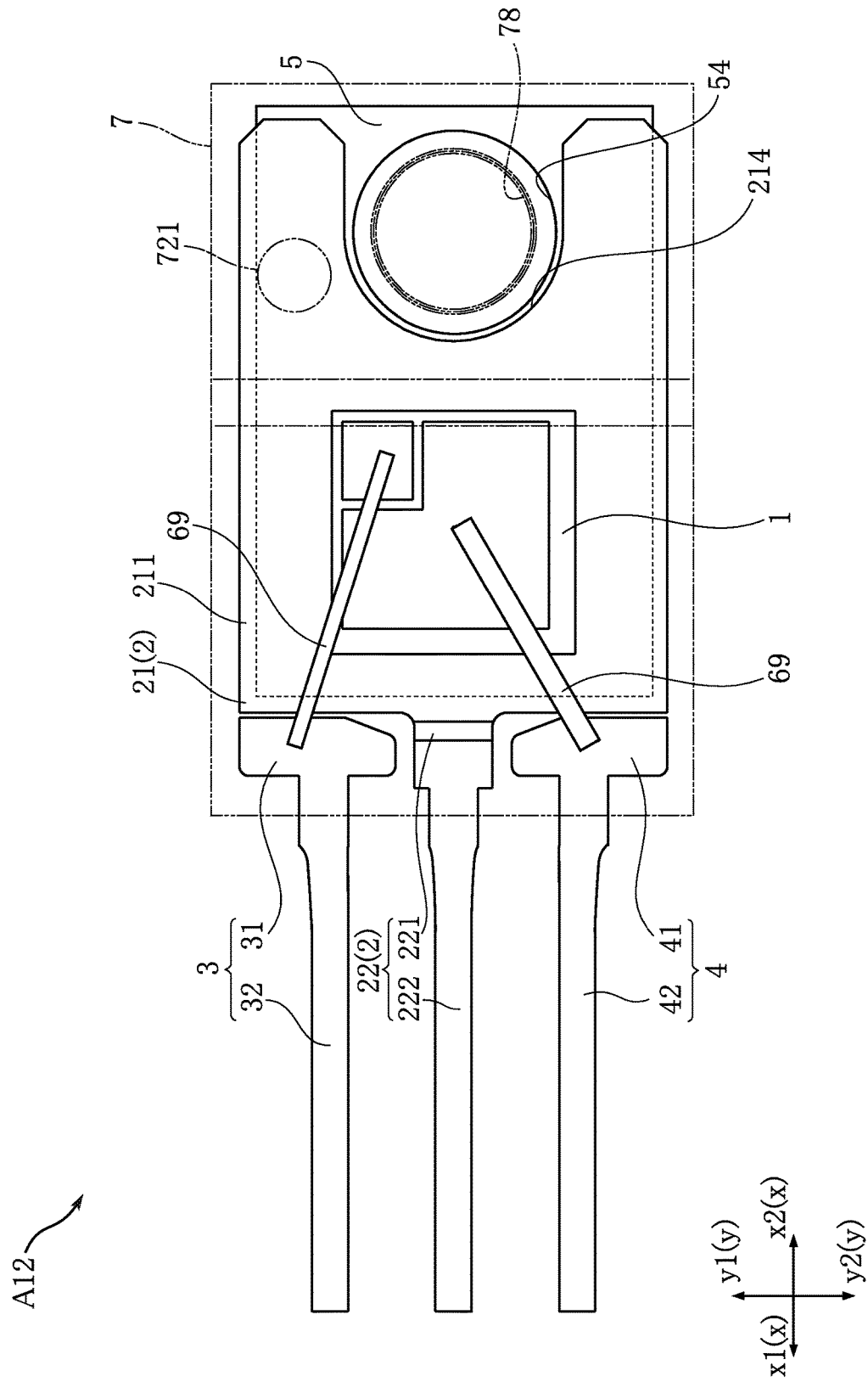
FIG. 36 is a plan view (partially see through) of the electronic device according to the second variation of the first embodiment of the present invention.
Figure 37:
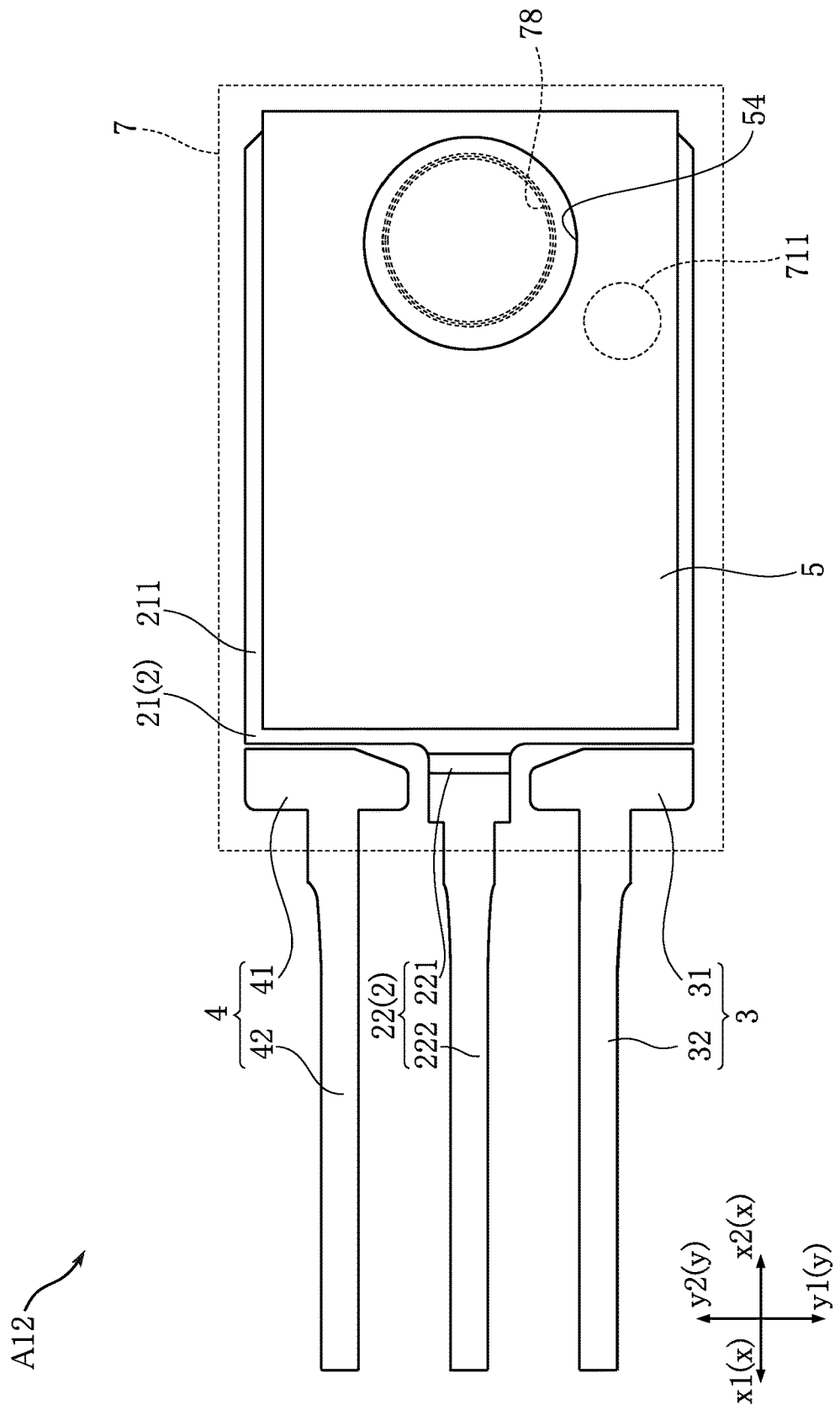
FIG. 37 is a bottom view (partially see through) of the electronic device according to the second variation of the first embodiment of the present invention.

Next, a second variation of the electronic device according to the present embodiment will be described using FIGS. 35 to 37.

Figure 35:
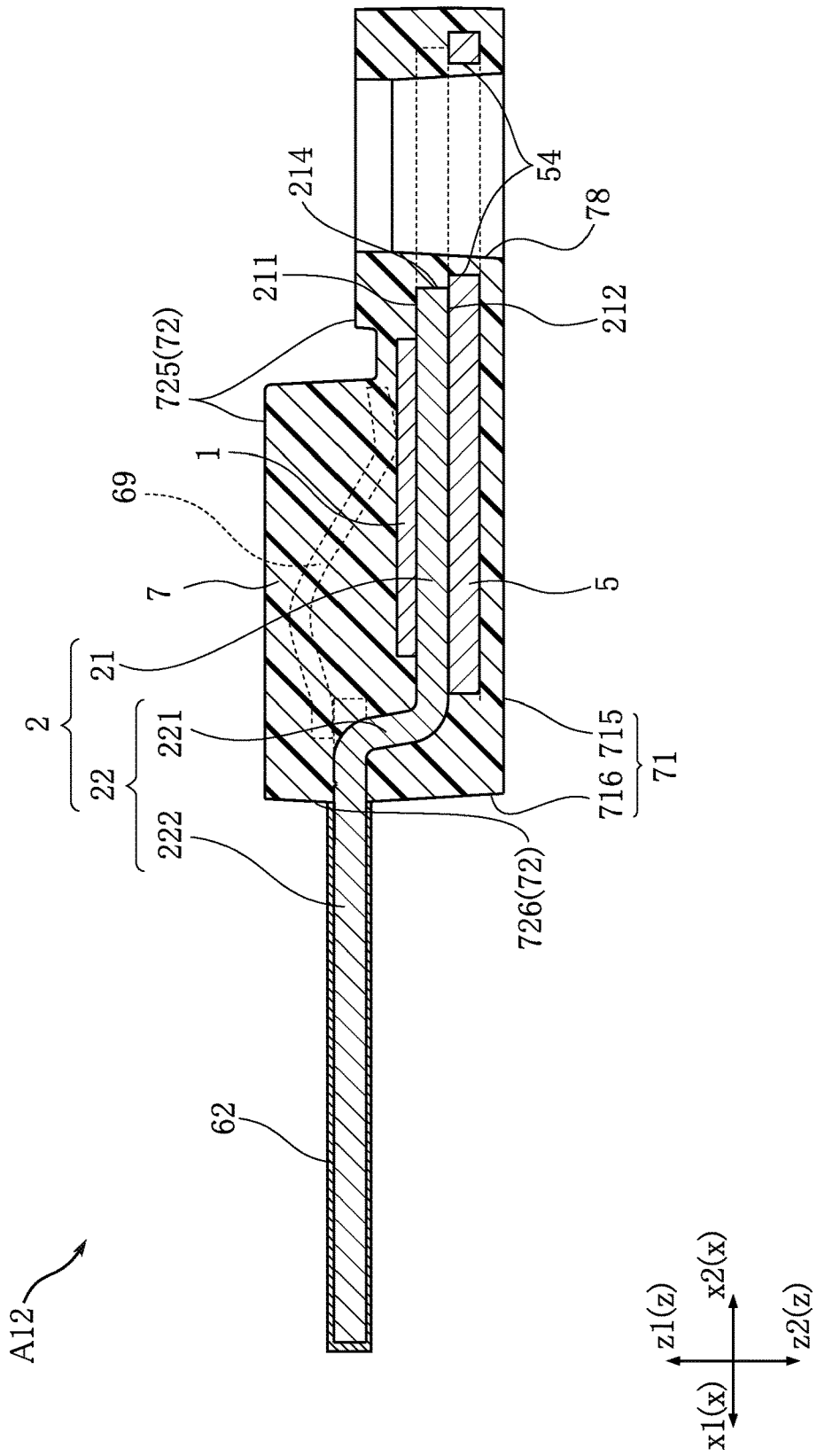
FIG. 35 is a cross-sectional view of an electronic device according to a second variation of the first embodiment of the present invention.

FIG. 35 is a cross-sectional view of an electronic device according to this variation. FIG. 36 is a plan view (partially see through) of the electronic device according to this variation. FIG. 37 is a bottom view (partially see through) of the electronic device according to this variation.

An electronic device A12 shown in these diagrams is provided, similarly to the electronic device A10, with the electronic element 1, the electrodes 2 to 4, the heat dissipation member 5, the adhesive layer 61 (see FIG. 8; illustration omitted in this variation), the plating layer 62, the two pieces of wire 69 and the resin package 7. The electronic device A12 differs from the electronic device A10 in the shape of the heat dissipation member 5. Since the respective configurations of the electronic element 1, the electrodes 2 to 4, the adhesive layer 61, the plating layer 62, the wire 69 and the resin package 7 in the electronic device A12 are similar to the configurations of the electronic device A10, description thereof will be omitted. A circular screw hole 54 for inserting a screw is formed in the heat dissipation member 5. As shown in FIG. 36, the heat dissipation member 5 has a region located further on the direction x2 side than the die bonding pad 21.

The electronic device A12 is suitable for enlarging the area of the heat dissipation member 5 in xy plan view. Thus, according to the electronic device A12, heat is readily transferred from the die bonding pad 21 to the heat sink 82 via the heat dissipation member 5.

Note that the heat dissipation member 5 in this variation may be a configuration provided with the tabular part 51 and the projecting part 52 of the electronic device A11.

<Third Variation>

Figure 39:
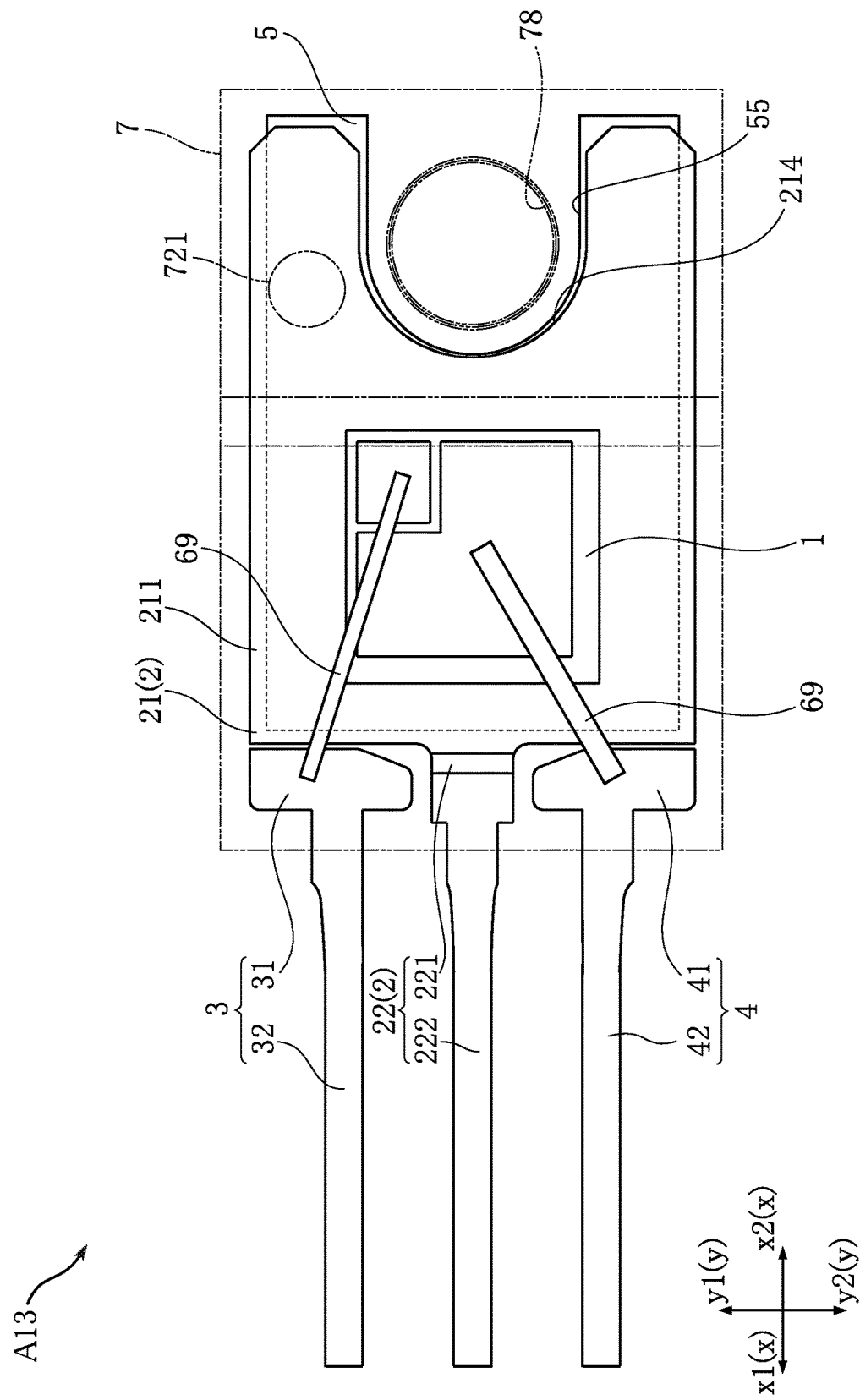
FIG. 39 is a plan view (partially see through) of the electronic device according to the third variation of the first embodiment of the present invention.
Figure 40:
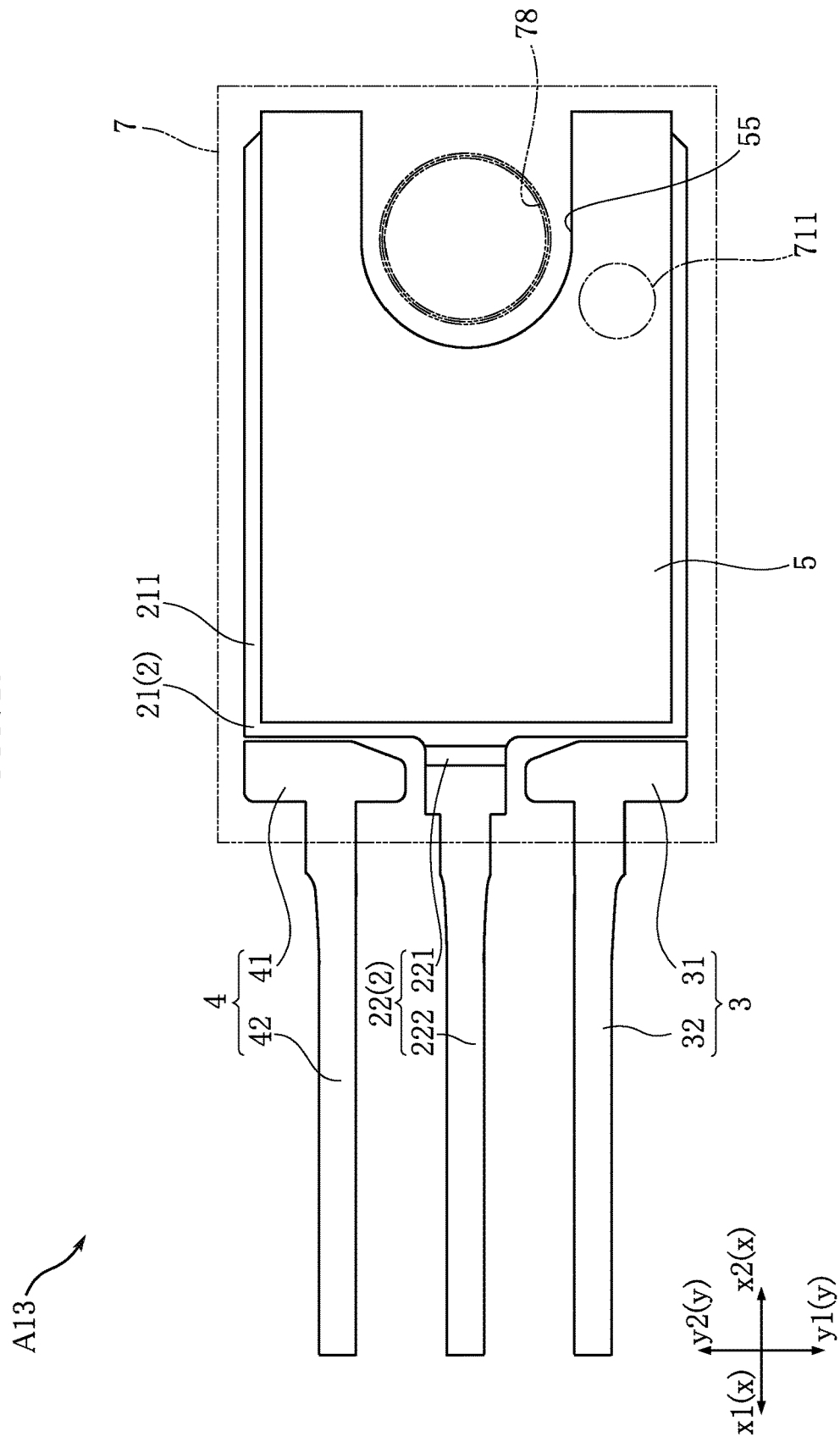
FIG. 40 is a bottom view (partially see through) of the electronic device according to the third variation of the first embodiment of the present invention.

Next, a third variation of the electronic device according to the present embodiment will be described using FIGS. 38 to 40.

Figure 38:
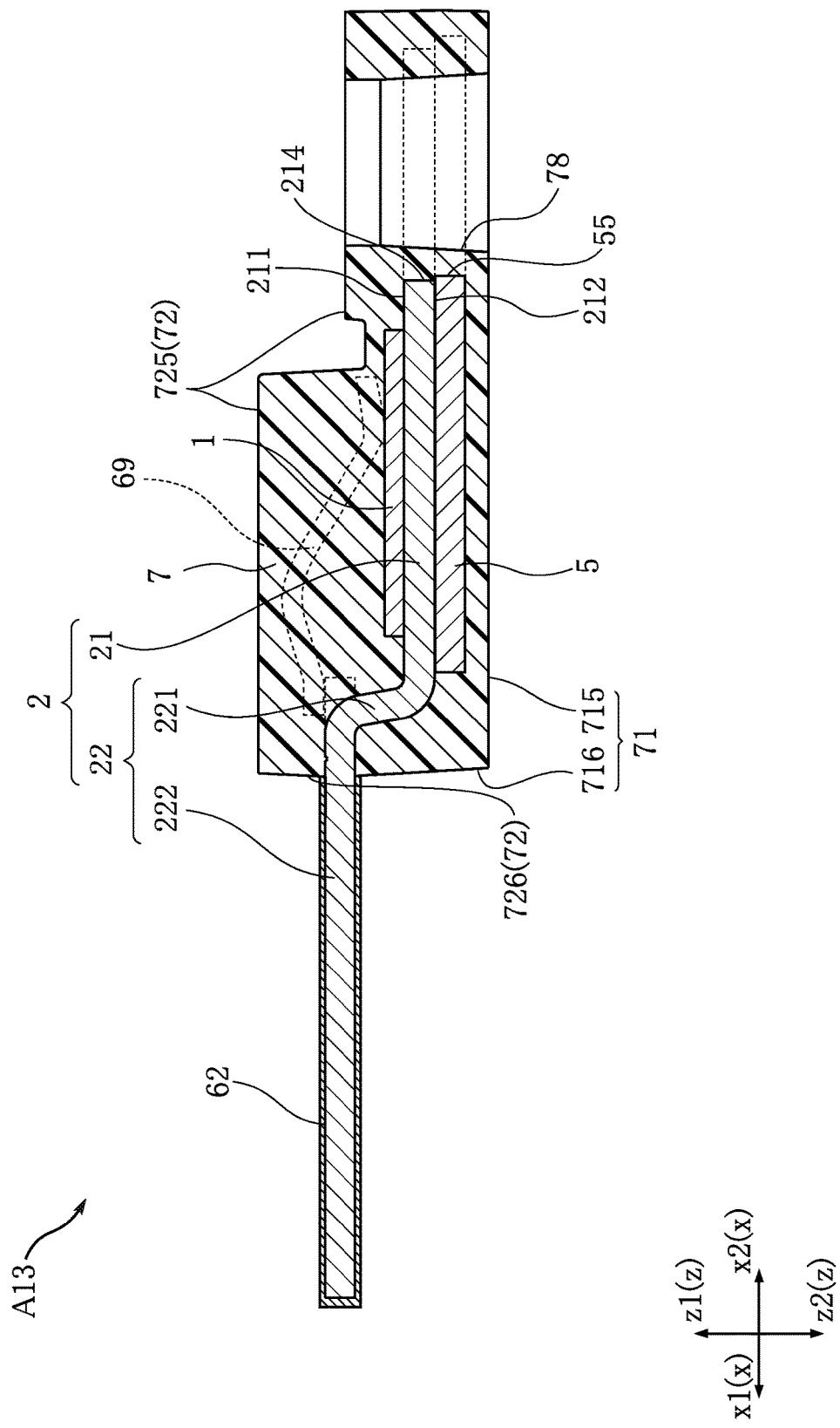
FIG. 38 is a cross-sectional view of an electronic device according to a third variation of the first embodiment of the present invention.

FIG. 38 is a cross-sectional view of an electronic device according to this variation. FIG. 39 is a plan view (partially see through) of the electronic device according to this variation. FIG. 40 is a bottom view (partially see through) of the electronic device according to this variation.

An electronic device A13 shown in these diagrams is provided, similarly to the electronic device A10, with the electronic element 1, the electrodes 2 to 4, the heat dissipation member 5, the adhesive layer 61 (see FIG. 8; illustration omitted in this variation), the plating layer 62, the two pieces of wire 69 and the resin package 7. The electronic device A13 differs from the electronic device A10 in the shape of the heat dissipation member 5. Since the respective configurations of the electronic element 1, the electrodes 2 to 4, the adhesive layer 61, the plating layer 62, the wire 69 and the resin package 7 in the electronic device A12 are similar to the configurations of the electronic device A10, description thereof will be omitted. A recessed portion 55 recessed on the direction x1 side from the end in the direction x2 is formed in the heat dissipation member 5. The recessed portion 55 is open on the direction x2 side. In xy plan view, the recessed portion 55 overlaps with the hole 214 in the die bonding pad 21. As shown in FIG. 39, even in this variation, the heat dissipation member 5 has a region located further on the direction x2 side than the die bonding pad 21.

The electronic device A13 is suitable for enlarging the area of the heat dissipation member 5 in xy plan view. Thus, according to the electronic device A13, heat is readily transferred from the die bonding pad 21 to the heat sink 82 via the heat dissipation member 5.

Note that the heat dissipation member 5 in this variation may be a configuration provided with the tabular part 51 and the projecting part 52 of the electronic device A11.

<Variation of Mounting Structure of Electronic Device>

Figure 41:
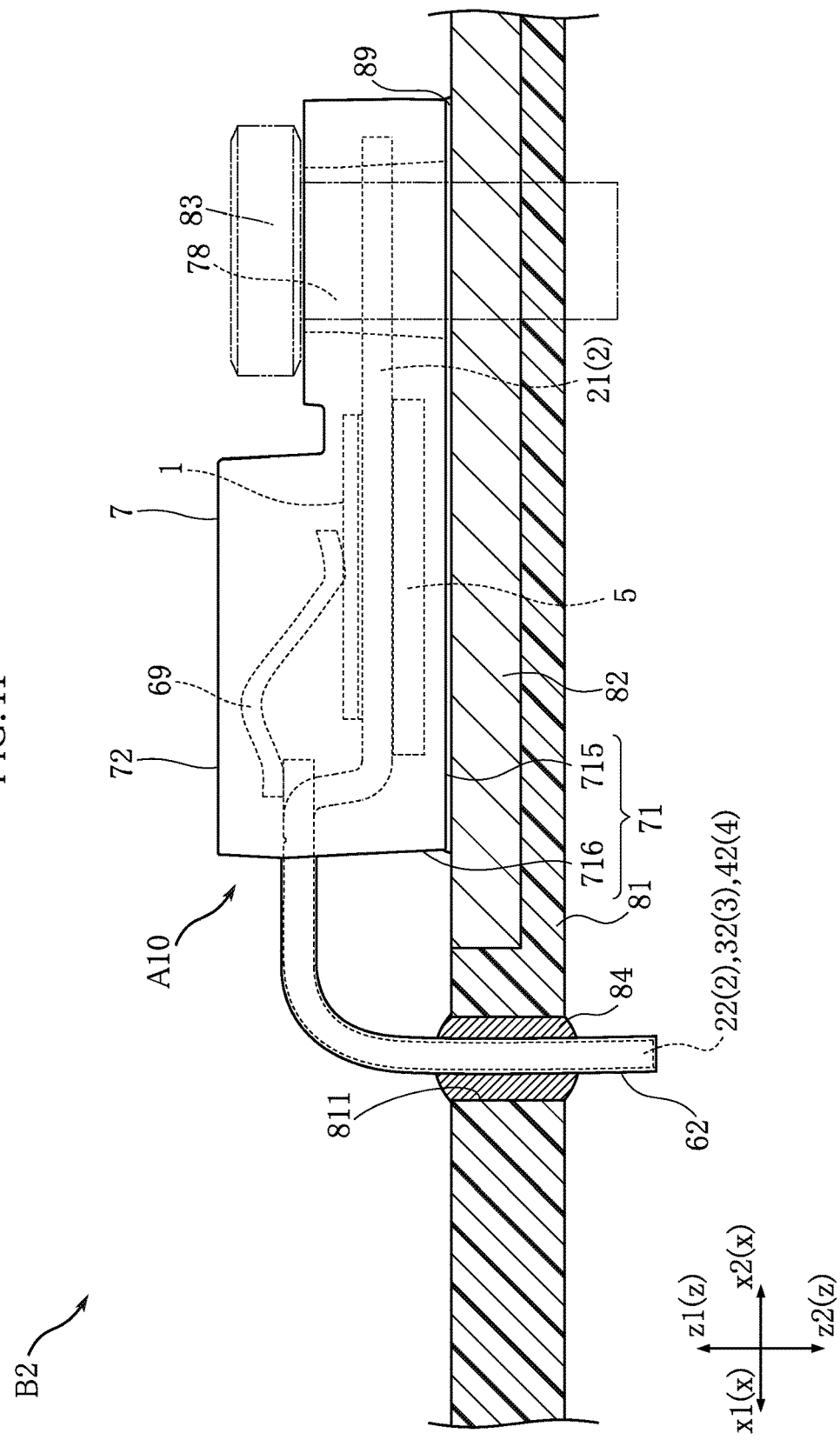
FIG. 41 is a cross-sectional view of a main section showing a variation of the mounting structure of the electronic device according to the first embodiment of the present invention.

Next, a variation of the mounting structure of the electronic device according to the present embodiment will be shown using FIG. 41.

FIG. 41 is a cross-sectional view of a main section of the mounting structure of the electronic device according to this variation. An electronic device mounting structure B2 shown in this diagram is provided with the electronic device A10, the mounting board 81 and the heat sink 82. In the electronic device mounting structure B2, the heat sink 82 is formed in parallel with the mounting board 81, unlike the electronic device mounting structure B1. The electronic device A10 is mounted on the mounting board 81 in a state in which all of the leads 22, 32 and 42 are bent. Note that any of the electronic devices A11 to A13 may be mounted on the mounting board 81 instead of the electronic device A10.

Second Embodiment

Next, a second embodiment of the present invention will be described using FIGS. 42 to 53.

Figure 42:
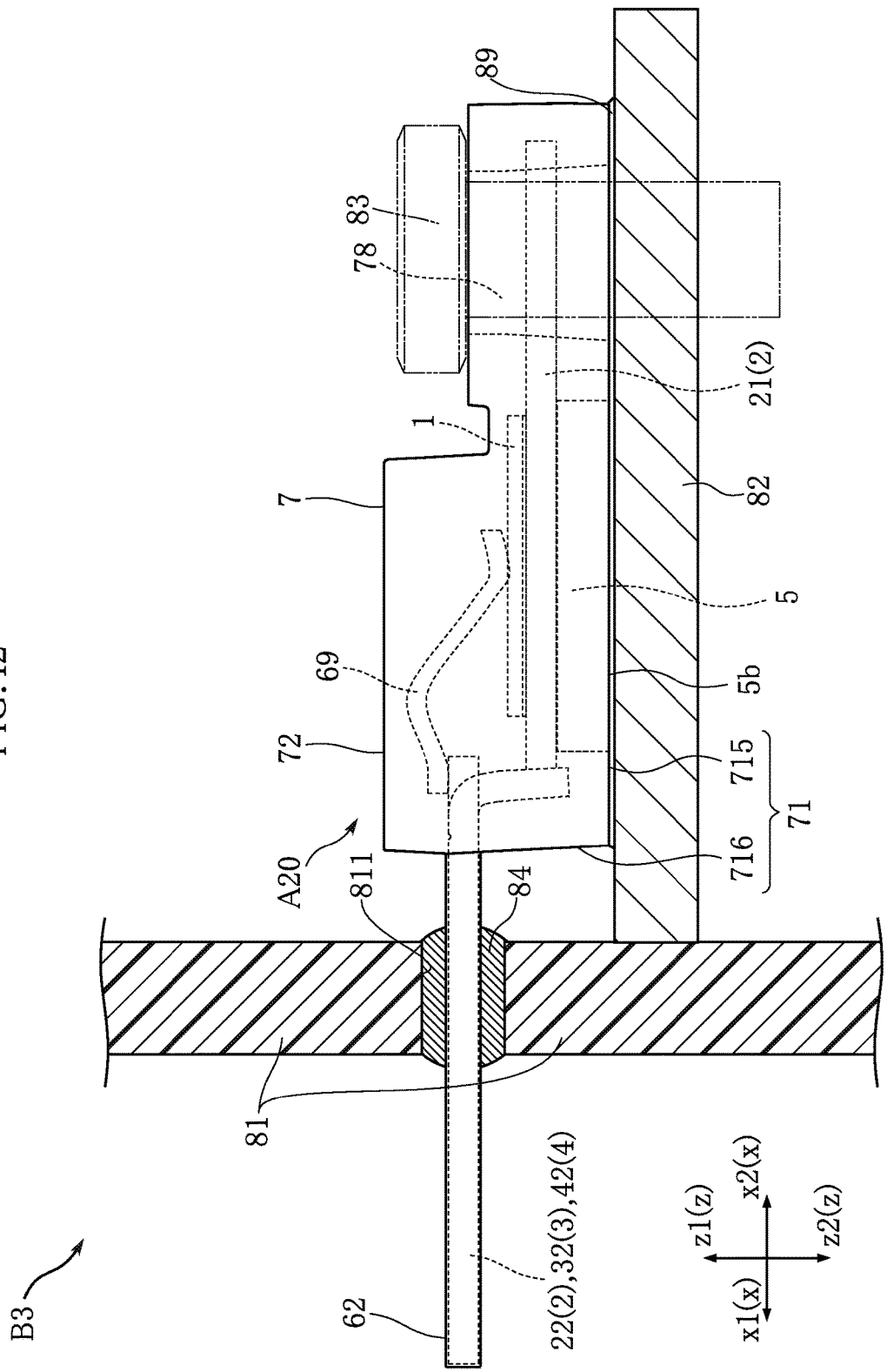
FIG. 42 is a cross-sectional view of a main section showing a mounting structure of an electronic device according to a second embodiment of the present invention.

FIG. 42 is a cross-sectional view of a main section showing a mounting structure of the electronic device according to the present embodiment.

An electronic device mounting structure B3 shown in FIG. 42 is provided with an electronic device A20, the mounting board 81 and the heat sink 82.

The mounting board 81 is a substrate on which a plurality of electronic components are mounted. The mounting board 81 is made of an insulating material. A wiring pattern which is not illustrated is formed on the mounting board 81. A plurality of holes 811 are formed in the mounting board 81. The heat sink 82 stands erect on the mounting board 81. The heat sink 82 is made of a material having comparatively high thermal conductivity, such as aluminum or a similar metal, for example.

Figure 43:
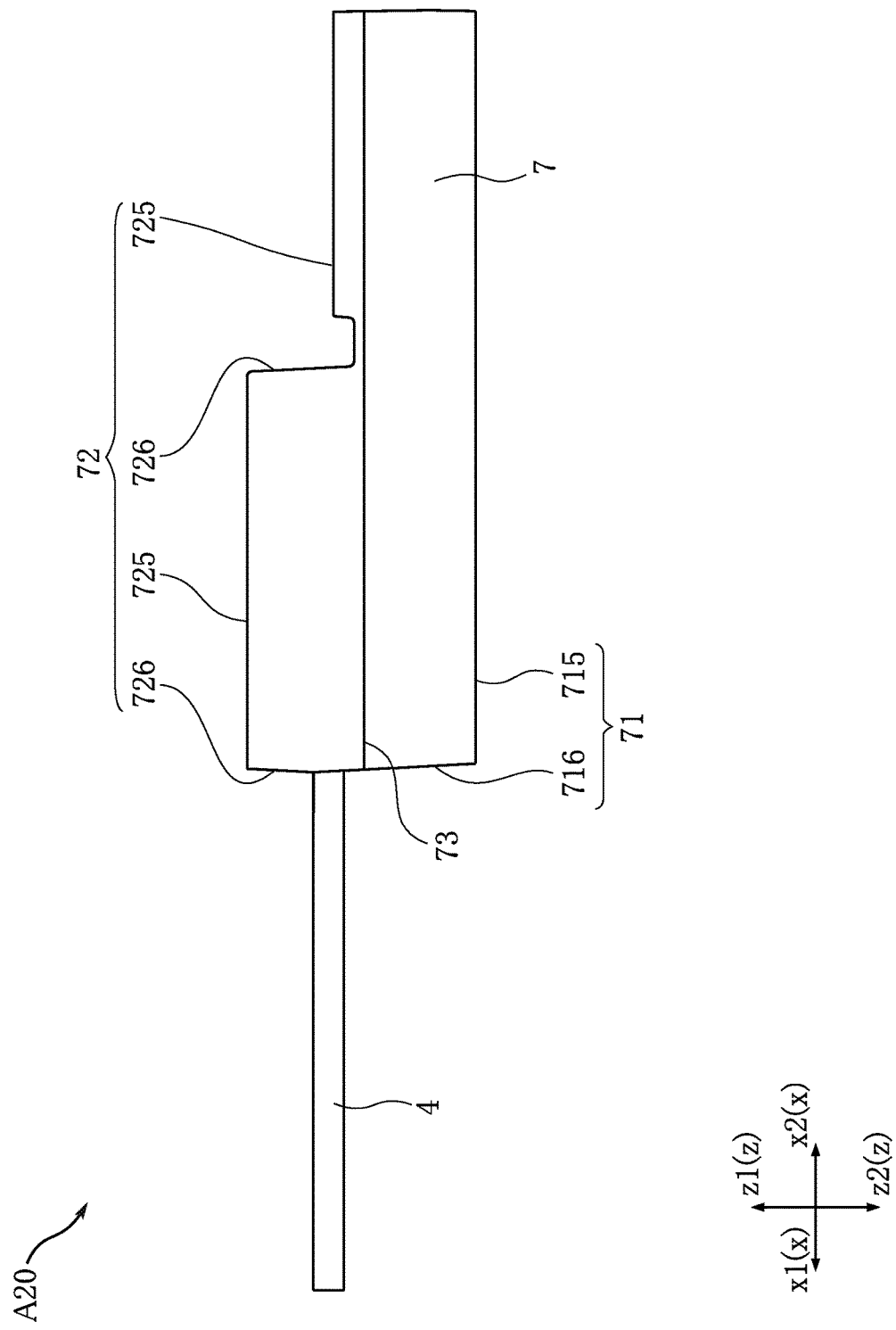
FIG. 43 is a front view of the electronic device according to the second embodiment of the present invention.
Figure 44:
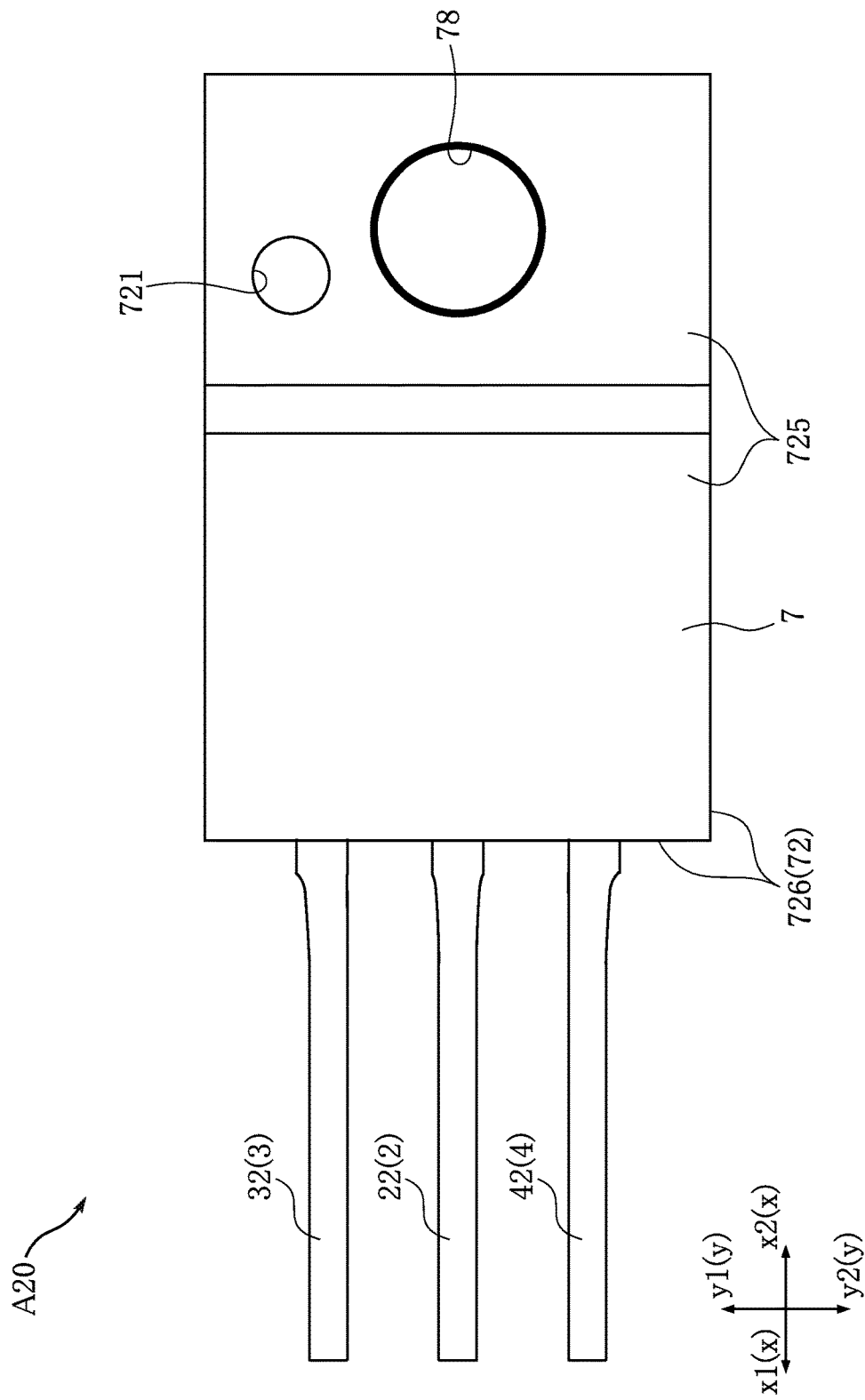
FIG. 44 is a plan view of the electronic device according to the second embodiment of the present invention.
Figure 45:
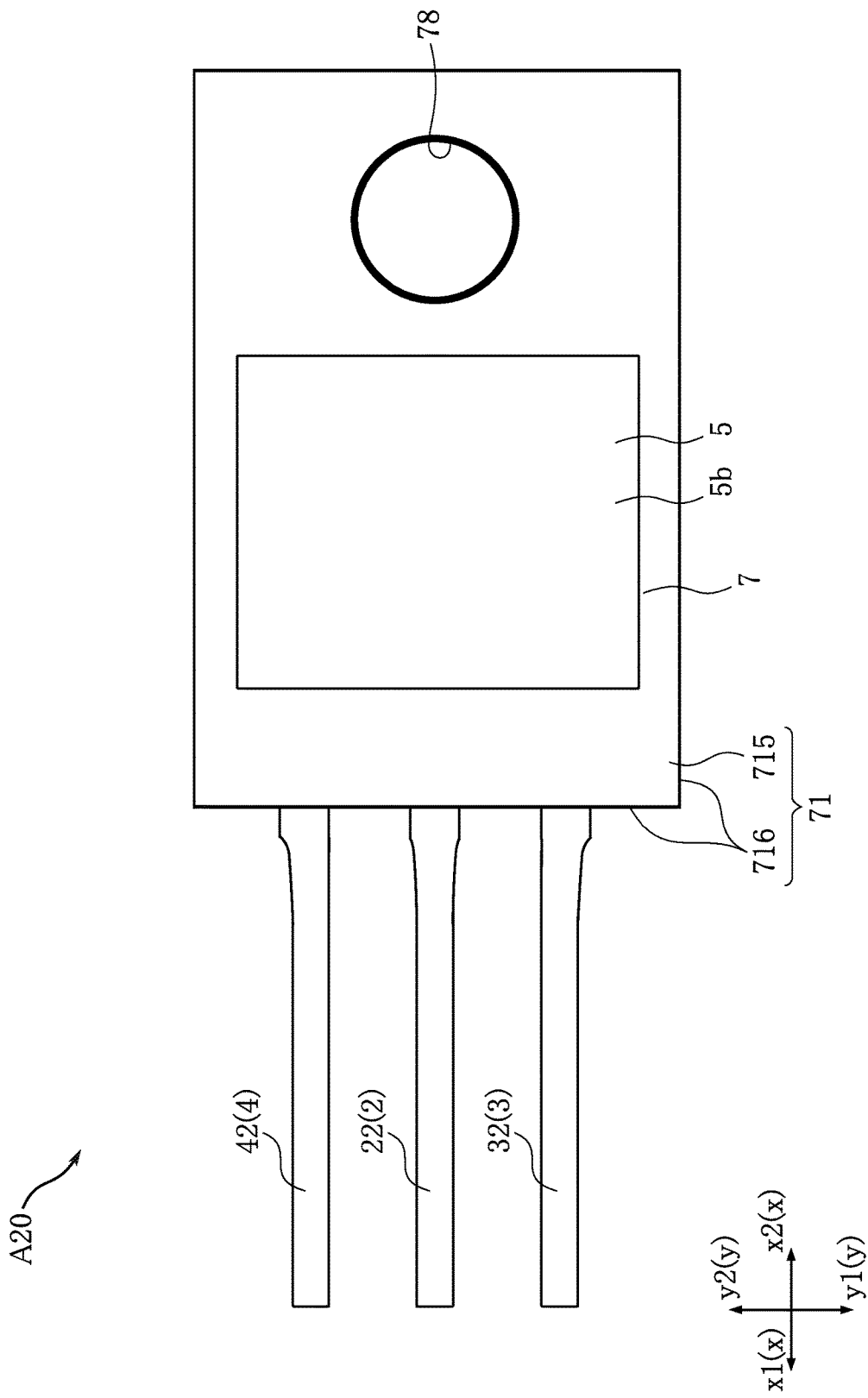
FIG. 45 is a bottom view of the electronic device according to the second embodiment of the present invention.
Figure 46:
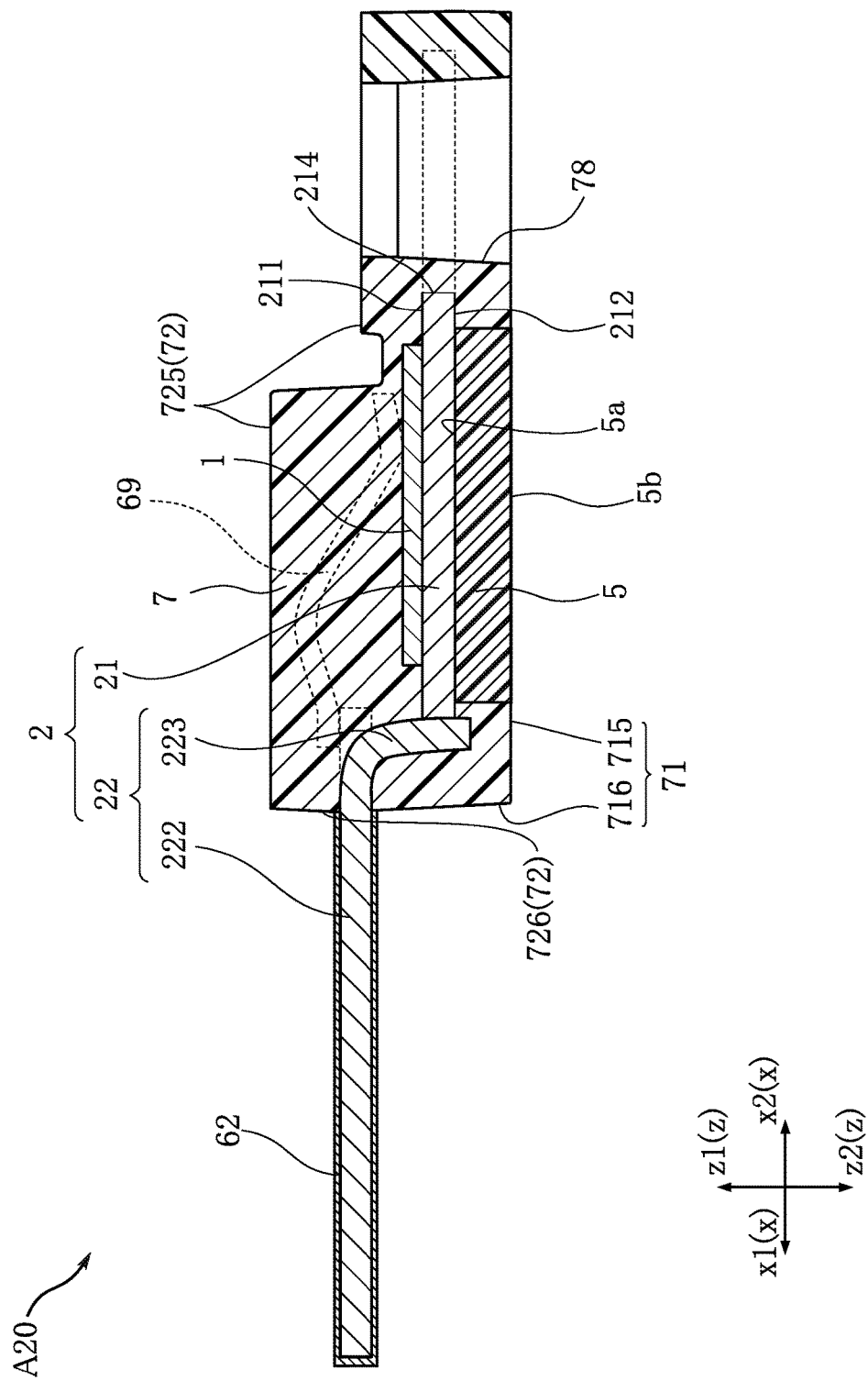
FIG. 46 is a cross-sectional view of the electronic device according to the second embodiment of the present invention.
Figure 47:
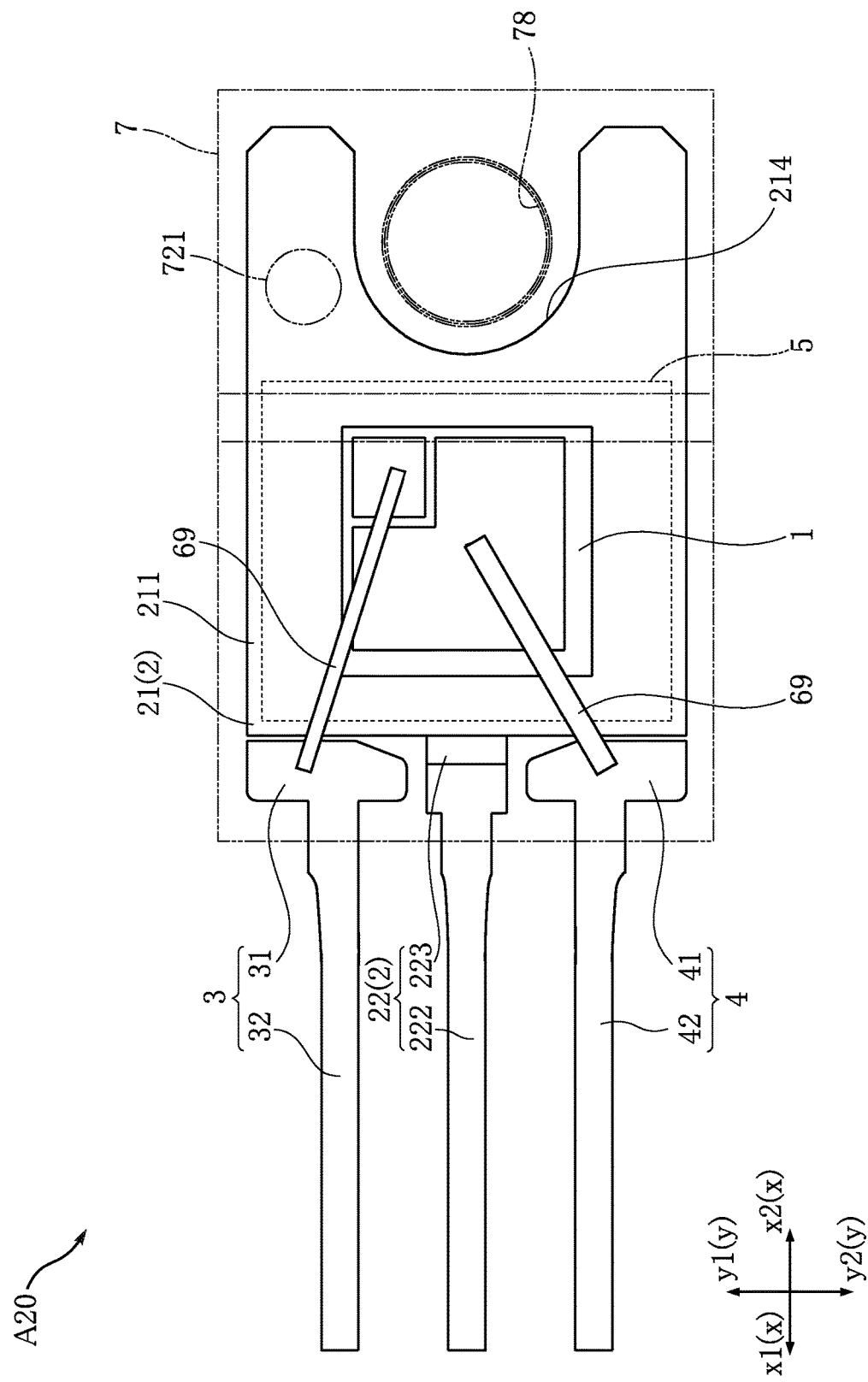
FIG. 47 is a plan view (partially see through) of the electronic device according to the second embodiment of the present invention.
Figure 48:
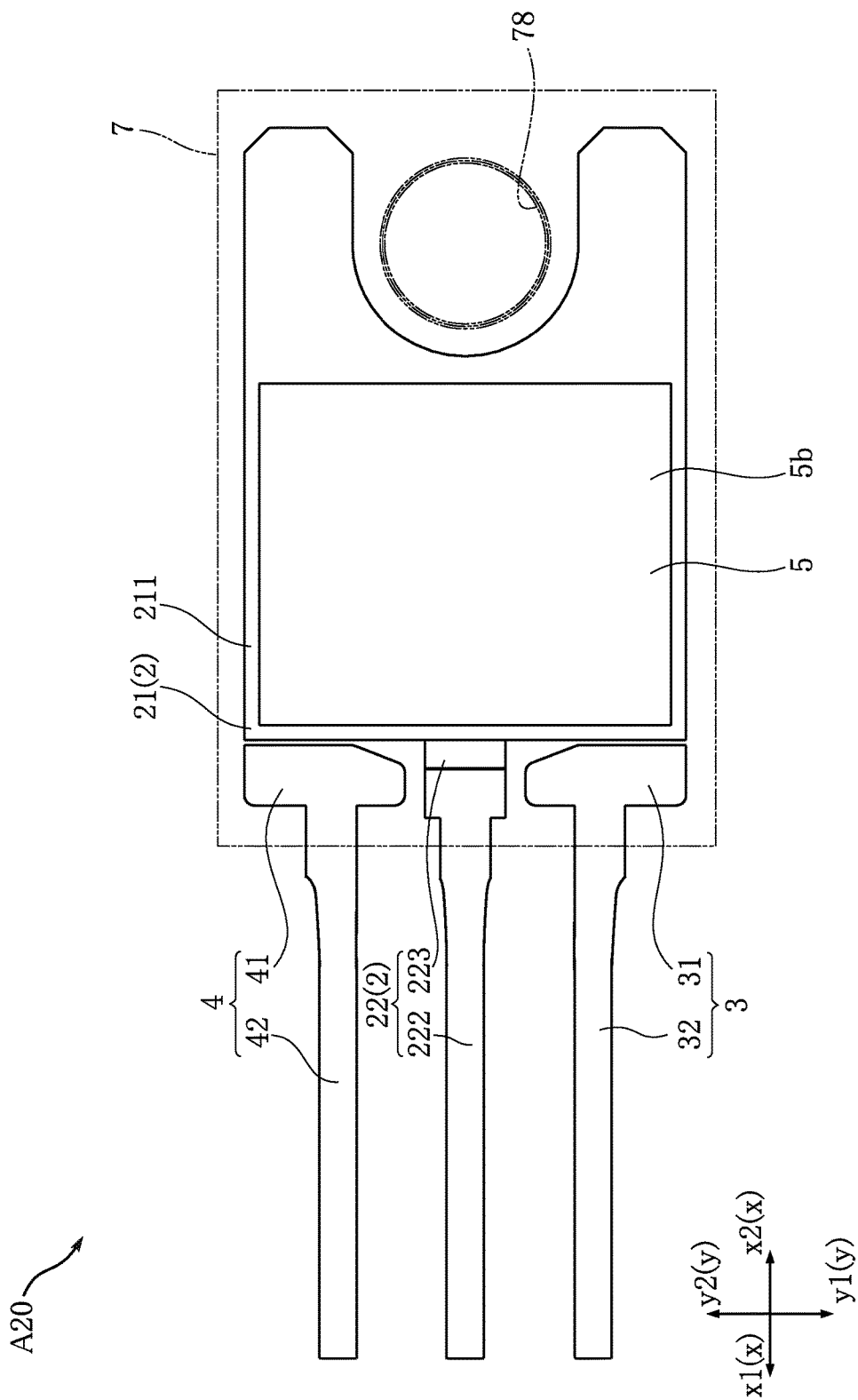
FIG. 48 is a bottom view (partially see through) of the electronic device according to the second embodiment of the present invention.
Figure 49:
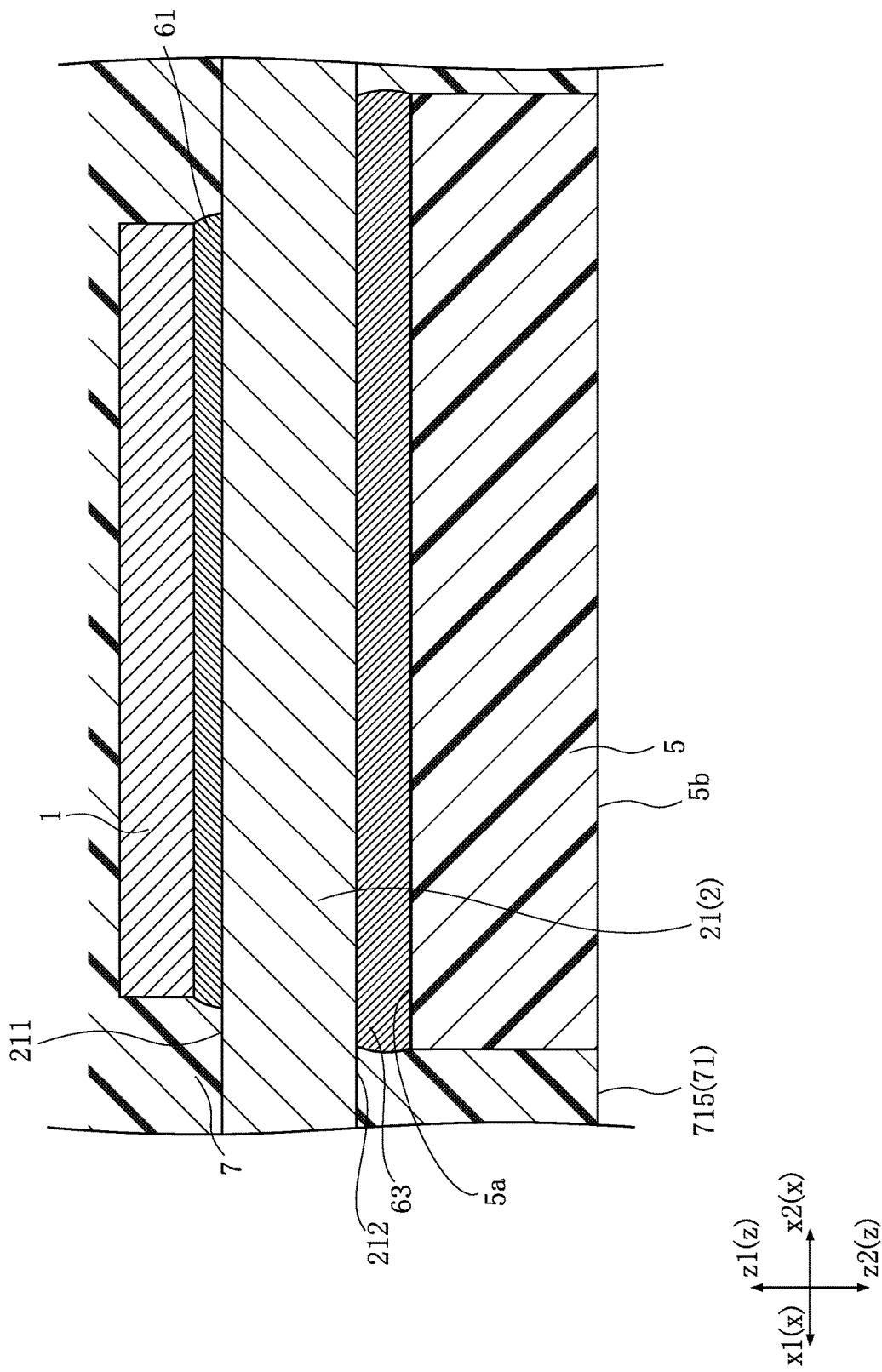
FIG. 49 is a partial enlarged cross-sectional view of the electronic device shown in FIG. 46.

FIG. 43 is a front view of the electronic device according to the present embodiment. FIG. 44 is a plan view of the electronic device according to the present embodiment. FIG. 45 is a bottom view of the electronic device according to the present embodiment. FIG. 46 is a cross-sectional view of the electronic device according to the present embodiment. FIG. 47 is a plan view (partially see through) of the electronic device according to the present embodiment. FIG. 48 is a bottom view (partially see through) of the electronic device according to the present embodiment. FIG. 49 is a partial enlarged cross-sectional view of the electronic device shown in FIG. 46.

The electronic device A20 shown in these diagrams is provided with the electronic element 1, the electrodes 2 to 4, the heat dissipation member 5, the adhesive layer 61 (see FIG. 49; omitted in other diagrams), the plating layer 62 (see FIGS. 42 and 46; omitted in other diagrams), a joining layer 63 (see FIG. 49; omitted in other diagrams), the two pieces of wire 69 and the resin package 7. In FIGS. 47 and 48, the resin package 7 is shown with a two-dot chain line. As shown in FIG. 42, the electronic device A20 is mounted on the mounting board 81. The electronic device A20 is used as an electronic component that performs functions such as switching, rectification and amplification in an electrical circuit, depending on the type of electronic element 1.

The electronic element 1 shown in FIGS. 42, 46 and 47 has a rectangular shape in plan view. The electronic element 1 is a device composed of a semiconductor such as a diode or a transistor, for example. In the present embodiment, the electronic element 1 is a transistor.

The electrode 2 shown in FIG. 42 and FIGS. 46 to 48 includes the die bonding pad 21 and the lead 22. The die bonding pad 21 and the lead 22 are made of a conductive material such as copper, for example.

The die bonding pad 21 is for mounting the electronic element 1. The die bonding pad 21 has a tabular shape. The die bonding pad 21 has the placement surface 211 and the back surface 212. The placement surface 211 faces in the direction z1. The back surface 212 faces in the direction z2. The electronic element 1 is placed on the placement surface 211. The heat produced in the electronic element 1 is transferred to the die bonding pad 21. The hole 214 passing through from the placement surface 211 to the back surface 212 is formed in the die bonding pad 21. As shown in FIG. 47, the hole 214 has a shape recessed in the x1 direction from the end of the die bonding pad 21 on the direction x2 side in xy plan view.

The lead 22 has a shape extending linearly from the die bonding pad 21. The lead 22 is for insertion mounting. As shown in FIG. 42, the lead 22 is inserted in the hole 811. The electronic device A20 is thereby mounted on the mounting board 81. In order to fix the lead 22 to the mounting board 81, the hole 811 is filled with the solder 84. As shown in FIGS. 46 to 48, the lead 22 has a joining part 223 and the terminal part 222. In the present embodiment, the joining part 223 and the terminal part 222 are integrally shaped. The joining part 223 is joined to the die bonding pad 21. The joining part 223 has a shape extending in a direction intersecting the placement surface 211. As shown in FIG. 46, the joining part 223 has a region that is located further on the direction z2 side than the back surface 212 of the die bonding pad 21. That is, the tip of the joining part 223 on the direction z2 side is located further on the direction z2 side than the back surface 212 of the die bonding pad 21. The terminal part 222 is connected to the joining part 223. The terminal part 222 extends from the joining part 223 in the direction x1. The terminal part 222 has a region projecting from the resin package 7 which will be discussed later.

The electrode 3 shown in FIGS. 47 and 48 includes the wire bonding pad 31 and the lead 32. The electrode 3 is located, in xy plan view, on the direction x1 side of the die bonding pad 21 and the direction y1 side of the lead 22. The wire bonding pad 31 and the lead 32 are integrally shaped. The wire bonding pad 31 and the lead 32 are made of a conductive material such as copper, for example. The wire bonding pad 31 has a substantially rectangular tabular shape that is smaller than the die bonding pad 21. The lead 32 is connected to the wire bonding pad 31. The lead 32 has a shape extending linearly from the wire bonding pad 31 in the direction x1. The lead 32 is disposed in parallel with the lead 22. The lead 32 has a region projecting from the resin package 7 which will be discussed later. The lead 32 is for insertion mounting. The lead 32 is inserted in the hole 811 as shown in FIG. 42. The electronic device A20 is thereby mounted on the mounting board 81. In order to fix the lead 32 to the mounting board 81, the hole 811 is filled with the solder 84.

The electrode 4 shown in FIGS. 47 and 48 includes the wire bonding pad 41 and the lead 42. The electrode 4 is located, in xy plan view, on the direction x1 side of the die bonding pad 21 and the direction y2 side of the lead 22. The wire bonding pad 41 and the lead 42 are integrally shaped. The wire bonding pad 41 and the lead 42 are made of a conductive material such as copper, for example. The wire bonding pad 41 has a substantially rectangular tabular shape that is smaller than the die bonding pad 21. The lead 42 is connected to the wire bonding pad 41. The lead 42 has a shape extending linearly from the wire bonding pad 41 in the direction x1. The lead 42 is disposed in parallel with the lead 22. The lead 22 is located between the lead 42 and the lead 32. The lead 42 has a region projecting from the resin package 7 which will be discussed later. The lead 42 is for insertion mounting. The lead 42 is inserted in the hole 811 as shown in FIG. 42. The electronic device A20 is thereby mounted on the mounting board 81. In order to fix the lead 42 to the mounting board 81, the hole 811 is filled with the solder 84.

As shown in FIG. 49, the adhesive layer 61 is interposed between the electronic element 1 and the die bonding pad 21. The adhesive layer 61 is for adhering the electronic element 1 to the die bonding pad 21. In the present embodiment, electrical continuity is established between the electronic element 1 and the die bonding pad 21 via the adhesive layer 61. The adhesive layer 61 is silver paste or solder paste, for example.

The heat dissipation member 5 shown in FIGS. 46 to 48 is placed on the opposite side to the side on which the electronic element 1 is placed, with the die bonding pad 21 sandwiched therebetween. That is, the die bonding pad 21 is located between the heat dissipation member 5 and the electronic element 1. The heat dissipation member 5 is located further on the direction x1 side than the hole 214. The heat dissipation member 5 has a substantially rectangular plate-like shape. Since special processing for making a hole is not necessary in forming the heat dissipation member 5, in the case where the heat dissipation member 5 has a substantially rectangular plate-like shape, manufacture of the heat dissipation member 5 is facilitated.

The heat dissipation member 5 is provided in order to quickly release the heat produced in the electronic element 1 to outside of the electronic device A20. In the present embodiment, the heat dissipation member 5 is made of an insulating material such as a ceramic material. Alumina, zirconia and aluminum nitride, for example, are given as such a ceramic material.

The heat dissipation member 5 has surfaces 5a and 5b. The surface 5a faces in the direction z1. The surface 5b faces in the direction z2. The surface 5a is joined to the die bonding pad 21.

The joining layer 63 shown in FIG. 49 is silver paste, for example. The joining layer 63 is interposed between the surface 5a and the die bonding pad 21. The joining layer 63 joins the surface 5a and the die bonding pad 21.

As shown in FIGS. 42 to 46, the resin package 7 covers the electronic element 1, the electrodes 2 to 4 and the heat dissipation member 5. The resin package 7 is made of a black epoxy resin, for example. As shown in FIG. 43, the resin package 7 has the first surface 71 and the second surface 72. The first surface 71 has the flat surface 715 and the tapered surface 716. The flat surface 715 is amounting surface for mounting the electronic device A20 on the mounting board 81. As shown in FIGS. 45 and 46, the surface 5b of the heat dissipation member 5 is exposed from the flat surface 715. The flat surface 715 is flush with the surface 5b. The flat surface 715 need not necessarily be flush with the surface 5b. For example, the heat dissipation member 5 may project slightly from the flat surface 715. As shown in FIG. 42, the flat surface 715 and the surface 5b are directly opposite the heat sink 82. The grease 89 for heat dissipation may be interposed between the surface 5b and the heat sink 82. Alternatively, although not illustrated, the heat sink 82 may contact the surface 5b. These configurations are preferable from the viewpoint of improving the heat dissipation of the electronic device A20. The tapered surface 716 is connected to the flat surface 715. The tapered surface 716 has a shape that extends outwardly in an xy plane moving in the direction z1.

As shown in FIG. 43, the second surface 72 has a plurality of flat surfaces 725 and a plurality of tapered surfaces 726. Each tapered surface 726 is connected to a different one of the plurality of flat surfaces 725. Each tapered surface 726 has a shape that extends outwardly in an xy plane moving in the direction z2. Each tapered surface 726 is connected to the tapered surface 716 on the boundary 73. As shown in FIG. 44, the pin mark 721 that is recessed from one of the plurality of flat surfaces 725 is formed in the resin package 7. The screw hole 78 is formed in the resin package 7. As shown in FIG. 42, the screw 83 for fixing the electronic device A20 to the heat sink 82 is inserted in the screw hole 78.

The two pieces of wire 69 shown in FIG. 47 are made of a metal such as aluminum, for example. One of the two pieces of wire 69 is joined to the electronic element 1 and the wire bonding pad 31. Electrical continuity is thereby established between the electronic element 1 and the wire bonding pad 31. The other of the two pieces of wire 69 is joined to the electronic element 1 and the wire bonding pad 41. Electrical continuity is thereby established between the electronic element 1 and the wire bonding pad 41. In the case where the electronic element 1 is a diode rather than a transistor, the wire 69 does not need to be bonded to both the wire bonding pads 31 and 41. In this case, the wire 69 need only be bonded to one of the wire bonding pads 31 and 41.

The plating layer 62 shown in FIGS. 42 and 46 covers the region of each of the leads 22, 32 and 42 that projects from the resin package 7. The plating layer 62 is made of an alloy of tin, silver and copper, for example.

Next, a manufacturing method for the electronic device A20 will be described using FIGS. 50 to 53.

Figure 50:
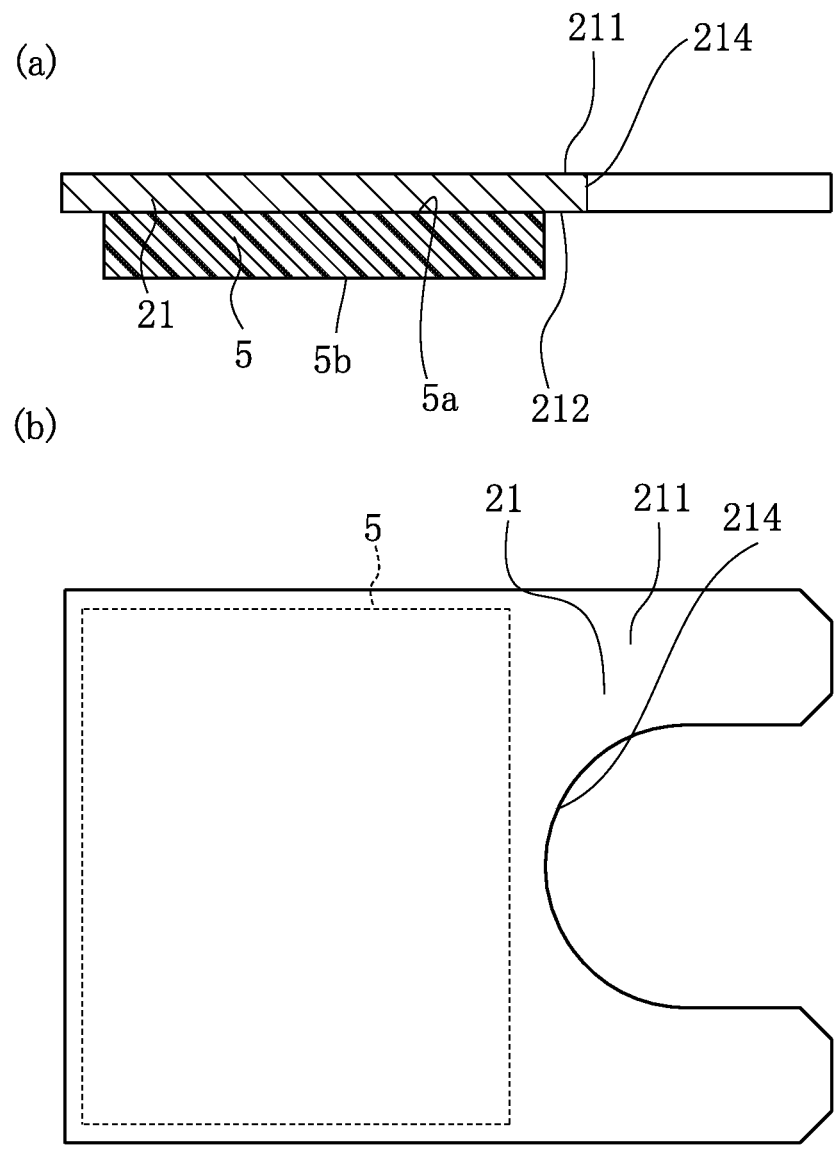
FIG. 50(a) is a front view in one process of manufacturing processes of the electronic device according to the second embodiment of the present invention.
FIG. 50(b) is a plan view of the configuration shown in FIG. 50(a).
Figure 51:
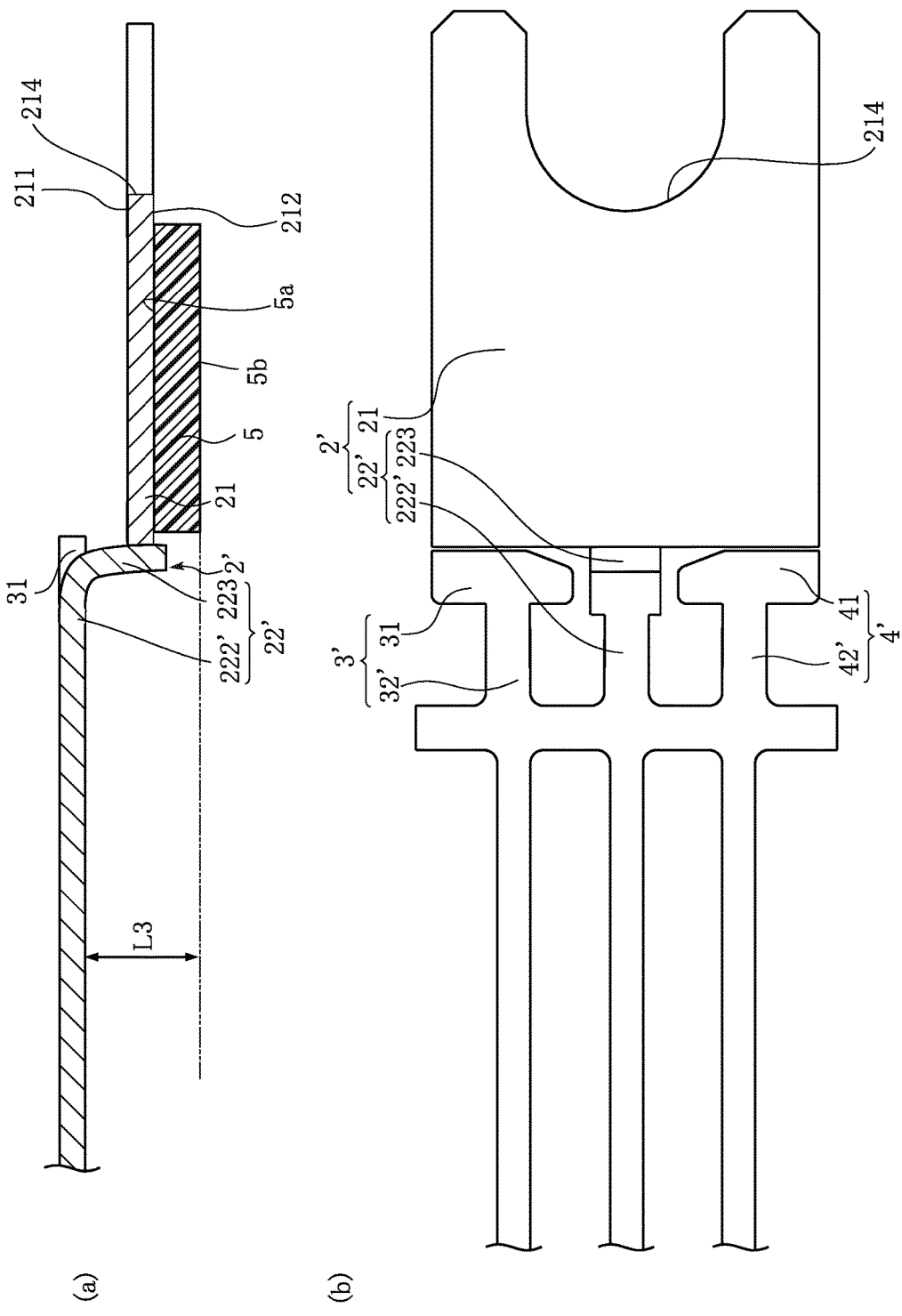
FIG. 51(a) is a front view in one process of manufacturing processes of the electronic device according to the second embodiment of the present invention.
FIG. 51(b) is a plan view of the configuration shown in FIG. 51(a).

First, as shown in FIG. 50, the die bonding pad 21 and the heat dissipation member 5 are readied. Next, the die bonding pad 21 is joined to the surface 5*a* of the heat dissipation member 5 via the joining layer 63 (see FIG. 49; omitted in FIG. 50). Next, as shown in FIG. 51, the lead 22' is joined to the die bonding pad 21 by welding, for example. Joining of the die bonding pad 21 to the lead 22' is performed in a state in which a terminal part 222' of the lead 22' is separated from the surface 5*b* of the heat dissipation member 5 by a distance L3 in the direction z. The electrodes 3' and 4' are placed around the lead 22'.

Figure 52:
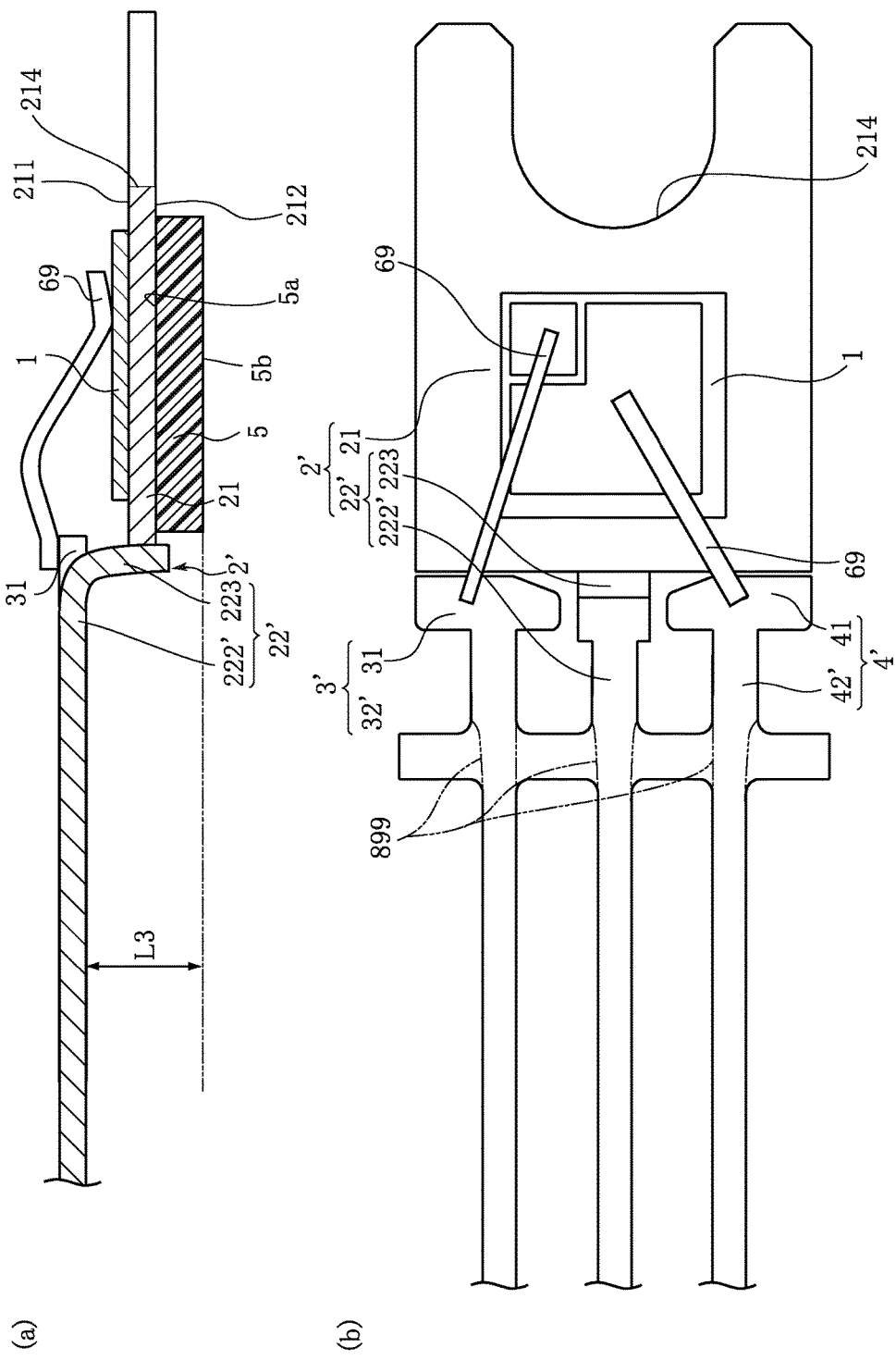
FIG. 52(a) is a front view in one process of manufacturing processes of the electronic device according to the second embodiment of the present invention.
FIG. 52(b) is a plan view of the configuration shown in FIG. 52(a).

Next, as shown in FIG. 52, the electronic element 1 is placed on the die bonding pad 21 via the adhesive layer 61 (see FIG. 49; omitted in FIG. 52). The position in which the electronic element 1 is placed is on the opposite side to the heat dissipation member 5 with the die bonding pad 21 sandwiched therebetween.

Figure 53:
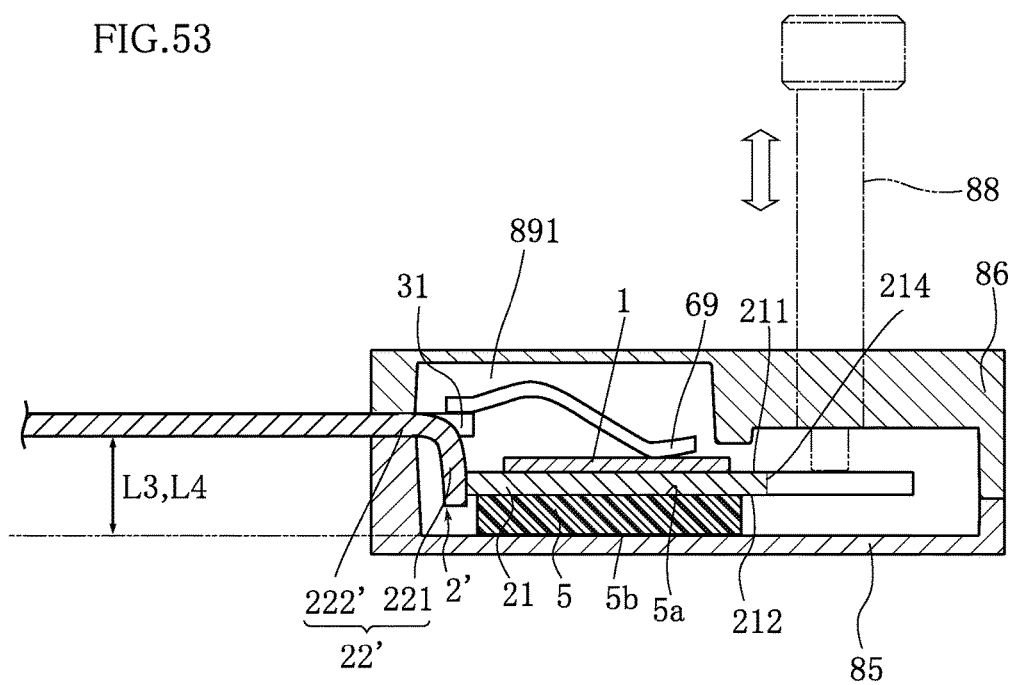
FIG. 53 is a cross-sectional view in one process of manufacturing processes of the electronic device according to the second embodiment of the present invention.

Next, the wire 69 is joined to the electronic element 1 and the wire bonding pad 31 of the electrode 3'. Similarly, the wire 69 is joined to the electronic element 1 and the wire bonding pad 41 of the electrode 4'. Joining of the wire 69 is performed as described in the first embodiment Next, as shown in FIG. 53, the leads 22', 32' and 42' (FIG. 53 shows only the lead 22') are sandwiched by the dies 85 and 86. The dies 85 and 86 are fixed to the leads 22', 32' and 42' in the state in which the dies 85 and 86 are sandwiching the leads 22', 32' and 42'. Also, the die bonding pad 21 is fixed to the dies 85 and 86 using the pin 88. The die 85 abuts the surface 5*b* of the heat dissipation member 5. A clearance L4 between a surface of the die 85 that abuts the surface 5*b* and a region of the die 85 that abuts the terminal part 222' in the direction z is substantially the same as the above-mentioned distance L3. The space 891 enclosed by the dies 85 and 86 is formed, when the leads 22', 32' and 42' are sandwiched by the dies 85 and 86. The space 891 houses the die bonding pad 21, the electronic element 1 and the like.

Next, resin is poured into the space 891. Next, the pin 88 is moved away slightly from the die bonding pad 21. Resin then enters between the die bonding pad 21 and the pin 88. Thereafter, the dies 85 and 86 are removed from the resin package 7 after the resin has completely hardened. This results in the above-mentioned resin package 7 shown in FIGS. 43 to 46 being formed. The surface of the resin package 7 formed by the die 85 serves as the above-mentioned first surface 71. On the other hand, the surface of the resin package 7 formed by the die 86 serves as the above-mentioned second surface 72. The region of the resin package 7 in which the pin 88 is inserted serves as the above-mentioned pin mark 721. Thereafter, the electronic device A20 is manufactured by processing such as sectioning the leads 22', 32' and 42' along the line 899 shown in FIG. 52.

Next, advantages of the present embodiment will be described.

The electronic device A20 is provided with the heat dissipation member 5. Thus, the heat transferred from the electronic element 1 to the die bonding pad 21 can be conducted to the heat sink 82 via the heat dissipation member 5. Therefore, the heat transferred from the electronic element 1 to the die bonding pad 21 is readily transferred to the heat sink 82. Accordingly, the electronic device A20 is suitable for suppressing the electronic element 1 from reaching an excessively high temperature. That is, the electronic device A20 has excellent heat dissipation characteristics.

In the electronic device A20, the surface 5*b* of the heat dissipation member 5 is exposed from the flat surface 715 of the resin package 7. Thus, heat can be transferred from the heat dissipation member 5 to the heat sink 82, without passing through the resin package 7. Heat is thereby quickly transferred from the heat dissipation member 5 to the heat sink 82. Therefore, the electronic device A20 is even more suitable for suppressing the electronic element 1 from reaching an excessively high temperature. That is, the electronic device A20 has particularly excellent heat dissipation characteristics.

In the manufacturing method according to the present embodiment, the lead 22' is joined to the die bonding pad 21 as shown in FIG. 51, after joining the heat dissipation member 5 to the die bonding pad 21 as shown in FIG. 50. Thus, even when there is variation in the thickness (size in the direction z) of the heat dissipation member 5, the clearance L3 in the direction z between the surface 5*b* of the heat dissipation member 5 and terminal part 222' of the lead 22' can be made substantially constant. The clearance L3 can thereby be made substantially the same as the clearance L4 of the die 85 shown in FIG. 53. Assume hypothetically that L3<L4. In this case, the die 85 abuts the terminal part 222' of the lead 22'. But a gap occurs between the die 85 and the surface 5*b* due to the die 85 not abutting the surface 5*b* of the heat dissipation member 5. With the gap remaining between the die 85 and the surface 5*b*, the surface 5*b* cannot be exposed from the resin package 7. Also, assume hypothetically that L3>L4. In this case, the die 85 abuts the surface 5*b* of the heat dissipation member 5. But a gap occurs between the die 85 and the terminal part 222', due to the die 85 not abutting the terminal part 222' of the lead 22'. With the gap remaining between the die 85 and the terminal part 222', the resin package 7 cannot be formed since resin flows out of the space 891. On the other hand, with the method of the present embodiment, the clearance L3 and the clearance L4 can be made substantially the same, and thus the die 85 can be reliably abutted against both the surface 5*b* and the terminal part 222' of the lead 22', when the lead 22' is sandwiched by the dies 85 and 86. Accordingly, the method according to the present embodiment is suitable for reliably manufacturing a device in which the surface 5*b* is exposed from the resin package 7.

In the electronic device A20, the heat dissipation member 5 is made of a ceramic material. The heat dissipation member 5 made of a ceramic material tends to vary in thickness between heat dissipation members 5. Even in such a case, the clearance L3, in the direction z, between the surface 5b and the terminal part 222' can be made substantially the same as the clearance L4, when the lead 22' is joined to the die bonding pad 21 after joining the heat dissipation member 5 to the die bonding pad 21. Accordingly, the method according to the present embodiment is more favorable in reliably manufacturing a device in which the surface 5b is exposed from the resin package 7 in the case where the heat dissipation member 5 is made of a ceramic material.

Hereinafter, variations of the present embodiment will be shown. In the following variations, the same reference signs as the above embodiment are given to constituent elements that are the same as or similar to the above embodiments.

<First Variation>

Figure 55:
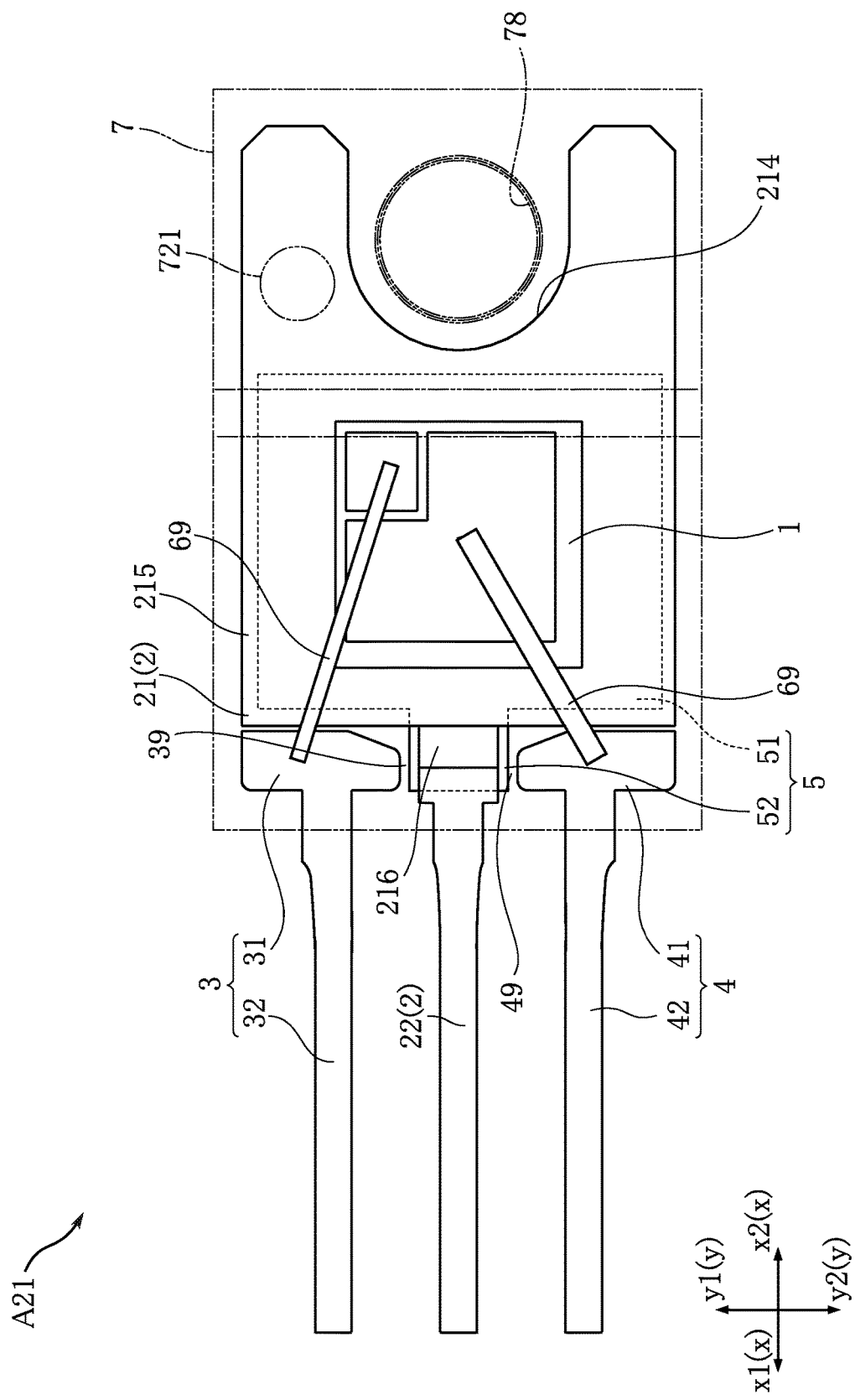
FIG. 55 is a plan view (partially see through) of the electronic device according to the first variation of the second embodiment of the present invention.
Figure 56:
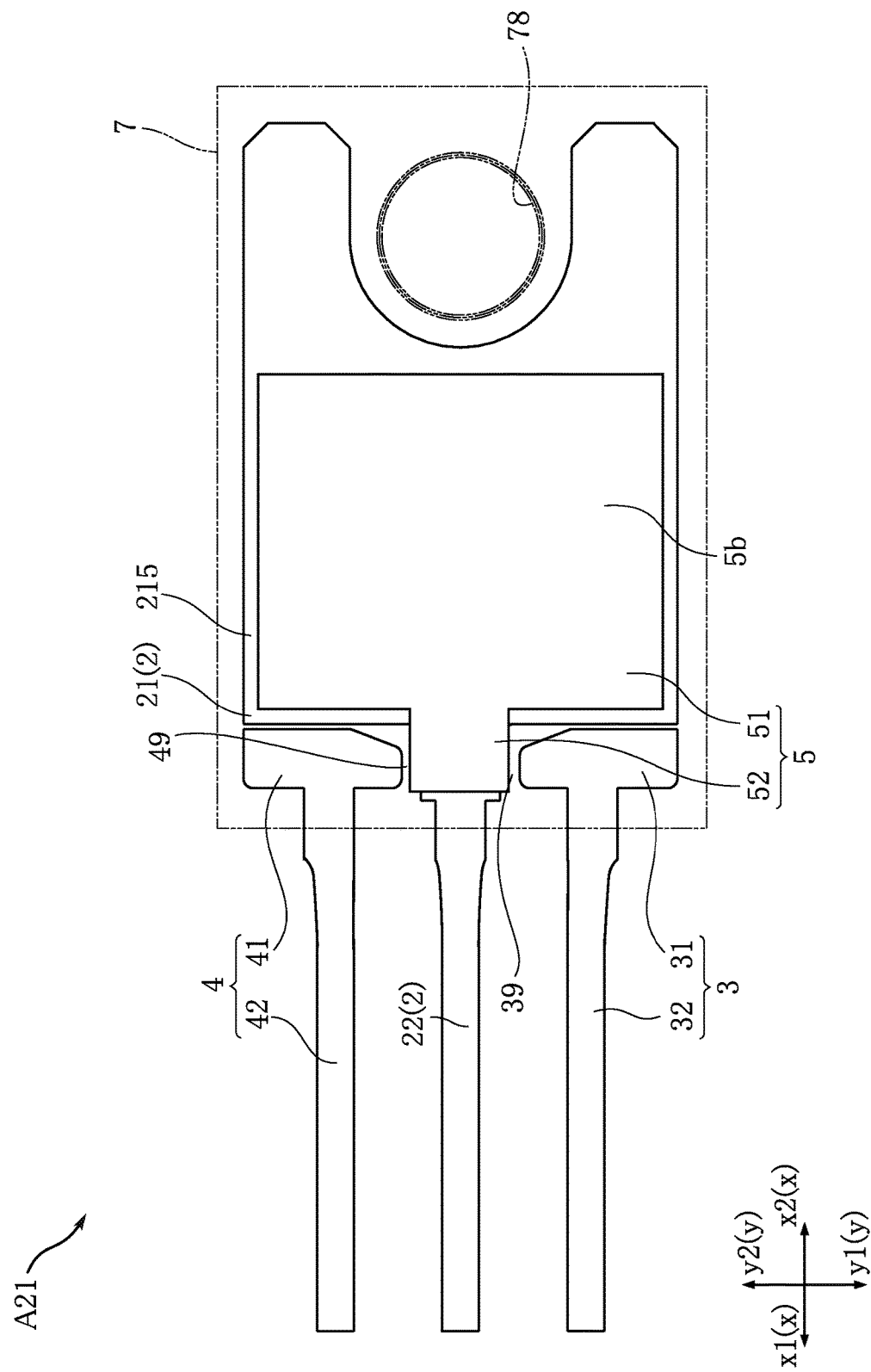
FIG. 56 is a bottom view (partially see through) of the electronic device according to the first variation of the second embodiment of the present invention.

Next, a first variation of the electronic device of the present embodiment will be described using FIGS. 54 to 56.

Figure 54:
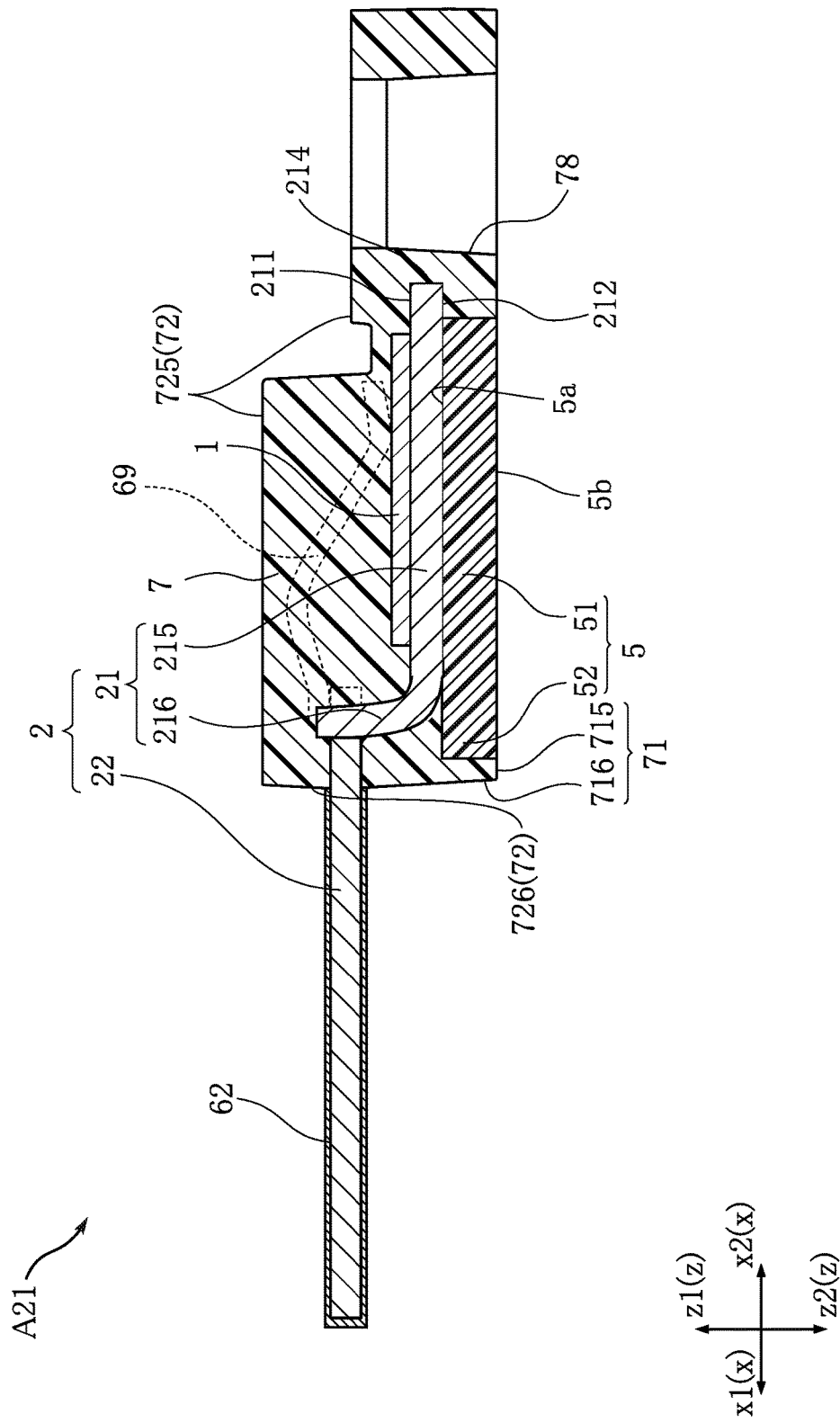
FIG. 54 is a cross-sectional view of an electronic device according to a first variation of the second embodiment of the present invention.

FIG. 54 is a cross-sectional view of an electronic device according to this variation. FIG. 55 is a plan view (partially see through) of the electronic device according to this variation. FIG. 56 is a bottom view (partially see through) of the electronic device according to this variation.

An electronic device A21 shown in these diagrams is, similarly to the electronic device A20, provided with the electronic element 1, the electrodes 2 to 4, the heat dissipation member 5, the adhesive layer 61 (see FIG. 49; illustration omitted in this variation), the plating layer 62, the joining layer 63 (see FIG. 49; illustration omitted in this variation), the two pieces of wire 69 and the resin package 7. The electronic device A21 differs from the electronic device A20 in the configuration of the electrode 2 and the shape of the heat dissipation member 5. Since the respective configurations of the electronic element 1, the electrodes 3 and 4, the adhesive layer 61, the plating layer 62, the joining layer 63, the wire 69 and the resin package 7 in the electronic device A21 are similar to the configurations of the electronic device A20, description thereof will be omitted.

The electrode 2 includes the die bonding pad 21 and the lead 22. In this variation, the die bonding pad 21 has a plate-like part 215 and an extension part 216. The plate-like part 215 has a substantially rectangular plate-like shape. The extension part 216 extends from the plate-like part 215 in a direction intersecting the placement surface 211. More specifically, the extension part 216 extends from the direction z2 side in a direction toward the direction z1 side. The plate-like part 215 and the extension part 216 are integrally shaped. The lead 22 has a linear shape extending in the direction x1. The lead 22 is joined to the extension part 216. As shown in FIG. 54, the extension part 216 has a region located further on the direction z1 side than the lead 22. That is, the tip of the extension part 216 on the direction z1 side is located further on the direction z1 side than the lead 22.

In this variation, the heat dissipation member 5 includes the tabular part 51 and the projecting part 52. The tabular part 51 has a substantially rectangular plate-like shape. As shown in FIGS. 55 and 56, the tabular part 51 overlaps with the die bonding pad 21 in xy plan view. The projecting part 52 projects in the direction x1 from the tabular part 51. The projecting part 52 overlaps with the lead 22 in xy plan view. In this variation, the gap 39 is formed between the projecting part 52 and the wire bonding pad 31. Similarly, the gap 49 is formed between the projecting part 52 and the wire bonding pad 41. The tip of the projecting part 52 on the direction x1 side is located further on the direction x1 side than the end surface of the plate-like part 215.

Next, advantages of this variation will be described.

In the electronic device A21, the heat dissipation member 5 includes the projecting part 52 projecting from the tabular part 51. The configuration in which the heat dissipation member 5 includes the projecting part 52 is suitable for enlarging the area of the heat dissipation member 5 in xy plan view. Thus, according to the electronic device A21, heat is readily transferred from the die bonding pad 21 to the heat sink 82 via the heat dissipation member 5.

In the electronic device A21, the gap 39 is formed between the projecting part 52 and the wire bonding pad 31 in xy plan view. According to such a configuration, the region where the projecting part 52 overlaps with the wire bonding pad 31 in xy plan view can be reduced in size. At the time of joining the wire 69 to the wire bonding pad 31, a heater which is not illustrated is placed on the direction z2 side of the wire bonding pad 31. Placement of the heater is facilitated when the region where the projecting part 52 and the wire bonding pad 31 overlap in xy plan view is small. Accordingly, the electronic device A21 enables the wire 69 to be readily joined to the wire bonding pad 31. For a similar reason, the electronic device A21 enables the wire 69 to be readily joined to the wire bonding pad 41.

<Second Variation>

Next, a second variation of the electronic device of the present embodiment will be described using FIGS. 57 to 60.

Figure 57:
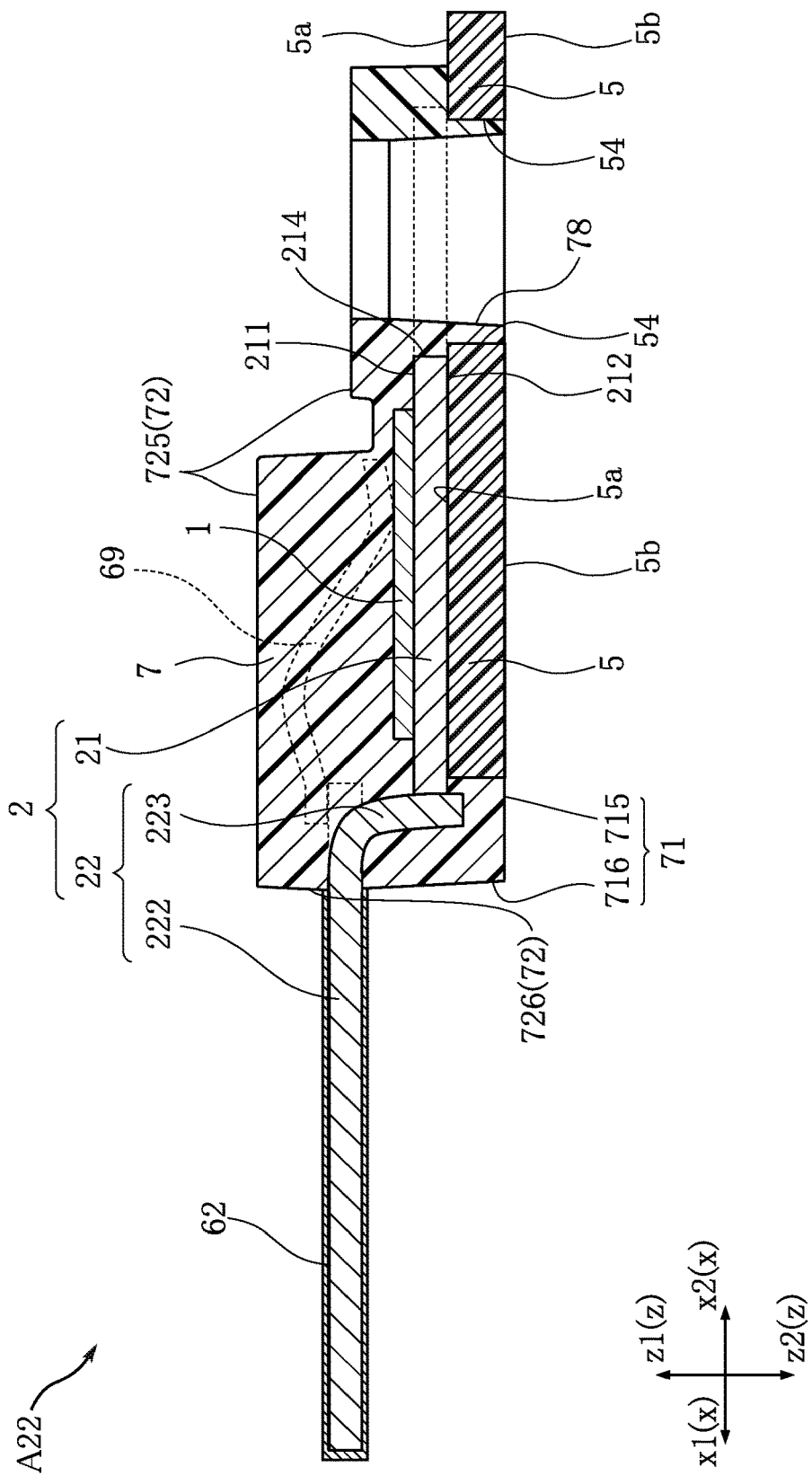
FIG. 57 is a cross-sectional view of an electronic device according to a second variation of the second embodiment of the present invention.
Figure 58:
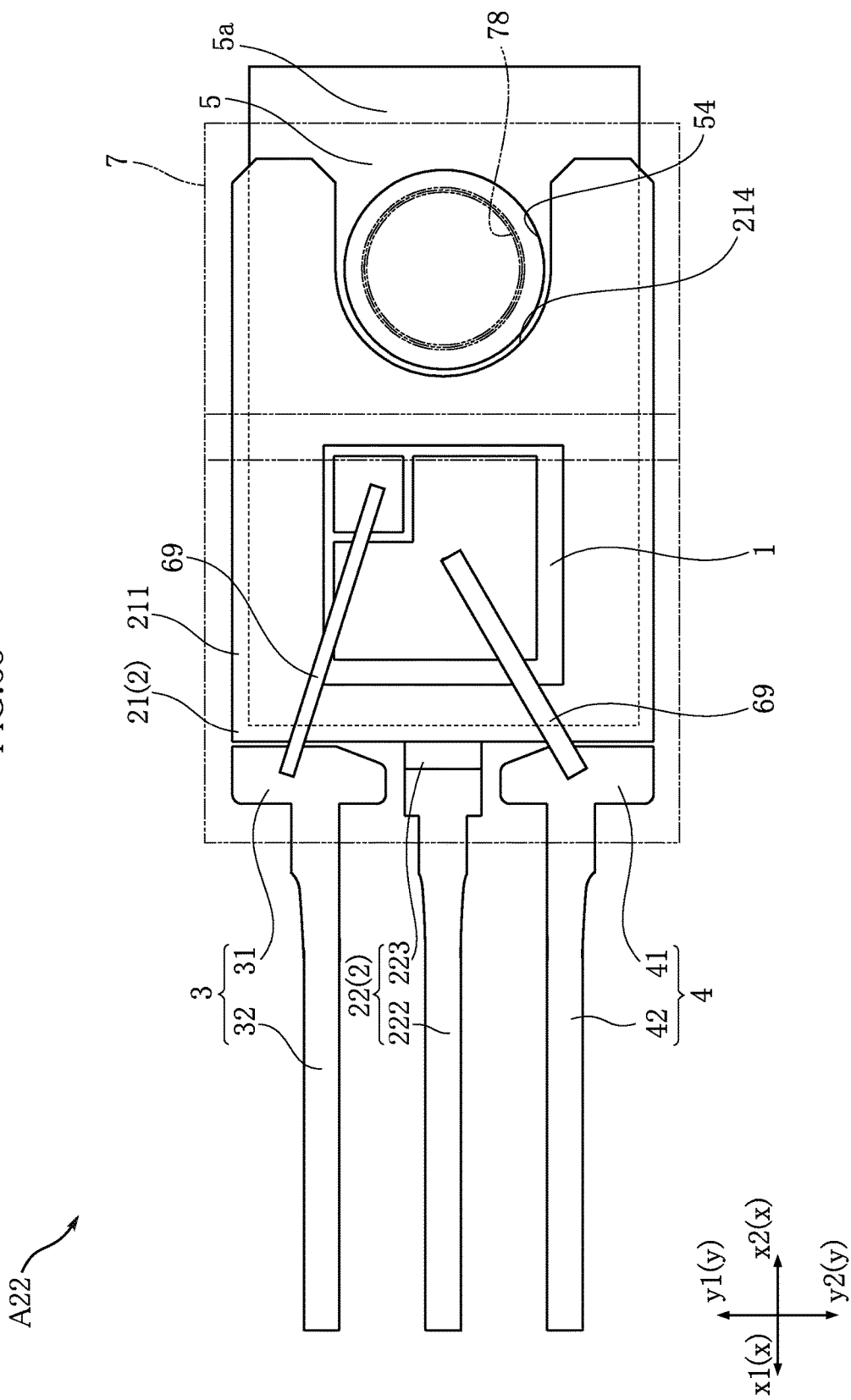
FIG. 58 is a plan view (partially see through) of the electronic device according to the second variation of the second embodiment of the present invention.
Figure 59:
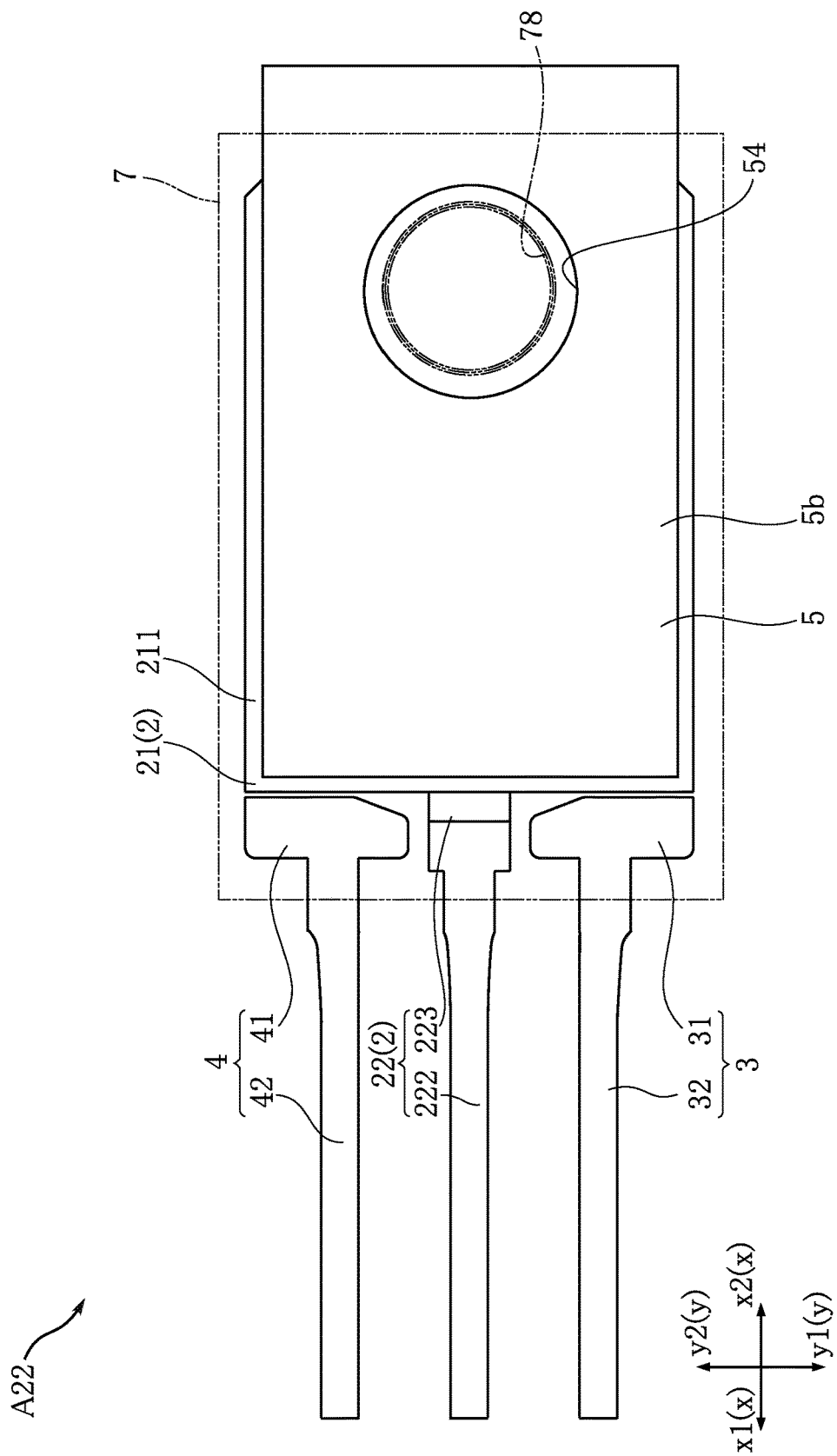
FIG. 59 is a bottom view (partially see through) of the electronic device according to the second variation of the second embodiment of the present invention.

FIG. 57 is a cross-sectional view of an electronic device according to this variation. FIG. 58 is a plan view (partially see through) of the electronic device according to this variation. FIG. 59 is a bottom view (partially see through) of the electronic device according to this variation.

An electronic device A22 shown in these diagrams is, similarly to the electronic device A20, provided with the electronic element 1, the electrodes 2 to 4, the heat dissipation member 5, the adhesive layer 61 (see FIG. 49; illustration omitted in this variation), the plating layer 62, the joining layer 63 (see FIG. 49; illustration omitted in this variation), the two pieces of wire 69 and the resin package 7. The electronic device A22 differs from the electronic device A20 in the shape of the heat dissipation member 5. Since the respective configurations of the electronic element 1, the electrodes 2 to 4, the adhesive layer 61, the plating layer 62, the joining layer 63, the wire 69 and the resin package 7 in the electronic device A22 are similar to the configurations of the electronic device A20, description thereof will be omitted. The heat dissipation member 5 has a rectangular plate-like shape in outline. The circular screw hole 54 for inserting a screw is formed in the heat dissipation member 5. The screw hole 54 overlaps with the hole 214 formed in the die bonding pad 21 in xy plan view. As shown in FIG. 58, the heat dissipation member 5 has a region located further on the direction x2 side than the die bonding pad 21. In this variation, the heat dissipation member 5 further has a region that protrudes from the resin package 7 on the direction x2 side in xy plan view.

In the electronic device A22, the heat dissipation member 5 has a region located further on the direction x2 side than the die bonding pad 21. This configuration is suitable for enlarging the area of the heat dissipation member 5 in xy plan view. Thus, according to the electronic device A22, heat is readily transferred from the die bonding pad 21 to the heat sink 82 via the heat dissipation member 5.

In the electronic device A22, the heat dissipation member 5 has a region that protrudes from the resin package 7 on the direction x2 side in xy plan view. This configuration is suitable for enlarging the area of the heat dissipation member 5 in xy plan view. Thus, according to the electronic device A22, heat is readily transferred from the die bonding pad 21 to the heat sink 82 via the heat dissipation member 5.

Figure 60:
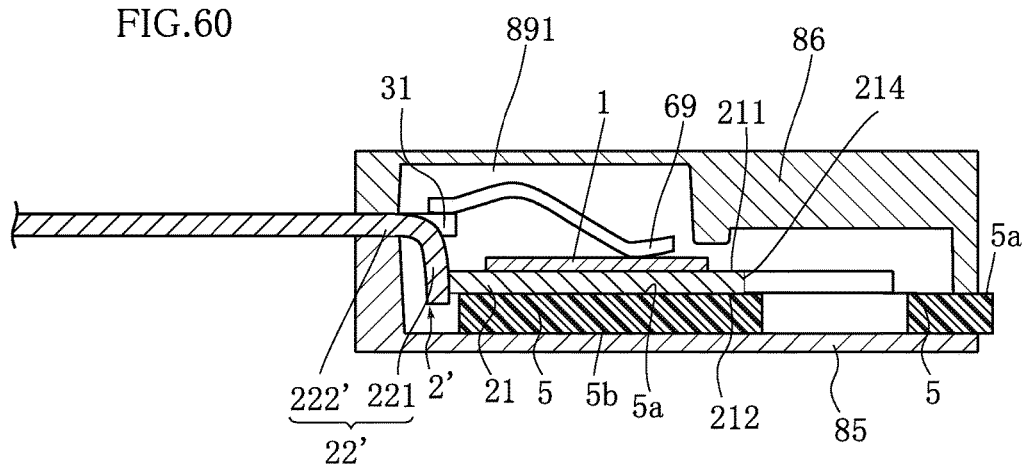
FIG. 60 is a cross-sectional view in one process of manufacturing processes of the electronic device according to the second variation of the second embodiment of the present invention.

In the electronic device A22, the heat dissipation member 5 has a region that protrudes from the resin package 7 on the direction x2 side in xy plan view. In order to manufacture such an electronic device A22, the dies 85 and 86 shown in FIG. 60 are used. In the case of using the dies 85 and 86 shown in this diagram, the dies 85 and 86 sandwich the heat dissipation member 5. Thus, the pin 88 shown in FIG. 53 does not need to be used. If the pin 88 is not used, the time and effort needed to move the pin 88 can be cut. Thus, the electronic device A22 is suitable for achieving simplification and increased efficiency of the manufacturing process.

Note that the heat dissipation member 5 in this variation may be a configuration provided with the tabular part 51 and the projecting part 52 of the electronic device A21.

<Third Variation>

Figure 62:
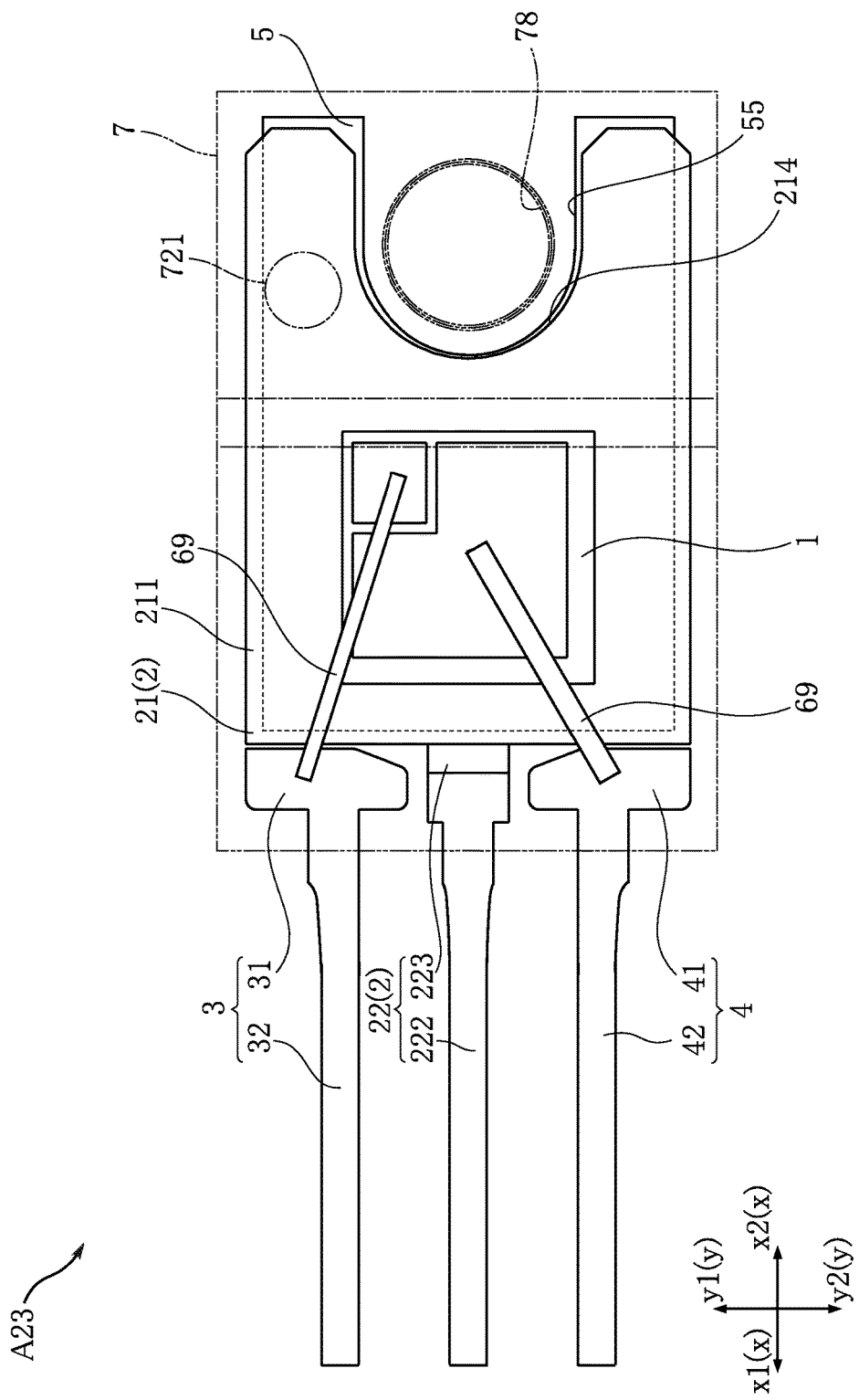
FIG. 62 is a plan view (partially see through) of the electronic device according to the third variation of the second embodiment of the present invention.
Figure 63:
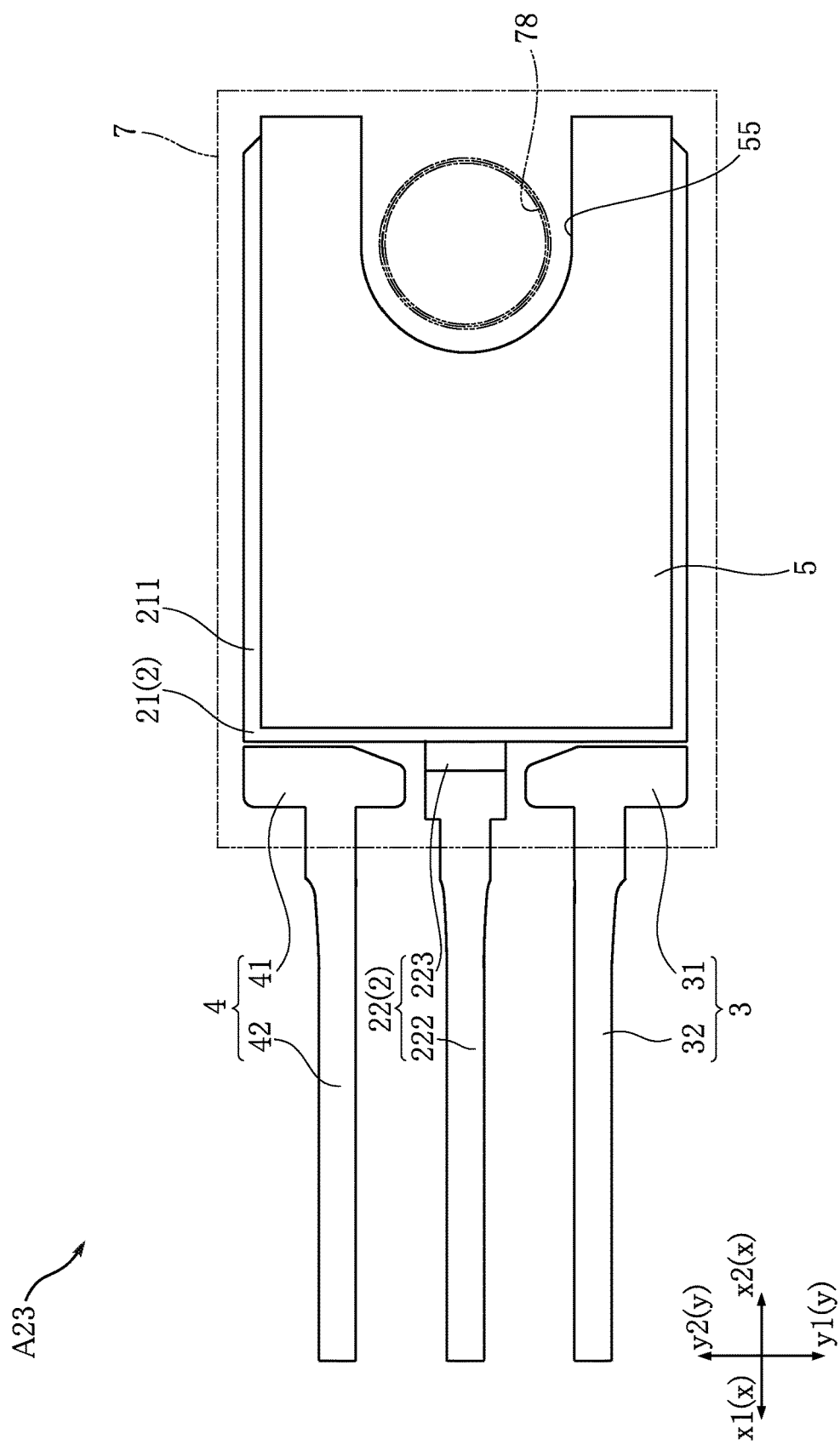
FIG. 63 is a bottom view (partially see through) of the electronic device according to the third variation of the second embodiment of the present invention.

Next, a third variation of the electronic device of the present embodiment will be described using FIGS. 61 to 63.

Figure 61:
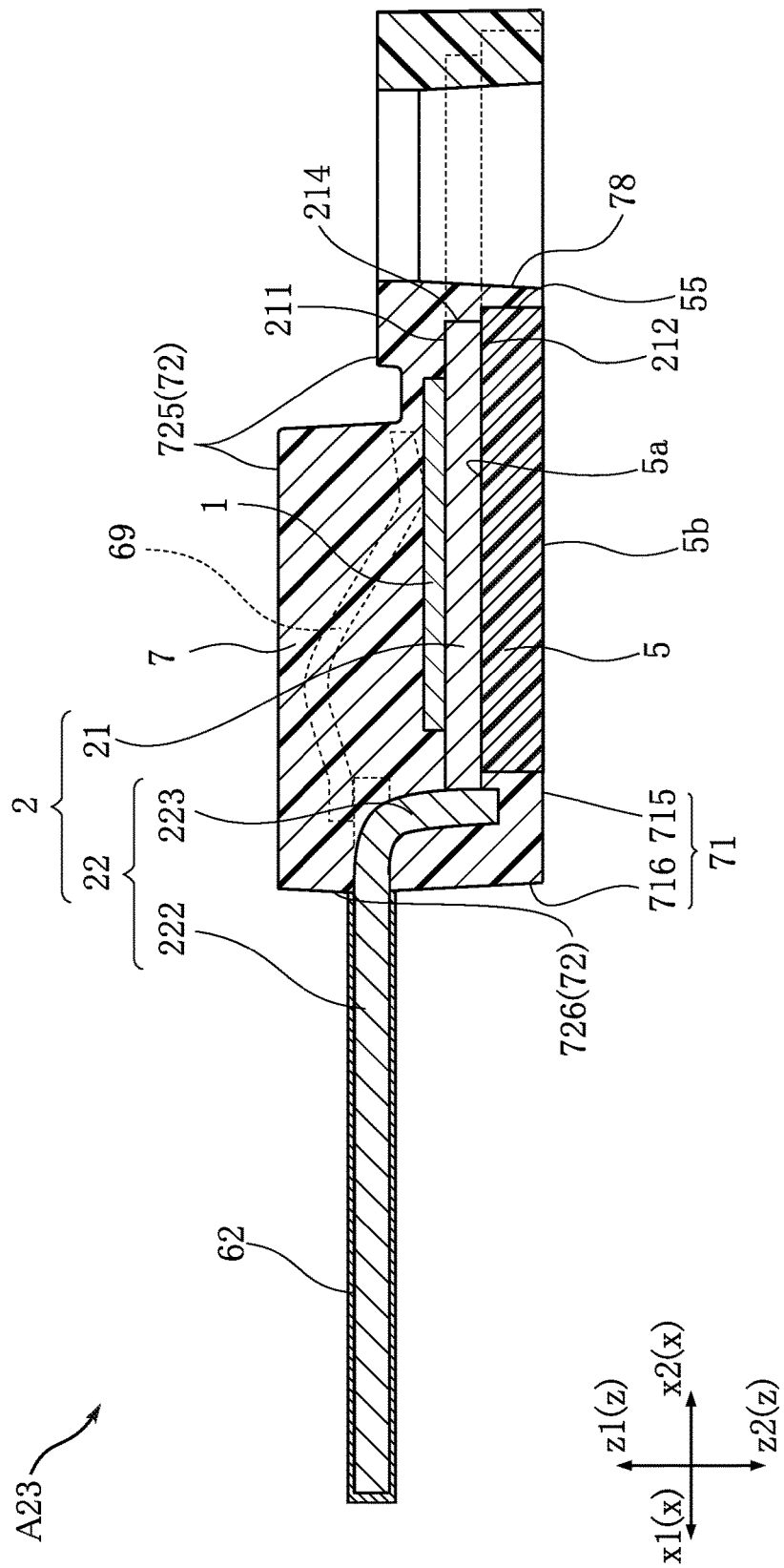
FIG. 61 is a cross-sectional view of an electronic device according to a third variation of the second embodiment of the present invention.

FIG. 61 is a cross-sectional view of an electronic device according to this variation. FIG. 62 is a plan view (partially see through) of the electronic device according to this variation. FIG. 63 is a bottom view (partially see through) of the electronic device according to this variation.

An electronic device A23 shown in these diagrams is, similarly to the electronic device A20, provided with the electronic element 1, the electrodes 2 to 4, the heat dissipation member 5, the adhesive layer 61 (see FIG. 49; illustration omitted in this variation), the plating layer 62, the joining layer 63 (see FIG. 49; illustration omitted in this variation), the two pieces of wire 69 and the resin package 7. The electronic device A23 differs from the electronic device A20 in the shape of the heat dissipation member 5. Since the respective configurations of the electronic element 1, the electrodes 2 to 4, the adhesive layer 61, the plating layer 62 and the resin package 7 in the electronic device A23 are similar to the configurations of the electronic device A20, description thereof will be omitted.

The recessed portion 55 recessed on the direction x1 side from the end in the direction x2 is formed in the heat dissipation member 5. The recessed portion 55 is open on the direction x2 side. In xy plan view, the recessed portion 55 overlaps with the hole 214 in the die bonding pad 21. As shown in FIG. 62, the heat dissipation member 5 has a region located further on the direction x2 side than the die bonding pad 21.

The electronic device A23 is suitable for enlarging the area of the heat dissipation member 5 in xy plan view. Thus, according to the electronic device A23, heat is readily transferred from the die bonding pad 21 to the heat sink 82 via the heat dissipation member 5.

Note that the heat dissipation member 5 in this variation may be a configuration provided with the tabular part 51 and the projecting part 52 of the electronic device A21.

<Fourth Variation>

Figure 65:
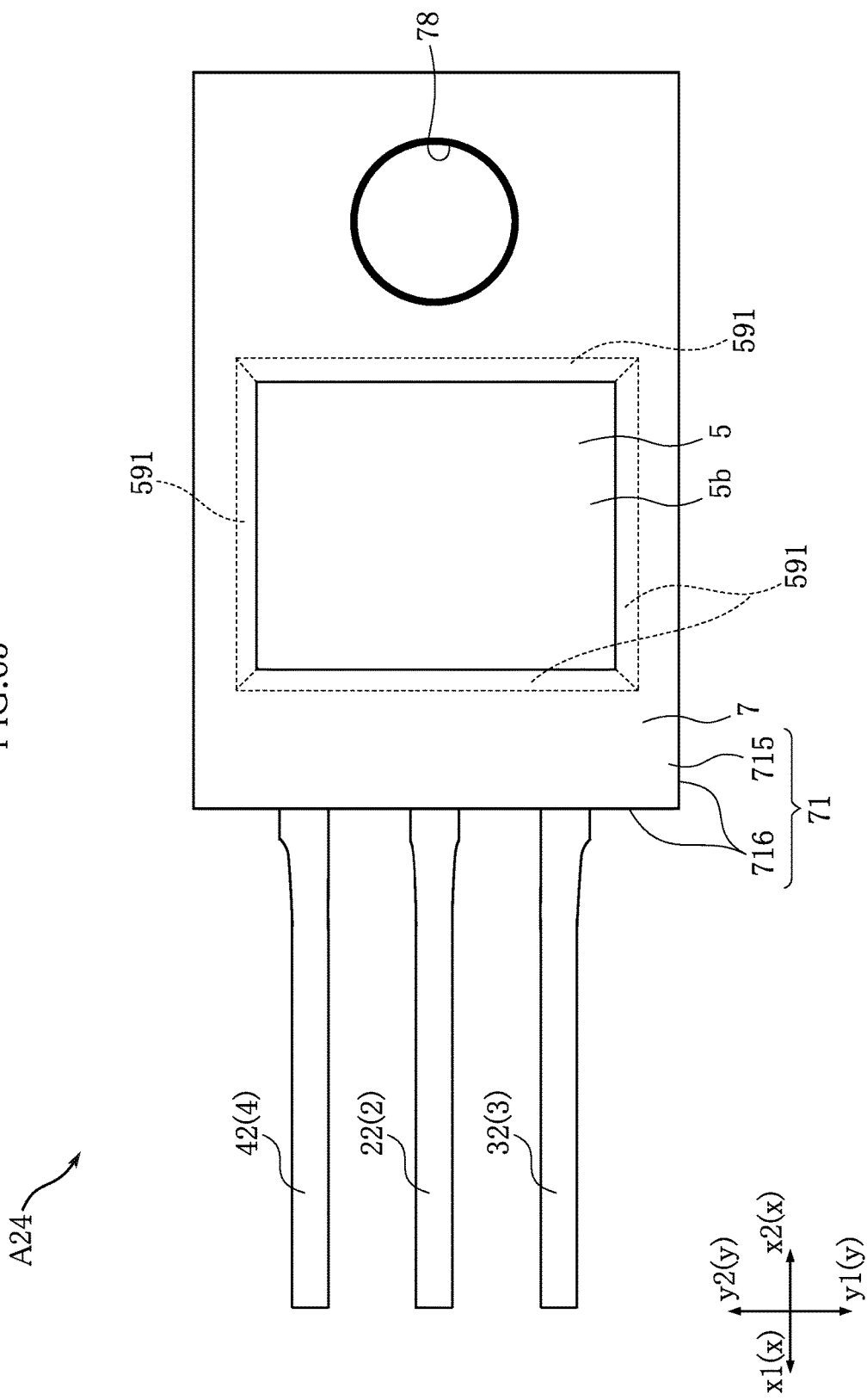
FIG. 65 is a bottom view of the electronic device according to the fourth variation of the second embodiment of the present invention.
Figure 66:
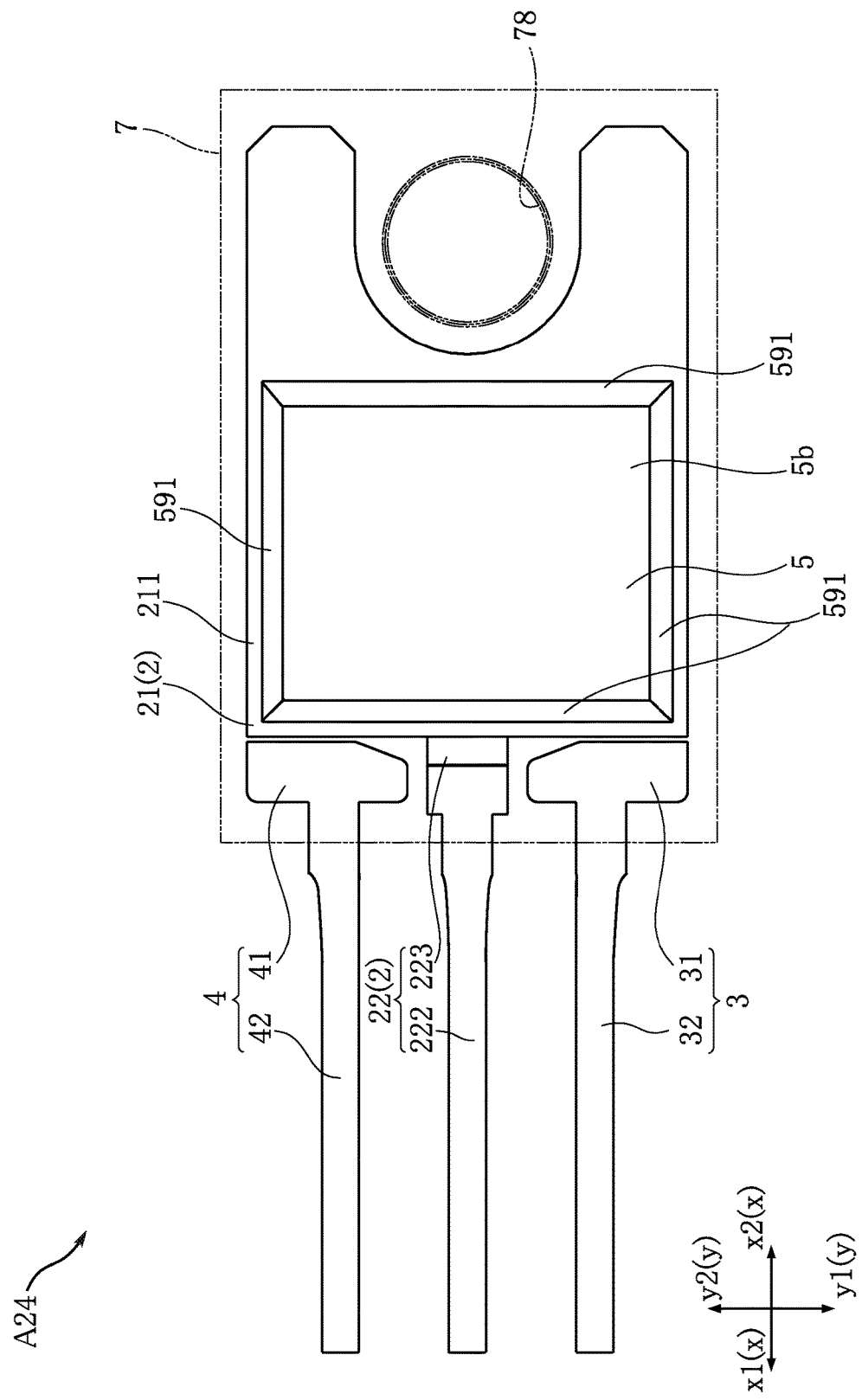
FIG. 66 is a bottom view (partially see through) of the electronic device according to the fourth variation of the second embodiment of the present invention.

Next, a fourth variation of the electronic device of the present embodiment will be described using FIGS. 64 to 66.

Figure 64:
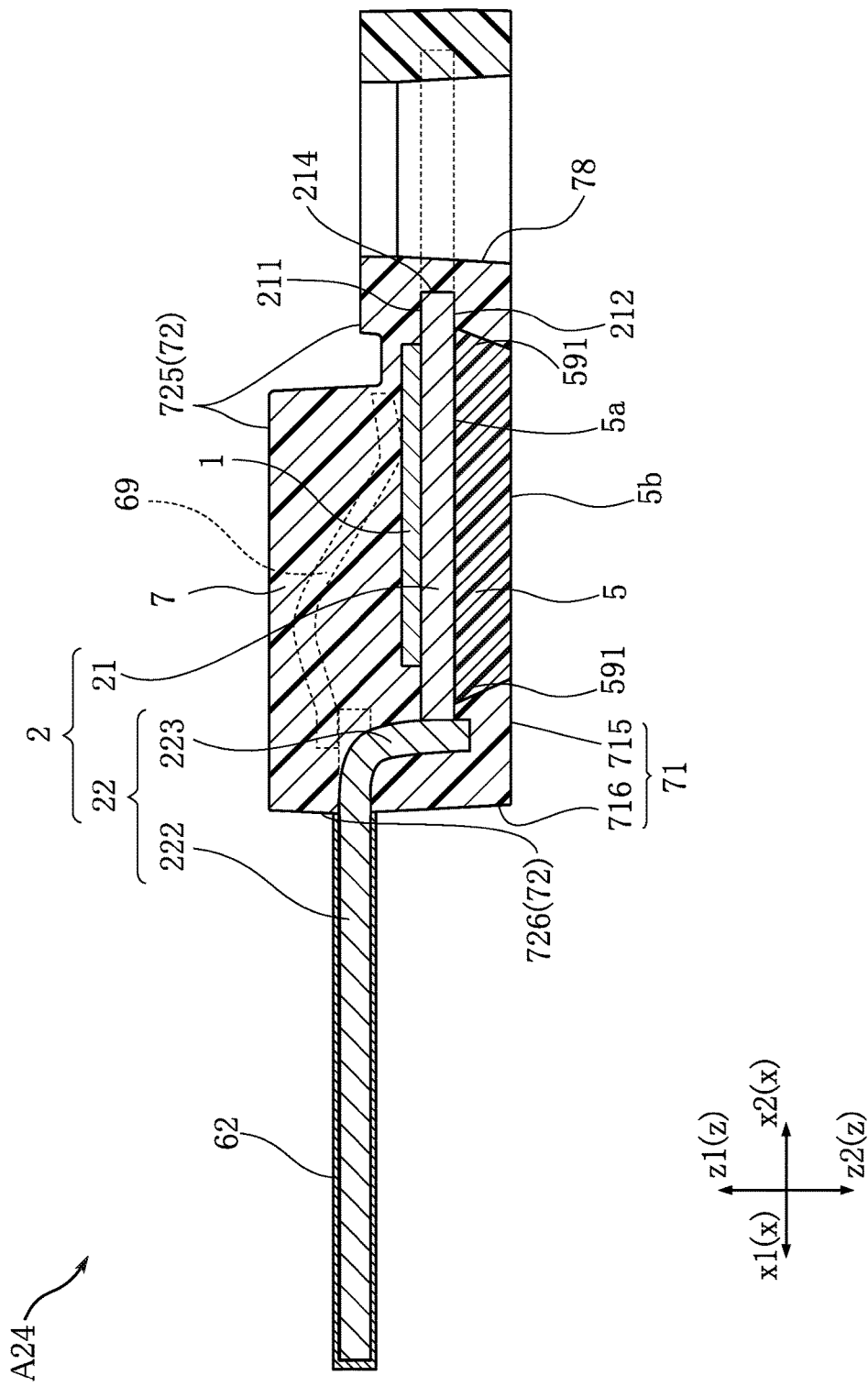
FIG. 64 is a cross-sectional view of an electronic device according to a fourth variation of the second embodiment of the present invention.

FIG. 64 is a cross-sectional view of an electronic device according to this variation. FIG. 65 is a bottom view of the electronic device according to this variation. FIG. 66 is a bottom view (partially see through) of the electronic device according to this variation.

An electronic device A24 shown in these diagrams is, similarly to the electronic device A20, provided with the electronic element 1, the electrodes 2 to 4, the heat dissipation member 5, the adhesive layer 61 (see FIG. 49; illustration omitted in this variation), the plating layer 62, the joining layer 63 (see FIG. 49; illustration omitted in this variation), the two pieces of wire 69 and the resin package 7. The electronic device A24 differs from the electronic device A20 in the shape of the heat dissipation member 5. Since the respective configurations of the electronic element 1, the electrodes 2 to 4, the adhesive layer 61, the plating layer 62 and the joining layer 63 in the electronic device A24 are similar to the configurations of the electronic device A20, description thereof will be omitted.

In this variation, the heat dissipation member 5 has a truncated quadrangular pyramid shape. The heat dissipation member 5 includes a dropout prevention part 591. The dropout prevention part 591 is a portion that protrudes from the surface 5*b* of the heat dissipation member 5 in xy plan view. That is, the dropout prevention part 591 is a portion that does not overlap with the surface 5*b* in xy plan view. As clearly shown in FIG. 64, the resin package 7 is formed further toward the direction z2 side than the dropout prevention part 591. According to such a configuration, movement of the heat dissipation member 5 to the direction z2 side with respect to the resin package 7 is restricted. Accordingly, the heat dissipation member 5 can be prevented from dropping out from the resin package 7.

Note that the configuration according to this variation may be combined with each of the configurations of the first to third variations according to the present embodiment.

<Fifth Variation>

Next, a fifth variation of the electronic device of the present embodiment will be described using FIG. 67.

Figure 67:
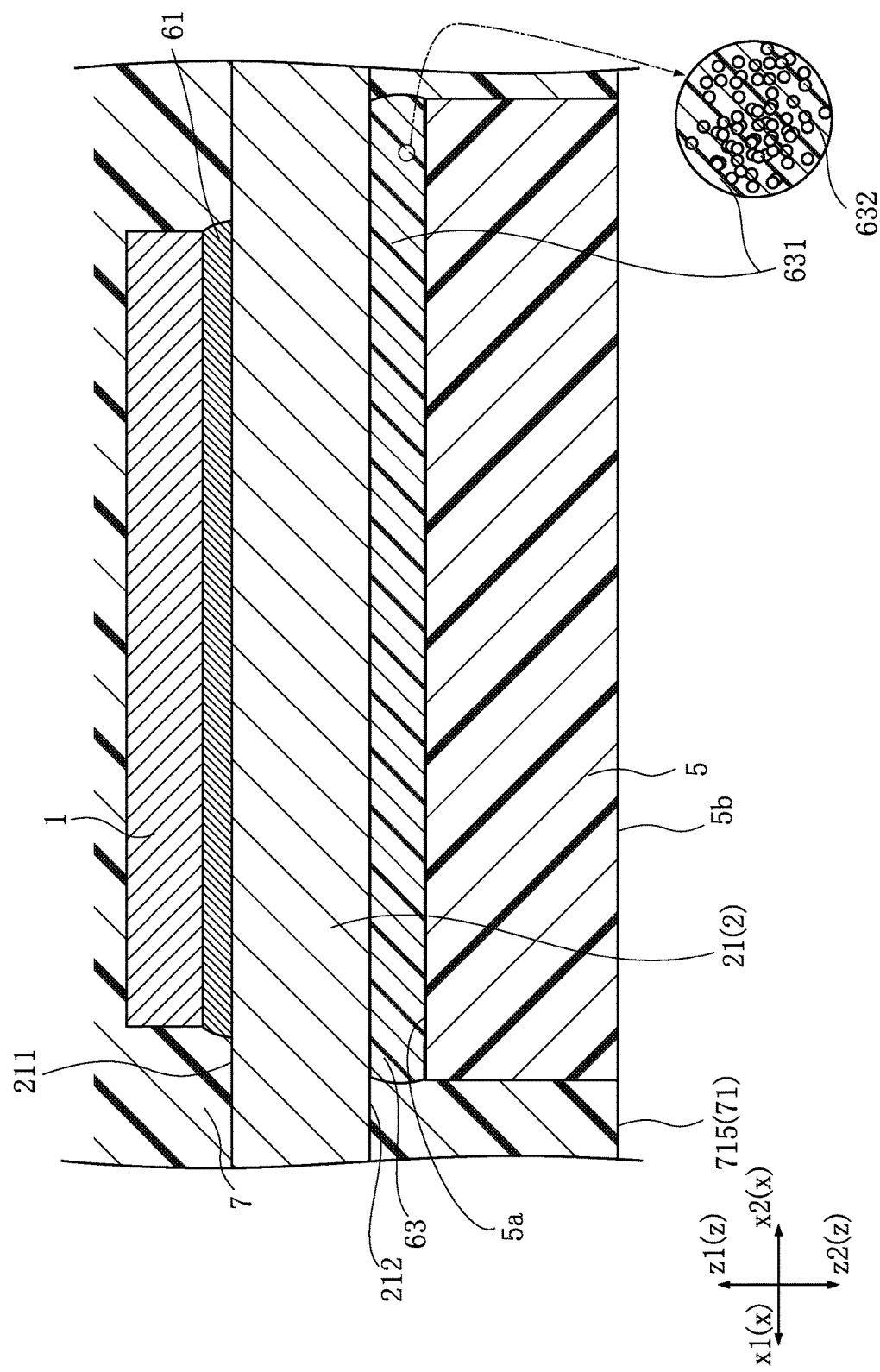
FIG. 67 is a partial enlarged cross-sectional view of an electronic device according to a fifth variation of the second embodiment of the present invention.

FIG. 67 is a partial enlarged cross-sectional view of an electronic device according to a fifth variation of the present embodiment.

An electronic device A25 shown in this diagram differs from the electronic device A20 in the configuration of the joining layer 63. Since the respective configurations of the electronic element 1, the electrodes 2 to 4, the heat dissipation member 5, the adhesive layer 61, the plating layer 62, the wire 69 and the resin package 7 in the electronic device A25 are similar to the configurations of the electronic device A20, description thereof will be omitted.

In this variation, the joining layer 63 includes a resin layer 631 and a filler 632. The resin layer 631 is interposed between the surface 5*a* of the heat dissipation member 5 and the die bonding pad 21. The resin layer 631 is made of a resin such as epoxy, for example. The filler 632 has a minute shape and is mixed in the resin layer 631. The filler 632 is made of material having a higher thermal conductivity than the thermal conductivity of the material constituting the resin layer 631. AlN and Ag, for example, are given as such a material.

According to such a configuration, heat can be conducted from the die bonding pad 21 to the heat dissipation member 5 through the filler 632 which readily transfers heat. Thus, heat is readily transferred from the die bonding pad 21 to the heat dissipation member 5. Accordingly, the electronic device A25 has excellent heat dissipation characteristics.

Note that the configuration of this variation may be employed as the joining layer 63 in the first to fourth variations of the present embodiment.

<Sixth Variation>

Next, a sixth variation of the electronic device of the present embodiment will be described using FIG. 68.

Figure 68:
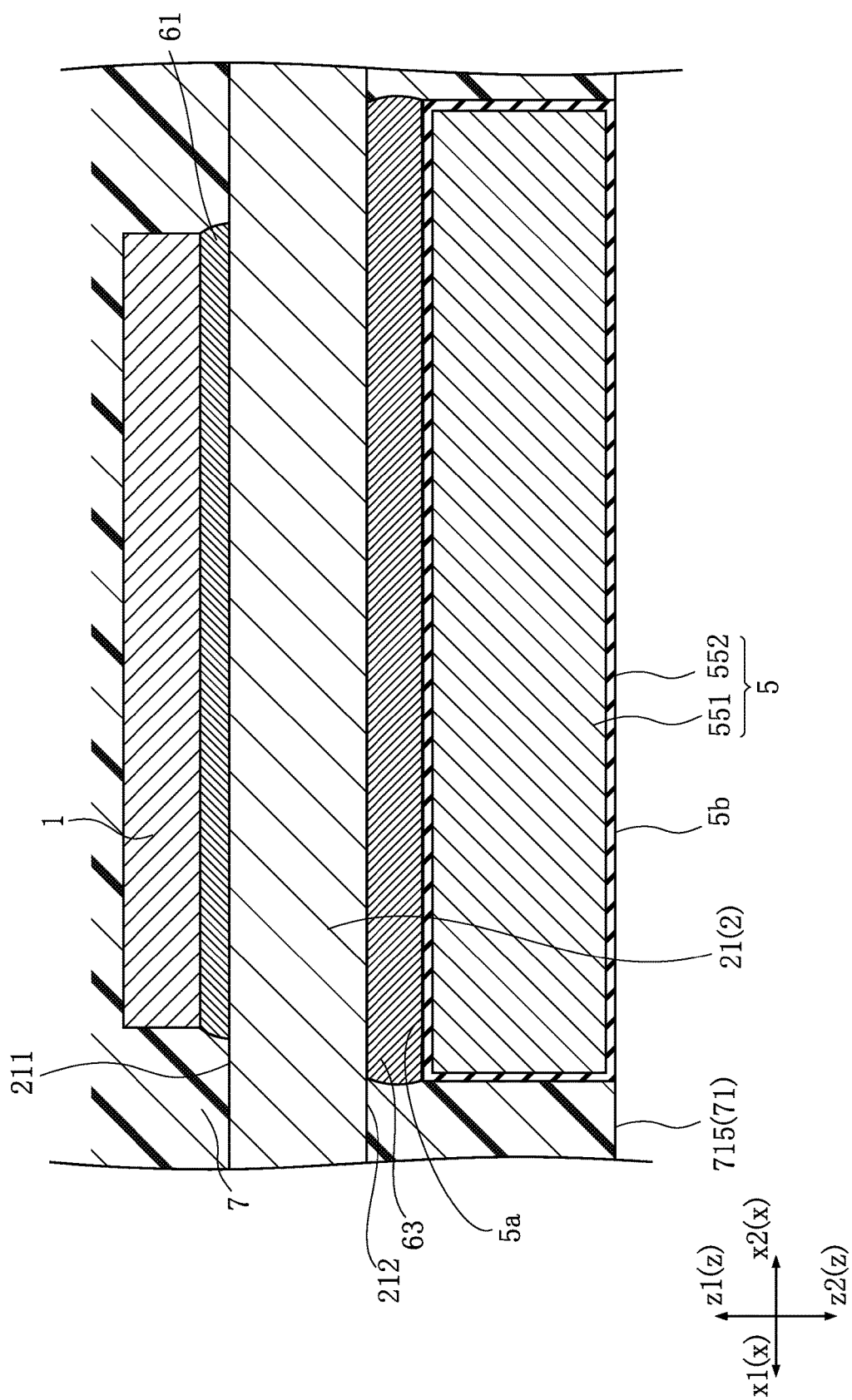
FIG. 68 is a partial enlarged cross-sectional view of an electronic device according to a sixth variation of the second embodiment of the present invention.

FIG. 68 is a partial enlarged cross-sectional view of an electronic device according to a sixth variation of the present embodiment.

An electronic device A26 shown in this diagram differs from the above-mentioned electronic device A20 in the configuration of the heat dissipation member 5. Since the respective configurations of the electronic element 1, the electrodes 2 to 4, the adhesive layer 61, the plating layer 62, the joining layer 63, the two pieces of the wire 69 and the resin package 7 are similar to the configurations of the electronic device A20, description thereof will be omitted.

The heat dissipation member 5 includes a base 551 and an insulating film 552. The base 551 is made of a metal such as aluminum, for example. The insulating film 552 is made of an insulating material. The insulating film 552 is made of an oxide of the metal constituting the base 551. The insulating film 552 is preferably an anodized aluminum film in the case where the base 551 is made of aluminum. The insulating film 552 constitutes the surfaces 5a and 5b.

Note that the configuration of this variation may be employed as the heat dissipation member 5 in the first to fifth variations of the present embodiment.

<Seventh Variation>

Next, a seventh variation of the electronic device of the present embodiment will be described using FIGS. 69 to 73.

Figure 69:
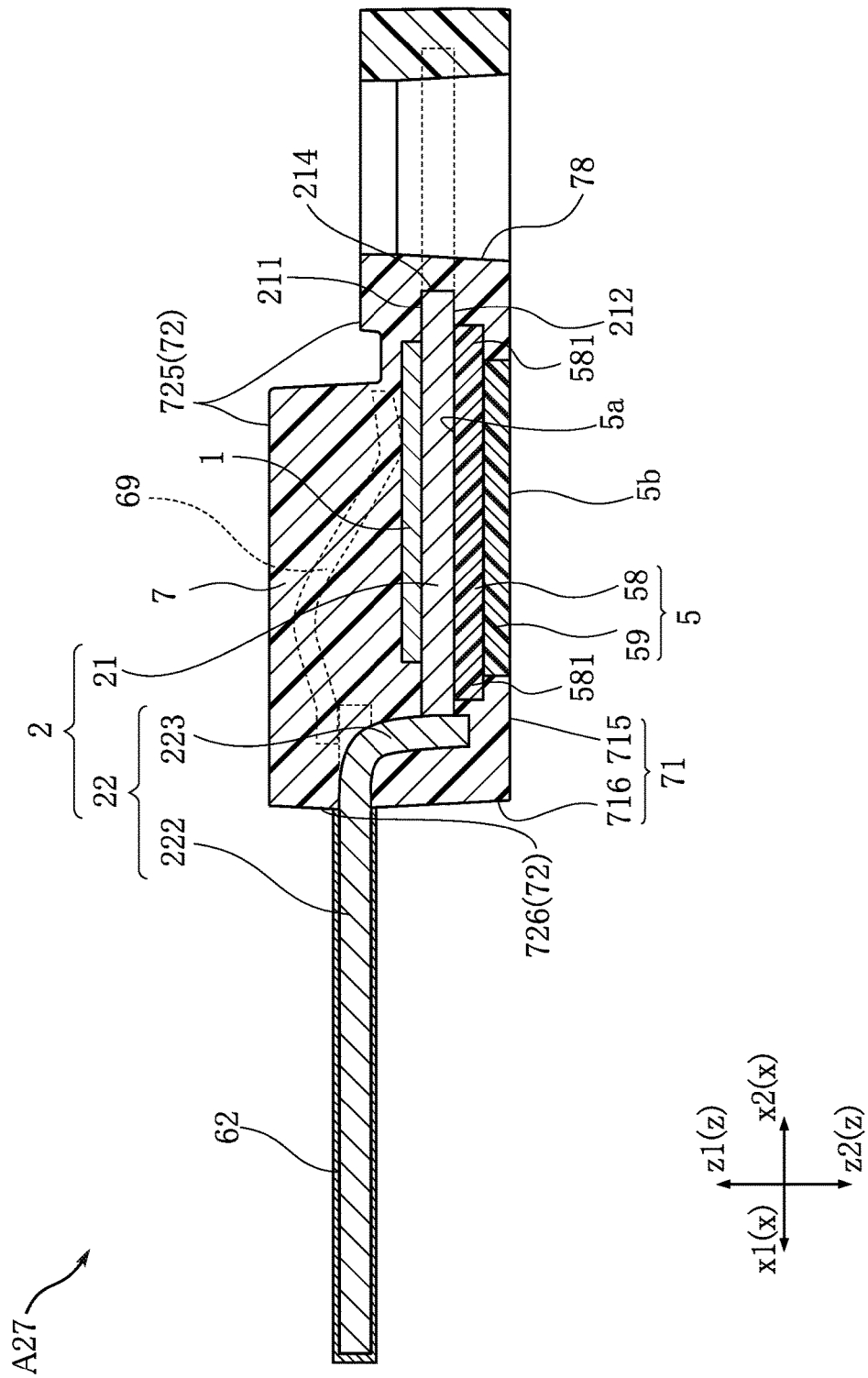
FIG. 69 is a cross-sectional view of an electronic device according to a seventh variation of the second embodiment of the present invention.
Figure 70:
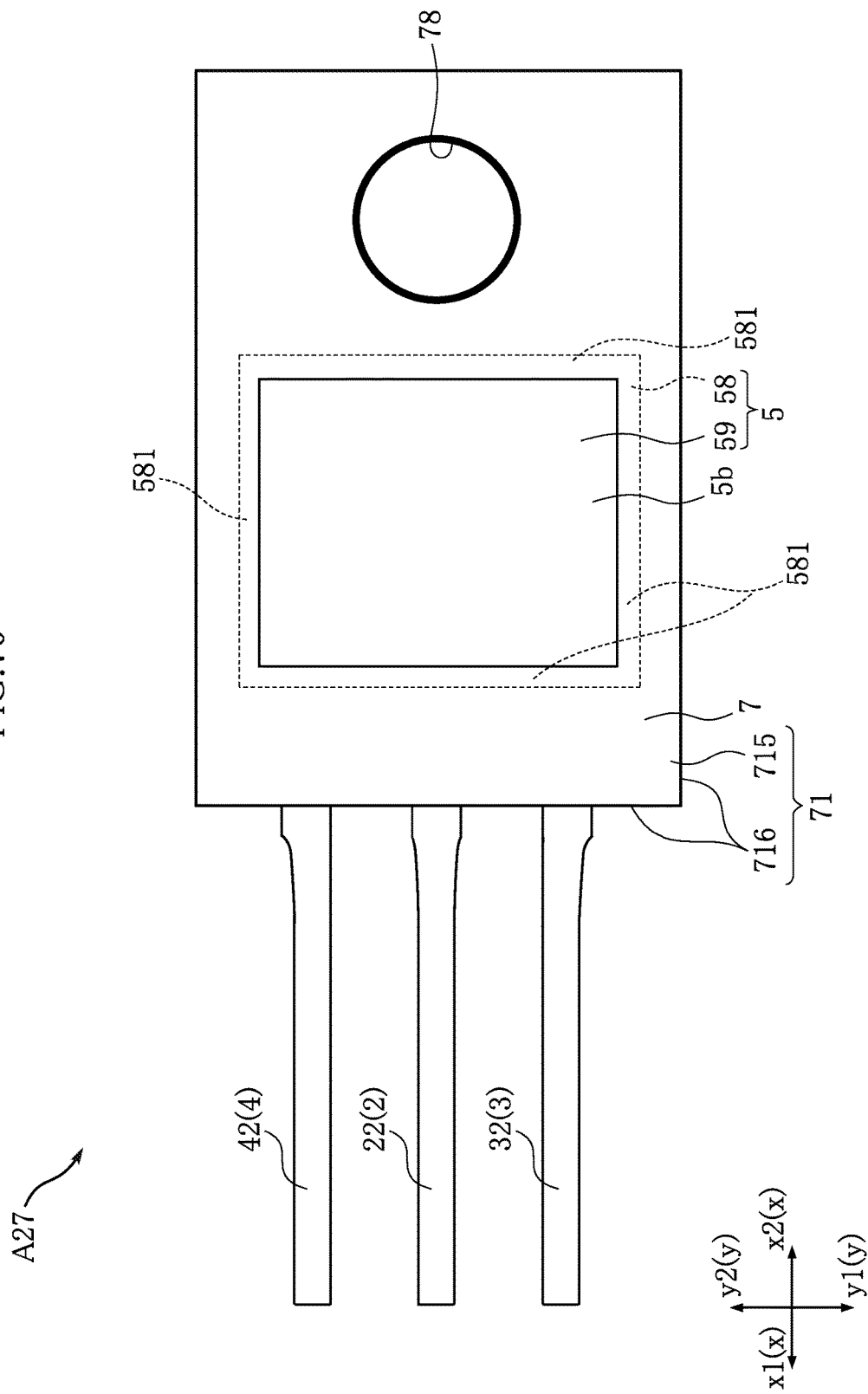
FIG. 70 is a bottom view of the electronic device according to the seventh variation of the second embodiment of the present invention.
Figure 71:
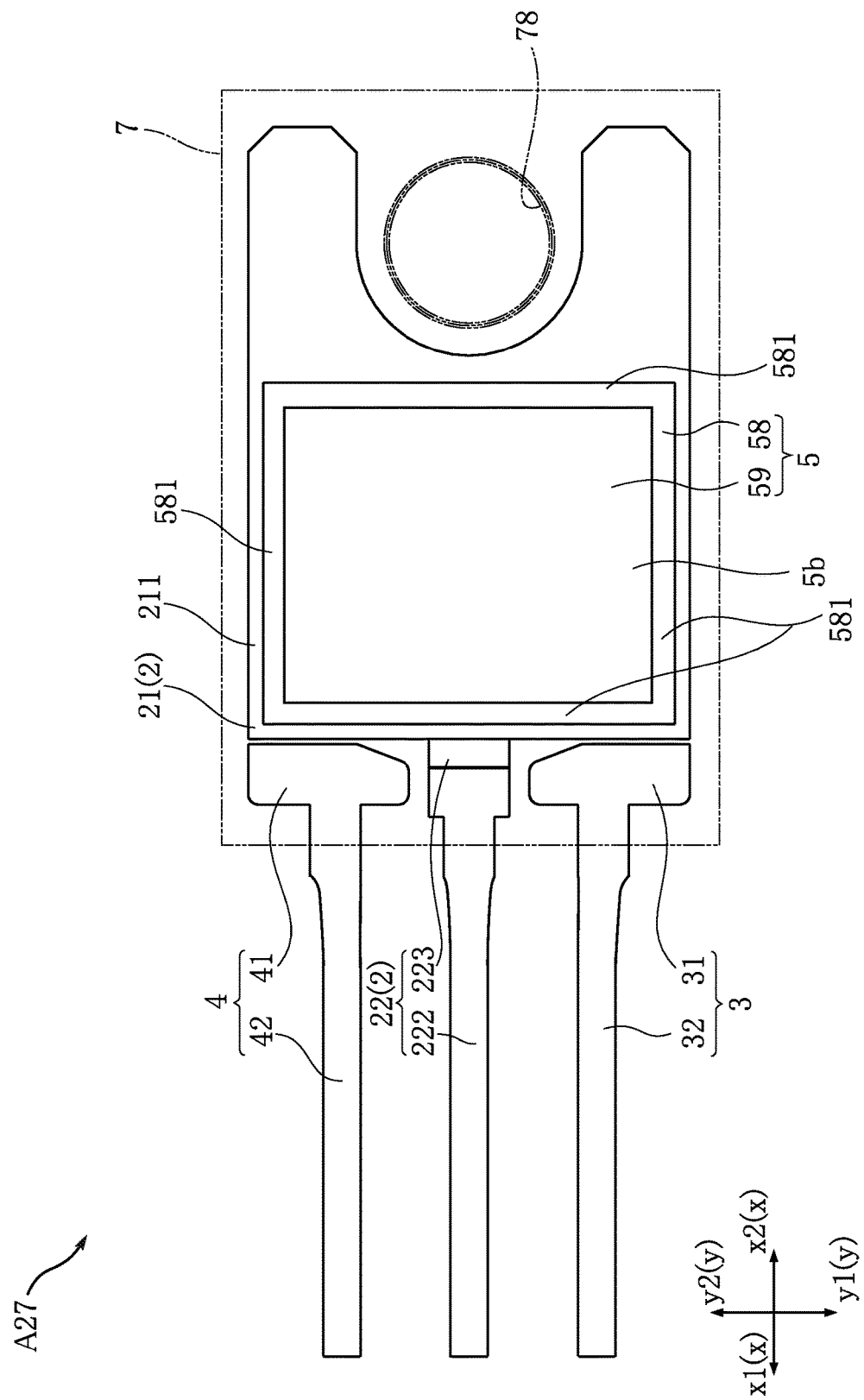
FIG. 71 is a bottom view (partially see through) of the electronic device according to the seventh variation of the second embodiment of the present invention.

FIG. 69 is a cross-sectional view of an electronic device according to this variation. FIG. 70 is a bottom view of the electronic device according to this variation. FIG. 71 is a bottom view (partially see through) of the electronic device according to this variation.

An electronic device A27 shown in these diagrams is provided, similarly to the electronic device A20, with the electronic element 1, the electrodes 2 to 4, the adhesive layer 61 (see FIG. 49; illustration omitted in this variation), the plating layer 62, the joining layer 63 (see FIG. 49; illustration omitted in this variation), the two pieces of wire 69 and the resin package 7. The electronic device A27 differs from the above-mentioned electronic device A20 in the configuration of the heat dissipation member 5. Since the respective configurations of the electronic element 1, the electrodes 2 to 4, the adhesive layer 61, the plating layer 62, the joining layer 63, the two pieces of wire 69 and the resin package 7 in the electronic device A27 are similar to the configurations of the electronic device A20, description thereof will be omitted.

In this variation, the heat dissipation member 5 includes a first substrate 58 and a second substrate 59. The first substrate 58 and the second substrate 59 are both made of an insulating material such as a ceramic material. Alumina, zirconia and aluminum nitride, for example, are given as such a ceramic material.

The first substrate 58 has a rectangular plate-like shape. The first substrate 58 constitutes the surface 5a. The second substrate 59 has a rectangular plate-like shape smaller than the first substrate 58. The second substrate 59 is stacked on the first substrate 58. The second substrate 59 constitutes the surface 5b. The second substrate 59 is joined by baking together with the first substrate 58, as will be discussed later. The second substrate 59 entirely overlaps with the first substrate 58 in xy plan view.

The first substrate 58 has a dropout prevention part 581. The dropout prevention part 581 is a region that protrudes from the second substrate 59 in xy plan view. That is, the dropout prevention part 581 is a region that does not overlap with the second substrate 59 of the first substrate 58 in xy plan view. As shown in FIG. 69, the resin package 7 is formed further toward the direction z2 side than the dropout prevention part 581. According to such a configuration, movement of the heat dissipation member 5 to the direction z2 side with respect to the resin package 7 is restricted. Accordingly, the heat dissipation member 5 can be prevented from dropping out from the resin package 7.

Figure 72:
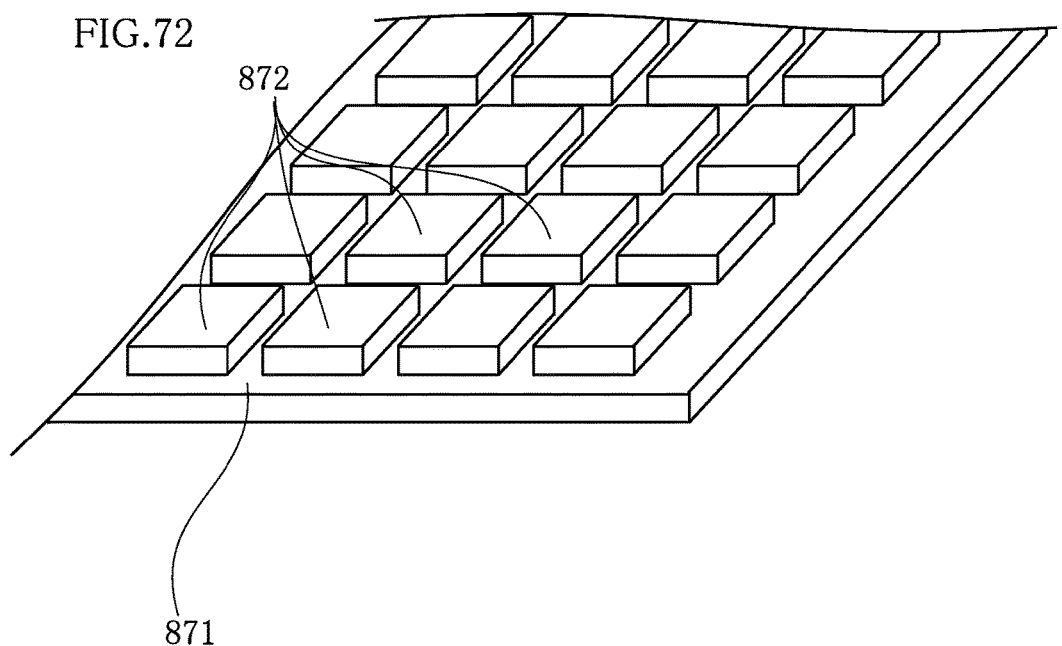
FIG. 72 is a perspective diagram in one process of manufacturing processes of the electronic device according to the seventh variation of the second embodiment of the present invention.
Figure 73:
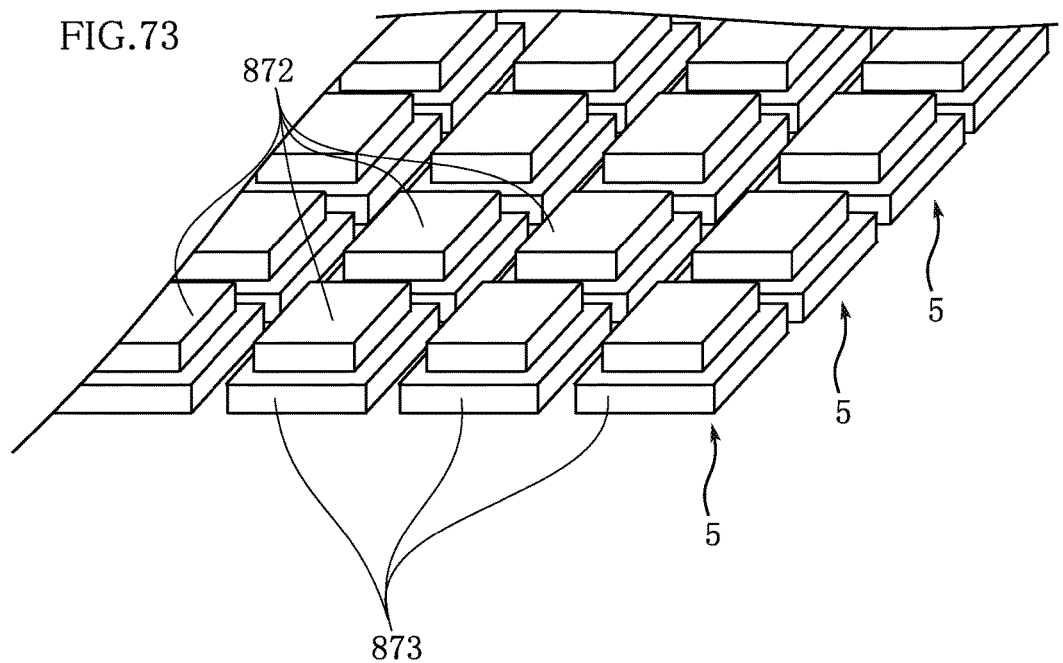
FIG. 73 is a perspective diagram in one process of manufacturing processes of the electronic device according to the seventh variation of the second embodiment of the present invention.

Next, an example of the manufacturing method for the heat dissipation member 5 of the electronic device A27 will be briefly described using FIGS. 72 and 73.

First, as shown in FIG. 72, a sheet 871 made of a ceramic material is prepared. Next, a plurality of substrates 872 made of a ceramic material are disposed on the sheet 871. Next, the sheet 871 and the plurality of substrates 872 are collectively baked. Next, as shown in FIG. 73, the sheet 871 is sectioned into a plurality of pieces 873. The substrates 872 are joined to the pieces 873. One of the pieces 873 to which the substrates 872 are joined is used as the heat dissipation member 5. The electronic device A27 can be manufactured by performing a similar method to the method described in relation to the electronic device A20, by processing such as joining the heat dissipation member 5 to the die bonding pad 21 via the joining layer 63 (see FIG. 49; illustration omitted in this variation).

Note that the configuration of this variation in which the first substrate 58 and the second substrate 59 are stacked may be employed as the heat dissipation member 5 in the first to sixth variations of the present embodiment.

<Variation of Mounting Structure of Electronic Device>

Figure 74:
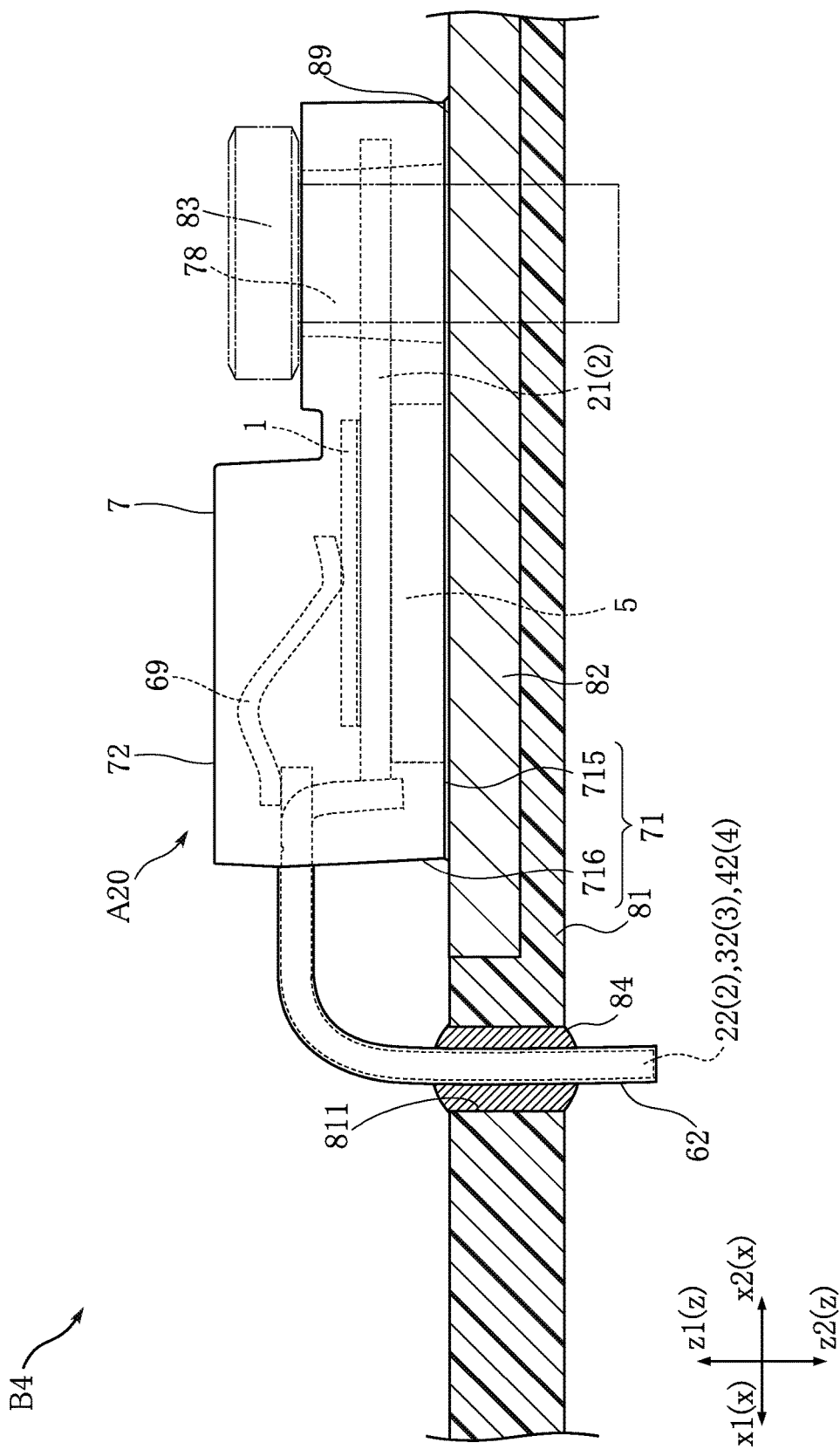
FIG. 74 is a cross-sectional view of a main section showing a variation of the mounting structure of the electronic device according to the second embodiment of the present invention.

Next, a variation of the mounting structure of an electronic device will be shown using FIG. 74.

FIG. 74 is a cross-sectional view of a main section showing a variation of the mounting structure of the electronic device according to the present embodiment.

An electronic device mounting structure B4 shown in this diagram is provided with the electronic device A20, the mounting board 81 and the heat sink 82. In the electronic device mounting structure B4, unlike the electronic device mounting structure B3, the heat sink 82 is formed in parallel with the mounting board 81. The electronic device A20 is mounted on the mounting board 81 in a state in which all of the leads 22, 32 and 42 are bent. Note that any of the electronic devices A21 to A27 may be mounted on the mounting board 81, instead of the electronic device A20.

Third Embodiment

Next, a third embodiment of the present invention will be described using FIGS. 75 to 86.

Figure 75:
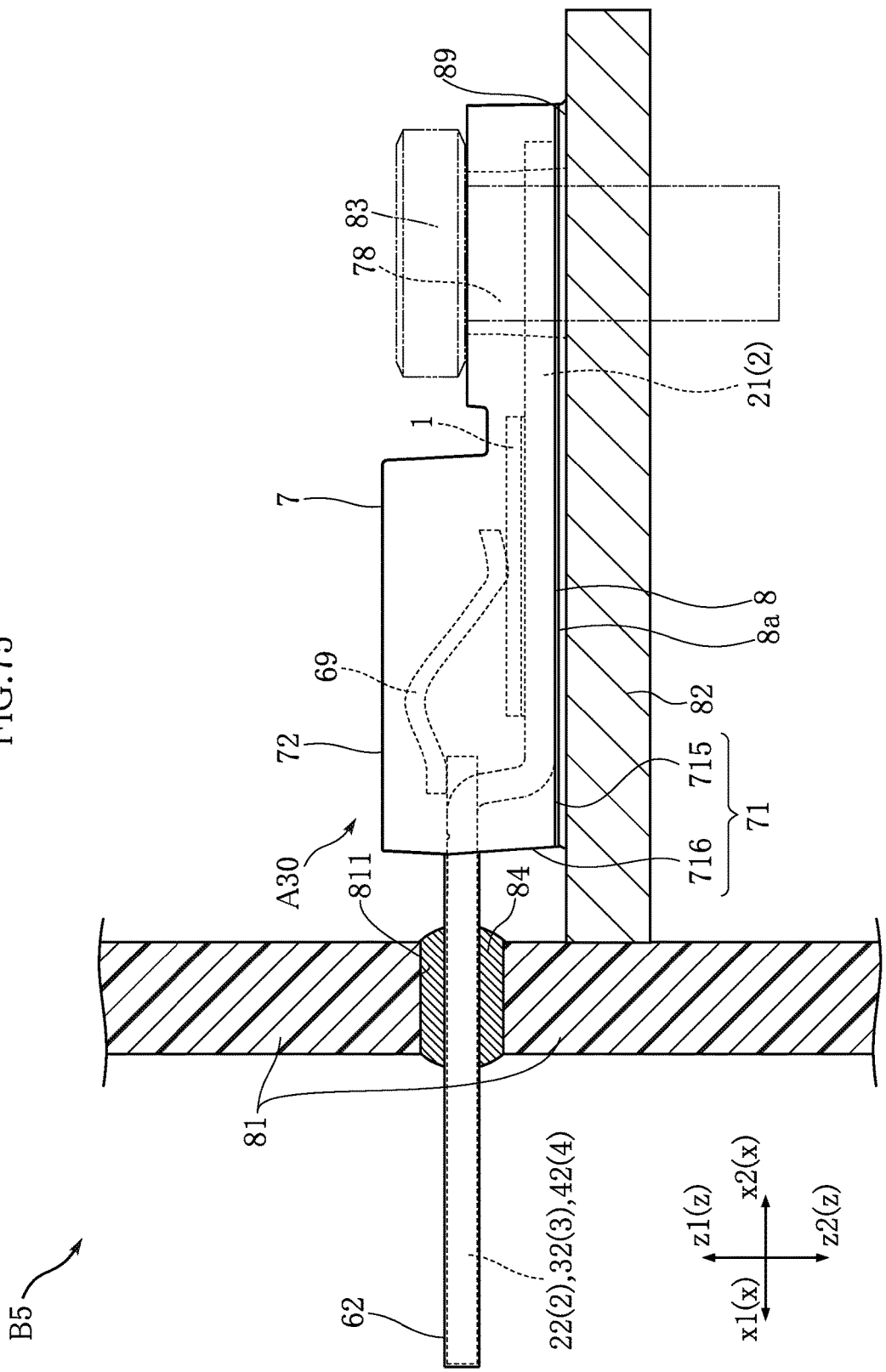
FIG. 75 is a cross-sectional view of a main section showing a mounting structure of an electronic device according to a third embodiment of the present invention.

FIG. 75 is a cross-sectional view of a main section showing amounting structure of the electronic device according to the present embodiment.

A mounting structure B5 of the electronic device shown in FIG. 75 is provided with an electronic device A30, the mounting board 81 and the heat sink 82.

The mounting board 81 is a substrate on which a plurality of electronic components are mounted. The mounting board 81 is made of an insulating material. A wiring pattern which is not illustrated is formed on the mounting board 81. A plurality of holes 811 are formed in the mounting board 81. The heat sink 82 stands erect on the mounting board 81. The heat sink 82 is made of a material having comparatively high thermal conductivity, such as aluminum or a similar metal, for example.

Figure 76:
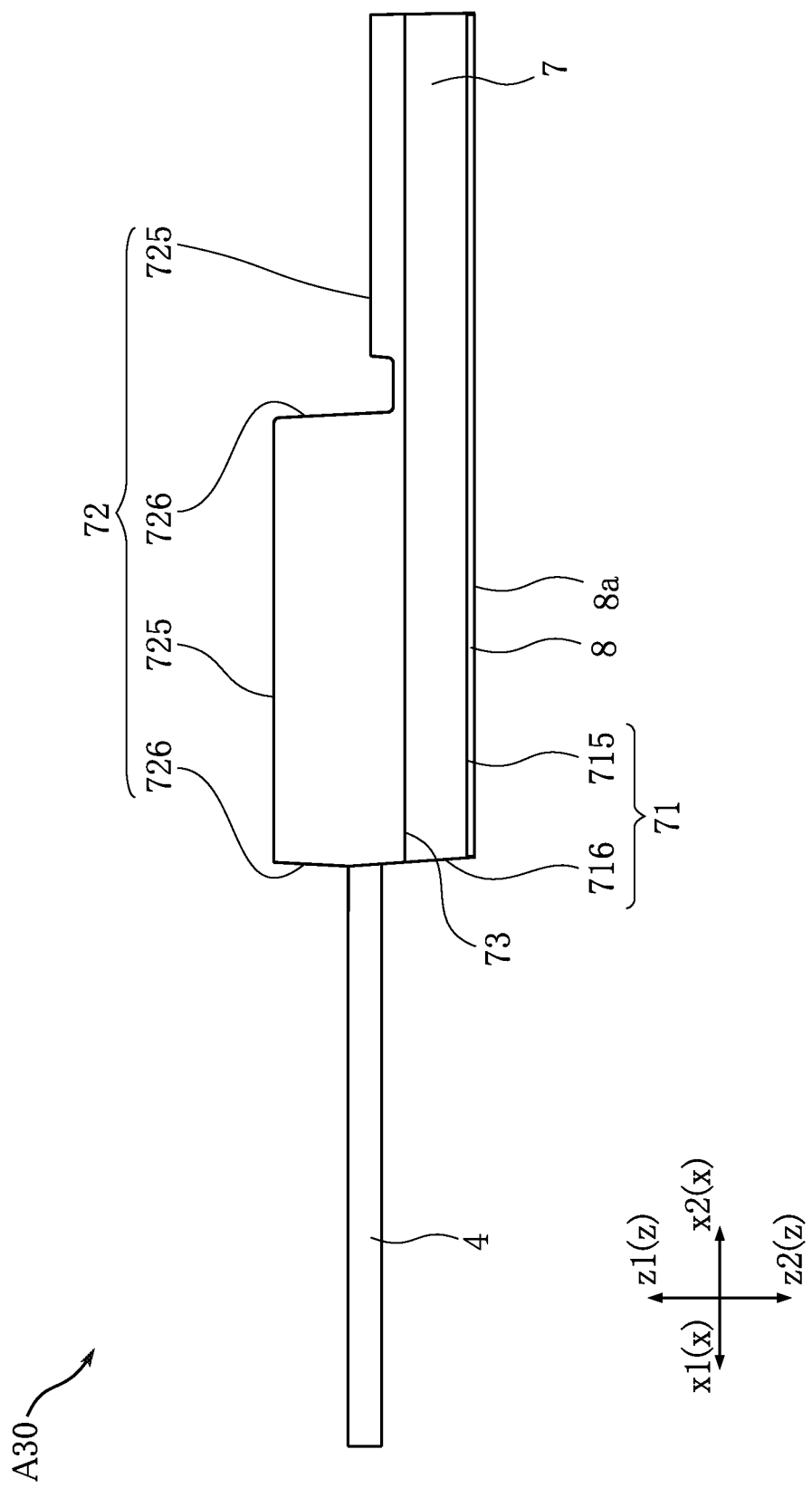
FIG. 76 is a front view of the electronic device according to the third embodiment of the present invention.
Figure 77:
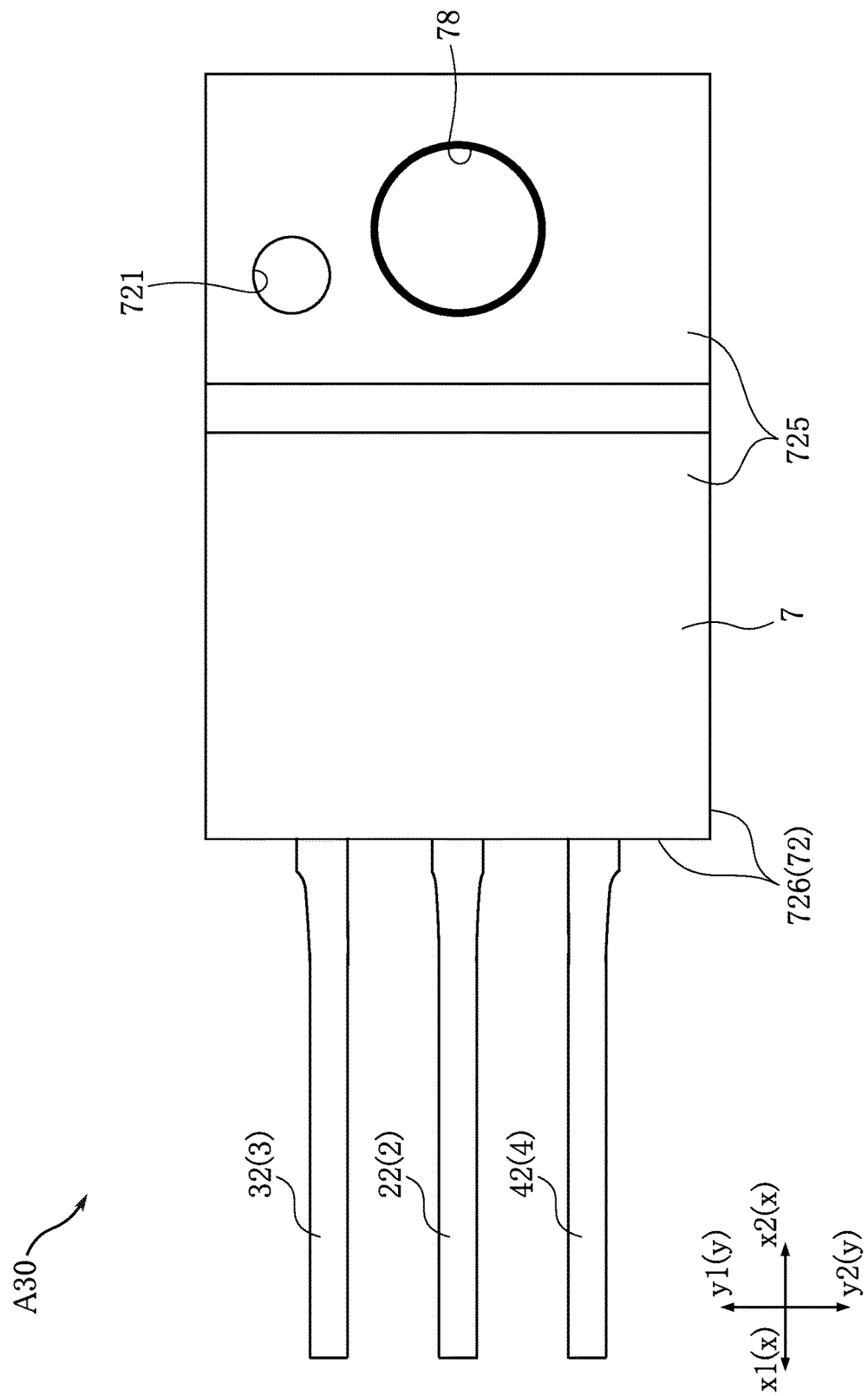
FIG. 77 is a plan view of the electronic device according to the third embodiment of the present invention.
Figure 78:
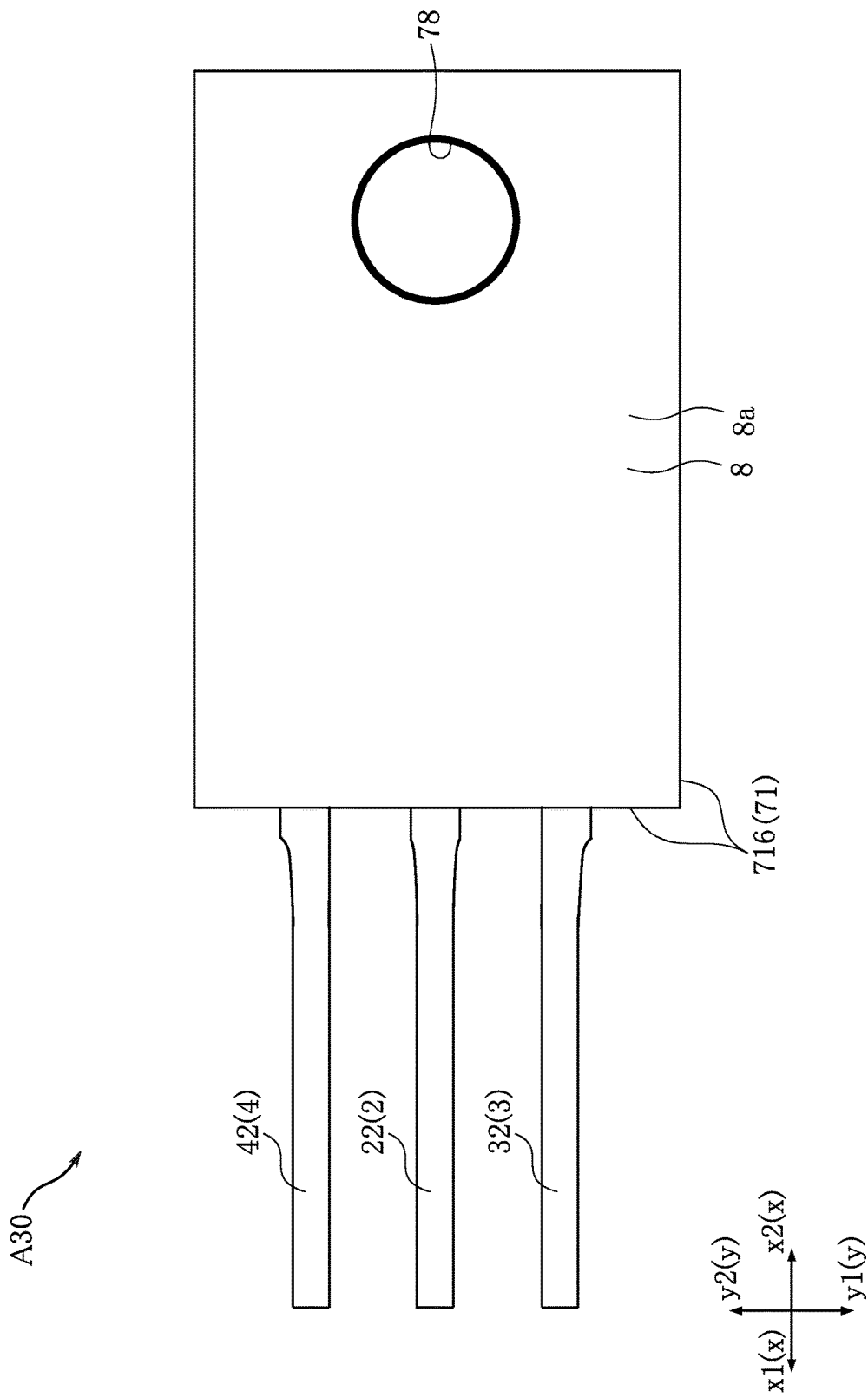
FIG. 78 is a bottom view of the electronic device according to the third embodiment of the present invention.
Figure 79:
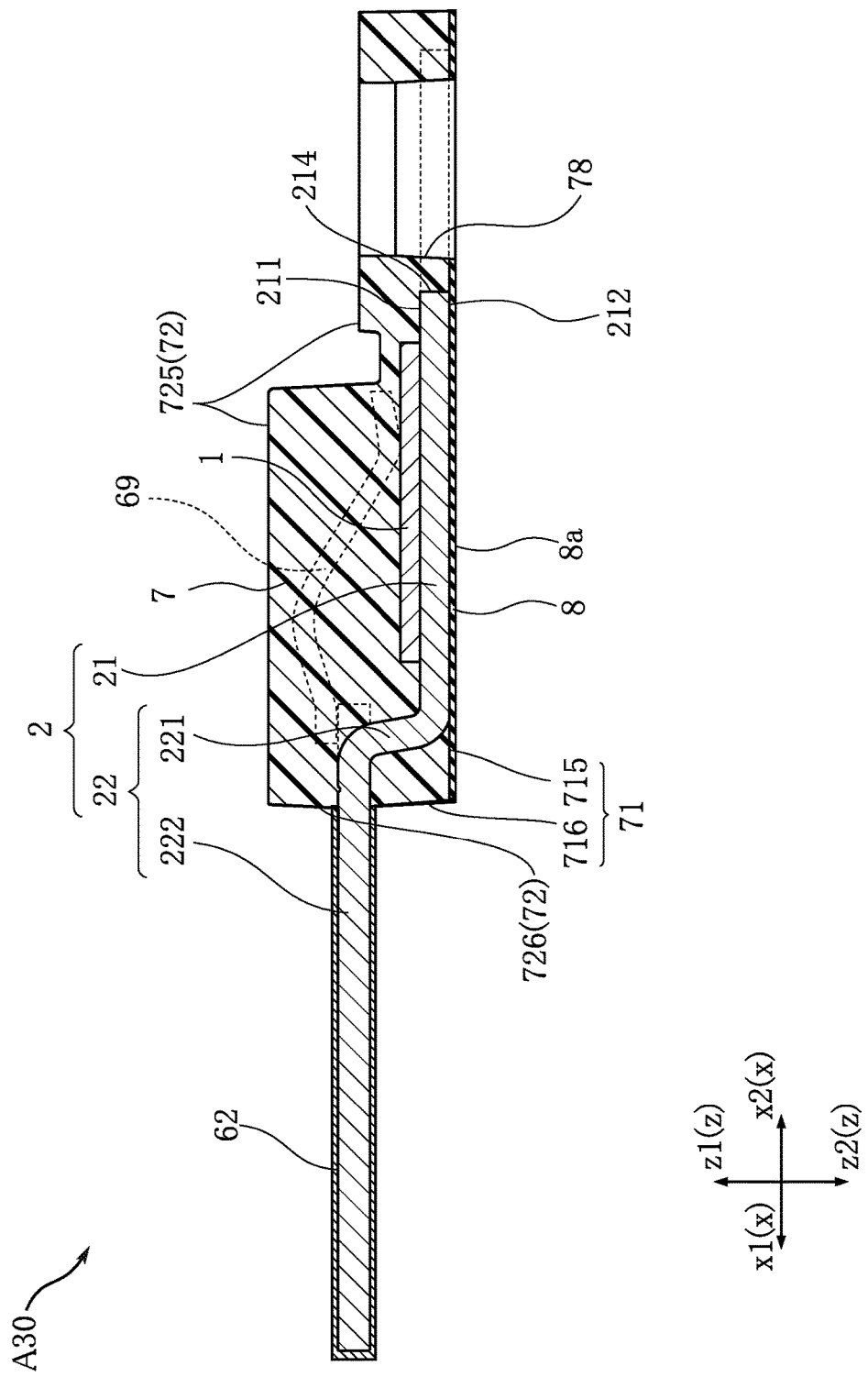
FIG. 79 is a cross-sectional view of the electronic device according to the third embodiment of the present invention.
Figure 80:
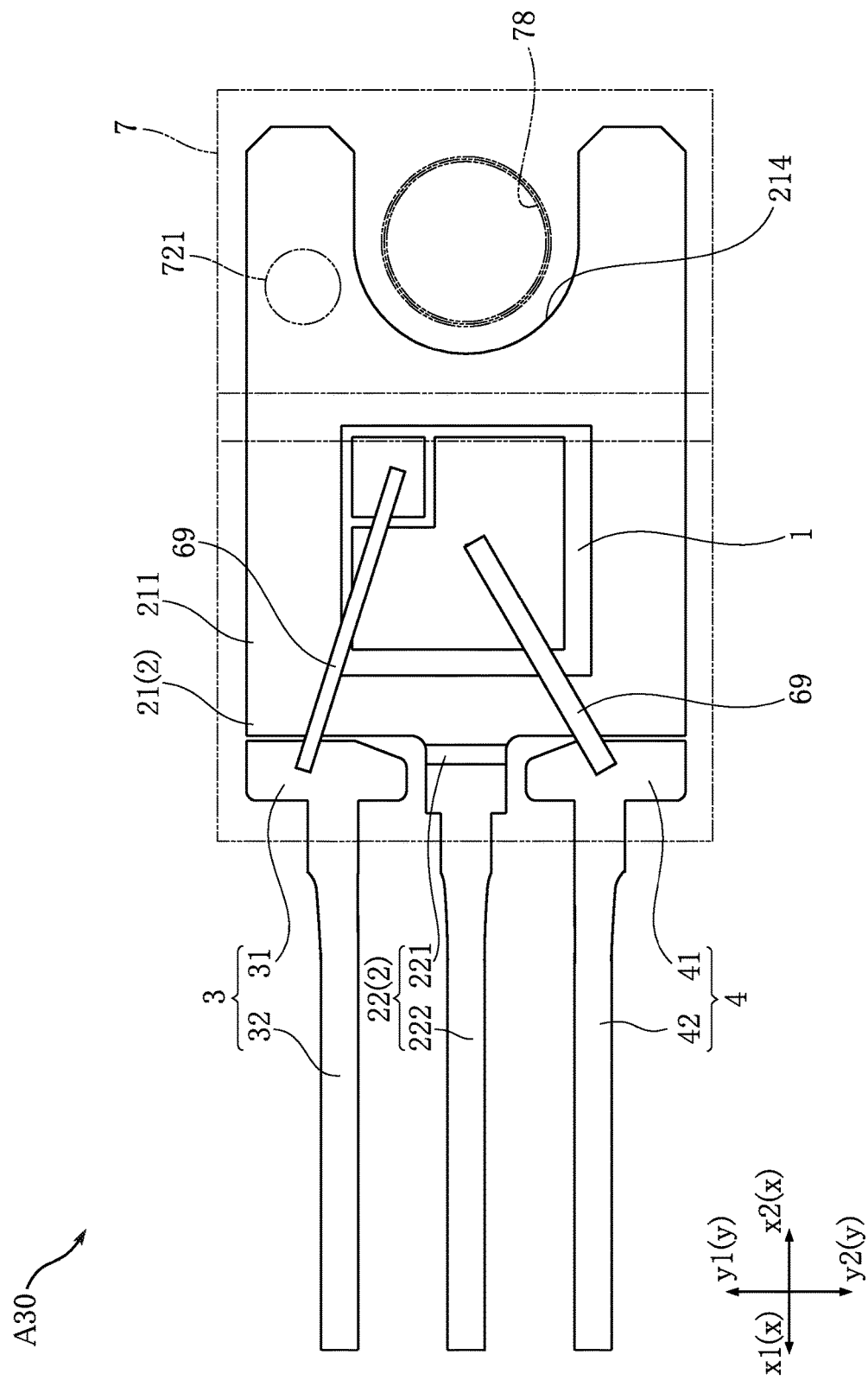
FIG. 80 is a plan view (partially see through) of the electronic device according to the third embodiment of the present invention.
Figure 81:
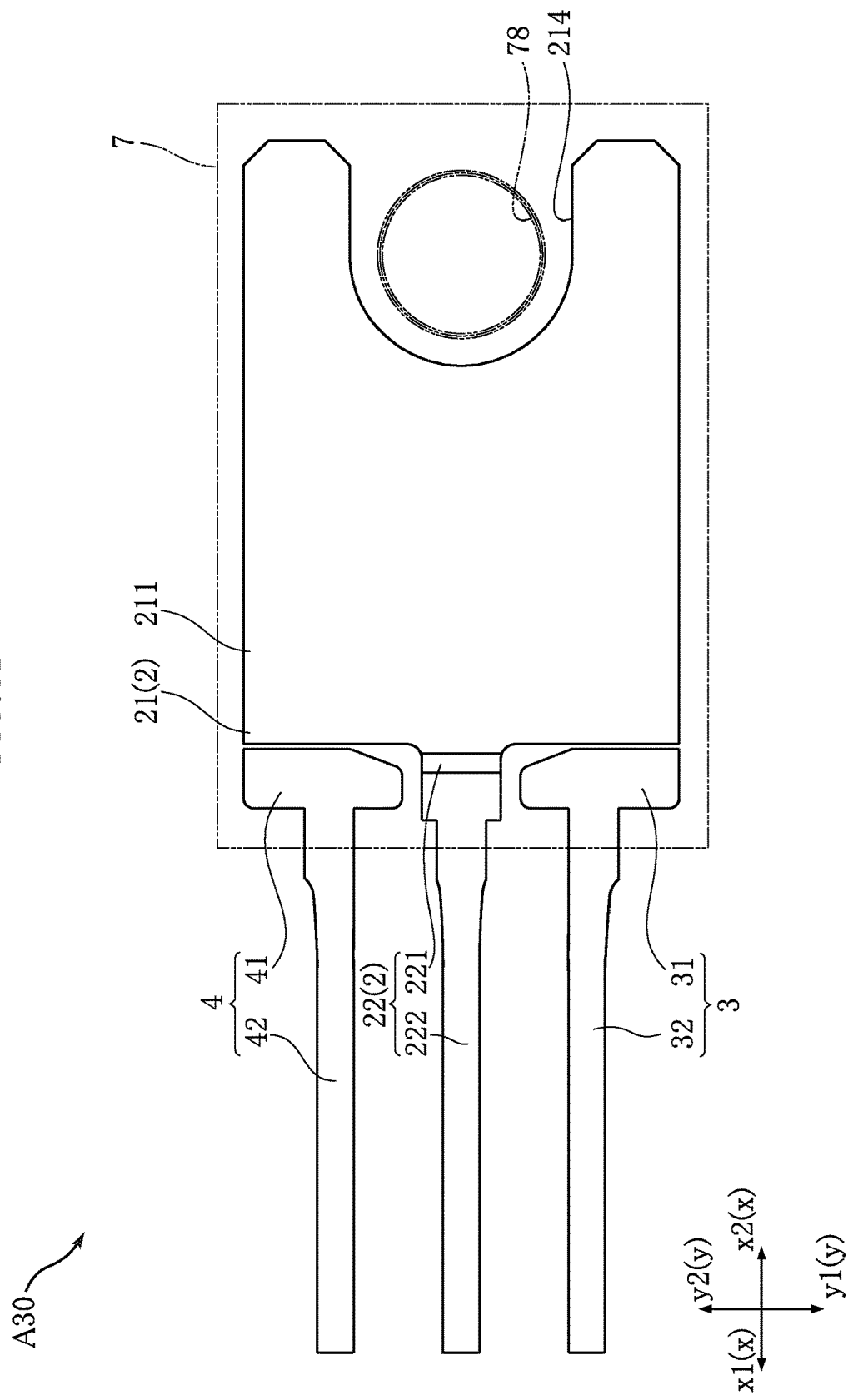
FIG. 81 is a bottom view (partially see through) of the electronic device according to the third embodiment of the present invention.
Figure 82:
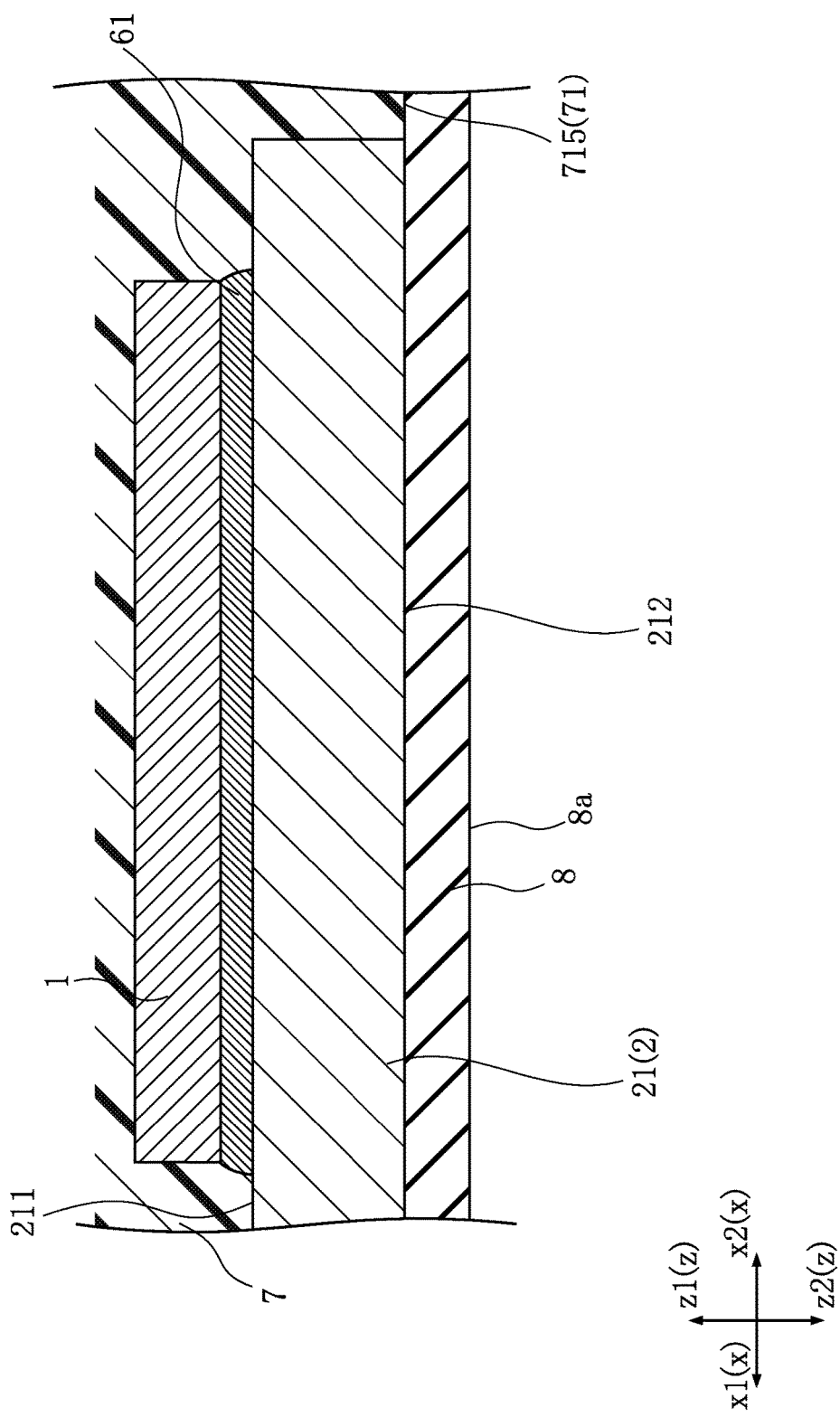
FIG. 82 is a partial enlarged cross-sectional view of the electronic device shown in FIG. 79.

FIG. 76 is a front view of the electronic device according to the present embodiment. FIG. 77 is a plan view of the electronic device according to the present embodiment. FIG. 78 is a bottom view of the electronic device according to the present embodiment. FIG. 79 is a cross-sectional view of the electronic device according to the present embodiment. FIG. 80 is a plan view (partially see through) of the electronic device according to the present embodiment. FIG. 81 is a bottom view (partially see through) of the electronic device according to the present embodiment. FIG. 82 is a partial enlarged cross-sectional view of the electronic device shown in FIG. 79.

The electronic device A30 shown in these diagrams is provided with the electronic element 1, the electrodes 2 to 4, the adhesive layer 61 (see FIG. 82; omitted in other diagrams), the plating layer 62 (see FIGS. 75 and 79; omitted in other diagrams), the two pieces of wire 69, the resin package 7 and the insulating film 8. In FIGS. 80 and 81, the resin package 7 is shown with a two-dot chain line. The electronic device A30 is mounted on the mounting board 81. As shown in FIG. 75, the electronic device A30 is used as an electronic component that performs functions such as switching, rectification and amplification in an electrical circuit, depending on the type of electronic element 1.

The electronic element 1 shown in FIGS. 75, 79 and 80 has a rectangular shape in plan view. The electronic element 1 is a device composed of a semiconductor such as a diode or a transistor, for example. In the present embodiment, the electronic element 1 is a transistor.

The electrode 2 shown in FIGS. 79 to 81 includes the die bonding pad 21 and the lead 22. The die bonding pad 21 and the lead 22 are made of a conductive material such as copper, for example.

The die bonding pad 21 is for mounting the electronic element 1. The die bonding pad 21 has a tabular shape. The die bonding pad 21 has the placement surface 211 and the back surface 212. The placement surface 211 faces in the direction z1. The back surface 212 faces in the direction z2. The electronic element 1 is placed on the placement surface 211. The heat produced in the electronic element 1 is transferred to the die bonding pad 21. The hole 214 passing through from the placement surface 211 to the back surface 212 is formed in the die bonding pad 21. As shown in FIG. 80, the hole 214 has a shape recessed in the x1 direction from the end on the direction x2 side of the die bonding pad 21 in xy plan view.

The lead 22 has a shape extending linearly from the die bonding pad 21. The lead 22 is for insertion mounting. The lead 22 is inserted in the hole 811 as shown in FIG. 75. The electronic device A30 is thereby mounted on the mounting board 81. In order to fix the lead 22 to the mounting board 81, the hole 811 is filled with the solder 84. As shown in FIGS. 79 to 81, the lead 22 has the coupling part 221 and the terminal part 222. In the present embodiment, the coupling part 221 and the terminal part 222 are integrally shaped. The coupling part 221 is connected to the die bonding pad 21. The coupling part 221 has a shape extending from the die bonding pad 21 in a direction intersecting the placement surface 211. The terminal part 222 is connected to the coupling part 221. The terminal part 222 extends from the coupling part 221 in the direction x1. The terminal part 222 has a region projecting from the resin package 7 which will be discussed later.

The electrode 3 shown in FIGS. 80 and 81 includes the wire bonding pad 31 and the lead 32. The electrode 3 is located, in xy plan view, on the direction x1 side of the die bonding pad 21 and the direction y1 side of the lead 22. The wire bonding pad 31 and the lead 32 are integrally shaped. The wire bonding pad 31 and the lead 32 are made of a conductive material such as copper, for example. The wire bonding pad 31 has a substantially rectangular tabular shape that is smaller than the die bonding pad 21. The lead 32 is connected to the wire bonding pad 31. The lead 32 has a shape extending linearly from the wire bonding pad 31 in the direction x1. The lead 32 is disposed in parallel with the lead 22. The lead 32 has a region projecting from the resin package 7 which will be discussed later. The lead 32 is for insertion mounting. The lead 32 is inserted in the hole 811 as shown in FIG. 75. The electronic device A30 is thereby mounted on the mounting board 81. In order to fix the lead 32 to the mounting board 81, the hole 811 is filled with the solder 84.

The electrode 4 shown in FIGS. 80 and 81 includes the wire bonding pad 41 and the lead 42. The electrode 4 is located, in xy plan view, on the direction x1 side of the die bonding pad 21 and the direction y2 side of the lead 22. The wire bonding pad 41 and the lead 42 are integrally shaped. The wire bonding pad 41 and the lead 42 are made of a conductive material such as copper, for example. The wire bonding pad 41 has a substantially rectangular tabular shape that is smaller than the die bonding pad 21. The lead 42 is connected to the wire bonding pad 41. The lead 42 has a shape extending linearly from the wire bonding pad 41 in the direction x1. In order to fix the lead 42 to the mounting board 81, the hole 811 is filled with the solder 84. The lead 42 is disposed in parallel with the lead 22. The lead 22 is located between the lead 42 and the lead 32. The lead 42 has a region projecting from the resin package 7 which will be discussed later. The lead 42 is for insertion mounting. The lead 42 is inserted in the hole 811 as shown in FIG. 75. The electronic device A30 is thereby mounted on the mounting board 81.

The adhesive layer 61 shown in FIG. 82 is interposed between the electronic element 1 and the die bonding pad 21. The adhesive layer 61 is for adhering the electronic element 1 to the die bonding pad 21. In the present embodiment, electrical continuity is established between the electronic element 1 and the die bonding pad 21 via the adhesive layer 61. The adhesive layer 61 is silver paste or solder paste, for example.

As shown in FIG. 79, the resin package 7 covers the electronic element 1 and the electrodes 2 to 4. The resin package 7 is made of a black epoxy resin, for example. As shown in FIG. 76, the resin package 7 has the first surface 71 and the second surface 72. The first surface 71 has the flat surface 715 and the tapered surface 716. As shown in FIG. 75, the flat surface 715 is a mounting surface for mounting the electronic device A30 on the mounting board 81. As shown in FIG. 82, the back surface 212 of the die bonding pad 21 is exposed from the flat surface 715. In the present embodiment, the flat surface 715 is flush with the back surface 212. Note that the flat surface 715 need not be flush with the back surface 212. As shown in FIG. 76, the tapered surface 716 is connected to the flat surface 715. The tapered surface 716 has a shape that extends outwardly in an xy plane moving in the direction z1.

As shown in FIG. 76, the second surface 72 has the plurality of flat surfaces 725 and the plurality of tapered surfaces 726. Each tapered surface 726 is connected to a different one of the plurality of flat surfaces 725. Each tapered surface 726 has a shape that extends outwardly in an xy plane moving in the direction z2. Each tapered surface 726 is connected to the tapered surface 716 on the boundary 73. As shown in FIG. 77, the pin mark 721 that is recessed from one of the plurality of flat surfaces 725 is formed in the resin package 7. Also, as shown in FIGS. 77 and 78, the screw hole 78 is formed in the resin package 7. As shown in FIG. 75, the screw 83 for fixing the electronic device A30 to the heat sink 82 is inserted in the screw hole 78.

As clearly shown in FIGS. 79 and 82, the insulating film 8 covers the back surface 212 of the die bonding pad 21 and the flat surface 715 of the resin package 7. The insulating film 8 directly covers the back surface 212 and the flat surface 715. That is, the insulating film 8 contacts the back surface 212 and the flat surface 715. Preferably if current flows through the die bonding pad 21 when using the electronic device A30, dielectric breakdown of the insulating film 8 will not occur, even when a voltage of approximately 6 kV is applied in the thickness direction. The thickness (size in the direction z) of the insulating film 8 is less than the thickness (size in the direction z) of the die bonding pad 21. The die bonding pad 21 has a thickness of 200 to 800 μm, for example. On the other hand, the insulating film 8 has a thickness of 10 to 200 μm, for example. The dielectric breakdown voltage of the material constituting the insulating film 8 is 3 to 4.6 kV/mm, for example. Polyamide-imide and polyimide, for example, are given as the material constituting the insulating film 8. The insulating film 8 has a surface 8*a*. The surface 8*a* faces in the direction z2.

As shown in FIG. 75, the surface 8*a* is directly opposite the heat sink 82. The grease 89 for heat dissipation may be interposed between the surface 8*a* and the heat sink 82. Alternatively, although not illustrated, the surface 8*a* may contact the heat sink 82. These configurations are preferable from the viewpoint of improving the heat dissipation of the electronic device A30.

The two pieces of wire 69 shown in FIG. 80 are made of a metal such as aluminum, for example. One of the two pieces of wire 69 is joined to the electronic element 1 and the wire bonding pad 31. Electrical continuity is thereby established between the electronic element 1 and the wire bonding pad 31. The other of the two pieces of wire 69 is joined to the electronic element 1 and the wire bonding pad 41. Electrical continuity is thereby established between the electronic element 1 and the wire bonding pad 41. In the case where the electronic element 1 is a diode rather than a transistor, the wire 69 does not need to be bonded to both the wire bonding pads 31 and 41. In this case, the wire 69 need only be bonded to one of the wire bonding pads 31 and 41.

The plating layer 62 shown in FIGS. 75 and 79 covers the region of each of the leads 22, 32 and 42 that projects from the resin package 7. The plating layer 62 is made of an alloy of tin, silver and copper, for example.

Next, an example of the manufacturing method for the electronic device A30 will be described using FIGS. 83 to 86.

Figure 83:
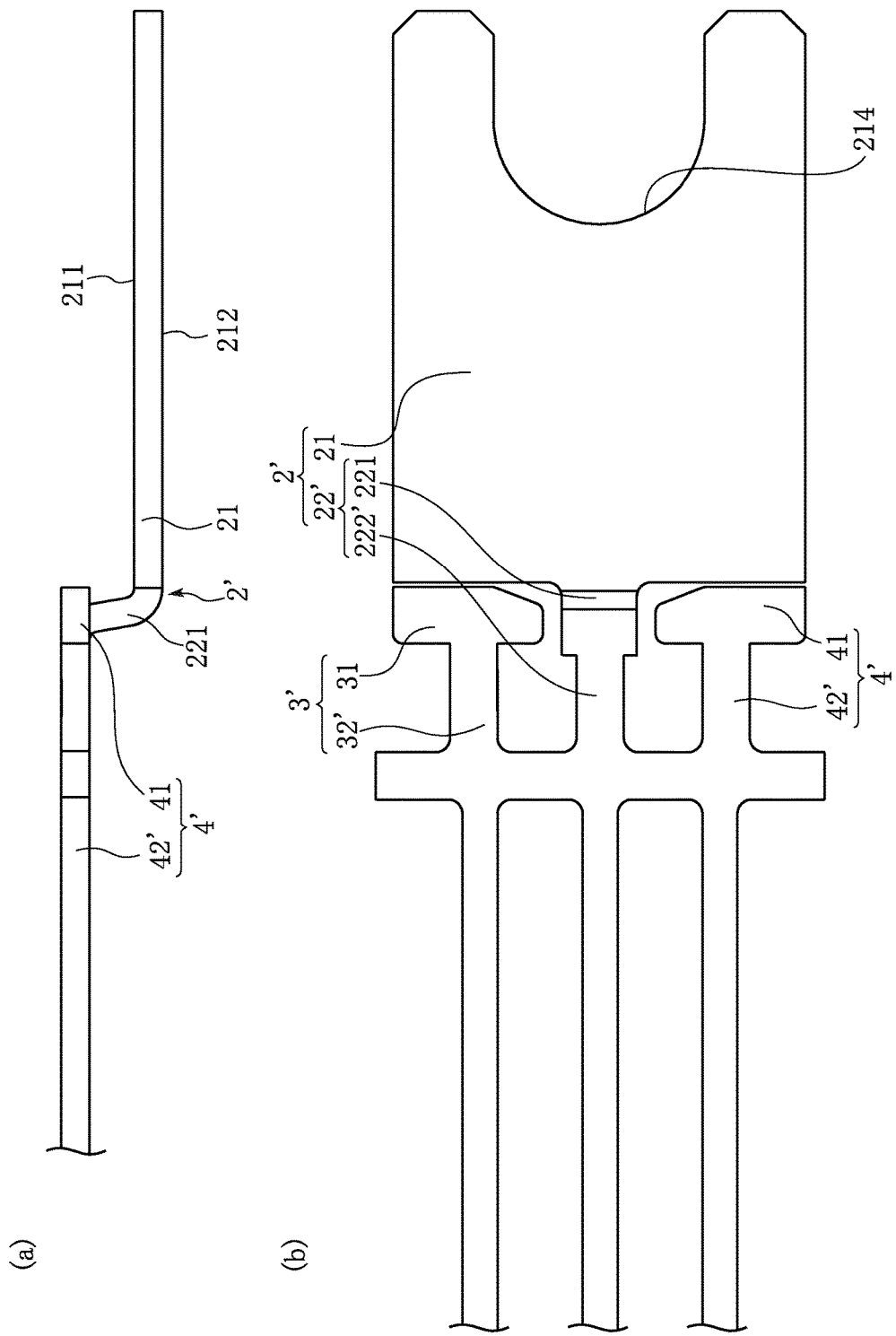
FIG. 83($a$) is a front view in one process of manufacturing processes of the electronic device according to the third embodiment of the present invention, and FIG. 83($b$) is a plan view of the configuration shown in FIG. 83($a$).
Figure 84:
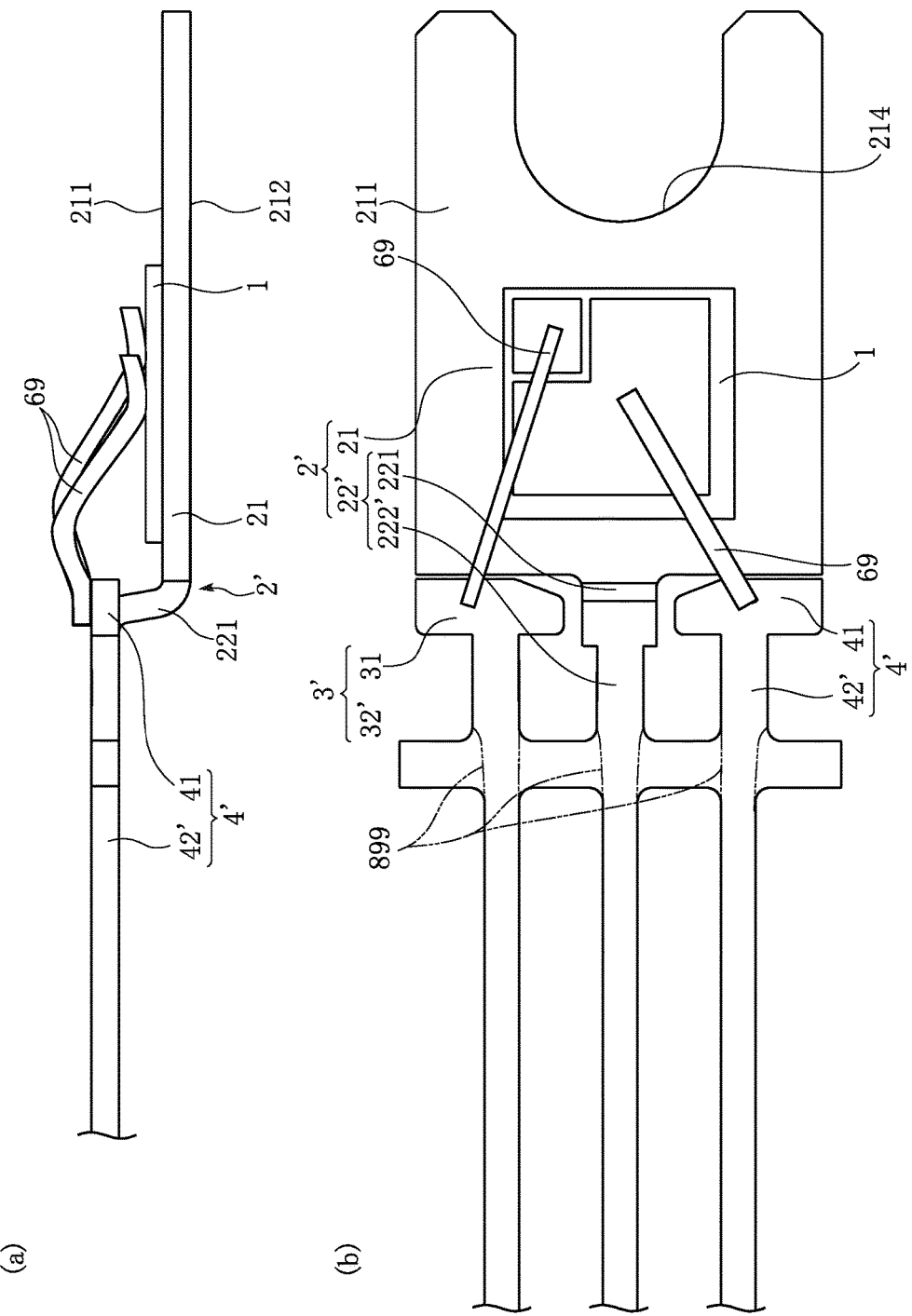
FIG. 84($a$) is a front view in one process of manufacturing processes of the electronic device according to the third embodiment of the present invention, and FIG. 84($b$) is a plan view of the configuration shown in FIG. 84($a$).

First, as shown in FIG. 83, the electrodes 2', 3' and 4' are formed. Next, as shown in FIG. 84, the electronic element 1 is placed on the placement surface 211 of the die bonding pad 21 via the adhesive layer 61 shown in FIG. 82. Placement of the electronic element 1 is performed in an environment of 300 to 350° C., for example, in a reducing atmosphere.

Next, the wire 69 is joined to the electronic element 1 and the wire bonding pad 31. Similarly, the wire 69 is joined to the electronic element 1 and the wire bonding pad 41. Joining of the wire 69 is performed as shown in the first embodiment.

Figure 85:
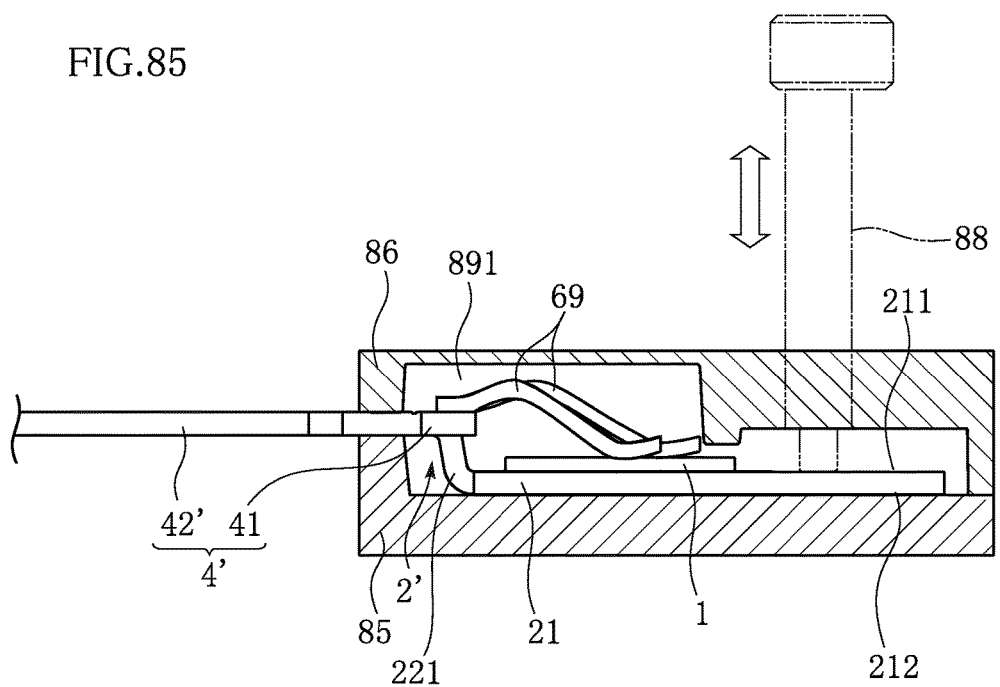
FIG. 85 is a cross-sectional view in one process of manufacturing processes of the electronic device according to the third embodiment of the present invention.
Figure 86:
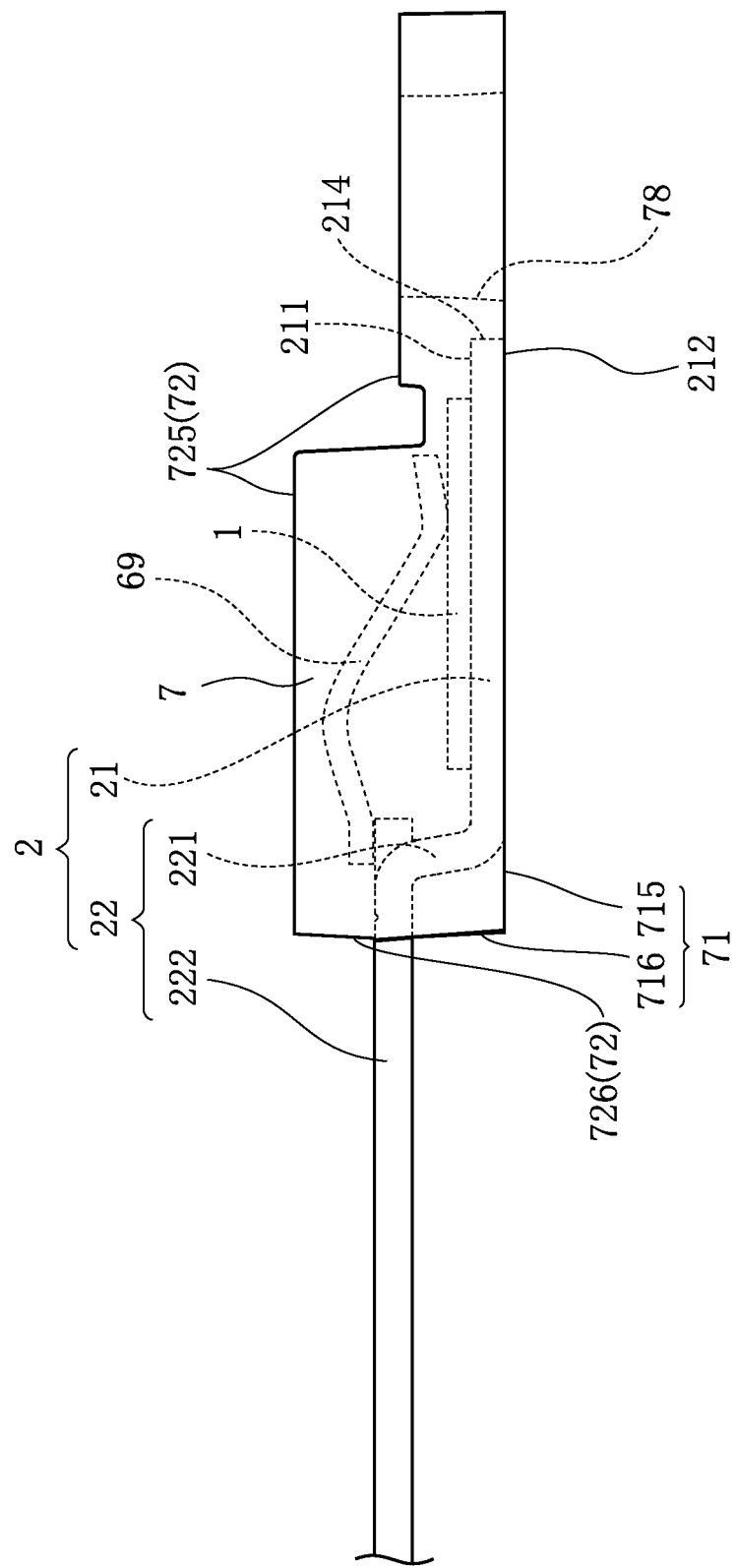
FIG. 86 is a front view showing an intermediate article that is manufactured in one process of manufacturing processes of the electronic device according to the third embodiment of the present invention.

Next, as shown in FIG. 85, the leads 22', 32' and 42' are sandwiched by the dies 85 and 86 (FIG. 85 shows only lead 42'). The dies 85 and 86 are fixed to the leads 22', 32' and 42' in the state in which the dies 85 and 86 are sandwiching the leads 22', 32' and 42'. The die bonding pad 21 is fixed to the dies 85 and 86 using the pin 88. The die 85 abuts the back surface 212 of the die bonding pad 21. The space 891 enclosed by the dies 85 and 86 is formed, when the leads 22', 32' and 42' are sandwiched by the dies 85 and 86. The space 891 houses the die bonding pad 21, the electronic element 1 and the like.

Next, resin is poured into the space 891. Next, the pin 88 is moved away slightly from the die bonding pad 21. Resin then enters between the die bonding pad 21 and the pin 88. Thereafter, the dies 85 and 86 are removed from the resin package 7 after the resin has completely hardened. This results in the resin package 7 shown in FIG. 86 being formed. The surface of the resin package 7 formed by the die 85 serves as the first surface 71. On the other hand, the surface of the resin package 7 formed by the die 86 serves as the second surface 72. The region of the resin package 7 in which the pin 88 is inserted serves as the pin mark 721.

Next, the insulating film 8 is formed on the back surface 212 of the die bonding pad 21 and the flat surface 715 of the resin package 7. Formation of the insulating film 8 is performed by surface treatment of the back surface 212 of the die bonding pad 21 and the like. Spray coating, for example, is given as such surface treatment. Note that, at this time, the insulating film 8 may be formed in part of the screw hole 78. Thereafter, the electronic device A30 is manufactured by processing such as sectioning the leads 22', 32' and 42' along the line 899 shown in FIG. 84.

Next, advantages of the present embodiment will be described.

In the electronic device A30, the back surface 212 of the die bonding pad 21 is exposed from the resin package 7. Thus, the insulating film 8 covering the back surface 212 also has a portion that is not covered by the resin package 7. The heat transferred from the die bonding pad 21 to the insulating film 8 can thereby be conducted to the heat sink 82, without passing through the resin package 7. As a result, heat is quickly transferred from the insulating film 8 to the heat sink 82. Accordingly, the electronic device A30 is suitable for suppressing the electronic element 1 from reaching an excessively high temperature. That is, the electronic device A30 has particularly excellent heat dissipation characteristics.

As described above, placement of the electronic element 1 on the die bonding pad 21 is performed in an environment of approximately 300 to 350° C. Also, in the manufacturing method for the electronic device according to the present embodiment, the insulating film 8 is formed, after placing the electronic element 1 on the die bonding pad 21. Thus, a material having a lower heat resistant temperature than the temperature (300 to 350° C.) at the time that the die bonding pad 21 is placed can be used as a material constituting the insulating film 8. As a result, the selection range of materials constituting the insulating film 8 is widened.

Hereinafter, variations of the present embodiment will be shown. In the following variations, the same reference signs as the above embodiment are given to constituent elements that are the same as or similar to the above embodiments.

<First Variation>

Next, a first variation of the electronic device according to the present embodiment will be described using FIGS. 87 to 91.

Figure 87:
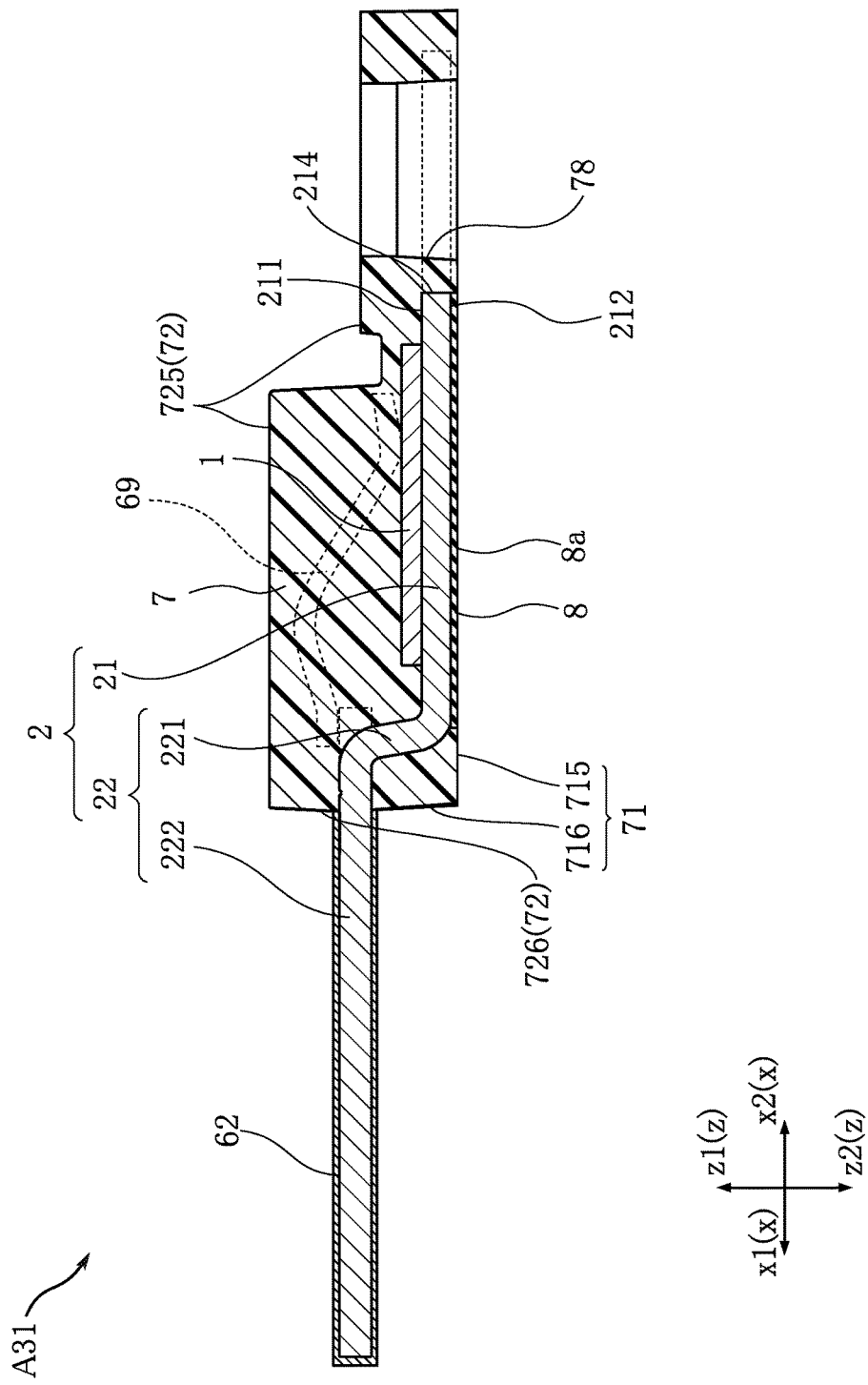
FIG. 87 is a cross-sectional view of an electronic device according to a first variation of the third embodiment of the present invention.
Figure 88:
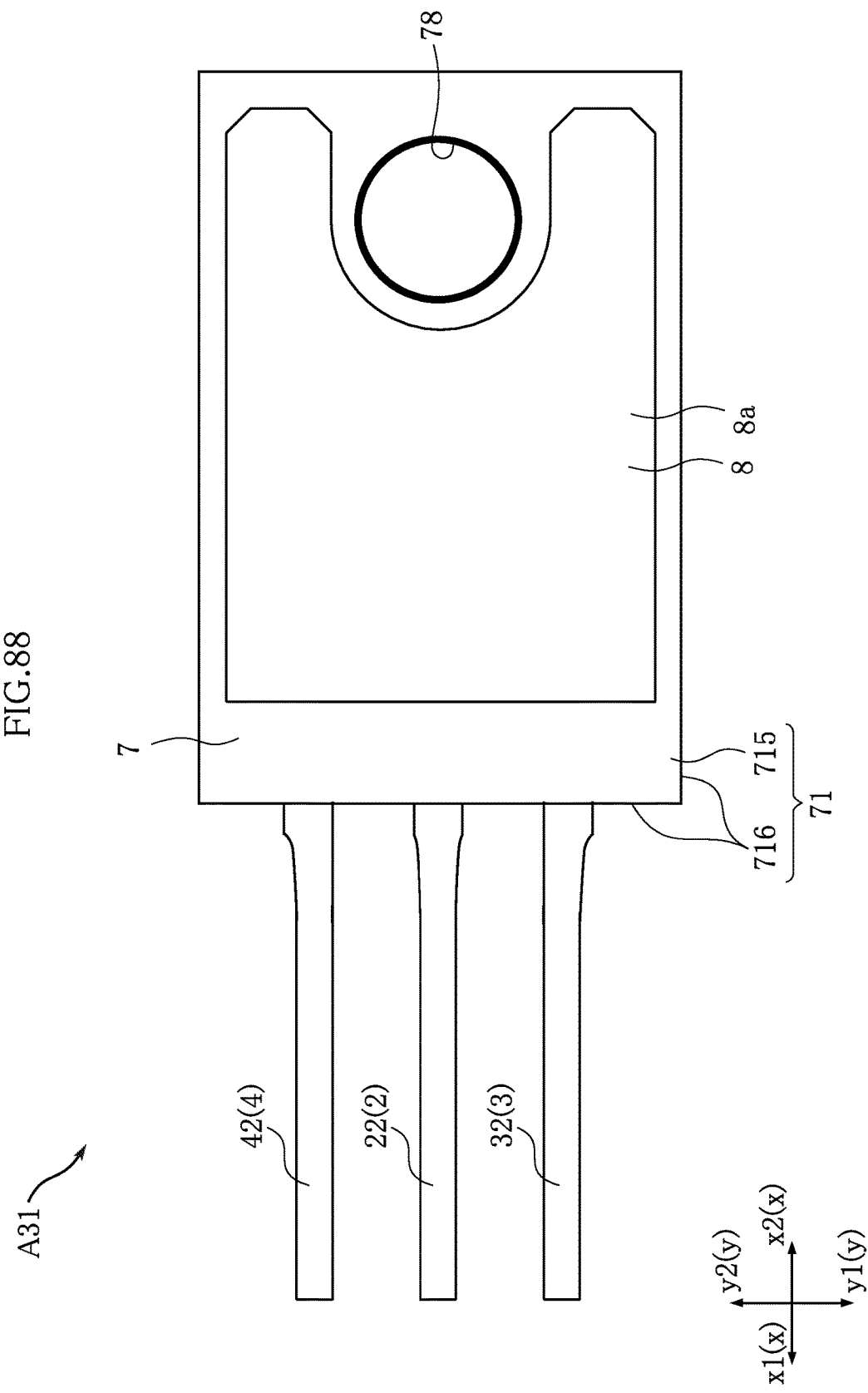
FIG. 88 is a bottom view of the electronic device according to the first variation of the third embodiment of the present invention.
Figure 89:
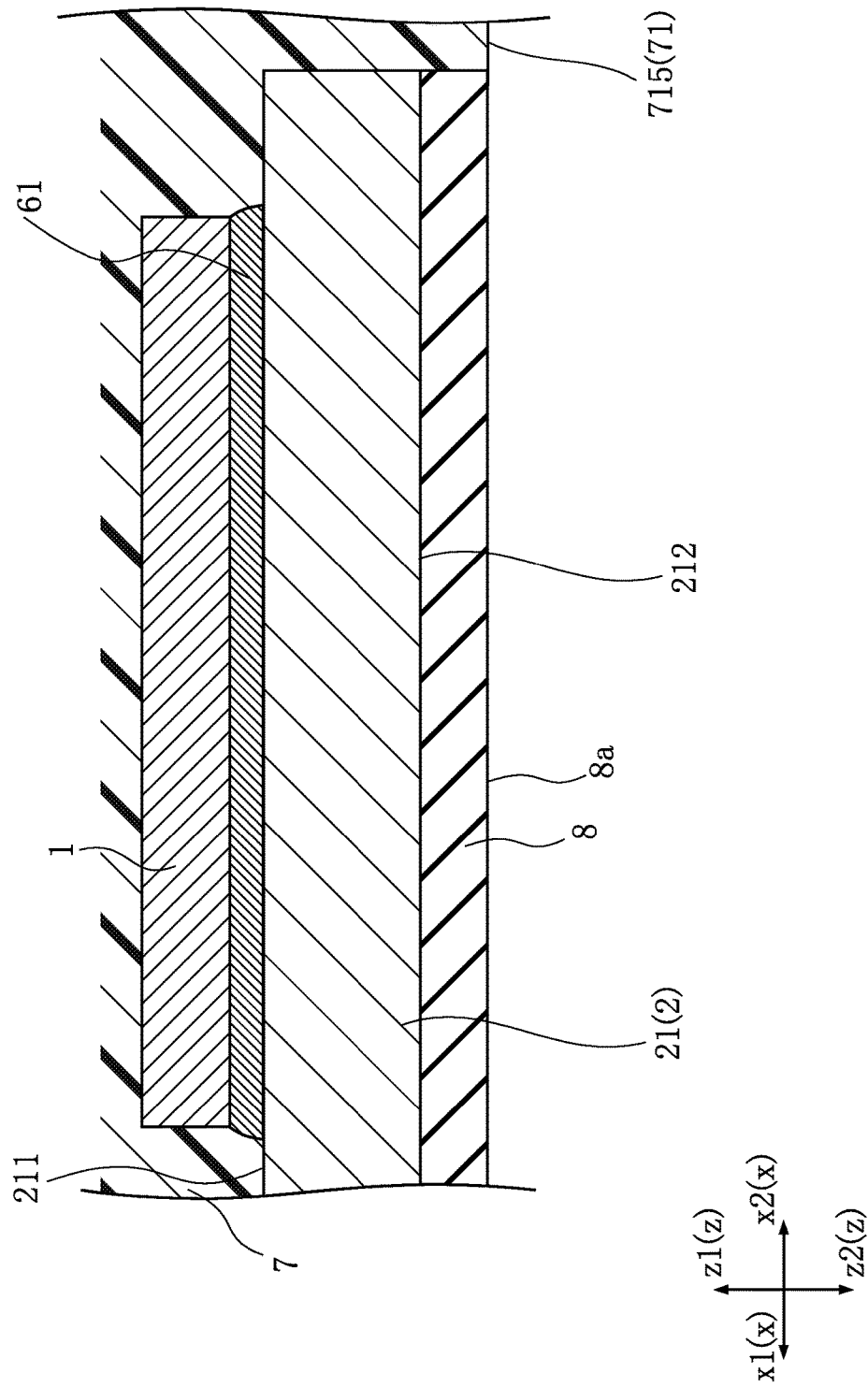
FIG. 89 is a partial enlarged cross-sectional view of the electronic device shown in FIG. 87.

FIG. 87 is a cross-sectional view of an electronic device according to a first variation of the present embodiment. FIG. 88 is a bottom view of the electronic device according to the first variation of the present embodiment. FIG. 89 is a partial enlarged cross-sectional view of the electronic device shown in FIG. 87.

An electronic device A31 shown in these diagrams is provided with the electronic element 1, the electrodes 2 to 4, the adhesive layer 61 (see FIG. 89; illustration omitted in this variation), the plating layer 62, the two pieces of wire 69, the resin package 7 and the insulating film 8. Since the respective configurations of the electronic element 1, the electrodes 2 to 4, the adhesive layer 61, the plating layer 62, and the wire 69 are similar to the above-mentioned electronic device A30, description thereof will be omitted.

As shown in FIGS. 87 and 89, the insulating film 8 covers the back surface 212 of the die bonding pad 21. The insulating film 8 directly covers the back surface 212. That is, the insulating film 8 contacts the back surface 212. Preferably if current flows through the die bonding pad 21 when using the electronic device A30, dielectric breakdown of the insulating film 8 will not occur, even when a voltage of approximately 6 kV is applied in the thickness direction. The thickness (size in the direction z) of the insulating film 8 is less than the thickness (size in the direction z) of the die bonding pad 21. The die bonding pad 21 has a thickness of 200 to 800 μm, for example. On the other hand, the insulating film 8 has a thickness of 10 to 200 μm, for example. The dielectric breakdown voltage of the material constituting the insulating film 8 is 3 to 4.6 kV/mm, for example. In this variation, preferably the heat resistant temperature of the material constituting the insulating film 8 is about 400° C., for example. A polyamide-imide-based material, for example, is given as the material constituting the insulating film 8. The insulating film 8 has the surface 8a. The surface 8a faces in the direction z2. The surface 8a is an exposed surface that is exposed from the resin package 7.

Preferably the surface 8a contacts the heat sink 82 or grease for heat dissipation (illustration omitted) is interposed between the surface 8a and the heat sink 82. This is preferable from the viewpoint of improving the heat dissipation of the electronic device A31.

As shown in FIGS. 87 and 89, in this variation, the flat surface 715 is flush with the surface 8a of the insulating film 8. Note that the flat surface 715 and the surface 8a need not necessarily be flush. Although not illustrated, the resin package 7 may cover part of the surface 8a, for example.

Next, an example of the manufacturing method for the electronic device A31 will be described using FIGS. 90 and 91.

Figure 90:
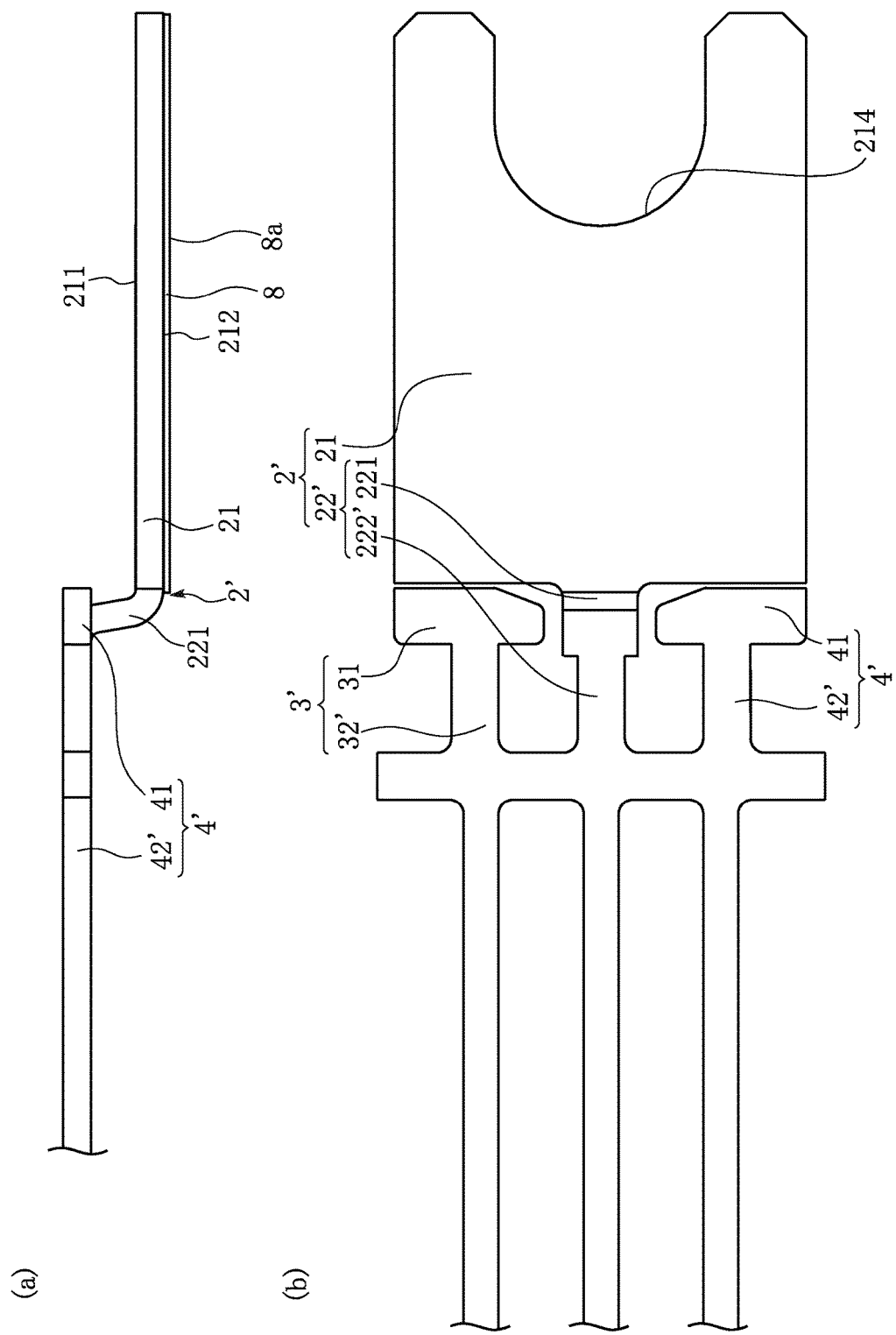
FIG. 90($a$) is a front view in one process of manufacturing processes of the electronic device according to the first variation of the third embodiment of the present invention, and FIG. 90($b$) is a plan view of the configuration shown in FIG. 90($a$).
Figure 91:
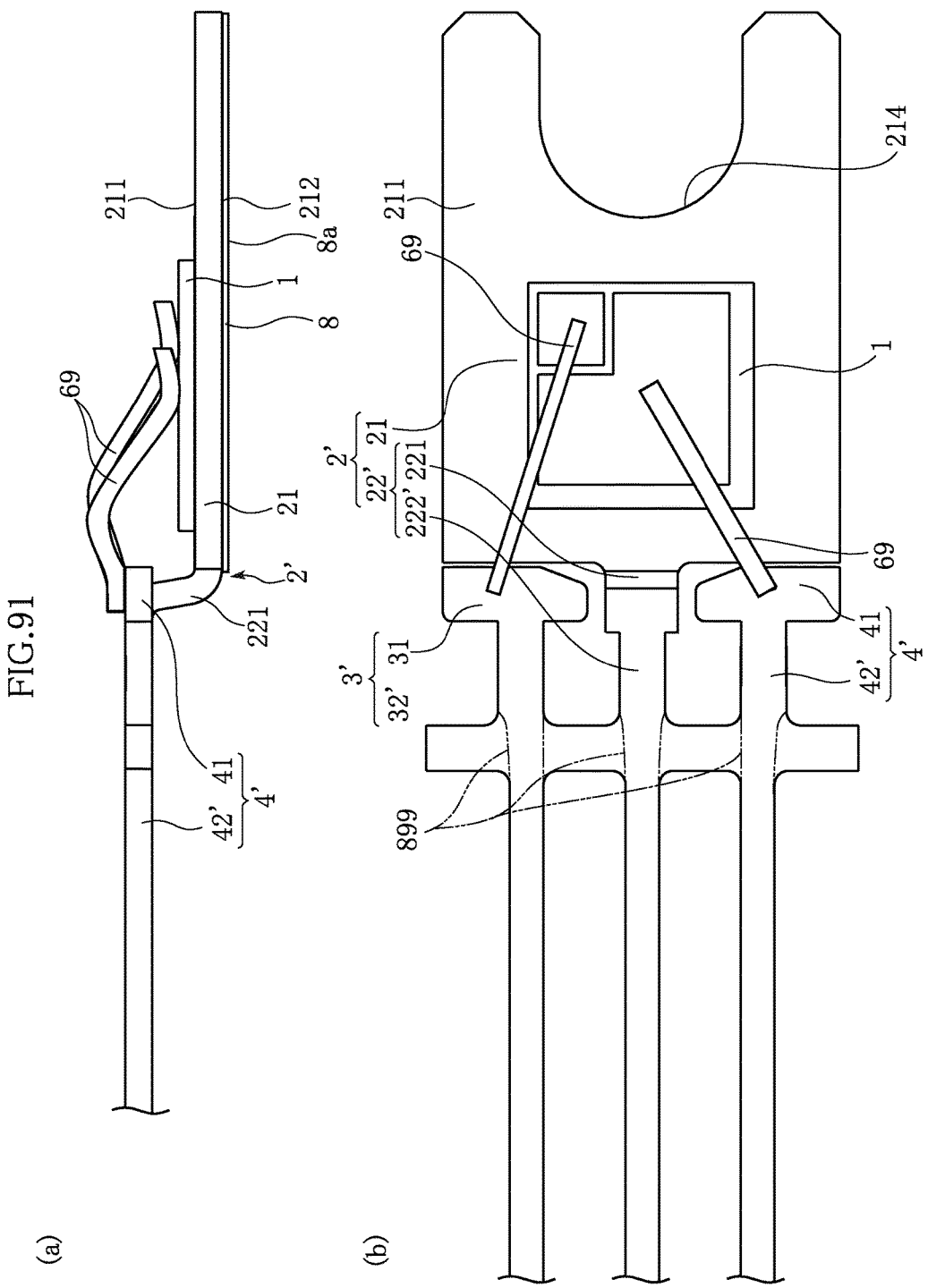
FIG. 91($a$) is a front view in one process of manufacturing processes of the electronic device according to the first variation of the third embodiment of the present invention, and FIG. 91($b$) is a plan view of the configuration shown in FIG. 91($a$).

First, as shown in FIG. 90, the electrodes 2', 3' and 4' are formed. Next, the insulating film 8 is formed on the back surface 212 of the die bonding pad 21. Formation of the insulating film 8 is performed by surface treatment of the back surface 212 of the die bonding pad 21. Spray coating, for example, is given as such surface treatment. Next, as shown in FIG. 91, the electronic element 1 is placed on the placement surface 211 of the die bonding pad 21 via the adhesive layer 61. Placement of the electronic element 1 is performed in an environment of 300 to 350° C., for example, in a reducing atmosphere.

Thereafter, the electronic device A31 is manufactured by processing such as bonding the wire 69 and forming the resin package 7, similarly to manufacturing the electronic device A30.

In the electronic device A31, the back surface 212 of the die bonding pad 21 is exposed from the resin package 7. Thus, the insulating film 8 covering the back surface 212 also has a portion that is not covered by the resin package 7. The heat transferred from the die bonding pad 21 to the insulating film 8 can thereby be conducted to the heat sink 82, without passing through the resin package 7. As a result, heat is quickly transferred from the insulating film 8 to the heat sink 82. Accordingly, the electronic device A31 is suitable for suppressing the electronic element 1 from reaching an excessively high temperature. That is, the electronic device A31 has particularly excellent heat dissipation characteristics.

Figure 92:
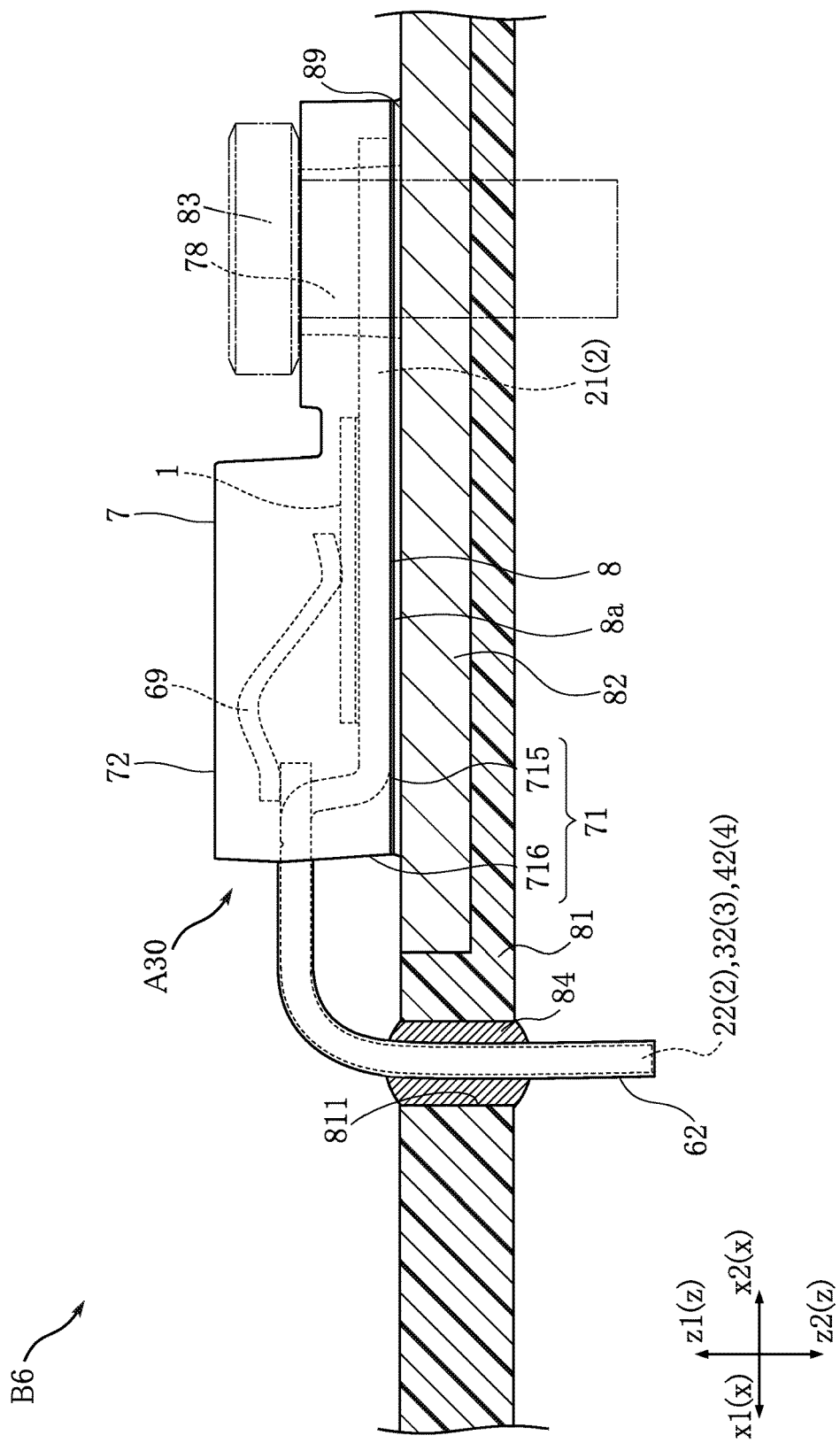
FIG. 92 is a cross-sectional view of a main section showing a variation of the mounting structure of the electronic device according to the third embodiment of the present invention.
Figure 93:
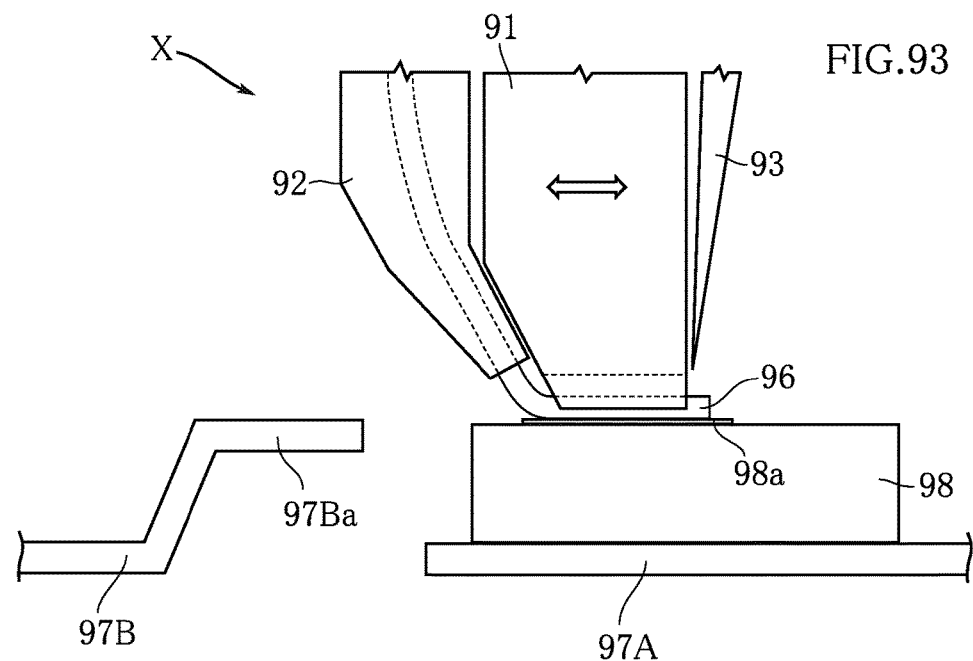
FIG. 93 is a diagram in an example of the conventional wire bonding method showing a first bonding process.
Figure 94:
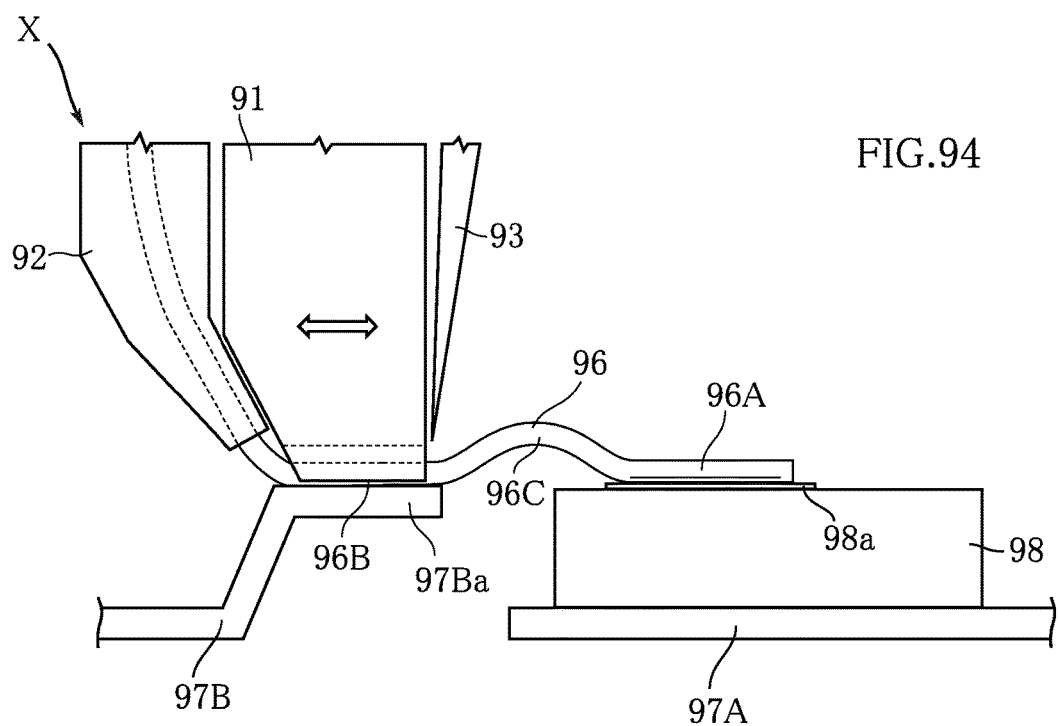
FIG. 94 is a diagram in an example of the conventional wire bonding method showing a second bonding process.

Next, a variation of the mounting structure of the electronic device of the present embodiment will be shown using FIG. 92.

FIG. 92 is a cross-sectional view of a main section of the mounting structure of the electronic device according to this variation. An electronic device mounting structure B6 shown in this diagram is provided with the electronic device A30, the mounting board 81 and the heat sink 82. In the electronic device mounting structure B6, unlike the electronic device mounting structure B5, the heat sink 82 is formed in parallel with the mounting board 81. The electronic device A30 is mounted on the mounting board 81 in a state in which all of the leads 22, 32 and 42 are bent. Note that the electronic device A31 may be mounted on the mounting board 81 instead of the electronic device A30.

The scope of the present invention is not limited to the aforementioned embodiments. The specific configurations of the respective parts of the present invention can undergo various design modifications.

As a summary of the above, configurations according to these embodiments and variations thereof will be enumerated below as Appendixes.

APPENDIX 1

An insertion mounting type electronic device provided with:
an electronic device;
a heat dissipation member;
a die bonding pad having a placement surface on which the electronic device is placed and located between the electronic device and the heat dissipation member;
a resin package covering the electronic device, the heat dissipation member, and the die bonding pad; and
a first lead for insertion mounting connected to the die bonding pad and projecting from the resin package.

APPENDIX 2

In the electronic device according to Appendix 1,
the die bonding pad and the first lead are integrally shaped, and
the die bonding pad has the same thickness as the first lead.

APPENDIX 3

In the electronic device according to Appendix 2, the first lead includes: a coupling part that extends in a direction intersecting the placement surface and is connected to the die bonding pad; and a terminal part that has a region connected to the coupling part and projecting from the resin package.

APPENDIX 4

In the electronic device according to Appendix 2 or 3, the heat dissipation member is joined to the die bonding pad by ultrasonic joining.

APPENDIX 5

In the electronic device according to any one of Appendixes 2 to 4, the heat dissipation member is made of a material having a higher thermal conductivity than a material constituting the resin package.

APPENDIX 6

In the electronic device according to any one of Appendixes 2 to 4, the heat dissipation member is made of a material having a higher thermal conductivity than a material constituting the die bonding pad.

APPENDIX 7

In the electronic device according to any one of Appendixes 2 to 4, the heat dissipation member is made of aluminum, copper or iron.

APPENDIX 8

In the electronic device according to Appendix 1,
the heat dissipation member has a first surface joined to the die bonding pad and a second surface facing an opposite side to the first surface, and
the second surface is exposed from the resin package.

APPENDIX 9

In the electronic device according to Appendix 8, the first lead is joined to the die bonding pad.

APPENDIX 10

In the electronic device according to Appendix 9,
the first lead includes: a joining part that extends in a direction intersecting the placement surface and is joined to the die bonding pad; and a terminal part that has a region connected to the joining part and projecting from the resin package, and
the joining part and the terminal part are integrally shaped.

APPENDIX 11

In the electronic device according to Appendix 9,
the die bonding pad includes: a plate-like part on which the electronic device is placed; and an extension part that extends from the plate-like part in a direction intersecting the placement surface and is joined to the first lead, and
the plate-like part and the extension part are integrally shaped.

APPENDIX 12

In the electronic device according to Appendix 11, the extension part extends from the plate-like part in a direction toward the first surface side from the second surface side.

APPENDIX 13

In the electronic device according to any one of Appendixes 8 to 12, the heat dissipation member is made of an insulating material.

APPENDIX 14

In the electronic device according to Appendix 13, the insulating material is a ceramic material.

APPENDIX 15

In the electronic device according to Appendix 14, the ceramic material is alumina, zirconia or aluminum nitride.

APPENDIX 16

In the electronic device according to any one of Appendixes 8 to 12, the heat dissipation member includes a base made of metal and an insulating film surrounding the base.

APPENDIX 17

In the electronic device according to Appendix 16, the insulating film is made of an oxide of the metal.

APPENDIX 18

In the electronic device according to any one of Appendixes 8 to 17,
the heat dissipation member includes a dropout prevention part that protrudes from the second surface, as viewed in a direction perpendicular to the placement surface, and
the dropout prevention part is located further toward the first surface side from the second surface than the resin package.

APPENDIX 19

In the electronic device according to any one of Appendixes 8 to 18, the heat dissipation member has a region that protrudes from the resin package, as viewed in a direction perpendicular to the placement surface.

APPENDIX 20

In the electronic device according to any one of Appendixes 13 to 15,
the heat dissipation member includes a first substrate constituting the first surface and a second substrate stacked on the first substrate and constituting the second surface, and
the first substrate has a dropout prevention part protruding from the second substrate as viewed in a direction perpendicular to the placement surface and located further toward the first surface side from the second surface than the resin package.

APPENDIX 21

In the electronic device according to Appendix 20, the second substrate entirely overlaps with the first substrate, as viewed in a direction perpendicular to the placement surface.

APPENDIX 22

The electronic device according to any one of the Appendixes 8 to 21, further provided with a joining layer that is interposed between the first surface and the die bonding pad and joins the first surface to the die bonding pad.

APPENDIX 23

In the electronic device according to Appendix 22, the joining layer is made of a silver paste.

APPENDIX 24

In the electronic device according to Appendix 22, the joining layer includes a resin layer interposed between the first surface and the die bonding pad and made of a resin, and a filler mixed in the resin layer.

APPENDIX 25

In the electronic device according to any one of Appendixes 1 to 24, the heat dissipation member further includes: a tabular part that overlaps with the die bonding pad as viewed in a direction perpendicular to the placement surface; and a projecting part that overlaps with the first lead and projects from the tabular part in a direction in which the first lead projects.

APPENDIX 26

The electronic device according to Appendix 25, further provided with:

a first wire bonding pad, and a second lead for insertion mounting that is in parallel with the first lead and is connected to the first wire bonding pad, and a gap is formed between the first wire bonding pad and the projecting part, as viewed in a direction perpendicular to the placement surface.

APPENDIX 27

The electronic device according to Appendix 26, further provided with:

a second wire bonding pad, and a third lead for insertion mounting that is in parallel with the first lead and is connected to the second wire bonding pad, the first lead is located between the second lead and the third lead, and a gap is formed between the second wire bonding pad and the projecting part, as viewed in a direction perpendicular to the placement surface.

APPENDIX 28

In the electronic device according to any one of Appendixes 1 to 24, a hole is formed in the die bonding pad, and the heat dissipation member has a rectangular shape and is located further in a direction in which the first lead projects than the hole.

APPENDIX 29

In the electronic device according to any one of the Appendixes 1 to 24, a hole is formed in the die bonding pad, and a screw hole that overlaps with the hole is formed in the heat dissipation member.

APPENDIX 30

In the electronic device according to any one of Appendixes 1 to 24, a hole is formed in the die bonding pad, and the heat dissipation member has a recessed portion that is open on an opposite side to a direction in which the first lead project, and overlaps with the hole.

APPENDIX 31

The electronic device according to any one of the Appendixes 1 to 30, further provided with an adhesive layer interposed between the electronic device and the die bonding pad.

APPENDIX 32

A manufacturing method for an insertion mounting type electronic device, the method including the steps of:

preparing a heat dissipation member having a first surface and a second surface on an opposite side to the first surface;

joining a die bonding pad to the first surface;

joining a lead to the die bonding pad, after the step of joining the die bonding pad;

placing an electronic device on an opposite side to the heat dissipation member, with the die bonding pad sandwiched therebetween; and forming a resin package that exposes the second surface and covers the die bonding pad, the electronic device and part of the lead.

APPENDIX 33

In the manufacturing method according to Appendix 32, the step of preparing the heat dissipation member includes the steps of:

placing a plurality of substrates made of a ceramic material on a sheet made of a ceramic material;

collectively baking the sheet and the plurality of substrates;

sectioning the sheet into a plurality of pieces that are each joined to a different one of the plurality of substrates.

APPENDIX 34

An insertion mounting type electronic device provided with:

an electronic device;

a resin package covering the electronic device;

a die bonding pad that has a placement surface on which the electronic device is placed and covered by the resin package, and that has a back surface that faces an opposite side to the placement surface and is exposed from the resin package;

an insulating film covering the back surface; and a first lead for insertion mounting that is connected to the die bonding pad and projects from the resin package.

APPENDIX 35

In the electronic device according to Appendix 34, the insulating film covers the resin package.

APPENDIX 36

In the electronic device according to Appendix 35, the resin package has a mounting surface that is flush with the back surface and covered by the insulating film.

APPENDIX 37

In the electronic device according to Appendix 34,
the insulating film has an exposed surface exposed from the resin package, and
the resin package has a mounting surface that is flush with the exposed surface.

APPENDIX 38

In the electronic device according to any one of Appendixes 34 to 37, the first lead includes a coupling part extending in a direction intersecting the placement surface and connected to the die bonding pad, and a terminal part having a region that is connected to the coupling part and projects from the resin package.

APPENDIX 39

The electronic device according to any one of Appendixes 34 to 38, further provided with:
a first wire bonding pad;
a second wire bonding pad;
a second lead for insertion mounting that is in parallel with the first lead and is connected to the first wire bonding pad; and
a third lead for insertion mounting that is in parallel with the first lead and is connected to the second wire bonding pad, and
the first lead is located between the second lead and the third lead.

APPENDIX 40

In the electronic device according to any one of Appendixes 34 to 39, the insulating film is made of polyamide-imide or polyimide.

APPENDIX 41

The electronic device according to any one of the Appendixes 34 to 40, further provided with an adhesive layer interposed between the electronic device and the die bonding pad.

APPENDIX 42

A manufacturing method for an insertion mounting type electronic device, the method including:
a step of placing, with use of a die bonding pad having a placement surface and a back surface facing an opposite side to the placement surface, an electronic device on the placement surface;
a step of forming a resin package having an opening that faces the back surface and covering the placement surface and the electronic device, after the step of placing the electronic device; and
a step of forming an insulating film on the back surface.

APPENDIX 43

In the manufacturing method according to Appendix 42, the step of forming the insulating film is performed after the step of forming the resin package.

APPENDIX 44

In the manufacturing method according to Appendix 43, in the step of forming the insulating film, part of the resin package is covered by the insulating film.

APPENDIX 45

In the manufacturing method for an electronic device according to Appendix 42, the step of forming the insulating film is performed before the step of placing the electronic device.

APPENDIX 46

In the manufacturing method for an electronic device according to any one of Appendixes 42 to 45, the step of forming the insulating film is performed by spray coating.

The invention claimed is:

1. A manufacturing method for a wire bonding structure, the method comprising:
a pressing step of forming a withdrawn surface by pressing a wire made of Cu against a pressing target;
a step of detaching the withdrawn surface from the pressing target;
a step of relocating the withdrawn surface from the pressing target to a first joining target formed on an electronic device; and
a step of joining the wire to the first joining target;
wherein before the joining step, the wire has an outer circumferential surface and the withdrawn surface,
the withdrawn surface is withdrawn toward a central axis of the wire from the outer circumferential surface and elongated along the central axis, and
in the joining step, ultrasonic vibration is applied to the wire in a state in which the withdrawn surface is pressed against the first joining target.

2. The manufacturing method according to claim 1, wherein the withdrawn surface is flat at a point in time of starting the joining step.

3. The manufacturing method according to claim 1, wherein the pressing target is made of a ceramic material or a metal.

4. The manufacturing method according to claim 1,
wherein in the pressing step of forming the withdrawn surface, the wire is pressed against the pressing target by a wedge for pressing the wire, and
in the step of joining the wire to the first joining target, the wire is pressed against the first joining target by the wedge.

5. The manufacturing method according to claim 4, wherein a guide groove that guides the wire is formed in the wedge,
the step of relocating the withdrawn surface comprises moving the wedge from a position in which the guide groove directly opposes the pressing target to a position in which the guide groove directly opposes the first joining target, while maintaining a state in which the wire is slotted into the guide groove, between the step of forming the withdrawn surface and the step of joining the wire to the first joining target, in the step of forming the withdrawn surface, the wire is pressed against the pressing target by an inner surface of the guide groove, and in the step of joining the wire to the first joining target, the wire is pressed against the first joining target by the inner surface of the guide groove.

6. The manufacturing method according to claim 1, wherein the wire has a circular shape with a diameter of 150 to 1000 μm.

7. The manufacturing method according to claim 1, wherein the wire has a circular shape with a diameter of 300 to 1000 μm.

8. The manufacturing method according to claim 1, wherein the wire is made entirely of Cu.

9. The manufacturing method according to claim 1, further comprising a step of joining the wire to a second joining target by applying ultrasonic vibration in a state in which the wire is pressed against the second joining target.

10. The manufacturing method according to claim 1, wherein the electronic device is a semiconductor device.

11. The manufacturing method according to claim 10, wherein the semiconductor device is a MOSFET or an IGBT.

12. A wire bonding structure comprising:
a first joining target having a first surface;
a second joining target; and
a wire joined to both the first joining target and the second joining target,
wherein the wire is made of Cu and has a circular cross-sectional shape with a diameter of 150 to 1000 μm, the circular cross-sectional shape having a curvature depending on the diameter,
the wire includes a bonding part joined to the first joining target,
the bonding part has an outer circumferential surface and a joining surface joined to the first joining target,
the joining surface is withdrawn toward a central axis of the wire from the outer circumferential surface and elongated along the central axis,
in a cross-section perpendicular to the central axis of the wire, the bonding part comprises first, second and third arcs spaced apart from each other about the central axis,
the first arc is disposed opposite to the joining surface with respect to the central axis, and the second arc and the third arc are spaced apart from each other via the joining surface, and
each of the first, the second and the third arcs has a curvature that is equal to the curvature of the circular cross-sectional shape of the wire.

13. The wire bonding structure according to claim 12, wherein the wire has a circular shape with a diameter of 300 to 1000 μm.

14. The wire bonding structure according to claim 12, wherein the wire is made entirely of Cu.

15. The wire bonding structure according to claim 12, wherein a size of the joining surface, in a cross-sectional shape of a cross-section orthogonal to a first direction, is 60 to 80% of the diameter of the wire, and
the first direction is a direction in which the central axis of the wire extends and is orthogonal to a direction in which the first surface faces.

16. The wire bonding structure according to claim 15, wherein the size of the joining surface, in a cross-sectional shape orthogonal to the first direction, is 90 to 800 μm.

17. The wire bonding structure according to claim 15, wherein the size of the joining surface in the first direction is 3 to 10 times the diameter of the wire.

18. The wire bonding structure according to claim 15, wherein the size of the joining surface in the first direction is 1200 to 4000 μm.

19. The wire bonding structure according to claim 12, wherein the joining surface has an elliptical shape whose major axis coincides with the direction in which the central axis of the wire extends.

20. The wire bonding structure according to claim 19, wherein an elliptical mark having an elliptical shape is formed in the joining surface, and the elliptical mark is located on an inner side of an edge of the joining surface.

21. The wire bonding structure according to claim 20, wherein the bonding part has a first pressed surface and a second pressed surface,
the first pressed surface and the second pressed surface are withdrawn toward the central axis of the wire from the outer circumferential surface, and
the first pressed surface and the second pressed surface are located on opposite sides to each other with a virtual plane that passes through the central axis and is orthogonal to the first surface sandwiched therebetween when viewed in a direction orthogonal to the first surface.

22. The wire bonding structure according to claim 21, wherein the first pressed surface and the second pressed surface slope with respect to the virtual plane.

23. The wire bonding structure according to claim 21, wherein a first curved mark formed at a position shifted from an edge of the first pressed surface and a second curved mark formed at a position shifted from an edge of the second pressed surface are formed in the bonding part.

24. The wire bonding structure according to claim 12, wherein the bonding part serves as a first bonding part,
the wire includes a second bonding part and a bridging part,
the bridging part connects the first bonding part and the second bonding part, and
the second bonding part is joined to the second joining target.

25. An electronic device comprising:
a wire bonding structure according to claim 12; and
an electronic device on which the first joining target is formed,
wherein the first joining target is an electrode pad.

26. The electronic device according to claim 25, wherein the electronic device is a semiconductor device.

27. The electronic device according to claim 26, wherein the semiconductor device is a MOSFET or an IGBT.

28. The electronic device according to claim 25, wherein the first joining target is made of Al.

29. The electronic device according to claim 25, wherein the first joining target has a thickness of 1 to 10 μm.

30. The electronic device according to claim 25, wherein a maximum current value that flows through the wire is 150 to 200 A.

31. The electronic device according to claim 25, wherein the first joining target includes a metal layer and an electrode pad,
the wire is joined to the metal layer,
the metal layer is interposed between the wire and the electrode pad, and
the metal layer has a greater thickness than the electrode pad.

* * * * *